United States Patent
Kodama et al.

(10) Patent No.: US 6,858,370 B2
(45) Date of Patent: Feb. 22, 2005

(54) POSITIVE PHOTOSENSITIVE COMPOSITION

(75) Inventors: Kunihiko Kodama, Shizuoka (JP); Kenichiro Sato, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 245 days.

(21) Appl. No.: 10/079,414

(22) Filed: Feb. 22, 2002

(65) Prior Publication Data
US 2003/0017415 A1 Jan. 23, 2003

(30) Foreign Application Priority Data

| Feb. 23, 2001 | (JP) | P.2001-048602 |
| Feb. 23, 2001 | (JP) | P.2001-048783 |
| Feb. 23, 2001 | (JP) | P.2001-048784 |
| Feb. 23, 2001 | (JP) | P.2001-048880 |
| May 25, 2001 | (JP) | P.2001-157366 |
| May 25, 2001 | (JP) | P.2001-157367 |

(51) Int. Cl.$^7$ ............................................. G03F 7/004
(52) U.S. Cl. ..................... 430/270.1; 430/905; 430/910
(58) Field of Search ............................. 430/270.1, 905, 430/910

(56) References Cited

U.S. PATENT DOCUMENTS

| 6,159,656 A | * | 12/2000 | Kawabe et al. | 430/270.1 |
| 6,511,787 B2 | * | 1/2003 | Harada et al. | 430/270.1 |
| 6,596,458 B1 | * | 7/2003 | Sato et al. | 430/270.1 |
| 6,630,280 B1 | * | 10/2003 | Fujimori et al. | 430/270.1 |
| 6,692,884 B2 | * | 2/2004 | Fujimori et al. | 430/170 |
| 6,699,635 B1 | * | 3/2004 | Kodama et al. | 430/270.1 |
| 6,787,283 B1 | * | 9/2004 | Aoai et al. | 430/270.1 |

FOREIGN PATENT DOCUMENTS

| EP | 1 041 442 A1 | 4/2000 |
| JP | 2000-275845 | 10/2000 |
| JP | 2000-292917 | 10/2000 |

* cited by examiner

*Primary Examiner*—John S. Chu
(74) *Attorney, Agent, or Firm*—Sughrue Mion, PLLC

(57) ABSTRACT

A positive photosensitive composition comprises: (A) an acid generator capable of generating an acid upon irradiation with one of an actinic ray and a radiation; and (B) a resin having a monocyclic or polycyclic alicyclic hydrocarbon structure and capable of decomposing by the action of an acid to increase the solubility in an alkali developer, wherein the acid generator (A) comprises at least two compounds of a sulfonium salt compound not having an aromatic ring, a triarylsulfonium salt compound, and a compound having a phenacylsulfonium salt structure.

19 Claims, No Drawings

POSITIVE PHOTOSENSITIVE COMPOSITION

FIELD OF THE INVENTION

The present invention relates to a positive photosensitive composition for use in the manufacturing process of a semiconductor such as IC, in the manufacture of a circuit board for a liquid crystal device or a thermal head, and in the process of other photofabrication, more specifically relates to a positive photosensitive composition which is preferred when far ultraviolet rays having a wavelength of 250 nm or less are used as exposure light sources.

BACKGROUND OF THE INVENTION

Chemical amplification positive resist compositions are materials for forming patterns on substrates, i.e., these compositions generate acids by irradiation with radiations, such as far ultraviolet rays, on the irradiated areas and undergo reaction utilizing these acids as a catalyst. This reaction causes a difference in solubilities in a developing solution between the irradiated area and non-irradiated area with the actinic radiations, thereby enabling pattern formation.

When KrF excimer laser is used as an exposure light source, compositions mainly comprising a resin having a fundamental skeleton of poly(hydroxystyrene) which is small in absorption in wavelength region of 248 nm are used, therefore high sensitivity, high resolution and good pattern forming can be ensured as compared with the cases where conventional naphthoquinonediazide/novolak series resins are used.

However, when light sources having further shorter wavelength, e.g., an ArF excimer laser (193 nm), are used, since compounds having an aromatic group fundamentally have large absorption in wavelength region of 193 nm, even chemical amplification resist compositions are not sufficient.

The use of poly(meth)acrylate is described in *J. Vac. Sci. Technol.*, B9, 3357 (1991) as a polymer having small absorption in wavelength region of 193 nm, however, this polymer is inferior to conventional phenolic resins having an aromatic group in resistance to dry etching generally performed in semiconductor manufacturing process.

A mixed acid generator comprising a specific sulfonium salt (an anion having from 1 to 15 carbon atoms) and a triarylsulfonium salt is disclosed in JP-A-00-292917 (the term "JP-A" as used herein means an "unexamined published Japanese patent application"), combination of a triphenylsulfonium salt of a perfluoroalkane sulfonic acid having from 4 to 8 carbon atoms and 2-alkyl-2-adamantyl (meth) acrylate is disclosed in JP-A-00-275845, and a mixed acid generator comprising a specific sulfonium salt (an anion having from 1 to 8 carbon atoms) and a triphenylsulfonium salt or iodonium salt of perfluoroalkane sulfonic acid having from 4 to 8 carbon atoms is disclosed in EP-A-1041442.

For coping with finer pattern-making, a transformed illumination method or a phase-shift mask is generally used, zonal illumination is used for a line-and-space pattern, and a half tone phase shift mask is used for a contact hole pattern in many cases.

It has been desired to obtain high resolution and broad defocus latitude when zonal illumination is used. "Wide defocus latitude" means that the fluctuation of line width by the shift of focus is small.

When a half tone phase shift mask is used, there is a problem of a side lobe caused by the dissolution of a pattern part with a trace amount of transmitted light, and the solution of this problem has been desired.

Further, p-hydroxystyrene resin for use in a KrF excimer laser resist interacts with an acid generator, in particular, an ionic compound, e.g., an onium salt, and improves the solubility of the acid generator, however, a resin having an acyclic hydrocarbon structure is very high in hydrophobicity and the interaction with an ionic compound such as an onium salt is difficult to occur. As a result, the solubility of an acid generator becomes low, resulting in the problem of particles being liable to be generated during storage of a resist solution.

There are other problems of hole pitch dependency, exposure margin, and the fluctuation of sensitivity due to storage with the lapse of time. Further, there arises a problem that the film stability inside or outside an irradiation apparatus with the lapse of time (PED) is deteriorated and the pattern dimension fluctuates.

"PED (Post Exposure Delay) stability" means the film stability in the case where a resist film is allowed to stand in or outside an irradiation apparatus during the period of time after irradiation and before heating.

There is a further problem in the uniformity of a decrease in a film by oxide etching of a resin.

SUMMARY OF THE INVENTION

Accordingly, a first object of the present invention is to provide a positive photosensitive composition capable of providing a broad defocus latitude when zonal illumination is used, hardly generating side lobe in pattern-forming using a half tone phase shift mask, and further hardly generating particles during storage.

Further, as described above, the above techniques have drawbacks in half tone exposure aptitude, hole pitch dependency, exposure margin, sensitivity fluctuation due to aging storage, PED stability, and the uniformity of a decrease in a film by oxide etching of a resin, and further improvement of these problems has been desired.

Accordingly, another object of the present invention is to provide a positive photosensitive composition excellent in half tone exposure aptitude, hole pitch dependency and exposure margin, capable of preventing sensitivity fluctuation due to aging storage, and improved in PED stability and the uniformity of a decrease in a film by oxide etching of a resin.

The positive photosensitive compositions having the following constitutions are provided as the embodiments of the present invention, thereby the above and other objects of the present invention have be achieved.

(1) A positive photosensitive composition comprising:

(A) an acid generator capable of generating an acid upon irradiation with one of an actinic ray and a radiation;

(B) a resin: having a monocyclic or polycyclic alicyclic hydrocarbon structure; and being capable of decomposing by the action of an acid to increase the solubility in an alkali developer;

(C) a basic compound; and (D) a surfactant containing at least one of a fluorine atom and a silicon atom;

wherein the acid generator (A) comprises at least two compounds selected from the group consisting of a sulfonium salt compound not having an aromatic ring, a triarylsulfonium salt compound, and a compound having a phenacylsulfonium salt structure (a first embodiment).

(2) The positive photosensitive composition as described in the item (1), which comprises (E) a solvent mixture including:

a solvent containing a hydroxyl group; and a solvent not containing a hydroxyl group.

(3) The positive photosensitive composition as described in the item (1), wherein the basic compound (C) includes a compound having at least one structure selected from the group consisting of an imidazole structure, a diazabicyclo structure, an onium hydroxide structure, an onium carboxylate structure and an aniline structure.

(4) The positive photosensitive composition as described in the item (1), which further comprises (F) a low molecular weight dissolution-inhibiting compound having: a molecular weight of 3,000 or less; and a group capable of decomposing by the action of an acid to increase the solubility in an alkali developer.

(5) The positive photosensitive composition as described in the item (1), wherein the acid generator (A) comprises the triarylsulfonium salt compound and the compound having a phenacylsulfonium salt structure.

(6) The positive photosensitive composition as described in the item (1), wherein the acid generator (A) comprises the sulfonium salt compound not having an aromatic ring and the compound having a phenacylsulfonium salt structure.

(7) The positive photosensitive composition as described in the item (1), wherein the acid generator (A) comprises the sulfonium salt compound not having an aromatic ring and the triarylsulfonium salt compound.

(8) The positive photosensitive composition as described in the item (1), wherein the resin (B) contains at least one selected from the group consisting of: a repeating unit having a partial structure containing an alicyclic hydrocarbon represented by formula (pI), (pII), (pIII), (pIV), (pV) or (pVI) below; and a repeating unit represented by formula (II-AB):

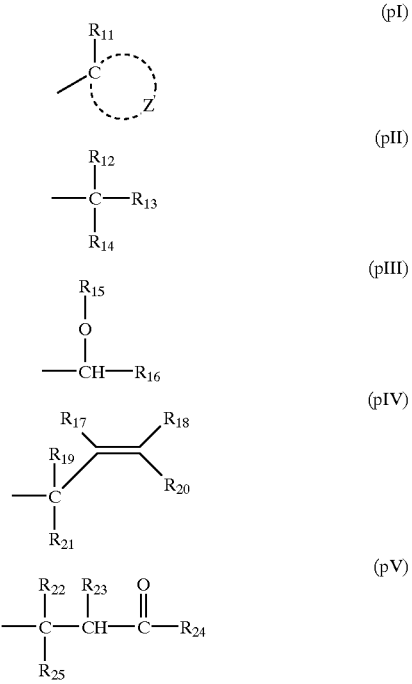

(pI)

(pII)

(pIII)

(pIV)

(pV)

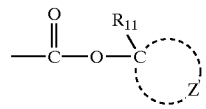

(pVI)

wherein $R_{11}$ represents a methyl group, an ethyl group, an n-propyl group, an isopropyl group, an n-butyl group, an isobutyl group or a sec-butyl group; Z represents an atomic group necessary to form an alicyclic hydrocarbon group together with the carbon atom; $R_{12}$, $R_{13}$, $R_{14}$, $R_{15}$ and $R_{16}$ each independently represents a straight chain or branched alkyl group having from 1 to 4 carbon atoms, or an alicyclic hydrocarbon group, provided that at least one of $R_{12}$, $R_{13}$ and $R_{14}$ represents an alicyclic hydrocarbon group, and at least one of $R_{15}$ and $R_{16}$ represents an alicyclic hydrocarbon group; $R_{17}$, $R_{18}$, $R_{19}$, $R_{20}$ and $R_{21}$ each independently represents a hydrogen atom, a straight chain or branched alkyl group having from 1 to 4 carbon atoms, or an alicyclic hydrocarbon group, provided that at least one of $R_{17}$, $R_{18}$, $R_{19}$, $R_{20}$ and $R_{21}$ represents an alicyclic hydrocarbon group, and at least one of $R_{19}$ and $R_{21}$ represents a straight chain or branched alkyl group having from 1 to 4 carbon atoms, or an alicyclic hydrocarbon group; and $R_{22}$, $R_{23}$, $R_{24}$ and $R_{25}$ each independently represents a straight chain or branched alkyl group having from 1 to 4 carbon atoms, or an alicyclic hydrocarbon group, provided that at least one of $R_{22}$, $R_{23}$, $R_{24}$ and $R_{25}$ represents an alicyclic hydrocarbon group, and $R_{23}$ and $R_{24}$ may be bonded to each other to form a ring;

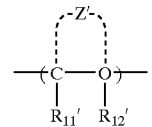

(II-AB)

wherein $R_{11}'$ and $R_{12}'$ each independently represents a hydrogen atom, a cyano group, a halogen atom, or an alkyl group which may have a substituent; Z' represents an atomic group necessary to form an alicyclic structure together with the two carbon atoms (C—C), which may have a substituent.

(9) The positive photosensitive composition as described in the item (8), wherein Z' in formula (II-AB) represents an atomic group necessary to form a bridge-containing alicyclic structure together with the two carbon atoms (C—C), which may have a substituent.

(10) The positive photosensitive composition as described in the item (8), wherein the compound represented by formula (II-AB) is represented by formula (II-A) or (II-B):

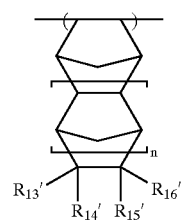

(II-A)

-continued (II-B)

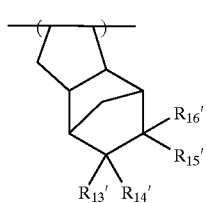

wherein $R_{13}'$, $R_{14}'$, $R_{15}'$ and $R_{16}'$ each independently represents a hydrogen atom, a halogen atom, a cyano group, —COOH, —COOR$_5$, a group which decomposes by the action of an acid, —C(=O)—X—A'—R$_{17}'$, an alkyl group which may have a substituent, or an alicyclic hydrocarbon group which may have a substituent; $R_5$ represents an alkyl group which may have a substituent, a cyclic hydrocarbon group which may have a substituent, or a —Y group shown below; X represents an oxygen atom, a sulfur atom, —NH—, —NHSO$_2$— or —NHSO$_2$NH—; A' represents a single bond or a divalent linking group; at least two of $R_{13}'$, $R_{14}'$, $R_{15}'$ and $R_{16}'$ may be bonded to each other to form a ring; n represents 0 or 1; $R_{17}'$ represents —COOH, —COOR$_5$, —CN, a hydroxyl group, an alkoxyl group which may have a substituent, —CO—NH—R$_6$, —CO—NH—SO$_2$—R$_6$, or a —Y group shown below; $R_6$ represents an alkyl group which may have a substituent or a cyclic hydrocarbon group which may have a substituent, —Y group:

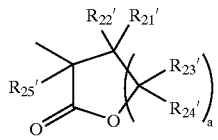 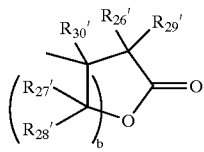

wherein $R_{21}'$ to $R_{30}'$ each independently represents a hydrogen atom or an alkyl group which may have a substituent, and a and b each represents 1 or 2.

(11) A positive photosensitive composition comprising:

(A) a compound capable of generating an acid upon irradiation with one of an actinic ray and a radiation; and (B1) a resin capable of increasing the solubility in an alkali developer by the action of an acid, in which the resin has: a repeating unit having a group represented by formula (V-1), (V-2), (V-3) or (V-4) below; and an aliphatic cyclic hydrocarbon group:

(V-1)

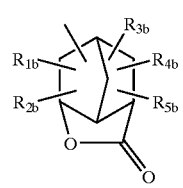

(V-2)

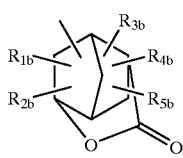

(V-3)

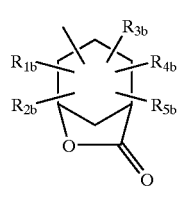

(V-4)

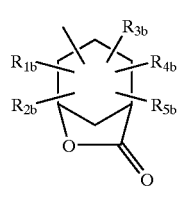

wherein $R_{1b}$, $R_{2b}$, $R_{3b}$, $R_{4b}$ and $R_{5b}$ each independently represents a hydrogen atom, an alkyl group which may have a substituent, a cycloalkyl group which may have a substituent, or an alkenyl group which may have a substituent; two of $R_{1b}$, $R_{2b}$, $R_{3b}$, $R_{4b}$ and $R_{5b}$ may be bonded to form a ring, wherein the acid generator (A) comprises at least two compounds selected from the group consisting of a triarylsulfonium salt compound, a compound having a phenacylsulfonium salt structure, and a sulfonium salt compound not having an aromatic ring (a second embodiment).

(12) The positive photosensitive composition as described in the item (11), wherein the resin (B) contains at least one selected from the group consisting of: a repeating unit having a partial structure containing analicyclic hydrocarbon represented by formula (pI), (pII), (pIII), (pIV), (pV) or (pVI) below; and a repeating unit represented by formula (II-AB):

(pI)

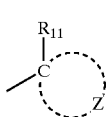

(pII)

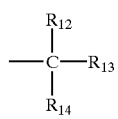

(pIII)

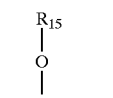

(pIV)

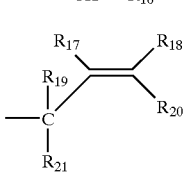

(pV)

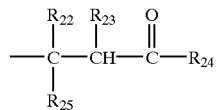

(pVI)

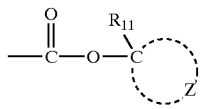

wherein $R_{11}$ represents a methyl group, an ethyl group, an n-propyl group, an isopropyl group, an n-butyl group, an isobutyl group or a sec-butyl group; Z represents an atomic group necessary to form an alicyclic hydrocarbon group together with the carbon atom; $R_{12}$, $R_{13}$, $R_{14}$, $R_{15}$ and $R_{16}$ each independently represents a straight chain or branched alkyl group having from 1 to 4 carbon atoms, or an alicyclic hydrocarbon group, provided that at least one of $R_{12}$, $R_{13}$ and $R_{14}$ represents an alicyclic hydrocarbon group, and at least one of $R_{15}$ and $R_{16}$ represents an alicyclic hydrocarbon group; $R_{17}$, $R_{18}$, $R_{19}$, $R_{20}$ and $R_{21}$ each independently represents a hydrogen atom, a straight chain or branched alkyl group having from 1 to 4 carbon atoms, or an alicyclic hydrocarbon group, provided that at least one of $R_{17}$, $R_{18}$, $R_{19}$, $R_{20}$ and $R_{21}$ represents an alicyclic hydrocarbon group, and at least one of $R_{19}$ and $R_{21}$ represents a straight chain or branched alkyl group having from 1 to 4 carbon atoms, or an alicyclic hydrocarbon group; and $R_{22}$, $R_{23}$, $R_{24}$ and $R_{25}$ each independently represents a straight chain or branched alkyl group having from 1 to 4 carbon atoms, or an alicyclic hydrocarbon group, provided that at least one of $R_{22}$, $R_{23}$, $R_{24}$ and $R_{25}$ represents an alicyclic hydrocarbon group, and $R_{23}$ and $R_{24}$ may be bonded to each other to form a ring;

(II-AB)

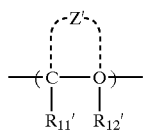

wherein $R_{11}'$ and $R_{12}'$ each independently represents a hydrogen atom, a cyano group, a halogen atom, or an alkyl group which may have a substituent; Z' represents an atomic group necessary to form an alicyclic structure together with the two carbon atoms (C—C), which may have a substituent.

(13) The positive photosensitive composition as described in the item (12), wherein Z' in formula (II-AB) represents an atomic group necessary to form a bridge-containing alicyclic structure together with the two carbon atoms (C—C), which may have a substituent.

(14) The positive photosensitive composition as described in the item (12), wherein the compound represented by formula (II-AB) is represented by formula (II-A) or (II-B):

(II-A)

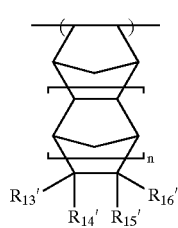

(II-B)

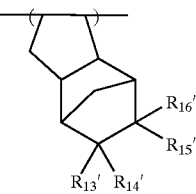

wherein $R_{13}'$, $R_{14}'$, $R_{15}'$ and $R_{16}'$ each independently represents a hydrogen atom, a halogen atom, a cyano group, —COOH, —COOR$_5$, a group which decomposes by the action of an acid, —C (=O)—X—A'—R$_{17}'$, an alkyl group which may have a substituent, or an alicyclic hydrocarbon group which may have a substituent; $R_5$ represents an alkyl group which may have a substituent, a cyclic hydrocarbon group which may have a substituent, or a —Y group shown below; X represents an oxygen atom, a sulfur atom, —NH—, —NHSO$_2$— or —NHSO$_2$NH—; A' represents a single bond or a divalent linking group; at least two of $R_{13}'$, $R_{14}'$, $R_{15}'$ and $R_{16}'$ may be bonded to each other to form a ring; n represents 0 or 1; $R_{17}'$ represents —COOH, —COOR$_5$, —CN, a hydroxyl group, an alkoxyl group which may have a substituent, —CO—NH—R$_6$, —CO—NH—SO$_2$—R$_6$, or a —Y group shown below; $R_6$ represents an alkyl group which may have a substituent or a cyclic hydrocarbon group which may have a substituent, —Y group:

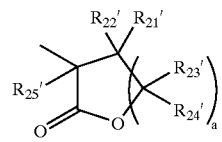 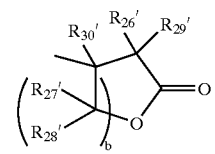

wherein $R_{21}'$ to $R_{30}'$ each independently represents a hydrogen atom or an alkyl group which may have a substituent, and a and b each represents 1 or 2.

(15) The positive photosensitive composition as described in the item (1), which further comprises (C) a surfactant containing at least one of a fluorine atom and a silicon atom.

(16) The positive photosensitive composition as described in the item (11), which further comprises (D) a solvent mixture containing:
  at least one solvent selected from the solvent group A below; and
  at least one of a solvent selected from the solvent group B below, and a solvent selected from the solvent group C:
  group A: propylene glycol monoalkyl ether acylate,
  group B: propylene glycol monoalkyl ether, alkyl lactate and alkyl alkoxypropionate,
  group C: γ-butyrolactone, ethylene carbonate, and propylene carbonate.

(17) The positive photosensitive composition as described in the item (11), which further comprises (D) a solvent mixture containing:
  at least one alkyl lactate; and
  at least one of an ester solvent and alkyl alkoxypropionate.

(18) The positive photosensitive composition as described in the item (17), wherein the solvent (D) further contains at least one of γ-butyrolactone, ethylene carbonate, and propylene carbonate.

(19) The positive photosensitive composition as described in the item (11), which further comprises (D) a solvent mixture containing:

at least one solvent selected from the solvent group D below; and at least one of a solvent selected from the solvent group E, and at a solvent selected from the solvent group F:
group D: heptanone;
group E: propylene glycol monoalkyl ether, alkyl lactate and alkyl alkoxypropionate;
group F: γ-butyrolactone, ethylene carbonate, and propylene carbonate.

DETAILED DESCRIPTION OF THE INVENTION (A) Acid Generator

The acid generator for use in the present invention is capable of generating an acid upon irradiation with one of an actinic ray and a radiation, which is a mixture comprising at least two compounds selected from the group consisting of a triarylsulfonium salt compound (a triarylsulfonium salt), a compound having a phenacylsulfonium salt structure (a phenacylsulfonium salt), and a sulfonium salt compound (a sulfonium salt) not having an aromatic ring (hereinafter referred to as "component (A)" or "acid generator").

The triarylsulfonium salt capable of generating an acid upon irradiation with an actinic ray or a radiation is a salt containing as a cation.

The aryl group of a triarylsulfonium cation is preferably a phenyl group and a naphthyl group, more preferably a phenyl group. Three aryl groups of a triarylsulfonium cation may be the same or different.

Each aryl group may be substituted with an alkyl group (e.g., an alkyl group having from 1 to 15 carbon atoms), an alkoxyl group (e.g., an alkoxyl group having from 1 to 15 carbon atoms), a halogen atom, a hydroxyl group, or a phenylthio group. The preferred substituents are an alkyl group having 1 to 4 carbon atoms and an alkoxyl group having 1 to 4 carbon atoms, and a t-butyl group and an alkoxyl group having from 1 to 4 carbon atoms are most preferred. Any one of three aryl groups may be substituted or all of three aryl groups may be substituted. It is preferred that the substituent is substituted on the p-position of the aryl group(s).

The anion of a triarylsulfonium salt is an anion of a sulfonic acid, preferably an anion of an alkanesulfonic acid substituted with a fluorine atom on the 1-position and a benzenesulfonic acid substituted with an electron attractive group, more preferably a anion of a perfluoroalkanesulfonic acid having from 1 to 8 carbon atoms, and most preferably an anion of perfluorobutanesulfonic acid and an anion of a perfluorooctanesulfonic acid. The decomposition velocity of an acid-decomposable group can be improved, the sensitivity is increased and the diffusibility of the acid generated is inhibited by using these compounds, resulting in the improvement of resolution.

The triarylsulfonium structure may take the form of a plurality of triarylsulfonium structures bonded to other triarylsulfonium structure by a linking group, such as an —S— group.

The examples of the electron attractive groups include a fluorine atom, a chlorine atom, a bromine atom, a nitro group, a cyano group, an alkoxycarbonyl group, an acyloxy group and an acyl group.

The specific examples of the triarylsulfonium salts which can be used in the present invention include the following compounds, however, these examples should not be construed as limiting the scope of the present invention.

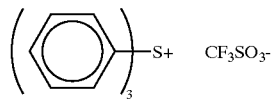
(I-1)

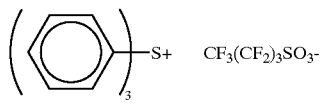
(I-2)

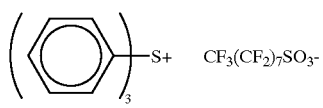
(I-3)

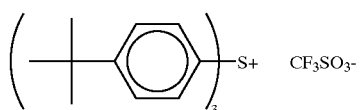
(I-4)

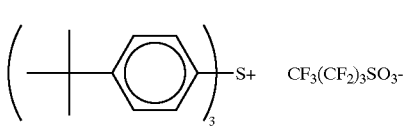
(I-5)

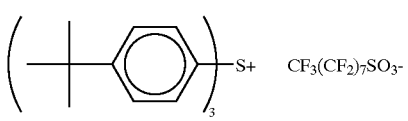
(I-6)

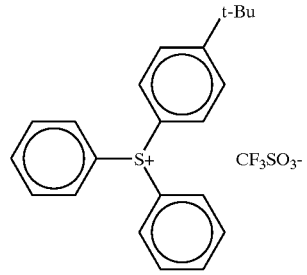
(I-7)

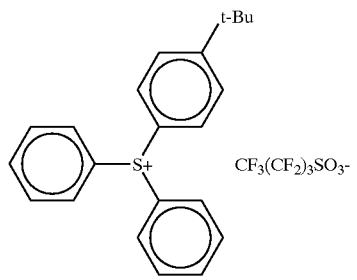
(I-8)

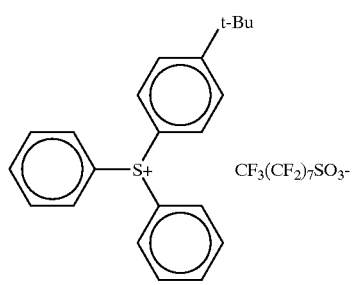
(I-9)

(I-10)
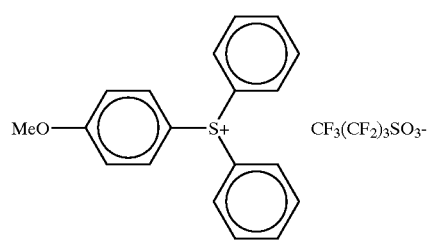
(I-11)
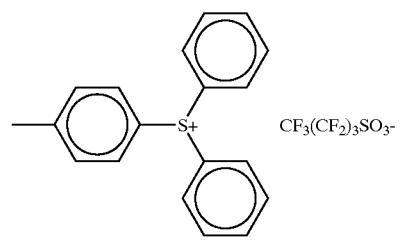
(I-12)
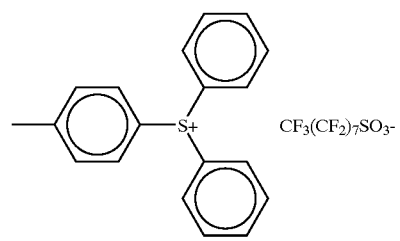
(I-13)
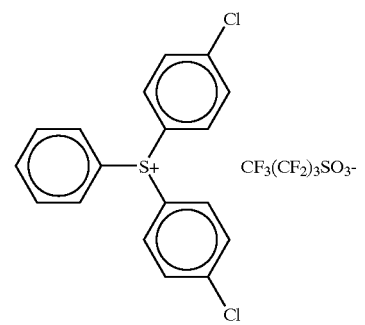
(I-14)
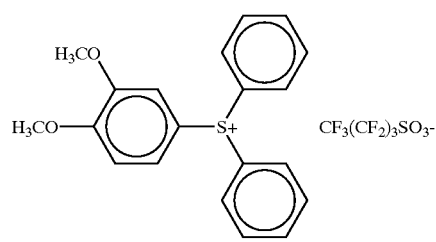
(I-15)
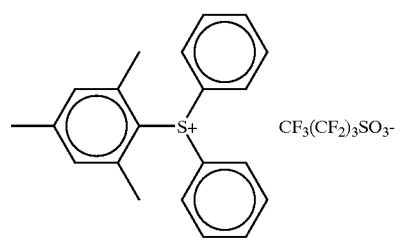
(I-16)
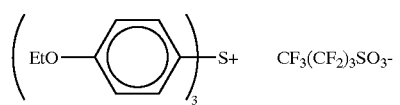
(I-17)
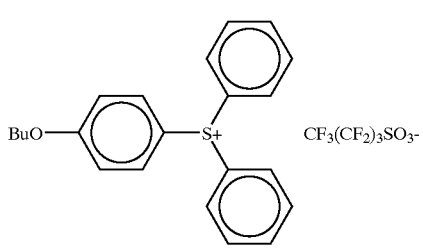
(I-18)
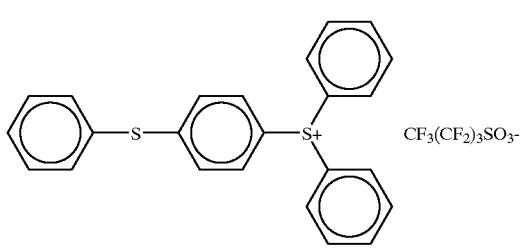
(I-19)
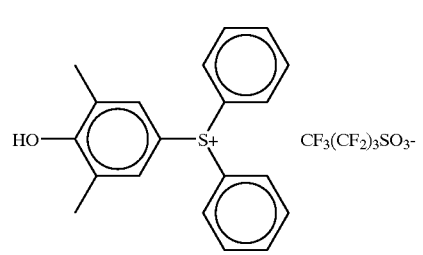
(I-20)
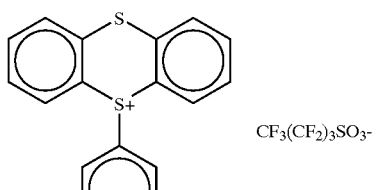
(I-21)
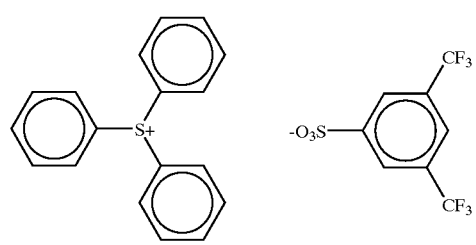
(I-22)
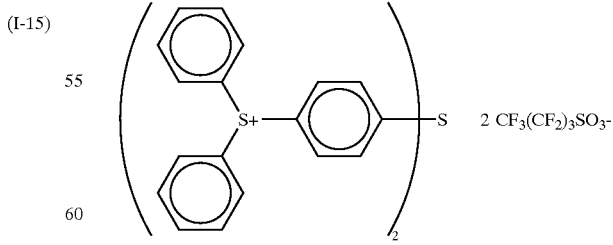
The sulfonium salt not having an aromatic ring is a salt containing a sulfonium represented by the following formula (II) as a cation:

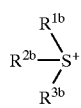
(II)

wherein $R^{1b}$, $R^{2b}$ and $R^{3b}$ each represents an organic group not having an aromatic ring, the aromatic ring here also includes aromatic rings containing hetero atoms.

The organic groups not having an aromatic ring represented by $R^{1b}$, $R^{2b}$ and $R^{3b}$ are organic groups generally having from 1 to 30, preferably from 1 to 20, carbon atoms.

$R^{1b}$, $R^{2b}$ and $R^{3b}$ each preferably represents an alkyl group, a 2-oxoalkyl group, an alkoxycarbonylmethyl group, an allyl group or a vinyl group, more preferably a straight chain, branched or cyclic 2-oxoalkyl group, or an alkoxycarbonylmethyl group, and most preferably a straight chain or branched 2-oxoalkyl group.

The alkyl groups represented by $R^{1b}$, $R^{2b}$ and $R^{3b}$ may be straight chain, branched or cyclic, preferably a straight chain or branched alkyl group having from 1 to 10 carbon atoms (e.g., methyl, ethyl, propyl, butyl and pentyl), or a cyclic alkyl group having from 3 to 10 carbon atoms (e.g., cyclopentyl, cyclohexyl and norbornyl).

The 2-oxoalkyl group represented by $R^{1b}$, $R^{2b}$ and $R^{3b}$ may be straight chain, branched or cyclic, preferably the above alkyl group having C=O on the 2-position can be exemplified.

The alkoxyl group in the above alkoxycarbonylmethyl group represented by $R^{1b}$, $R^{2b}$ and $R^{3b}$ is preferably an alkyl group having from 1 to 5 carbon atoms (e.g., methyl, ethyl, propyl, butyl and pentyl).

$R^{1b}$, $R^{2b}$ and $R^{3b}$ may further be substituted with a halogen atom, an alkoxyl group (e.g., an alkoxyl group having from 1 to 5 carbon atoms), a hydroxyl group, a cyano group or a nitro group.

Two of $R^{1b}$, $R^{2b}$ and $R^{3b}$ may be bonded to form a cyclic structure, and an oxygen atom, a sulfur atom, an ester bond, an amide bond or a carbonyl group may be contained in the ring. The examples of the groups formed by bonding two of $R^{1b}$, $R^{2b}$ and $R^{3b}$ include alkylene groups (e.g., butylene and pentylene).

From the viewpoint of photo-reactivity, it is preferred that any one of $R^{1b}$, $R^{2b}$ and $R^{3b}$ should represent a group having a carbon-carbon double bond or a carbon-oxygen double bond.

The anion of a sulfonium salt not having an aromatic ring is an anion of a sulfonic acid, preferably an anion of an alkanesulfonic acid substituted with a fluorine atom on the 1-position and a benzenesulfonic acid substituted with an electron attractive group, more preferably an anion of a perfluoroalkanesulfonic acid having from 1 to 8 carbon atoms, and most preferably an anion of a perfluorobutanesulfonic acid and an anion of a perfluorooctanesulfonic acid. The decomposition velocity of an acid-decomposable group can be improved, the sensitivity is increased and the diffusibility of the acid generated is inhibited by using these compounds, resulting in the improvement of resolution.

The examples of the electron attractive groups include a fluorine atom, a chlorine atom, a bromine atom, a nitro group, a cyano group, an alkoxycarbonyl group, an acyloxy group and an acyl group.

At least one of $R^{1b}$, $R^{2b}$ and $R^{3b}$ of a compound represented by formula (II) may be bonded to at least one of $R^{1b}$, $R^{2b}$ and $R^{3b}$ of other compound represented by formula (II).

The specific examples of the sulfonium salts not having an aromatic ring which can be used in the present invention include the following compounds, however, these examples should not be construed as limiting the scope of the present invention.

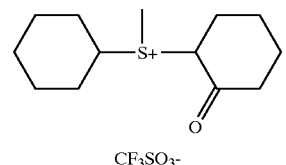
(II-1)

$CF_3SO_3-$

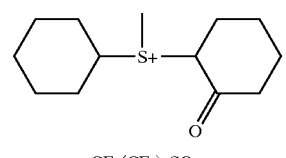
(II-2)

$CF_3(CF_2)_3SO_3-$

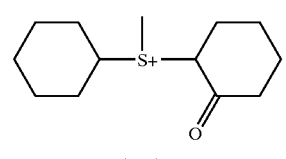
(II-3)

$CF_3(CF_2)_7SO_3-$

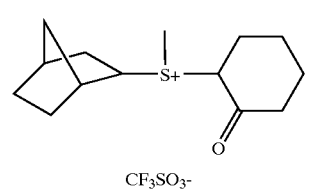
(II-4)

$CF_3SO_3-$

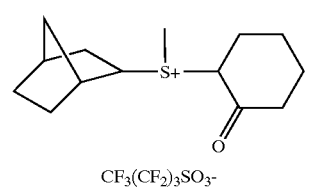
(II-5)

$CF_3(CF_2)_3SO_3-$

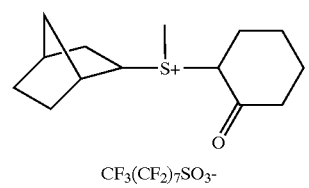
(II-6)

$CF_3(CF_2)_7SO_3-$

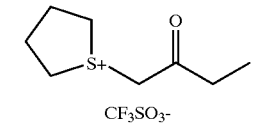
(II-7)

$CF_3SO_3-$

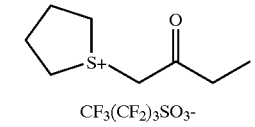
(II-8)

$CF_3(CF_2)_3SO_3-$

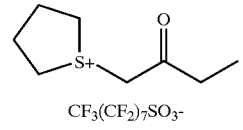
(II-9)

$CF_3(CF_2)_7SO_3-$

-continued

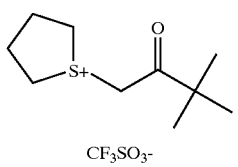
(II-10)
CF₃SO₃⁻

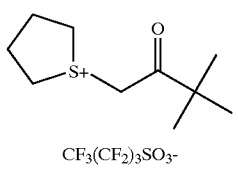
(II-11)
CF₃(CF₂)₃SO₃⁻

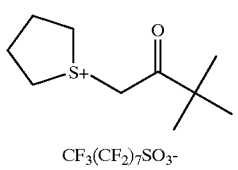
(II-12)
CF₃(CF₂)₇SO₃⁻

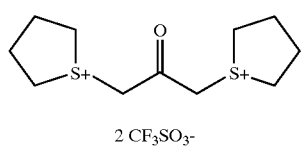
(II-13)
2 CF₃SO₃⁻

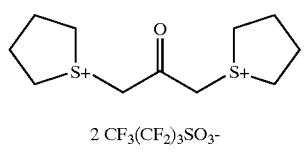
(II-14)
2 CF₃(CF₂)₃SO₃⁻

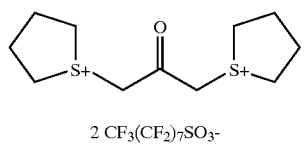
(II-15)
2 CF₃(CF₂)₇SO₃⁻

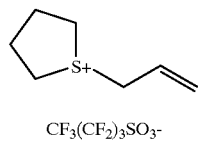
(II-16)
CF₃(CF₂)₃SO₃⁻

(II-17)
CF₃(CF₂)₃SO₃⁻

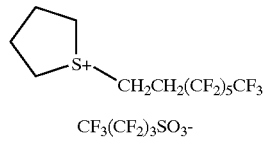
(II-18)
CF₃(CF₂)₃SO₃⁻

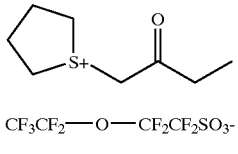
(II-19)
CF₃CF₂—O—CF₂CF₂SO₃⁻

-continued

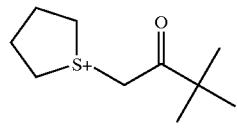
(II-20)
CF₃CF₂—O—CF₂CF₂SO₃⁻

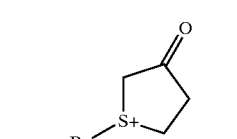
(II-21)
CF₃(CF₂)₃SO₃⁻

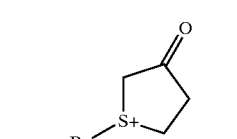

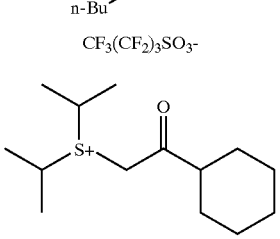
(II-22)
CF₃(CF₂)₃SO₃⁻

The compound having a phenacylsulfonium salt structure capable of generating an acid upon irradiation with an actinic ray or a radiation is, e.g., a compound represented by the following formula (III):

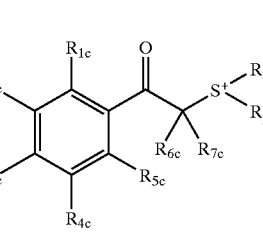

(III)

wherein $R_{1c}$, $R_{2c}$, $R_{3c}$, $R_{4c}$ and $R_{5c}$ each represents a hydrogen atom, an alkyl group, an alkoxyl group or a halogen atom; $R_{6c}$ and $R_{7c}$ each represents a hydrogen atom, an alkyl group or an aryl group; and $R_x$ and $R_y$ each represents an alkyl group, a 2-oxoalkyl group, an alkoxycarbonylmethyl group, an allyl group or a vinyl group.

Two or more of $R_{1c}$, $R_{2c}$, $R_{3c}$, $R_{4c}$, $R_{5c}$, $R_{6c}$ and $R_{7c}$, and $R_x$ and $R_y$ may be bonded to form a cyclic structure, and the cyclic structure may contain an oxygen atom, a sulfur atom, an ester bond, or an amide bond.

$X^-$ represents an anion of a sulfonic acid, a carboxylic acid or a sulfonylimide.

The alkyl group represented by $R_{1c}$, $R_{2c}$, $R_{3c}$, $R_{4c}$ and $R_{5c}$ may be straight chain, branched or cyclic, e.g., an alkyl group having from 1 to 10 carbon atoms, preferably a straight chain or branched alkyl group having from 1 to 5 carbon atoms (e.g., methyl, ethyl, straight chain or branched propyl, straight chain or branched butyl, and straight chain or branched pentyl), and a cyclic alkyl group having from 3 to 8 carbon atoms (e.g., cyclopentyl and cyclohexyl) can be exemplified.

The alkoxyl group represented by $R_{1c}$, $R_{2c}$, $R_{3c}$, $R_{4c}$ and $R_{5c}$ may be straight chain, branched or cyclic, e.g., an alkoxyl group having from 1 to 10 carbon atoms, preferably a straight chain or branched alkoxyl group having from 1 to 5 carbon atoms (e.g., methoxy, ethoxy, straight chain or branched propoxy, straight chain or branched butoxy and straight chain or branched pentoxy), and a cyclic alkoxyl group having from 3 to 8 carbon atoms (e.g., cyclopentyloxy and cyclohexyloxy) can be exemplified.

Preferably any of $R_{1c}$, $R_{2c}$, $R_{3c}$, $R_{4c}$ and $R_{5c}$ represents a straight chain, branched or cyclic alkyl group, or a straight chain, branched or cyclic alkoxyl group, more preferably the sum of the carbon atoms of $R_{1c}$, $R_{2c}$, $R_{3c}$, $R_{4c}$ and $R_{5c}$ is from 2 to 15, by which the solubility in a solvent is improved and the generation of particles during storage can be inhibited.

As the alkyl groups represented by $R_{6c}$ and $R_{7c}$, the same alkyl groups as represented by $R_{1c}$, $R_{2c}$, $R_{3c}$, $R_{4c}$ and $R_{5c}$ can be exemplified. As the aryl groups represented by $R_{6c}$ and $R_{7c}$, e.g., an aryl group having from 6 to 14 carbon atoms (e.g., phenyl) can be exemplified.

As the alkyl groups represented by $R_x$ and $R_y$, the same alkyl groups as represented by $R_{1c}$, $R_{2c}$, $R_{3c}$, $R_{4c}$ and $R_{5c}$ can be exemplified.

As the 2-oxoalkyl groups represented by $R_x$ and $R_y$, the same alkyl groups as represented by $R_{1c}$, $R_{2c}$, $R_{3c}$, $R_{4c}$ and $R_{5c}$ and having C=O on the 2-position can be exemplified.

As the alkoxyl groups in the alkoxycarbonylmethyl group represented by $R_x$ and $R_y$, the same alkoxyl groups as defined in $R_{1c}$, $R_{2c}$, $R_{3c}$, $R_{4c}$ and $R_{5c}$ can be exemplified.

As the groups formed by bonding of $R_x$ and $R_y$, a butylene group and a pentylene group can be exemplified.

The stereostructure of the compound represented by formula (III) is fixed by forming a ring, as a result, photodecomposing property is improved. When two of $R_{1c}$, $R_{2c}$, $R_{3c}$, $R_{4c}$, $R_{5c}$, $R_{6c}$ and $R_{7c}$ are bonded to form a cyclic structure, the case where any one of $R_{1c}$, $R_{2c}$, $R_{3c}$, $R_{4c}$ and $R_{5c}$ and any one of $R_{6c}$ and $R_{7c}$ are bonded to form a single bond or a linking group and form a ring is preferred, and the case where $R_{5c}$ and one of $R_{6c}$ and $R_{7c}$ are bonded to form a single bond or a linking group and form a ring is particularly preferred.

The examples of the linking groups include an alkylene group which may have a substituent, an alkenylene group which may have a substituent, —O—, —S—, —CO—, —CONR— (where R represents a hydrogen atom, an alkyl group or an acyl group), and the groups consisting of two of these groups, preferably an alkylene group which may have a substituent, an alkylene group containing an oxygen atom which may have a substituent, and an alkylene group containing a sulfur atom which may have a substituent. The examples of the substituents include an alkyl group (preferably an alkyl group having from 1 to 5 carbon atoms), an aryl group (preferably an aryl group having from 6 to 10 carbon atoms, e.g., phenyl), and an acyl group (preferably an acyl group having from 2 to 11 carbon atoms).

The linking groups forming a 5- to 7-membered ring, e.g., a methylene group, an ethylene group, a propylene group, —CH$_2$—O— and —CH$_2$—S— are preferred, and the linking groups forming a 6-membered ring, e.g., an ethylene group, —CH$_2$—O— and —CH$_2$—S— are particularly preferred. By forming a 6-membered ring, carbonyl plane and S—C+sigma bond become near vertical, and photodecomposing property is improved by orbital interaction.

The compound represented by formula (III) maybe a compound having two or more structures represented by formula (III) bonded by a single bond or via a linking group at any positions of $R_1$, $R_{2c}$, $R_{3c}$, $R_{4c}$, $R_{5c}$, $R_{6c}$ and $R_{7c}$, and $R_x$ and $R_y$.

$X^-$ preferably represents an anion of a sulfonic acid, more preferably an anion of an alkanesulfonic acid substituted with a fluorine atom on the 1-position and a benzenesulfonic acid substituted with an electron attractive group. The alkene moiety of the anion of the alkanesulfonic acid may be substituted with an alkoxyl group (e.g., having from 1 to 8 carbon atoms), or a perfluoroalkoxy group (e.g., having from 1 to 8 carbon atoms). The examples of the electron attractive groups include a fluorine atom, a chlorine atom, a bromine atom, a nitro group, a cyano group, an alkoxycarbonyl group, an acyloxy group and an acyl group.

$X^-$ more preferably represents an anion of a perfluoroalkanesulfonic acid having from 1 to 8 carbon atoms, particularly preferably an anion of a perfluorooctanesulfonic acid, and most preferably an anion of a perfluorobutanesulfonic acid and an anion of a trifluoromethanesulfonic acid. The decomposition velocity of an acid-decomposable group can be improved, the sensitivity is increased and the diffusibility of the acid generated is inhibited by using these compounds, resulting in the improvement of resolution.

The specific examples of the compounds having a phenacylsulfonium salt structure which can be used in the present invention are shown below, however, these compounds should not be construed as limiting the scope of the present invention.

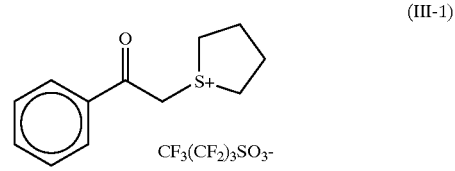

(III-1)

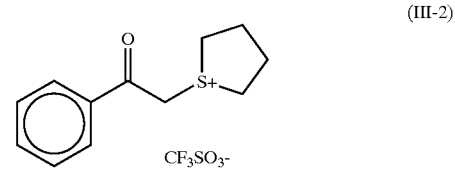

(III-2)

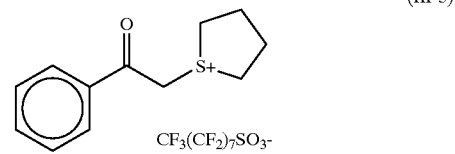

(III-3)

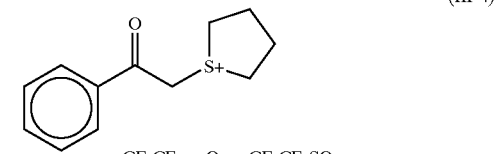

(III-4)

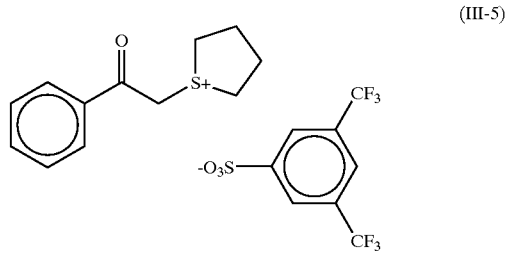

(III-5)

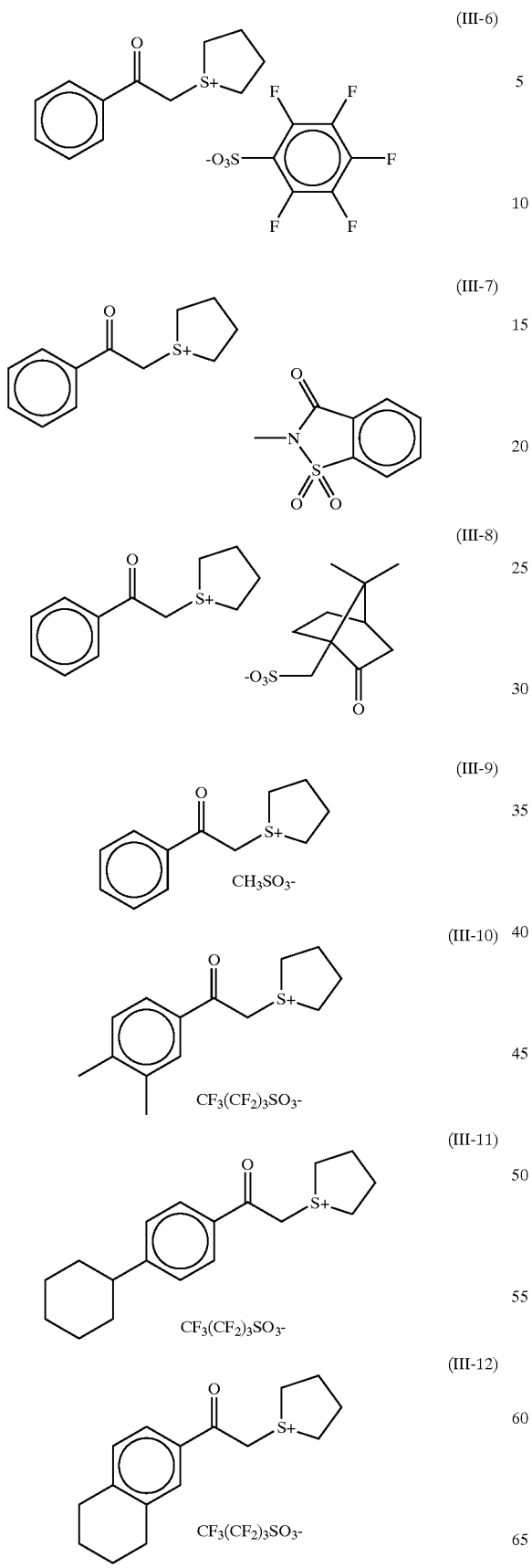
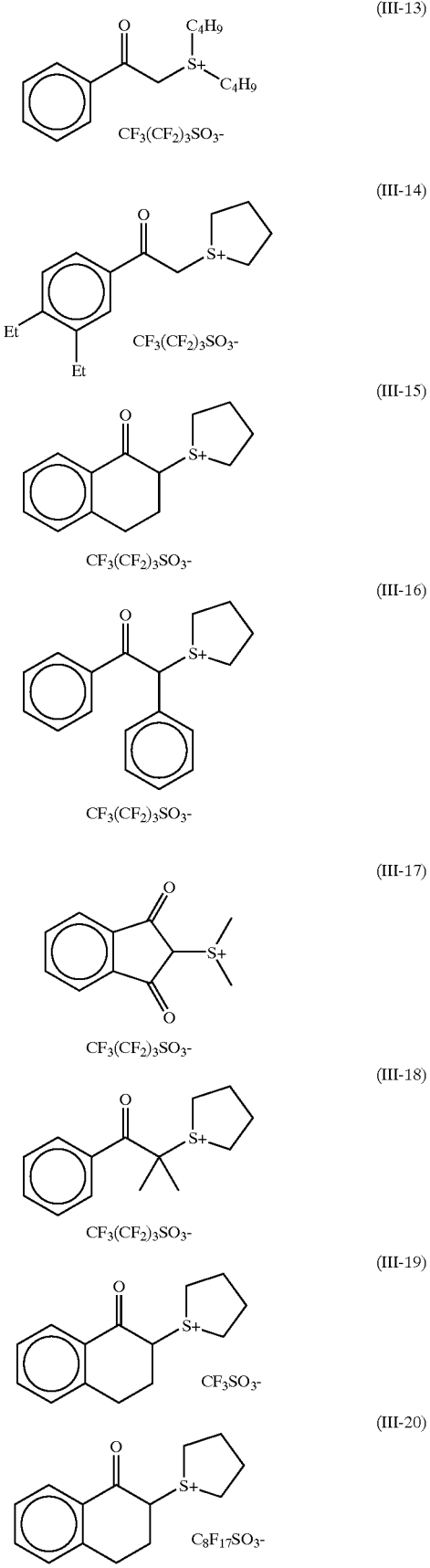

-continued
(III-21) 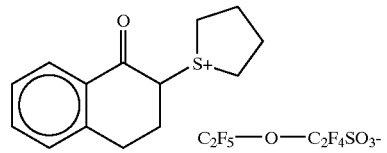
(III-22) 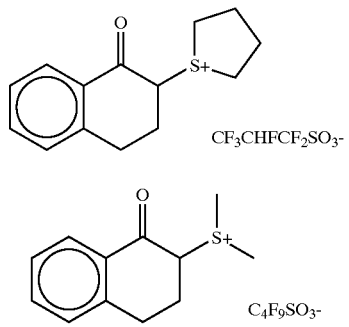
(III-23) 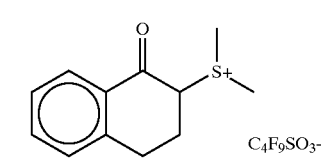
(III-24) 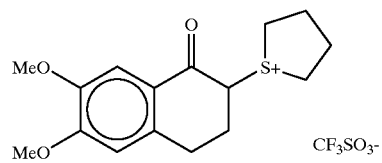
(III-25) 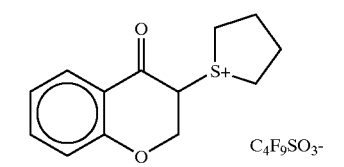
(III-26) 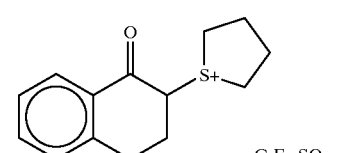
(III-27) 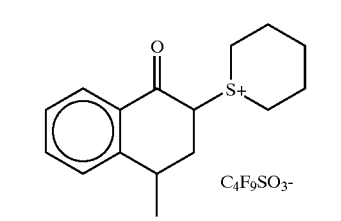
(III-28) 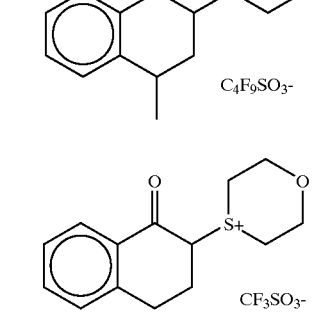
(III-29) 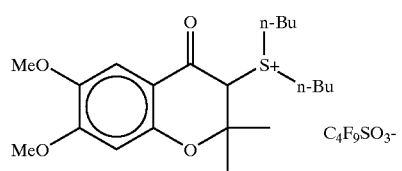
-continued
(III-30) 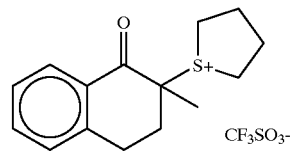
(III-31) 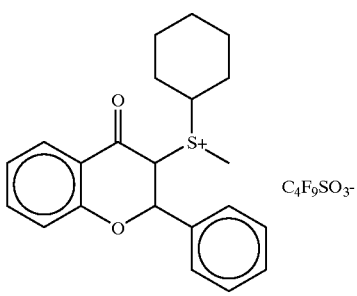
(III-32) 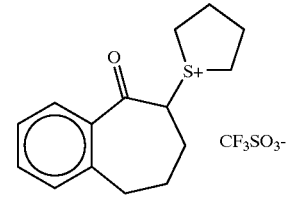
(III-33) 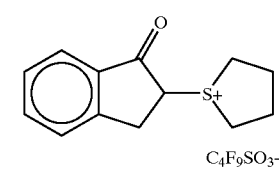
(III-34) 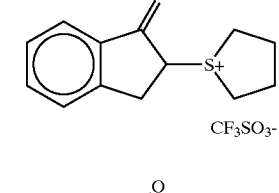
(III-35) 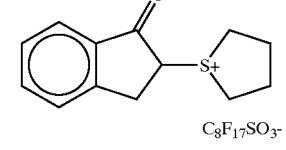
(III-36) 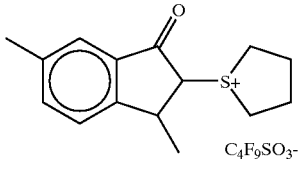
(III-37) 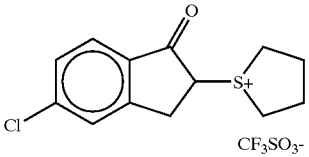

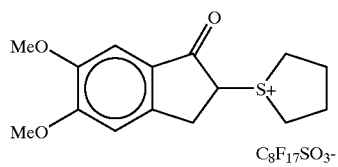
(III-38)
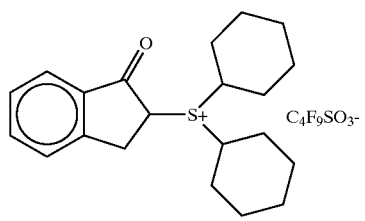
(III-39)
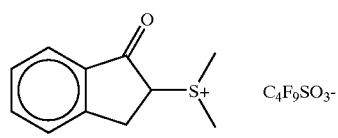
(III-40)
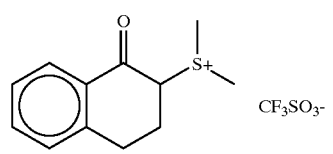
(III-41)
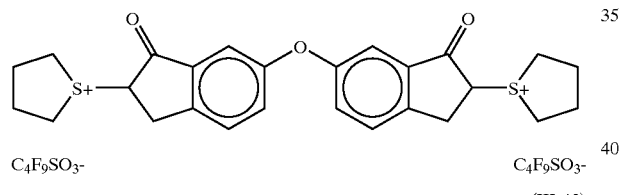
(III-42)
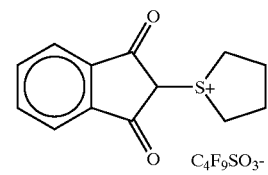
(III-43)
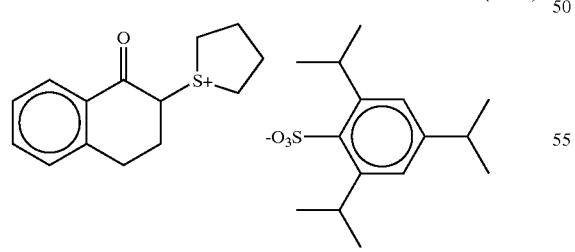
(III-44)
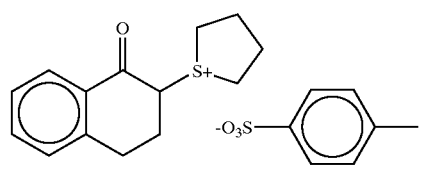
(III-45)
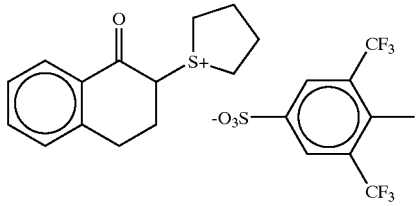
(III-46)
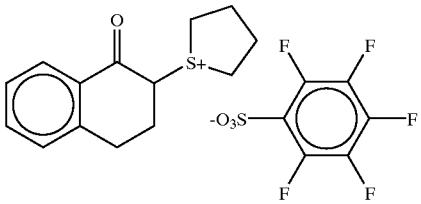
(III-47)
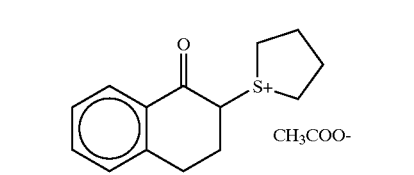
(III-48)
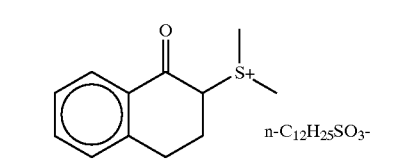
(III-49)
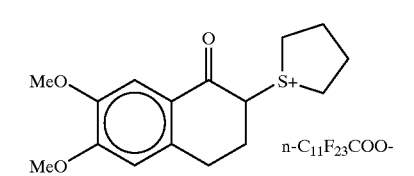
(III-50)
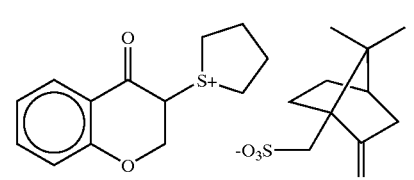
(III-51)
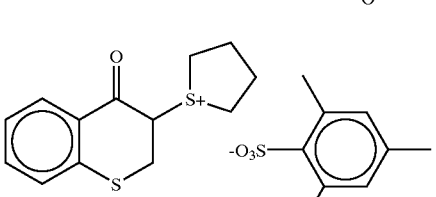
(III-52)
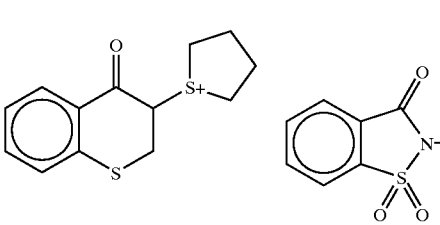
(III-53)

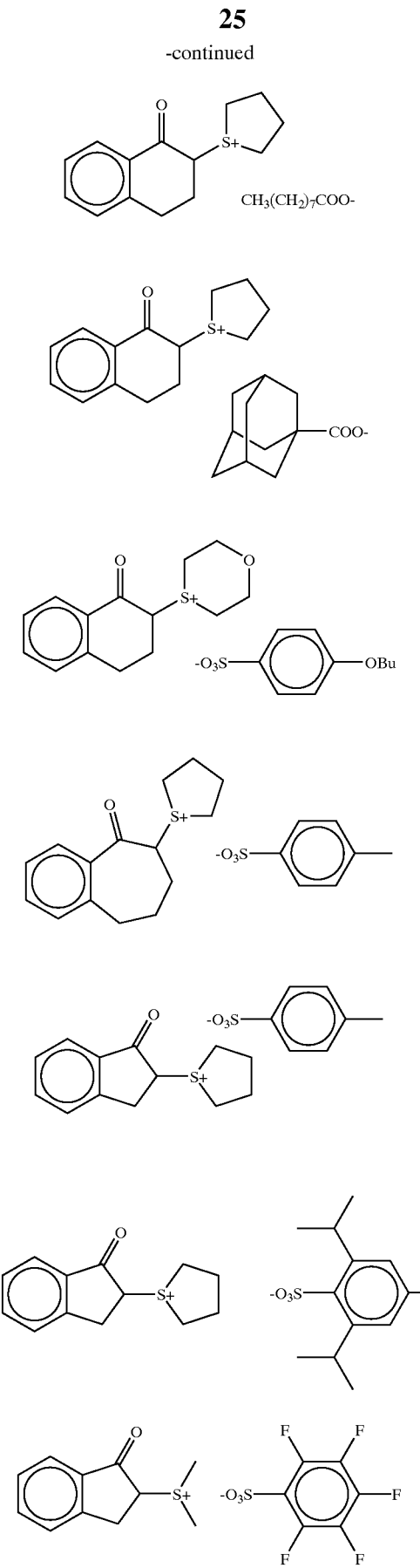
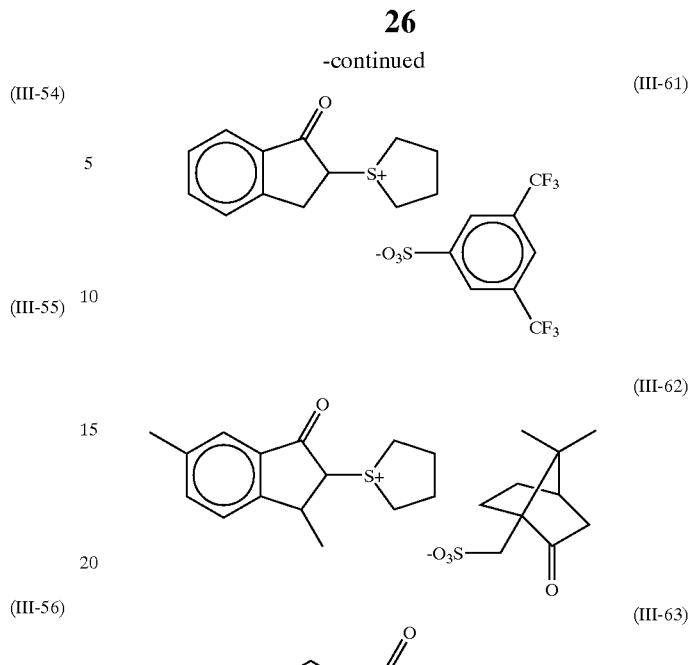

The component (A) in the composition of the present invention is preferably i) a mixture comprising a triarylsulfonium salt and a phenacylsulfonium salt, ii) a mixture comprising a sulfonium salt not having an aromatic ring and a phenacylsulfonium salt, or iii) a mixture comprising a triarylsulfonium salt and a sulfonium salt not having an aromatic ring.

In the case i) where a mixture comprises a triarylsulfonium salt and a phenacylsulfonium salt, it is preferred to satisfy the following conditions:

(1) A triarylsulfonium salt is contained in an amount of from 0.4 to 4 wt %, preferably from 0.8 to 3.5 wt %, and more preferably from 1 to 3 wt %, based on the entire solid content in the composition.

(2) A phenacylsulfonium salt is contained in an amount of 1 wt % or more, preferably from 2 to 12 wt %, and more preferably from 3 to 8 wt %, based on the entire solid content in the composition.

(3) The total addition amount of the two acid generators is 1.1 wt % or more, preferably from 1.5 to 12 wt %, and more preferably from 3 to 10 wt %, based on the entire solid content in the composition.

It is preferred that one or more of conditions 1) to 3) are satisfied, more preferably two or more of conditions 1) to 3) are satisfied, and most preferably all the conditions 1) to 3) are satisfied. When none of these conditions are satisfied, generating amount of an acid becomes insufficient and the sensitivity is liable to lower.

From the point of side lobe margin, the ratio (weight ratio) of a triarylsulfonium salt to a phenacylsulfonium salt is preferably from 20/80 to 80/20, more preferably from 25/75 to 75/25, and particularly preferably from 30/70 to 70/30.

In the case ii) where a mixture comprises a sulfonium salt not having an aromatic ring and a phenacylsulfonium salt, it is preferred to satisfy the following conditions:
(1) A sulfonium salt not having an aromatic ring is contained in an amount of 2 wt % or more, preferably from 2.5 to 15 wt %, and more preferably from 3 to 12 wt %, based on the entire solid content in the composition.
(2) A phenacylsulfonium salt is contained in an amount of 1 wt % or more, preferably from 2 to 12 wt %, and more preferably from 3 to 8 wt %, based on the entire solid content in the composition.
(3) The total addition amount of the two acid generators is 3 wt % or more, preferably from 4.5 to 20 wt %, and more preferably from 6 to 15 wt %, based on the entire solid content in the composition.

It is preferred that one or more of conditions 1) to 3) are satisfied, more preferably two or more of conditions 1) to 3) are satisfied, and most preferably all the conditions 1) to 3) are satisfied. When none of these conditions are satisfied, generating amount of an acid becomes insufficient and the sensitivity is liable to lower.

In the case iii) where a mixture comprises a triarylsulfonium salt and a sulfonium salt not having an aromatic ring, it is preferred to satisfy the following conditions:
(1) A sulfonium salt not having an aromatic ring is contained in an amount of 2 wt % or more, preferably from 2.5 to 15 wt %, and more preferably from 3 to 12 wt %, based on the entire solid content in the composition.
(2) A triarylsulfonium salt is contained in an amount of from 0.1 to 4 wt %, preferably from 0.5 to 3.5 wt %, and more preferably from 1 to 3 wt %, based on the entire solid content in the composition.
(3) The total addition amount of the two acid generators is 2.1 wt % or more, preferably from 2.5 to 20 wt %, and more preferably from 3 to 15 wt %, based on the entire solid content in the composition.

Acid Generators Usable in Combination Besides Component (A)

A compound which decomposes and generates an acid upon irradiation with an actinic ray or a radiation can be used in the present invention besides mixture component (A).

The use amount of a phot-acid generator capable of being used in combination with component (A) of the present invention is, in molar ratio of (component (A))/(other photo-acid generator), generally from 100/0 to 20/80, preferably from 100/0 to 40/60, and more preferably from 100/0 to 50/50.

As such photo-acid generators which can be used in combination, a photoinitiator for photocationic polymerization, a photoinitiator for photoradical polymerization, a photodecoloring agent for dyes, a photo-discoloring agent, well-known compounds used for a microresist or the like which generate an acid upon irradiation with an actinic ray or a radiation, and mixtures of these compounds can be arbitrarily selected.

As such compounds, for example, onium salts, e.g., diazonium salts, ammonium salts, phosphonium salts, iodonium salts, sulfonium salts, selenonium salts, and arsonium salts, organic halogen compounds, organic metals/organic halides, photo-acid generators having an o-nitrobenzyl type protective group, compounds which generate a sulfonic acid by photo-decomposition represented by iminosulfonate, and disulfone compounds can be exemplified.

Further, compounds having introduced these groups or compounds capable of generating an acid upon irradiation with an actinic ray or a radiation into the main chain or side chain of the polymer can be used in the present invention, e.g., those disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Further, the compounds which generate an acid by light as described, e.g., in U.S. Pat. No. 3,779,778 and EP No. 126712 can also be used in the present invention.

Of the above compounds which decompose upon irradiation with an actinic ray or a radiation and generate an acid usable in combination with component (A), those particularly effectively used in the present invention are described below.

(1) An oxazole derivative represented by the following formula (PAG1) and an S-triazine derivative represented by the following formula (PAG2), which are substituted with a trihalomethyl group

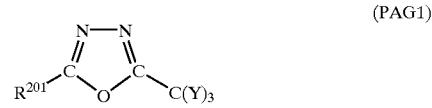

(PAG1)

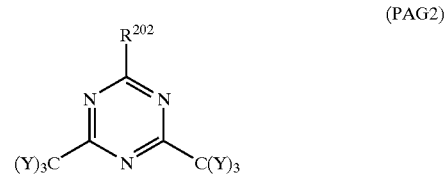

(PAG2)

wherein $R^{201}$ represents a substituted or unsubstituted aryl group or a substituted or unsubstituted alkenyl group; $R^{202}$ represents a substituted or unsubstituted aryl group, a substituted or unsubstituted alkenyl group, a substituted or unsubstituted alkyl group, or $-C(Y)_3$; and Y represents a chlorine atom or a bromine atom.

The specific examples thereof include the following compounds, however, these compounds should not be construed as limiting the scope of the present invention.

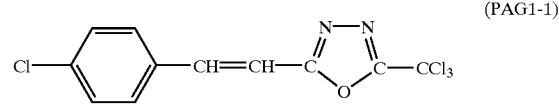

(PAG1-1)

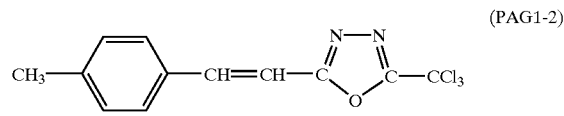

(PAG1-2)

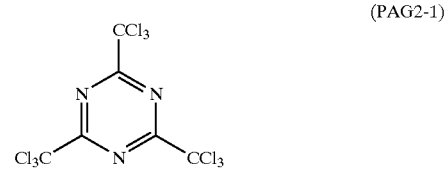

(PAG2-1)

(PAG2-2)

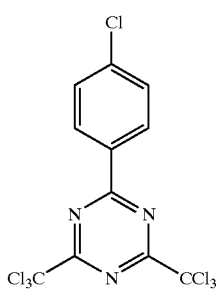

(2) An iodonium salt represented by the following formula (PAG3) or a sulfonium salt represented by the following formula (PAG4)

(PAG3)

(PAG4)
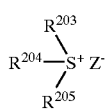

In formula (PAG3), $Ar^1$ and $Ar^2$ each represents a substituted or unsubstituted aryl group. The examples of the preferred substituents include an alkyl group, a haloalkyl group, a cycloalkyl group, an aryl group, an alkoxyl group, a nitro group, a carboxyl group, an alkoxycarbonyl group, a hydroxyl group, a mercapto group and a halogen atom.

In formula (PAG4), $R^{203}$, $R^{204}$ and $R^{205}$ each represents a substituted or unsubstituted alkyl group or a substituted or unsubstituted aryl group, provided that at least one represents a substituted or unsubstituted alkyl group and at least one represents a substituted or unsubstituted aryl group. For example, an aryl group having from 6 to 14 carbon atoms can be exemplified as the aryl group, and an alkyl group having from 1 to 8 carbon atom can be exemplified as the alkyl group.

The substituent of the aryl group is preferably an alkoxyl group having from 1 to 8 carbon atoms, an alkyl group having from 1 to 8 carbon atoms, a nitro group, a carboxyl group, a hydroxyl group or a halogen atom, and the substituent of the alkyl group is preferably an alkoxyl group having from 1 to 8 carbon atoms, a carboxyl group, or an alkoxycarbonyl group.

In formulae (PAG3) and (PAG4), $Z^-$ represents a counter anion, e.g., a perfluoroalkanesulfonate anion such as $BF_4^-$, $AsF_6^-$, $PF_6^-$, $SbF_6^-$, $SiF_6^{2-}$, $ClO_4^-$ and $CF_3SO_3^-$, a pentafluorobenzenesulfonate anion, a condensed polynuclear aromatic sulfonate anion such as a naphthalene-1-sulfonate anion, an anthraquinonesulfonate anion, or a sulfonic acid group-containing dye, but the present invention is not limited thereto.

Further, two of $R^{203}$, $R^{204}$ and $R^{205}$, and $Ar^1$ and $Ar^2$ may be bonded through respective single bonds or substituents.

The specific examples thereof include the following compounds but the present invention is not limited thereto.

(PAG3-1)
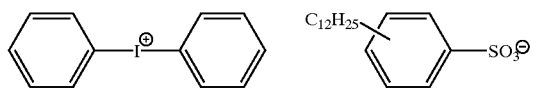

(PAG3-2)
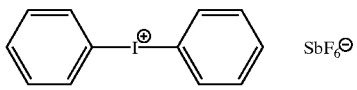

(PAG3-3)
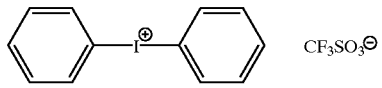

(PAG3-4)
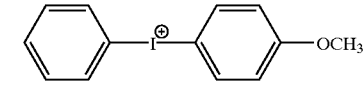

(PAG3-5)
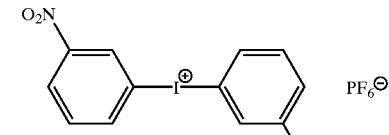

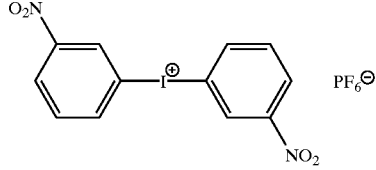

(PAG3-6)
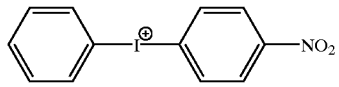

(PAG3-7)
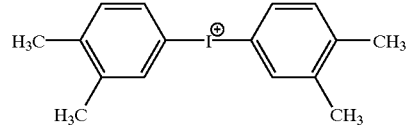

(PAG3-8)
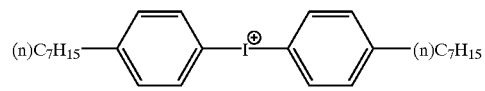

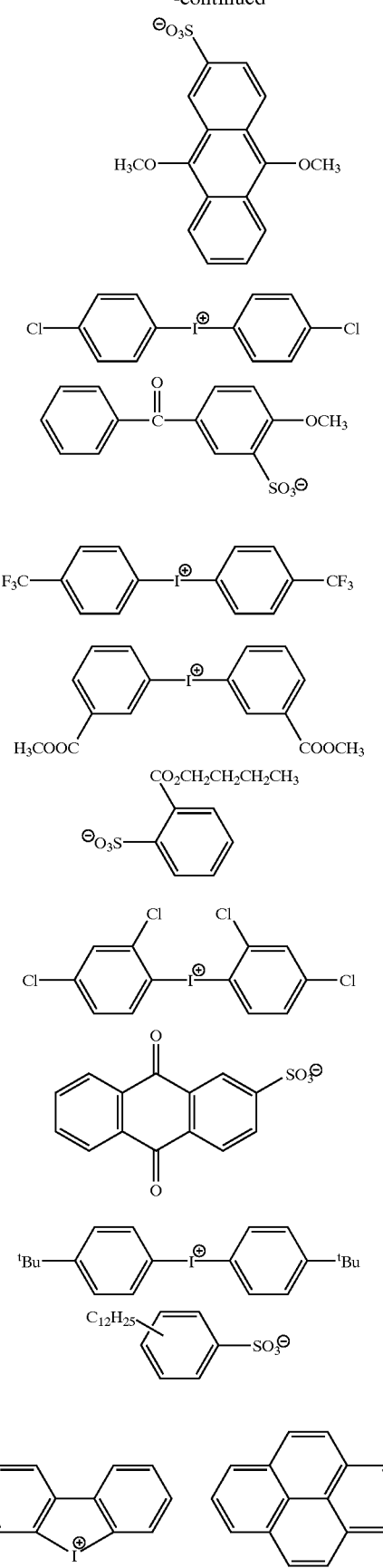

-continued

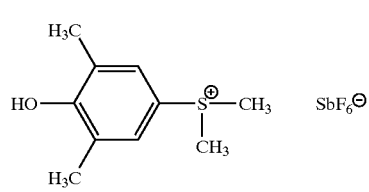
(PAG4-10)

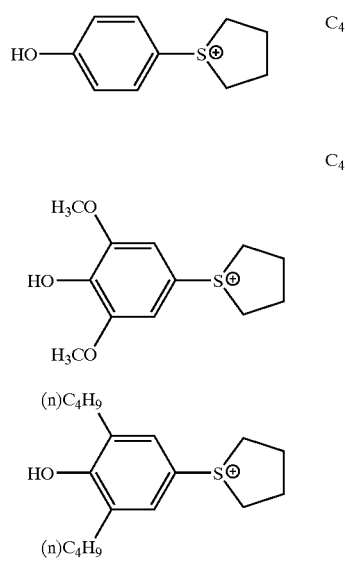
(PAG4-11)
(PAG4-12)
(PAG4-13)
(PAG4-14)

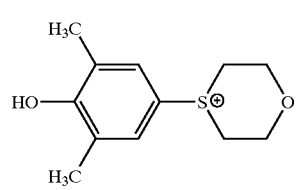
(PAG4-16)
(PAG4-18)
(PAG4-19)

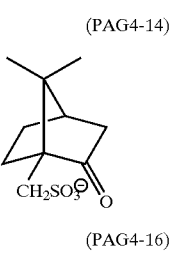

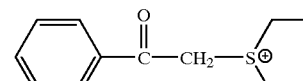
(PAG4-30)

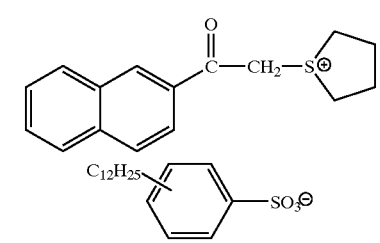

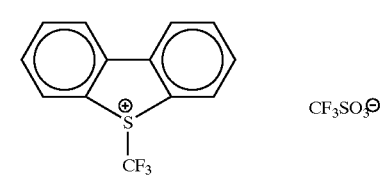

The onium salts represented by formulae (PAG3) and (PAG4) are well-known compounds and can be synthesized according to the methods disclosed, e.g., in U.S. Pat. Nos. 2,807,648, 4,247,473, and JP-A-53-101331.

(3) A disulfone derivative represented by the following formula (PAG5) or an iminosulfonate derivative represented by the following formula (PAG6)

(PAG5)

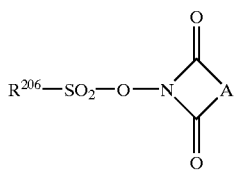
(PAG6)

wherein $Ar^3$ and $Ar^4$ each represents a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group, or a substituted or unsubstituted arylene group.

The specific examples thereof include the following compounds but the present invention is not limited thereto.

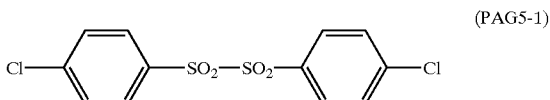
(PAG5-1)

(PAG5-2)

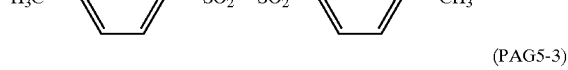
(PAG5-3)

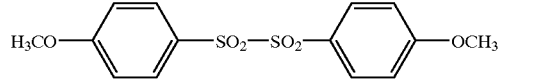
(PAG5-4)

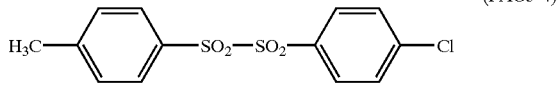
(PAG5-5)

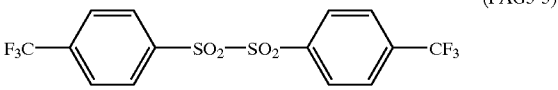
(PAG5-6)

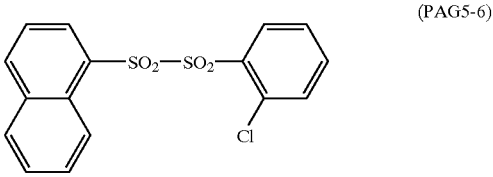
(PAG5-7)

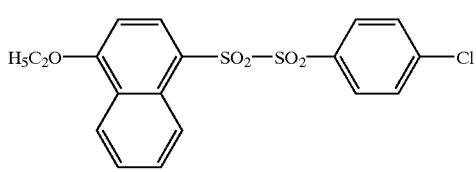

-continued
(PAG5-8)
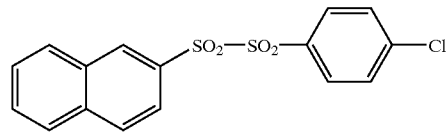
(PAG5-9)
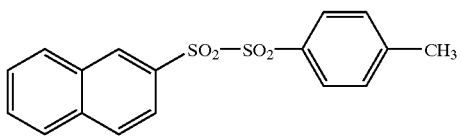
(PAG5-10)
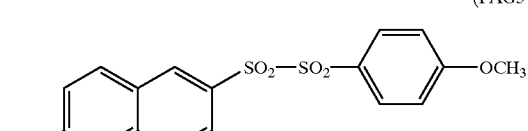
(PAG5-11)
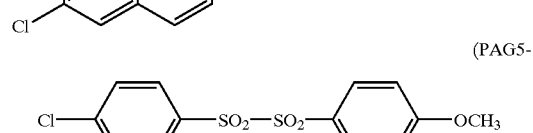
(PAG5-12)
(PAG5-13)
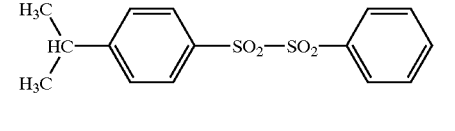
(PAG6-1)
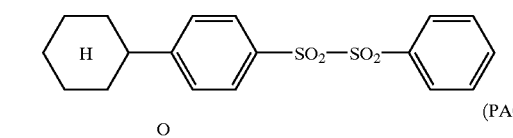
(PAG6-2)
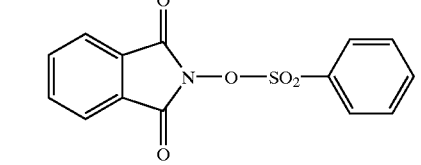
(PAG6-3)
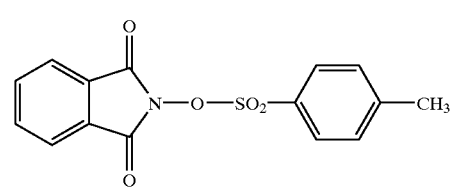
(PAG6-4)
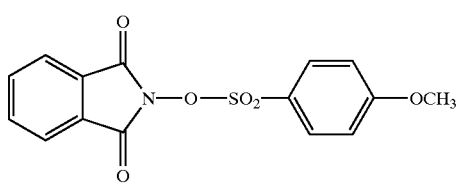
-continued
(PAG6-5)
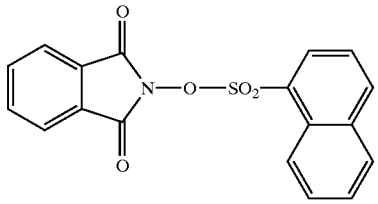
(PAG6-6)
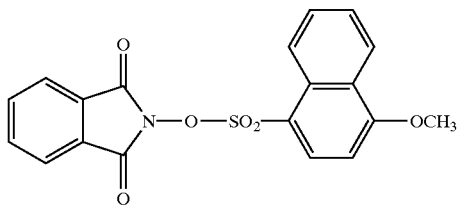
(PAG6-7)
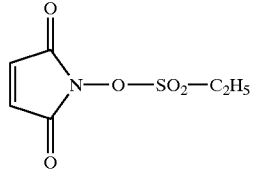
(PAG6-8)
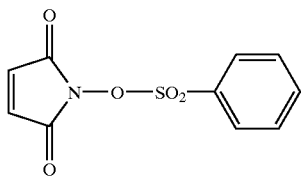
(PAG6-9)
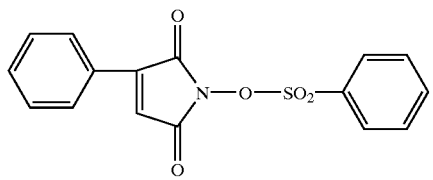
(PAG6-10)
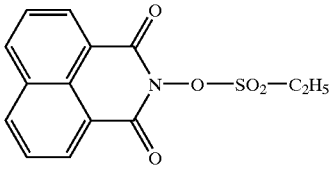
(PAG6-11)
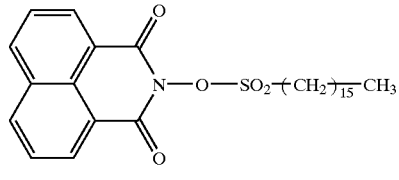
(PAG6-12)
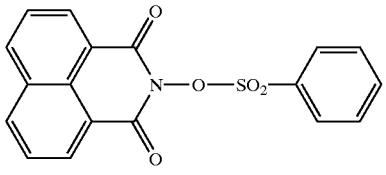

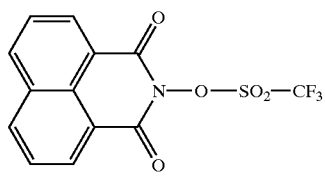
(PAG6-13)

(4) A diazodisulfone derivative represented by the following formula (PAG7)

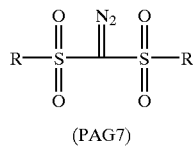
(PAG7)

wherein R represents a straight chain, branched or cyclic alkyl group or an aryl group which may be substituted.

Specific examples thereof are shown below but the present invention is not limited thereto.

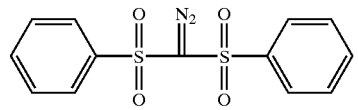
(PAG7-1)

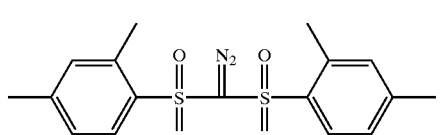
(PAG7-2)

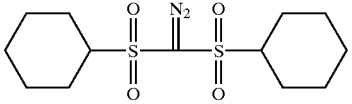
(PAG7-3)

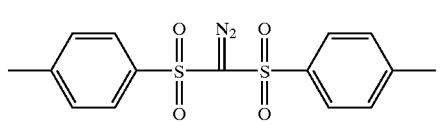
(PAG7-4)

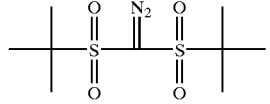
(PAG7-5)

The following compounds can be exemplified as particularly preferred acid generators for use in combination in the present invention.

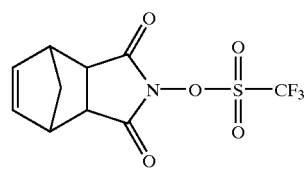
(a1)

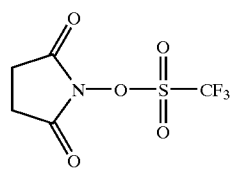
(a2)

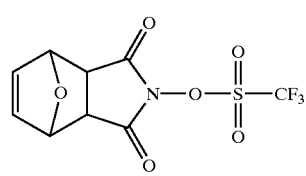
(a3)

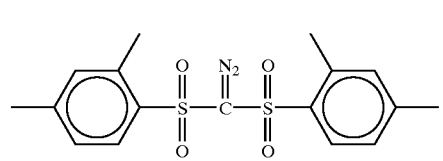
(a4)

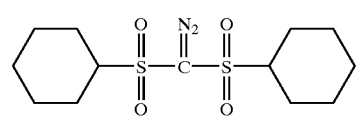
(a5)

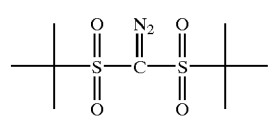
(a6)

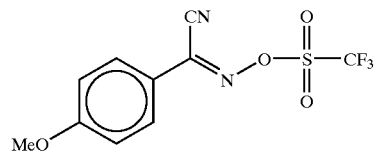
(a7)

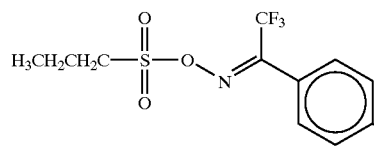
(a8)

(a9)
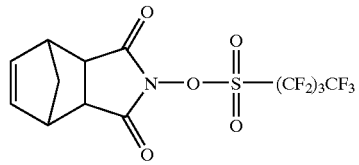

(a10)
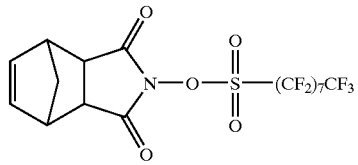

(B) Resin Capable of Increasing the Solubility in Alkali Developer by the Action of Acid (Also Referred to as "Acid-decomposable Resin")

As the acid-decomposable resin (B) for use in the first embodiment of the present invention, any resin having a monocyclic or polycyclic alicyclic hydrocarbon structure and capable of increasing the solubility in an alkali developer by the action of an acid can be used.

Resin (B1) for use in the second embodiment of the present invention is a resin capable of increasing the solubility in an alkali developer by the action of an acid, having a repeating unit having a group represented by the above formula (V-1), (V-2), (V-3) or (V-4), and an aliphatic cyclic hydrocarbon group.

It is also preferred to use a repeating unit having a group represented by the above formula (V-1), (V-2), (V-3) or (V-4) in the first embodiment of the present invention.

Formulae (V-1), (V-2), (V-3) and (V-4) are described below.

In formulae (V-1), (V-2), (V-3) and (V-4), $R_{1b}$, $R_{2b}$, $R_{3b}$, $R_{4b}$ and $R_{5b}$ each represents a hydrogen atom, an alkyl group which may have a substituent, a cycloalkyl group which may have a substituent, or an alkenyl group which may have a substituent, and two of $R_{1b}$, $R_{2b}$, $R_{3b}$, $R_{4b}$ and $R_{5b}$ may be bonded to form a ring.

In formulae (V-1), (V-2), (V-3) and (V-4), the alkyl group represented by $R_{1b}$, $R_{2b}$, $R_{3b}$, $R_{4b}$ and $R_{5b}$ is a straight chain or branched alkyl group, which may have a substituent.

The straight chain or branched alkyl group is preferably a straight chain or branched alkyl group having from 1 to 12 carbon atoms, more preferably a straight chain or branched alkyl group having from 1 to 10 carbon atoms, and still more preferably a methyl group, an ethyl group, a propyl group, an isopropyl group, an n-butyl group, an isobutyl group, a sec-butyl group, a t-butyl group, a pentyl group, a hexyl group, a heptyl group, an octyl group, a nonyl group, and a decyl group.

The cycloalkyl group represented by $R_{1b}$, $R_{2b}$, $R_{3b}$, $R_{4b}$ and $R_{5b}$ is preferably a cycloalkyl group having from 3 to 8 carbon atoms, e.g., a cyclopropyl group, a cyclopentyl group, a cyclohexyl group, a cycloheptyl group and a cyclooctyl group.

The alkenyl group represented by $R_{1b}$, $R_{2b}$, $R_{3b}$, $R_{4b}$ and $R_{5b}$ is preferably an alkenyl group having from 2 to 6 carbon atoms, e.g., a vinyl group, a propenyl group, a butenyl group and a hexenyl group.

As the rings formed by bonding two of $R_{1b}$, $R_{2b}$, $R_{3b}$, $R_{4b}$ and $R_{5b}$, 3- to 8-membered rings, e.g., a cyclopropane ring, a cyclobutane ring, a cyclopentane ring, a cyclohexane ring and a cyclooctane ring can be exemplified.

In formulae (V-1), (V-2), (V-3) and (V-4), $R_{1b}$, $R_{2b}$, $R_{3b}$, $R_{4b}$ and $R_{5b}$ may be bonded to any carbon atoms constituting a cyclic skeleton.

As preferred substituents for the above alkyl, cycloalkyl and alkenyl groups, an alkoxyl group having from 1 to 4 carbon atoms, a halogen atom (e.g., fluorine, chlorine, bromine and iodine), an acyl group having from 2 to 5 carbon atoms, an acyloxy group having from 2 to 5 carbon atoms, a cyano group, a hydroxyl group, a carboxyl group, an alkoxycarbonyl group having from 2 to 5 carbon atoms, and a nitro group can be exemplified.

The repeating units having a group represented by the above formula (V-1), (V-2), (V-3) or (V-4) include the repeating units represented by the above formula (II-A) or (II-B) wherein at least one of $R_{13}'$, $R_{14}'$, $R_{15}'$ and $R_{16}'$ has a group represented by formula (V-1), (V-2), (V-3) or (V-4) (e.g., $R_5$ in $-COOR_5$ represents a group represented by formula (V-1), (V-2), (V-3) or (V-4)), and a repeating unit represented by the following formula (AI).

(AI)
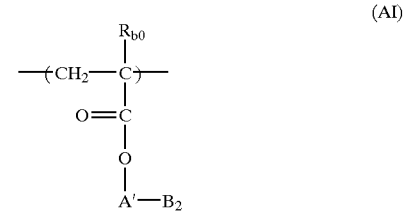

wherein $R_{b0}$ represents a hydrogen atom, a halogen atom, or a substituted or unsubstituted alkyl group having from 1 to 4 carbon atoms. The preferred substituents of the alkyl group represented by $R_{b0}$ include the same substituents as exemplified above as the preferred substituents of the alkyl group represented by $R_{1b}$ in formula (V-1), (V-2), (V-3) or (V-4).

The halogen atom represented by $R_{b0}$ includes a fluorine atom, a chlorine atom, a bromine atom or an iodine atom. $R_{b0}$ preferably represents a hydrogen atom.

A' represents a single bond, an ether group, an ester group, a carbonyl group, an alkylene group or a linking group consisting of these groups in combination.

$B_2$ represents any group represented by formula (V-1), (V-2), (V-3) or (V-4). The linking group in A' includes, e.g., the following.

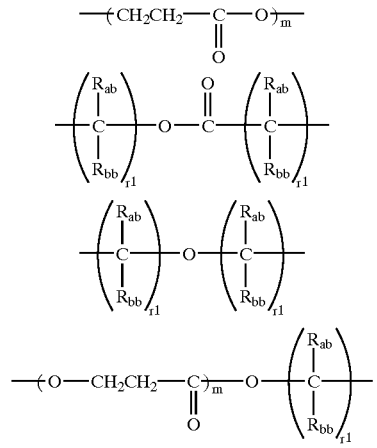

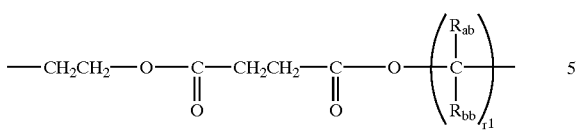

In the above formulae, $R_{ab}$ and $R_{bb}$, which may be the same or different, each represents a hydrogen atom, an alkyl group, a substituted alkyl group, a halogen atom, a hydroxyl group, or an alkoxyl group.

The alkyl group is preferably a lower alkyl group, e.g., a methyl group, an ethyl group, a propyl group, an isopropyl group, or a butyl group, more preferably a methyl group, an ethyl group, a propyl group, or an isopropyl group. The examples of the substituents for the substituted alkyl group include a hydroxyl group, a halogen atom, and an alkoxyl group having from 1 to 4 carbon atoms.

The examples of the alkoxyl groups include an alkoxyl group having from 1 to 4 carbon atoms, e.g., a methoxy group, an ethoxy group, a propoxy group, and a butoxy group. The examples of the halogen atoms include a chlorine atom, a bromine atom, a fluorine atom and an iodine atom. r1 represents an integer of from 1 to 10, preferably an integer of from 1 to 4, and m represents an integer of from 1 to 3, preferably 1 or 2.

The specific examples of the repeating units represented by formula (AI) are shown below, however, these compounds should not be construed as limiting the scope of the present invention.

(Ib-1)
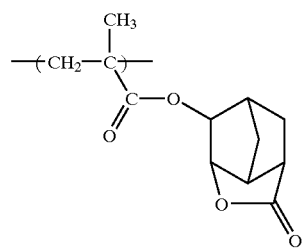

(Ib-2)
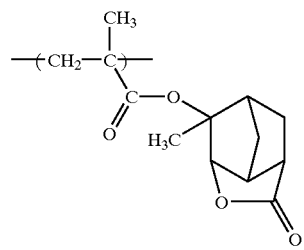

(Ib-3)
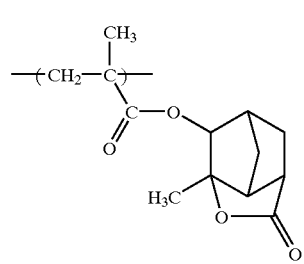

(Ib-4)
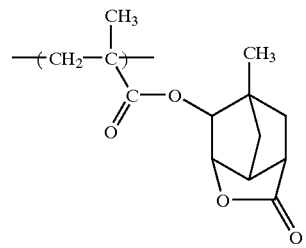

(Ib-5)
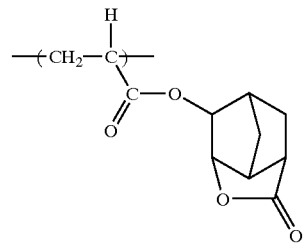

(Ib-6)
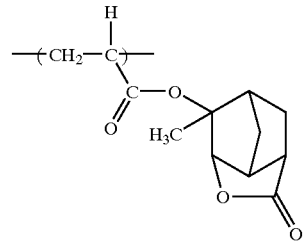

(Ib-7)
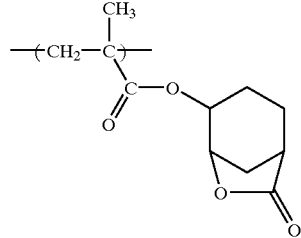

(Ib-8)
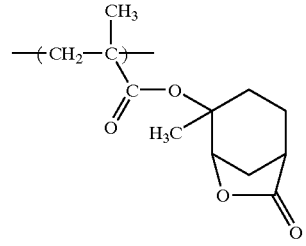

(Ib-9)
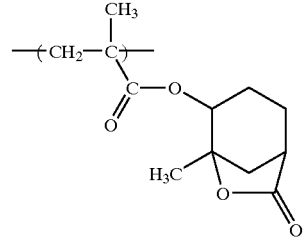

(Ib-10)
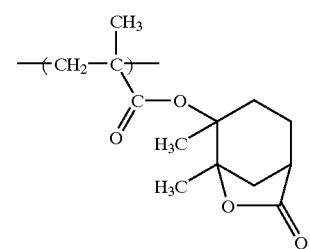
(Ib-11)
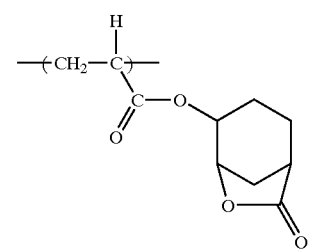
(Ib-12)
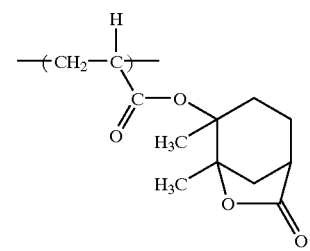
(Ib-13)
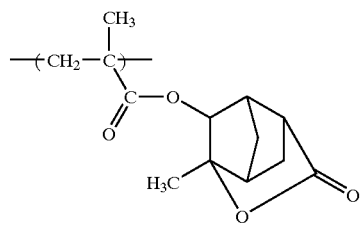
(Ib-14)
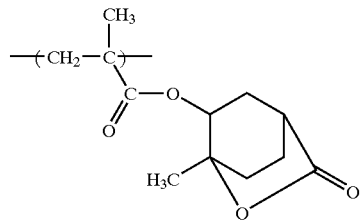
(Ib-15)
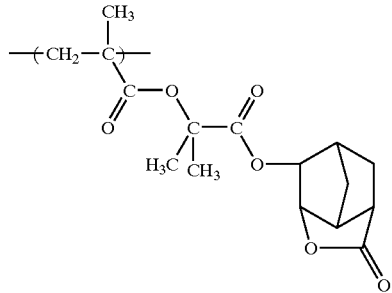
(Ib-16)
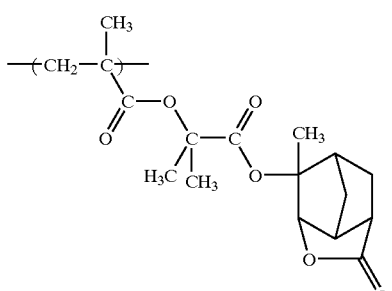
(Ib-17)
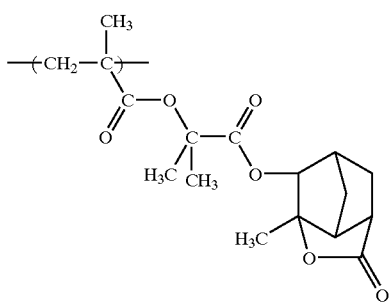
(Ib-18)
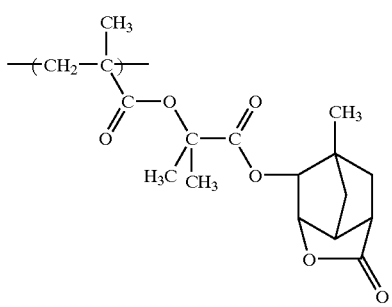
(Ib-19)
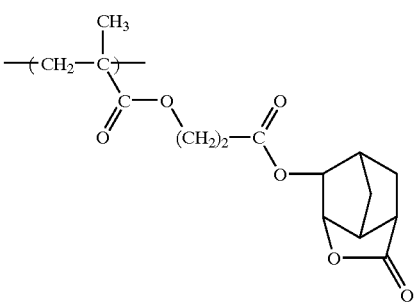
(Ib-20)
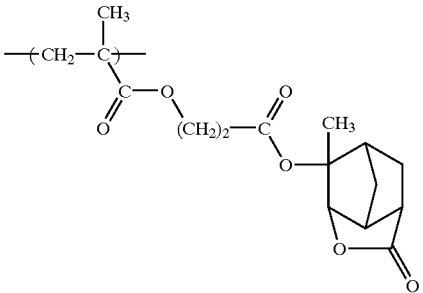

(Ib-21)
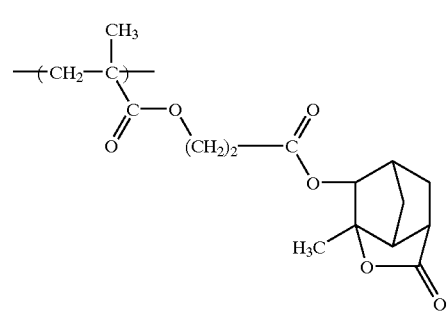
(Ib-22)
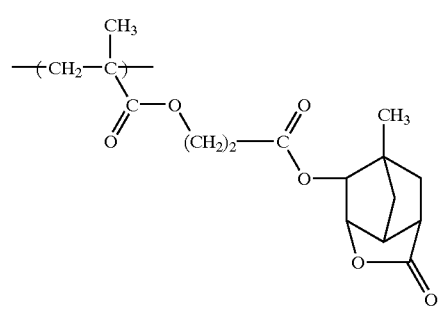
(Ib-23)
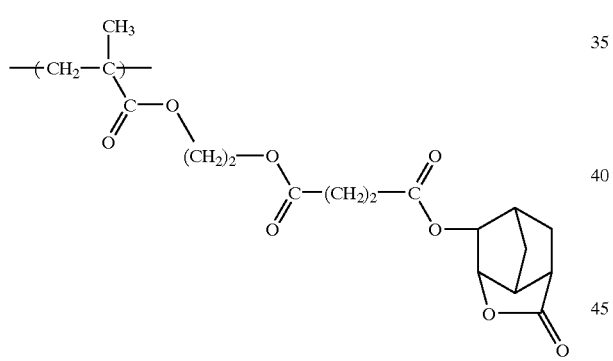
(Ib-24)
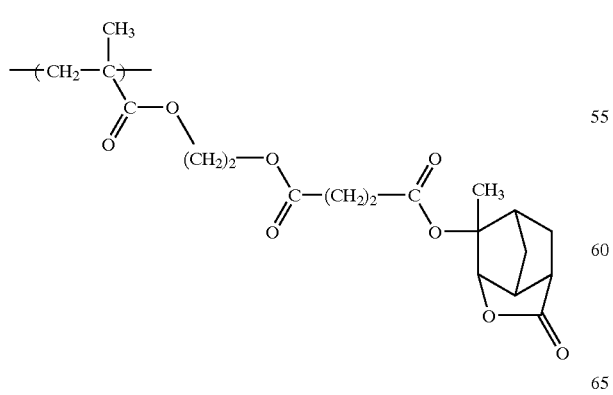
(Ib-25)
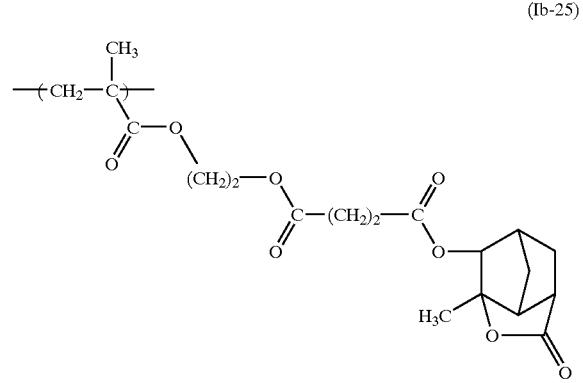
(Ib-26)
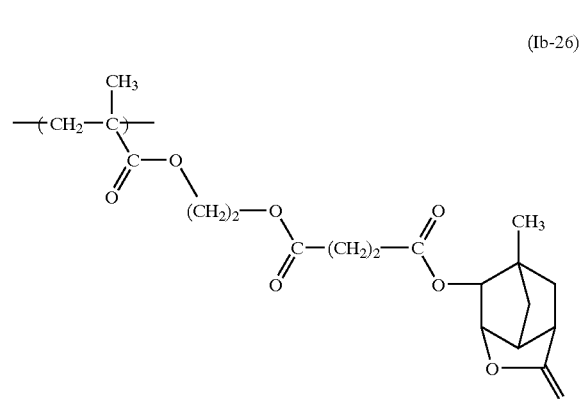
(Ib-27)
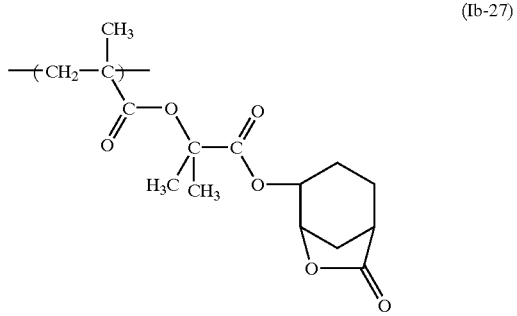
(Ib-28)
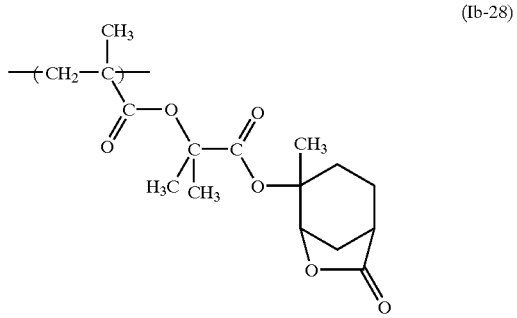

(Ib-29) 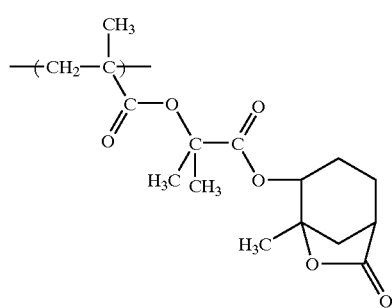
(Ib-30) 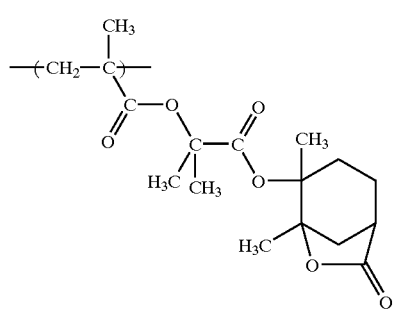
(Ib-31) 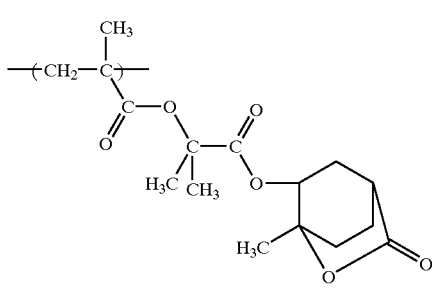
(Ib-32) 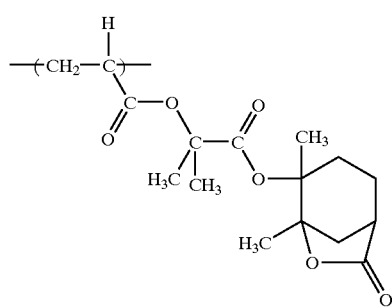
(Ib-33) 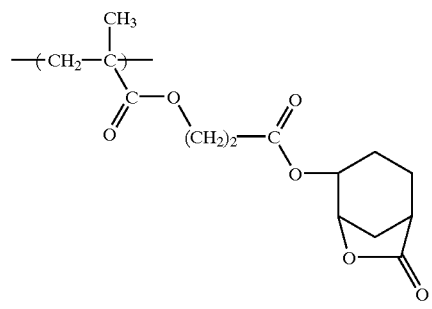
(Ib-34) 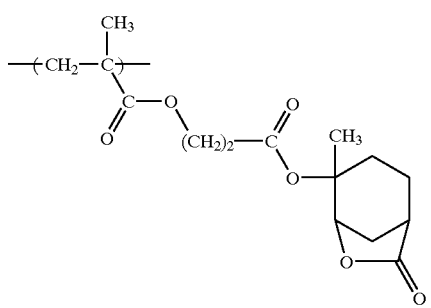
(Ib-35) 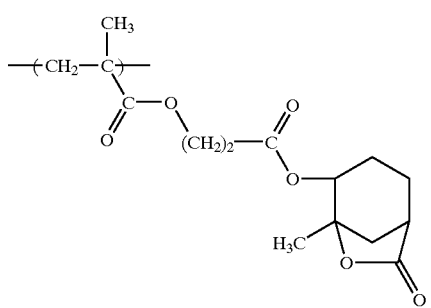
(Ib-36) 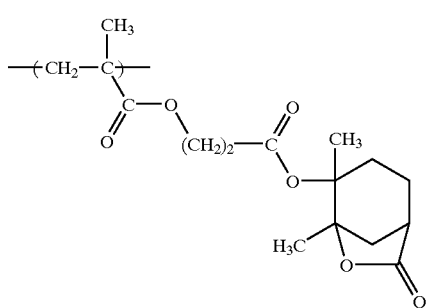
(Ib-37) 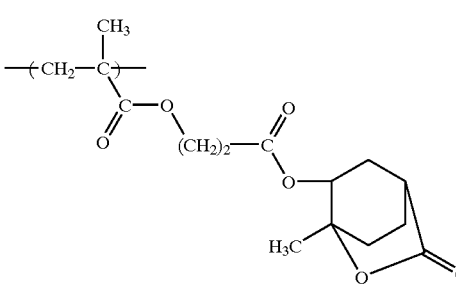
(Ib-38) 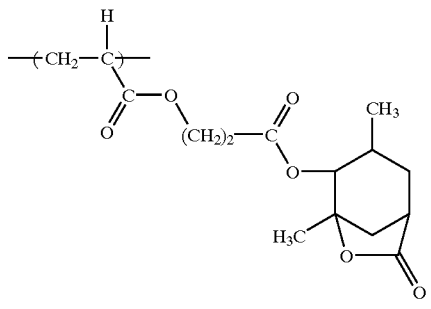

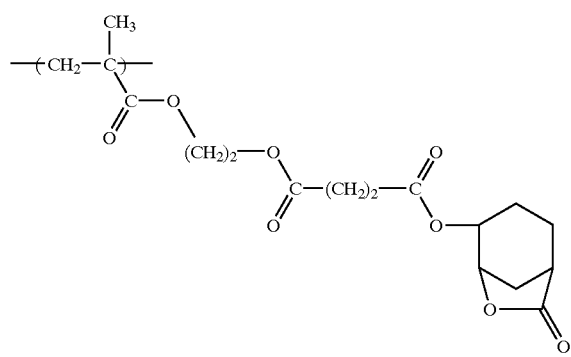
(Ib-39)
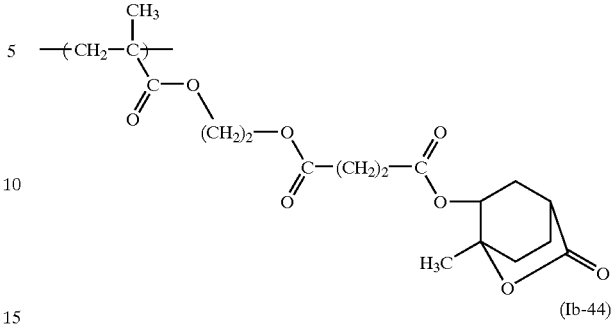
(Ib-43)
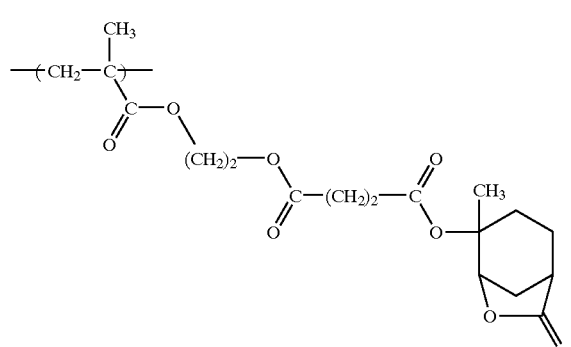
(Ib-40)
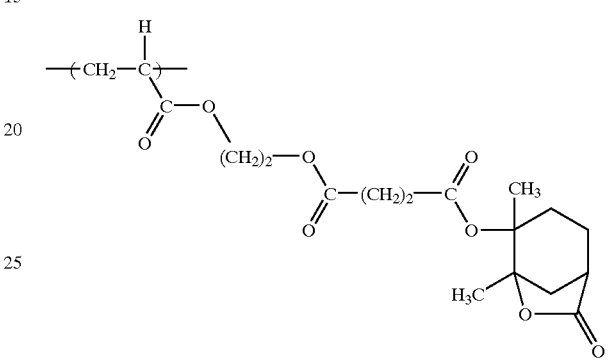
(Ib-44)
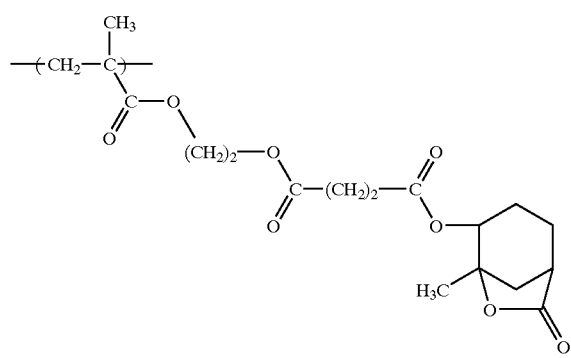
(Ib-41)
In resin (B) and resin (B1) in the present invention, it is preferred to contain at least one selected from the group consisting of: a repeating unit having a partial structure containing an alicyclic hydrocarbon represented by formula (pI), (pII), (pIII), (pIV), (pV) or (pVI); and a repeating unit represented by formula (II-AB):
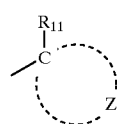
(pI)
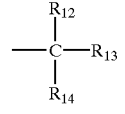
(pII)
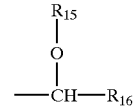
(pIII)
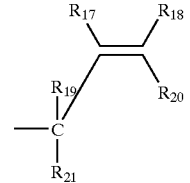
(pIV)
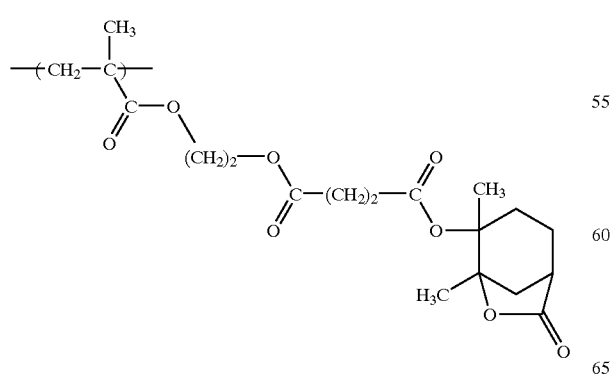
(Ib-42)
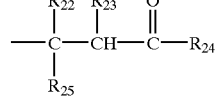
(pV)

(pVI)

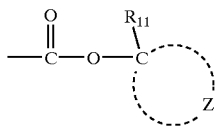

wherein $R_{11}$ represents a methyl group, an ethyl group, an n-propyl group, an isopropyl group, an n-butyl group, an isobutyl group or a sec-butyl group; Z represents an atomic group necessary to form an alicyclic hydrocarbon group together with carbon atoms; $R_{12}$, $R_{13}$, $R_{14}$, $R_{15}$ and $R_{16}$ each represents a straight chain or branched alkyl group having from 1 to 4 carbon atoms, or an alicyclic hydrocarbon group, provided that at least one of $R_{12}$, $R_{13}$ and $R_{14}$, or either $R_{15}$ or $R_{16}$ represents an alicyclic hydrocarbon group; $R_{17}$, $R_{18}$, $R_{19}$, $R_{20}$ and $R_{21}$ each represents a hydrogen atom, a straight chain or branched alkyl group having from 1 to 4 carbon atoms, or an alicyclic hydrocarbon group, provided that at least one of $R_{17}$, $R_{18}$, $R_{19}$, $R_{20}$ and $R_{21}$ represents an alicyclic hydrocarbon group, and either $R_{19}$ or $R_{21}$ represents a straight chain or branched alkyl group having from 1 to 4 carbon atoms, or an alicyclic hydrocarbon group; and $R_{22}$, $R_{23}$, $R_{24}$ and $R_{25}$ each represents a straight chain or branched alkyl group having from 1 to 4 carbon atoms, or an alicyclic hydrocarbon group, provided that at least one of $R_{22}$, $R_{23}$, $R_{24}$ and $R_{25}$ represents an alicyclic hydrocarbon group, and $R_{23}$ and $R_{24}$ may be bonded to each other to form a ring;

(II-AB)

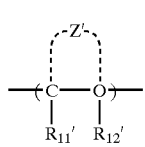

wherein $R_{11}'$ and $R_{12}'$ each represents a hydrogen atom, a cyano group, a halogen atom, or an alkyl group which may have a substituent; Z' contains two bonded carbon atoms (C—C), and represents an atomic group necessary to form an alicyclic structure which may have a substituent.

The compound represented by formula (II-AB) is preferably represented by formula (II-A) or (II-B):

(II-A)

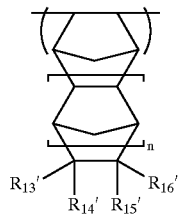

(II-B)

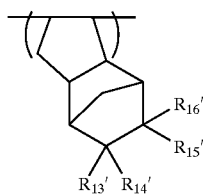

wherein $R_{13}'$, $R_{14}'$, $R_{15}'$ and $R_{16}'$ each represents a hydrogen atom, a halogen atom, a cyano group, —COOH, —COOR$_5$, a group which decomposes by the action of an acid, —C(=O)—X—A'—R$_{17}'$, an alkyl group which may have a substituent, or an alicyclic hydrocarbon group which may have a substituent, $R_5$ represents an alkyl group which may have a substituent, a cyclic hydrocarbon group which may have a substituent, or a —Y group shown below; X represents an oxygen atom, a sulfur atom, —NH—, —NHSO$_2$— or —NHSO$_2$NH—; A' represents a single bond or a divalent linking group; at least two of $R_{13}'$, $R_{14}'$, $R_{15}'$ and $R_{16}'$ may be bonded to each other to form a ring; n represents 0 or 1; $R_{17}'$ represents —COOH, —COOR$_5$, —CN, a hydroxyl group, an alkoxyl group which may have a substituent, —CO—NH—R$_6$, —CO—NH—SO$_2$—R$_6$, or a —Y group shown below; and $R_6$ represents an alkyl group which may have a substituent or a cyclic hydrocarbon group which may have a substituent, —Y group

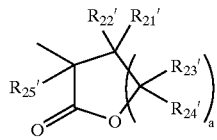 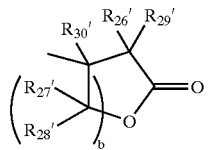

wherein $R_{21}'$ to $R_{30}'$ each represents a hydrogen atom or an alkyl group which may have a substituent, and a and b each represents 1 or 2.

In formulae (pI), (pII), (pIII), (pIV), (pV) and (pVI), the alkyl group represented by $R_{12}$ to $R_{25}$ is a substituted or unsubstituted, straight chain or branched alkyl group having from 1 to 4 carbon atoms, e.g., a methyl group, an ethyl group, an n-propyl group, an isopropyl group, an n-butyl group, an isobutyl group, a sec-butyl group and a t-butyl group can be exemplified.

The examples of the substituents of the substituted alkyl group include an alkoxyl group having from 1 to 4 carbon atoms, a halogen atom (e.g., fluorine, chlorine, bromine and iodine), an acyl group, an acyloxy group, a cyano group, a hydroxyl group, a carboxyl group, an alkoxycarbonyl group, and a nitro group.

The alicyclic hydrocarbon group represented by $R_{11}$ to $R_{25}$ and the alicyclic hydrocarbon group formed by Z and carbon atoms may be monocyclic or polycyclic. Specifically, groups having a monocyclo, bicyclo, tricyclo, or tetracyclo structure and 5 or more carbon atoms, preferably from 6 to 30, and particularly preferably from 7 to 25, can be exemplified. These alicyclic hydrocarbon groups may have a substituent.

The structural examples of alicyclic moieties of the alicyclic hydrocarbon groups are shown below.

(1)

(2)

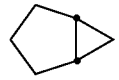

(3)

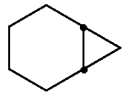

(4)

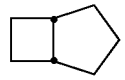

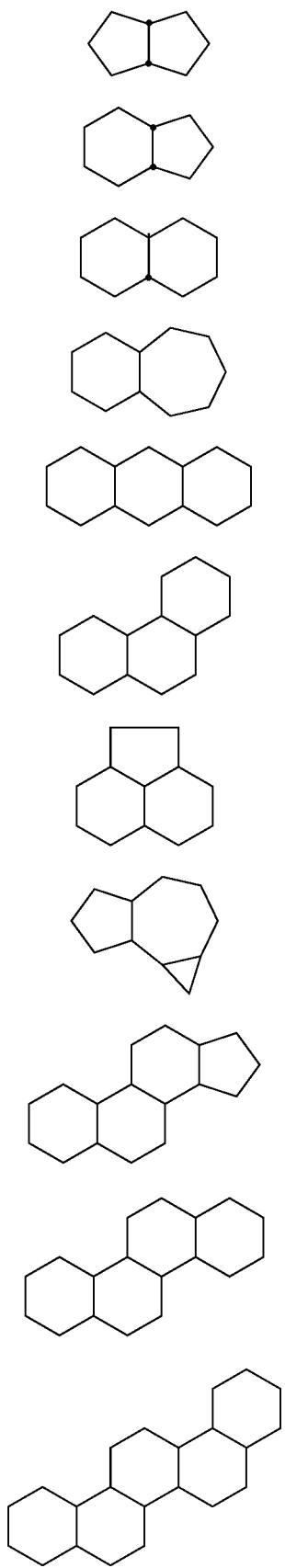
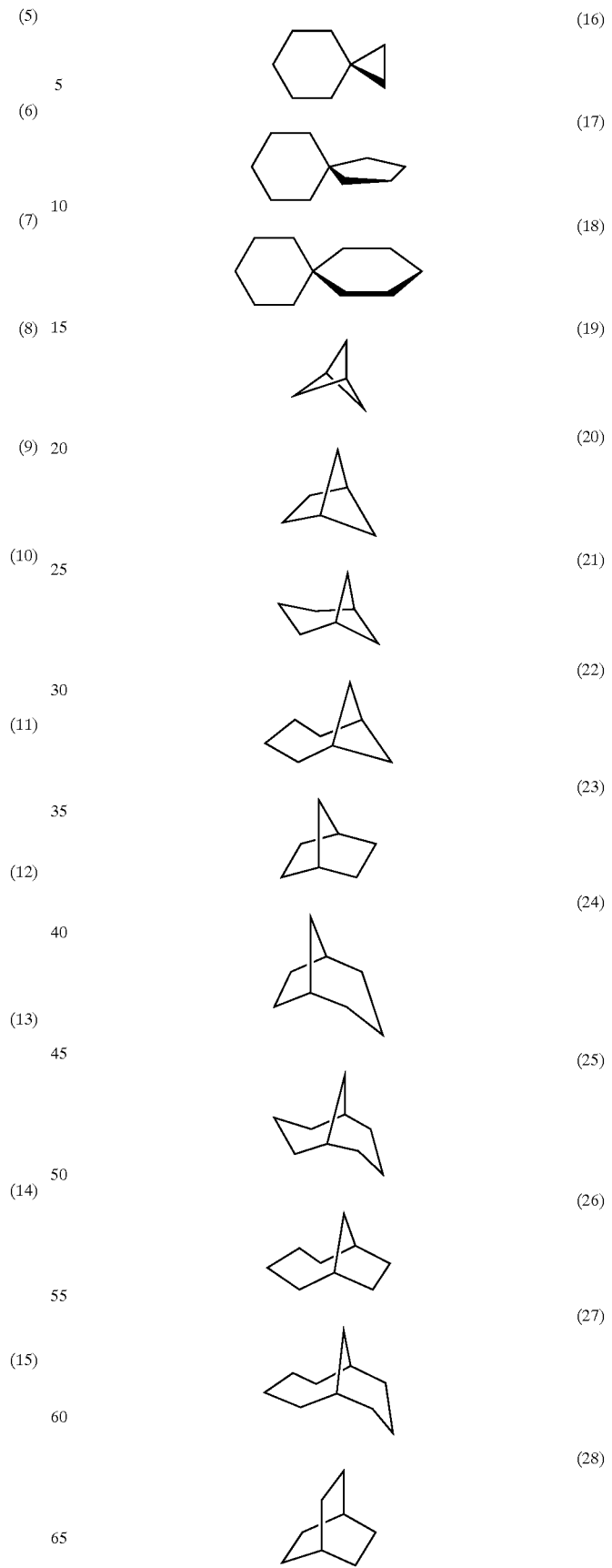

-continued

(29) 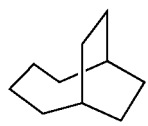

(30) 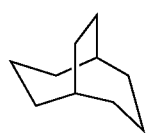

(31) 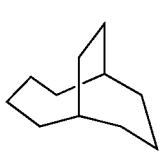

(32) 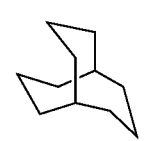

(33) 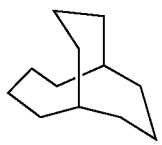

(34) 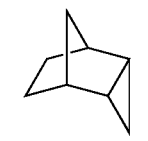

(35) 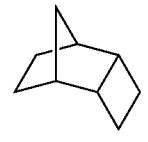

(36) 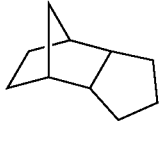

(37) 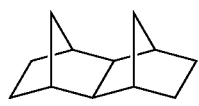

(38) 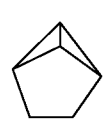

(39) 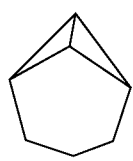

-continued

(40) 

(41) 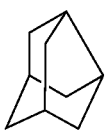

(42) 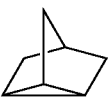

(43) 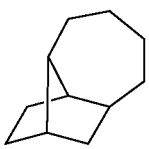

(44) 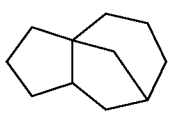

(45) 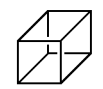

(46) 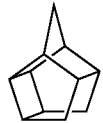

(47) 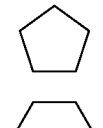

(48) 

(49) 

(50) 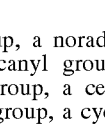

An adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group are exemplified as the preferred of the above alicyclic moieties in the present invention, and an adamantyl group, a decalin residue, a norbornyl group, a cedrol group, a cyclohexyl group, a cycloheptyl group, a cyclooctyl group, a cyclodecanyl group, and a cyclododecanyl group are more preferred.

The examples of the substituents of these alicyclic hydrocarbon groups include an alkyl group, a substituted alkyl group, a halogen atom, a hydroxyl group, an alkoxyl group, a carboxyl group, and an alkoxycarbonyl group. The alkyl group is preferably a lower alkyl group, e.g., a methyl group, an ethyl group, a propyl group, an isopropyl group, and a butyl group, more preferably a methyl group, an ethyl group, a propyl group, and an isopropyl group. The examples of the substituents for the substituted alkyl group include a hydroxyl group, a halogen atom, and an alkoxyl group. The alkoxyl group is an alkoxyl group having from 1 to 4 carbon atoms, e.g., a methoxy group, an ethoxy group, a propoxy group or a butoxy group.

The structure represented by formula (pI), (pII), (pIII), (pIV), (pV) or (pVI) in resin (B) and resin (B1) can be used for protecting an alkali-soluble group. As the alkali-soluble group, various alkali-soluble groups well known in this field of art are exemplified.

Specifically, a carboxylic acid group, a sulfonic acid group, a phenol group, and a thiol group are exemplified, preferably a carboxylic acid group and a sulfonic acid group.

The alkali-soluble group protected with the structure represented by formula (pI), (pII), (pIII), (pIV), (pV) or (pVI) in resin (B) and resin (B1) include the groups represented by the following formula (pVII), (pVIII), (pIX), (pX) or (pXI):

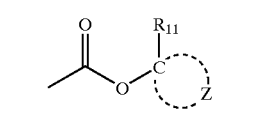 (pVII)

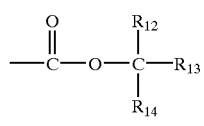 (pVIII)

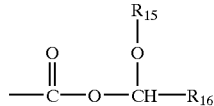 (pIX)

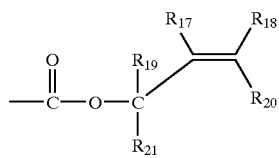 (pX)

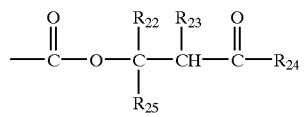 (pXI)

In formulae (pVII), (pVIII), (pIX), (pX) and (pXI), $R_{11}$ to $R_{25}$ and Z each has the same meaning as defined above.

In resin (B) and resin (B1), the repeating unit having an alkali-soluble group protected with the structure represented by formula (pI), (pII), (pIII), (pIV), (pV) or (pVI) is preferably represented by the following formula (pA):

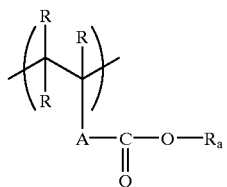 (pA)

wherein R represents a hydrogen atom, a halogen atom, or a substituted or unsubstituted, straight chain or branched alkyl group having from 1 to 4 carbon atoms. A plurality of R's may be the same or different.

A represents a combination of two or more groups selected from the group consisting of a single bond, an alkylene group, a substituted alkylene group, an ether group, a thioether group, a carbonyl group, an ester group, an amido group, a sulfonamido group, a urethane group, and a urea group.

$R_a$ represents a group represented by formula (pI), (pII), (pIII), (pIV), (pV) or (pVI).

The specific examples of the monomers corresponding to the repeating unit represented by formula (pA) are shown below.

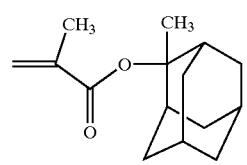

1

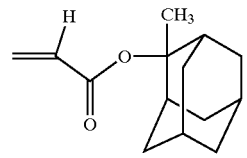

2

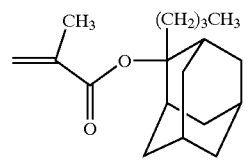

3

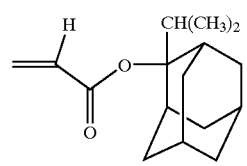

4

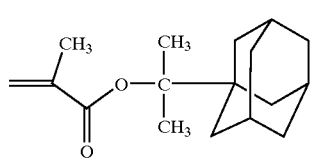

5

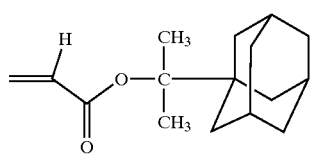

6

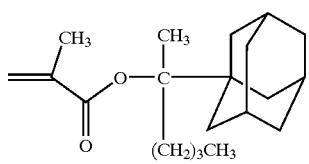
7
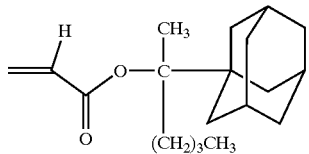
8
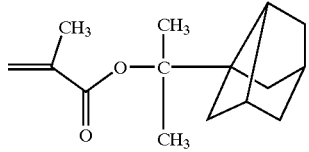
9
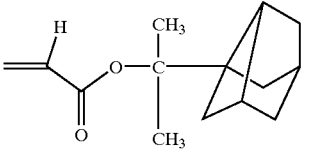
10
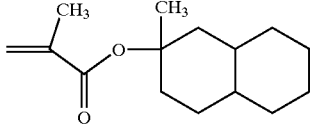
11
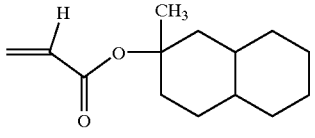
12
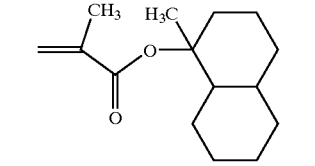
13
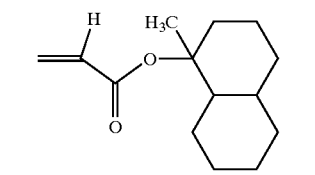
14
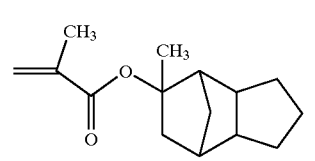
15
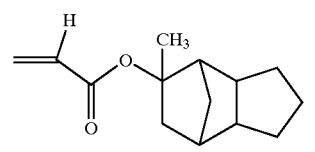
16
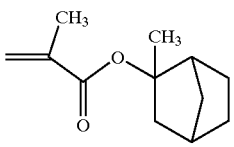
17
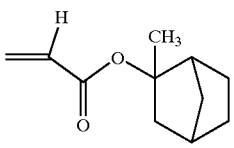
18
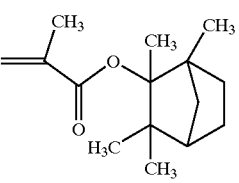
19
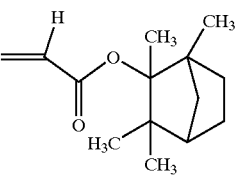
20
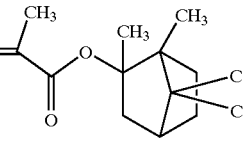
21
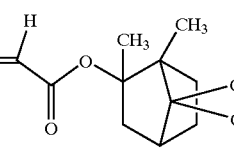
22
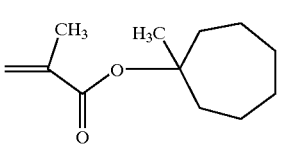
23
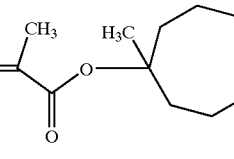
24
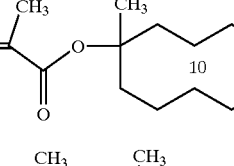
25
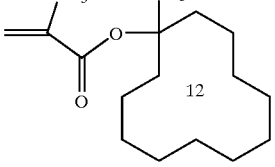
26

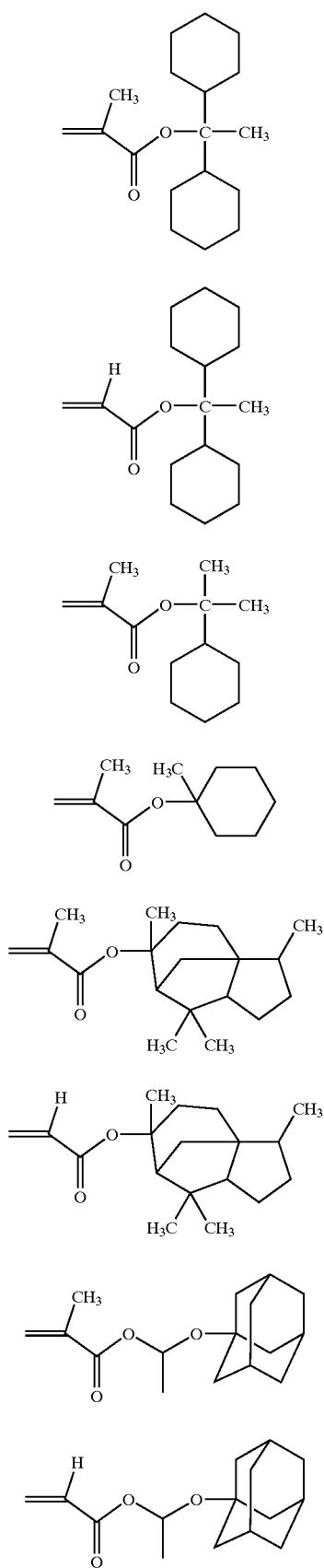

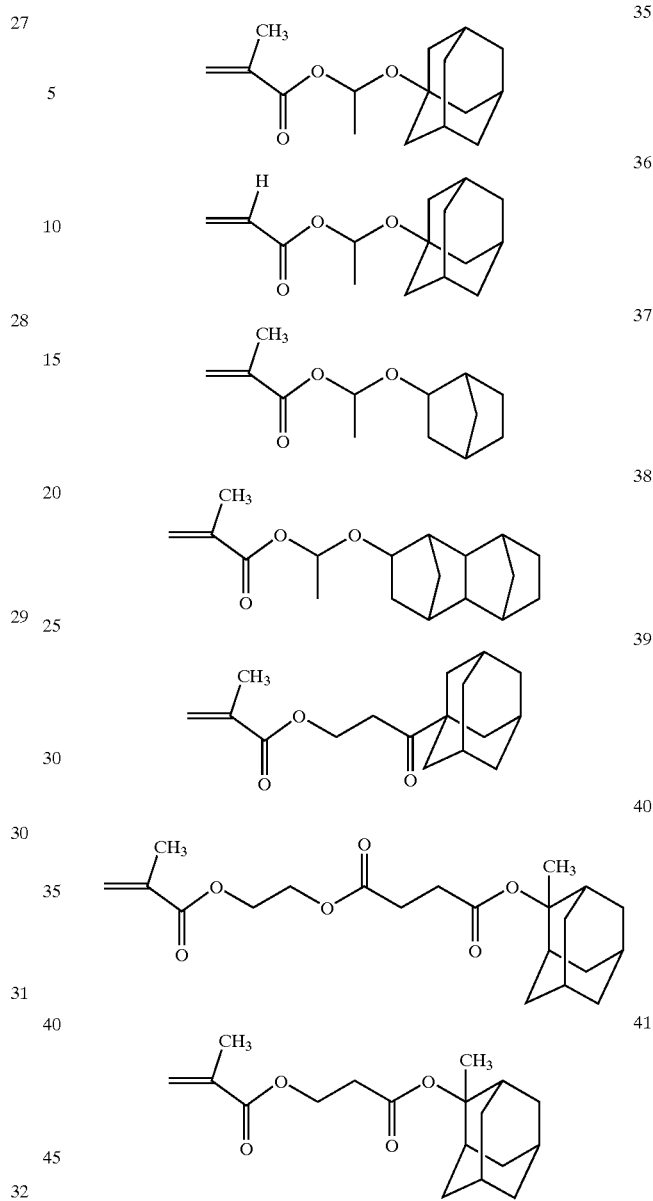

In the above formula (II-AB), $R_{11}'$ and $R_{12}'$ each represents a hydrogen atom, a cyano group, a halogen atom, or an alkyl group which may have a substituent.

Z' contains two bonded carbon atoms (C—C), and represents an atomic group necessary to form an alicyclic structure which may have a substituent.

The halogen atom represented by $R_{11}'$ and $R_{12}'$ includes a chlorine atom, a bromine atom, a fluorine atom or an iodine atom.

The alkyl group represented by $R_{11}'$, $R_{12}'$ $R_{21}'$ to $R_{30}'$ is preferably a straight chain or branched alkyl group having from 1 to 10 carbon atoms, more preferably a straight chain or branched alkyl group having from 1 to 6 carbon atoms, and still more preferably a methyl group, an ethyl group, a propyl group, an isopropyl group, an n-butyl group, an isobutyl group, a sec-butyl group or a t-butyl group.

As further substituents of the above alkyl group, a hydroxyl group, a halogen atom, a carboxyl group, an alkoxyl group, an acyl group, a cyano group, and an acyloxy group, can be exemplified. The examples of the halogen atoms include a chlorine atom, a bromine atom, a fluorine atom and an iodine atom. The examples of the alkoxyl groups include an alkoxyl group having from 1 to 4 carbon atoms, e.g., a methoxy group, an ethoxy group, a propoxy group and a butoxy group. The examples of the acyl group include a formyl group and an acetyl group, and the acyloxy group includes an acetoxy group.

The atomic group represented by Z' to form an alicyclic structure is an atomic group for forming a repeating unit of an alicyclic hydrocarbon which may have a substituent to a resin and, above all, an atomic group for forming a bridge-containing alicyclic structure for forming a bridge-containing alicyclic hydrocarbon repeating unit is preferred.

The examples of the skeletons of the alicyclic hydrocarbons to be formed include the following structures.

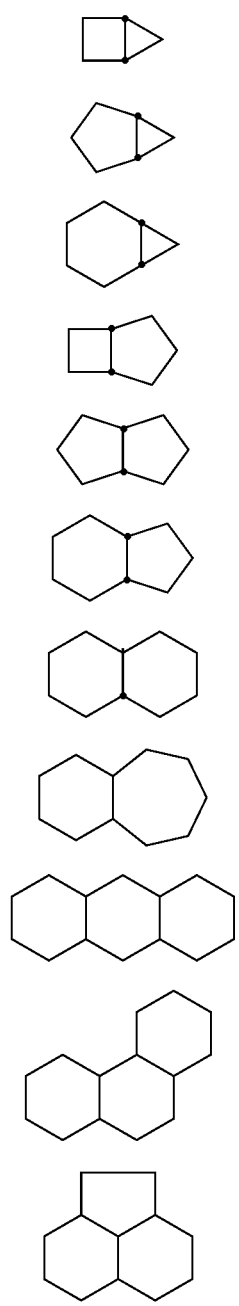

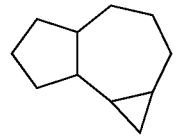

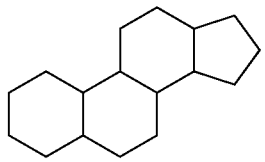

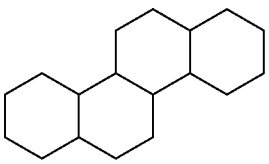

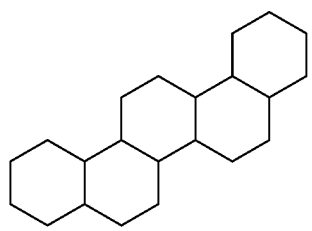

(24) 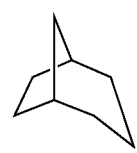
(25) 
(26) 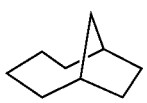
(27) 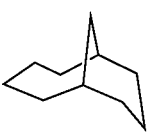
(28) 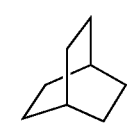
(29) 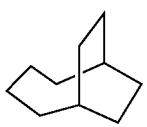
(30) 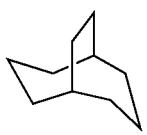
(31) 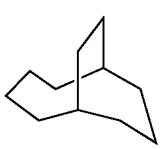
(32) 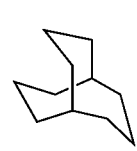
(33) 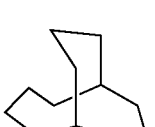
(34) 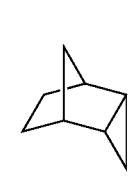
(35) 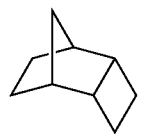
(36) 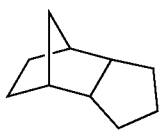
(37) 
(38) 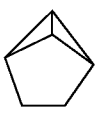
(39) 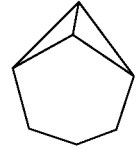
(40) 
(41) 
(42) 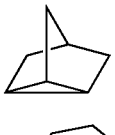
(43) 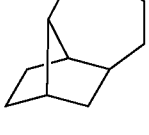
(44) 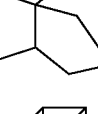
(45) 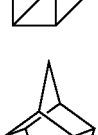
(46) 

-continued (47)

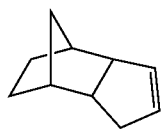

Of the above structures, preferred skeletons of bridge-containing alicyclic hydrocarbons are (5), (6), (7), (9), (10), (13), (14), (15), (23), (28), (36), (37), (42) and (47).

The alicyclic hydrocarbons skeletons may have a substituent, e.g., $R_{13}'$, $R_{14}'$, $R_{15}'$ and $R_{16}'$ in formula (II-A) and (II-B) can be exemplified as the substituents.

Of the repeating units having a bridge-containing alicyclic hydrocarbon, the repeating units represented by formula (II-A) or (II-B) are more preferred.

In formula (II-A) or (II-B), $R_{13}'$, $R_{14}'$, $R_{15}'$ and $R_{16}'$ each represents a hydrogen atom, a halogen atom, a cyano group, —COOH, —COOR$_5$, a group which decomposes by the action of an acid, —C(=O)—X—A'—R$_{17}'$, an alkyl group which may have a substituent, or an alicyclic hydrocarbon group which may have a substituent, $R_5$ represents an alkyl group which may have a substituent, a cyclic hydrocarbon group which may have a substituent, or a —Y group; X represents an oxygen atom, a sulfur atom, —NH—, —NHSO$_2$— or —NHSO$_2$NH—; A' represents a single bond or a divalent linking group; at least two of $R_{13}'$, $R_{14}'$, $R_{15}'$ and $R_{16}'$ may be bonded to each other to form a ring; n represents 0 or 1; $R_{17}'$ represents —COOH, —COOR$_5$, —CN, a hydroxyl group, an alkoxyl group which may have a substituent, —CO—NH—R$_6$, —CO—NH—SO$_2$—R$_6$, or a —Y group; $R_6$ represents an alkyl group which may have a substituent or a cyclic hydrocarbon group which may have a substituent.

In the above —Y group, $R_{21}'$ to $R_{30}'$ each represents a hydrogen atom or an alkyl group which may have a substituent, and a and b each represents 1 or 2.

In the resin according to the present invention, an acid-decomposable group may be contained in —C(=O)—X—A'—R$_{17}'$ or contained as the substituent of Z' in formula (II-AB).

The acid-decomposable group is represented by —C(=O)—X$_1$—R$_0$, wherein $R_0$ represents a tertiary alkyl group, e.g., a t-butyl group or a t-amyl group; a 1-alkoxyethyl group, e.g., a 1-ethoxyethyl group, a 1-butoxyethyl group, a 1-isobutoxyethyl group, or a 1-cyclohexylethyl group; an alkoxymethyl group, e.g., a 1-methoxymethyl group or a 1-ethoxymethyl group; a 3-oxoalkyl group, a tetrahydropyranyl group, a tetrahydrofuranyl group, a trialkylsylyl ester group, a 3-oxocyclohexyl ester group, a 2-methyl-2-adamantyl group, or a mevalonic lactone residue. $X_1$ has the same meaning as X described above.

The examples of the halogen atoms represented by $R_{13}'$, $R_{14}'$, $R_{15}'$ and $R_{16}'$ include a chlorine atom, a bromine atom, a fluorine atom and an iodine atom.

The alkyl group represented by $R_5$, $R_6$, $R_{13}'$, $R_{14}'$, $R_{15}'$ and $R_{16}'$ is preferably a straight chain or branched alkyl group having from 1 to 10 carbon atoms, more preferably a straight chain or branched alkyl group having from 1 to 6 carbon atoms, and still more preferably a methyl group, an ethyl group, a propyl group, an isopropyl group, an n-butyl group, an isobutyl group, a sec-butyl group or a t-butyl group.

The cyclic hydrocarbon group represented by $R_5$, $R_6$, $R_{13}'$, $R_{14}'$, $R_{15}'$ and $R_{16}'$ is a cyclic alkyl group or a bridge-containing alicyclic hydrocarbon, specifically, a cyclopropyl group, a cyclopentyl group, a cyclohexyl group, an adamantyl group, a 2-methyl-2-adamantyl group, a norbornyl group, a boronyl group, an isoboronyl group, a tricyclodecanyl group, a dicyclopentenyl group, a nobornan epoxy group, a menthyl group, an isomenthyl group, a neomenthyl group, or a tetracyclododecanyl group can be exemplified.

As the examples of the rings formed by bonding at least two of $R_{13}'$, $R_{14}'$, $R_{15}'$ and $R_{16}'$, rings having from 5 to 12 carbon atoms, e.g., cyclopentene, cyclohexene, cycloheptane and cyclooctane are exemplified.

As the alkoxyl group represented by $R_{17}'$, an alkoxyl group having from 1 to 4 carbon atoms, e.g., a methoxy group, an ethoxy group, a propoxy group, or a butoxy group can be exemplified.

As further substituents of the alkyl, cyclic hydrocarbon and alkoxyl groups, a hydroxyl group, a halogen atom, a carboxyl group, an alkoxyl group, an acyl group, a cyano group, an acyloxy group, an alkyl group and a cyclic hydrocarbon group can be exemplified. The examples of the halogen atoms include a chlorine atom, a bromine atom, a fluorine atom and an iodine atom. The examples of the alkoxyl groups include an alkoxyl group having from 1 to 4 carbon atoms, e.g., a methoxy group, an ethoxy group, a propoxy group and a butoxy group. The examples of the acyl group include a formyl group and an acetyl group, and the acyloxy group includes an acetoxy group.

As the alkyl group and the cyclic hydrocarbon group, those described above can be exemplified.

As the divalent linking group represented by A', combination of alone or two or more groups selected from the group consisting of an alkylene group, a substituted alkylene group, an ether group, a thioether group, a carbonyl group, an ester group, an amido group, a sulfonamido group, a urethane group and a urea group can be exemplified.

The alkylene group and the substituted alkylene group represented by A' is a group represented by the following formula:

$$-[C(R_a)(R_b)]_r-$$

wherein $R_a$ and $R_b$, which may be the same or different, each represents a hydrogen atom, an alkyl group, a substituted alkyl group, a halogen atom, a hydroxyl group or an alkoxyl group. The alkyl group is preferably a lower alkyl group, e.g., a methyl group, an ethyl group, a propyl group, an isopropyl group, or a butyl group, more preferably a methyl group, an ethyl group, a propyl group, or an isopropyl group. The examples of the substituents for the substituted alkyl group include a hydroxyl group, a halogen atom, and an alkoxyl group. The alkoxyl group is an alkoxyl group having from 1 to 4 carbon atoms, e.g., a methoxy group, an ethoxy group, a propoxy group or a butoxy group. The examples of the halogen atoms include a chlorine atom, a bromine atom, a fluorine atom and an iodine atom. r represents an integer of from 1 to 10.

In the resin according to the present invention, the group capable of decomposing by the action of an acid can be contained in at least one repeating unit of a repeating unit having a partial structure containing an alicyclic hydrocarbon represented by formula (pI), (pII), (pIII), (pIV), (pV) or (pVI), a repeating unit represented by formula (II-AB), and a repeating unit comprising the later-described copolymer component.

The various substituents of $R_{13}'$, $R_{14}'$, $R_{15}'$ and $R_{16}'$ in formula (II-A) or (II-B) are the substituents of the atomic group for forming an alicyclic structure in formula (II-AB) or atomic group Z for forming a bridge-containing alicyclic structure.

The specific examples of the repeating units represented by formula (II-A) or (II-B) include the following compounds [II-1] to [II-175], however, these compounds should not be construed as limiting the scope of the present invention.
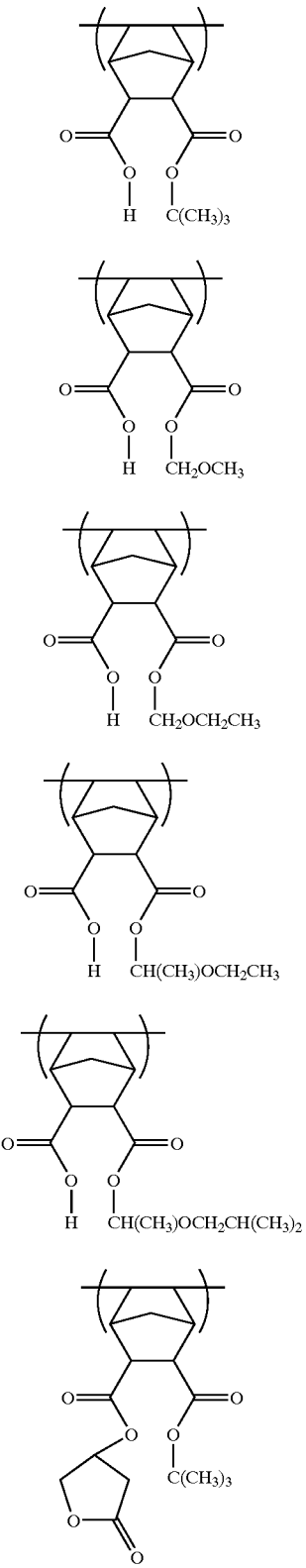
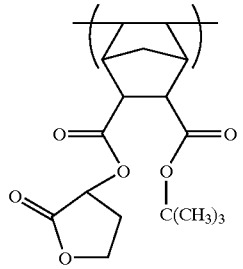
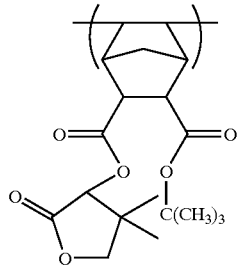
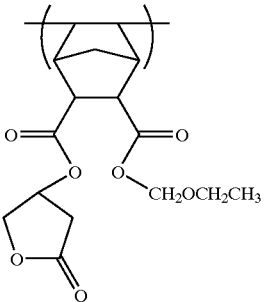
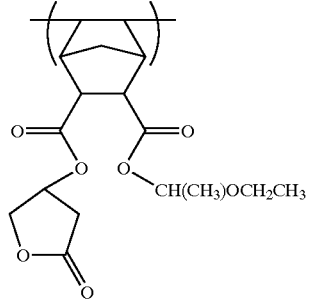
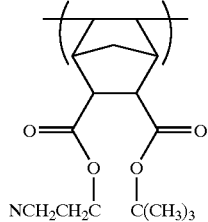

[II-12] 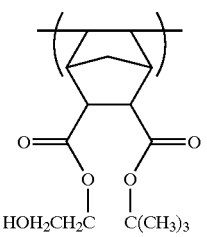
[II-13] 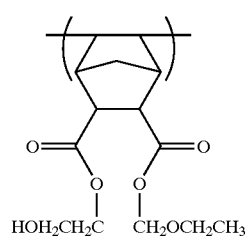
[II-14] 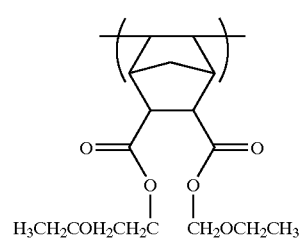
[II-15] 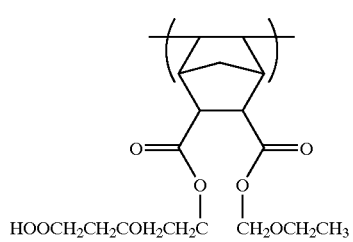
[II-16] 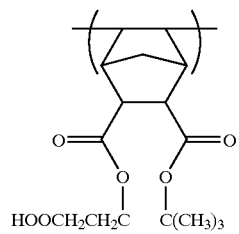
[II-17] 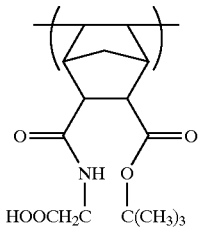
[II-18] 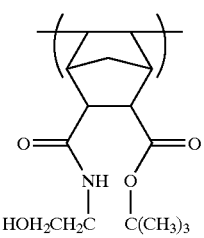
[II-19] 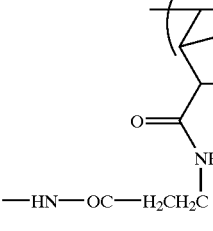
[II-20] 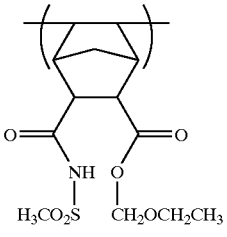
[II-21] 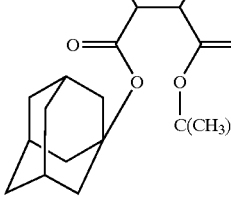
[II-22] 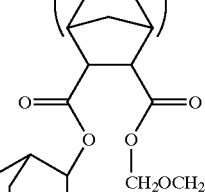
[II-23] 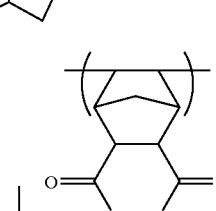

[II-24] 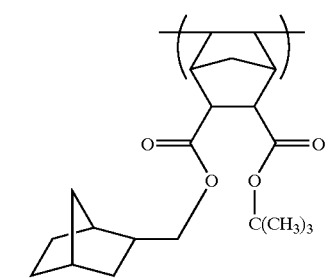
[II-25] 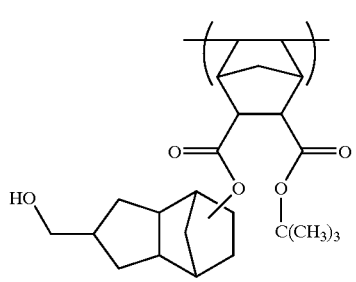
[II-26] 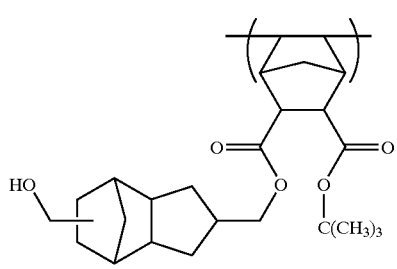
[II-27] 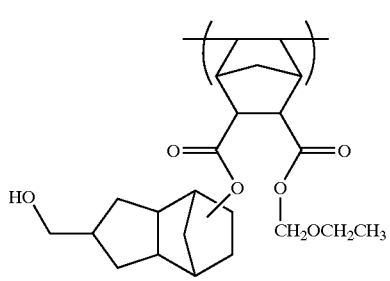
[II-28] 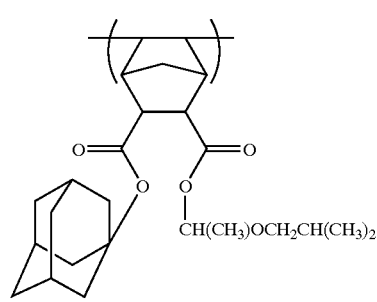
[II-29] 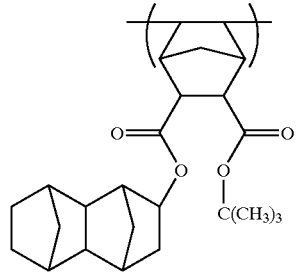
[II-30] 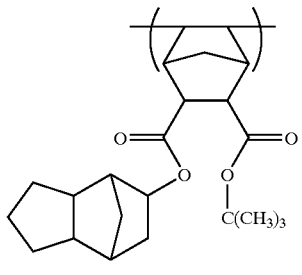
[II-31] 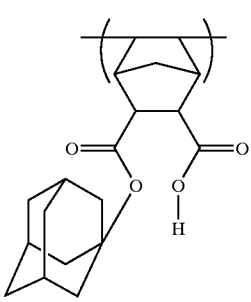
[II-32] 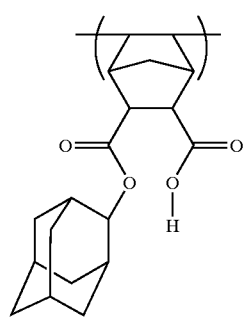
[II-33] 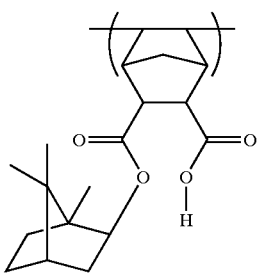

[II-34]
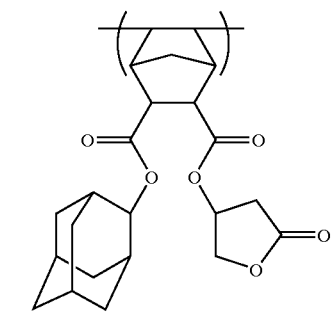
[II-35]
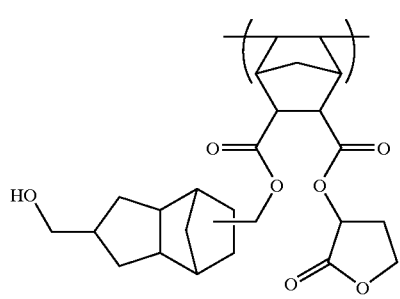
[II-36]
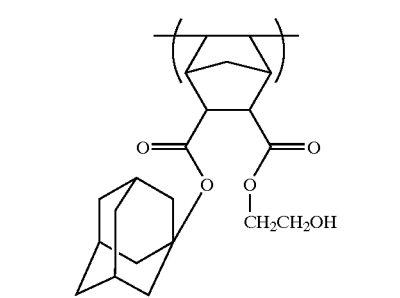
[II-37]
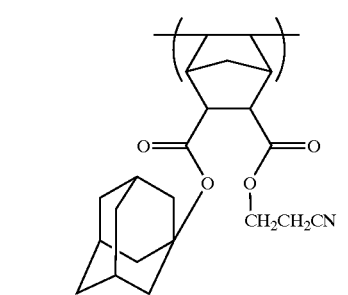
[II-38]
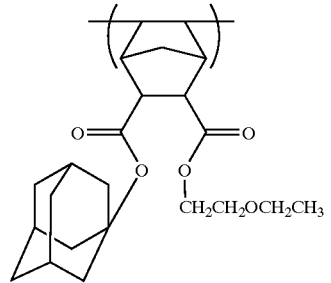
[II-39]
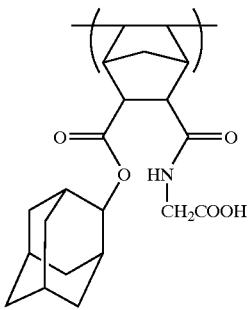
[II-40]
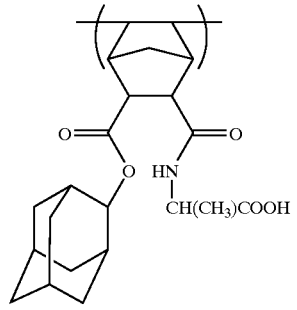
[II-41]
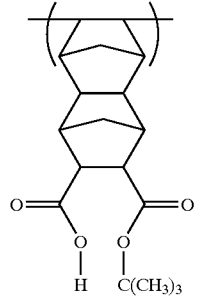
[II-42]
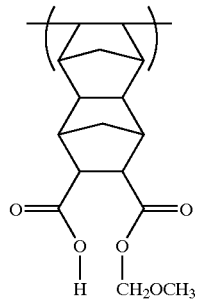
[II-43]
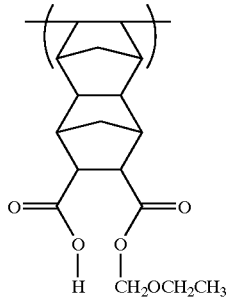

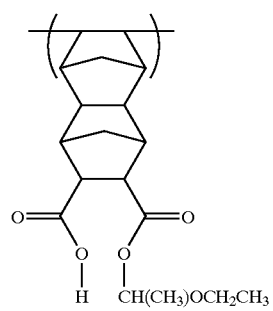
[II-44]
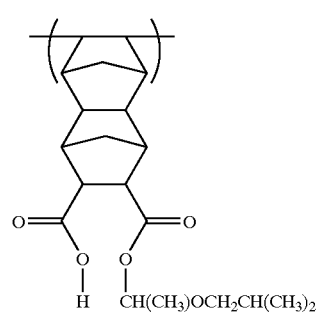
[II-45]
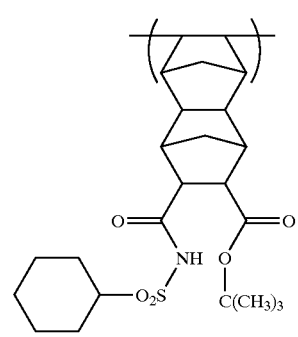
[II-46]
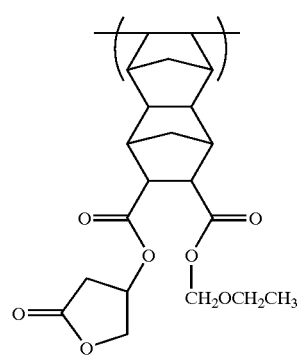
[II-47]
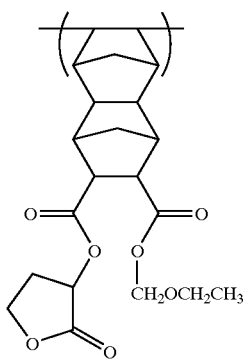
[II-48]
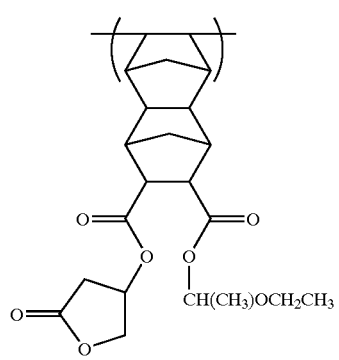
[II-49]
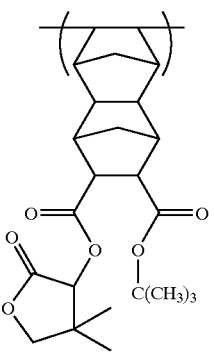
[II-50]
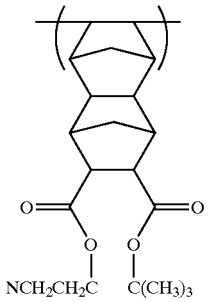
[II-51]

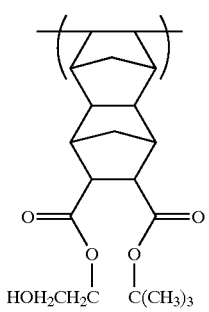 [II-52]
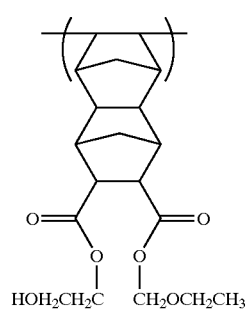 [II-53]
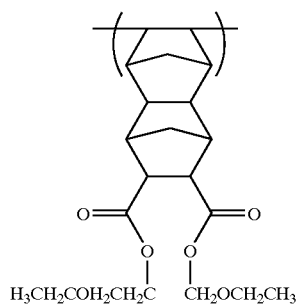 [II-54]
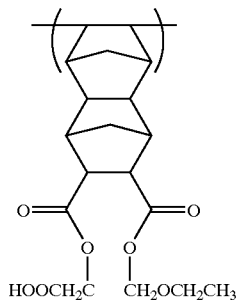 [II-55]
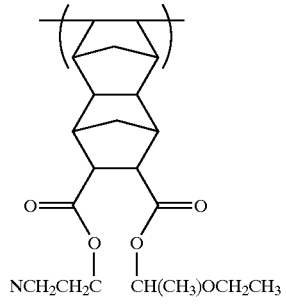 [II-56]
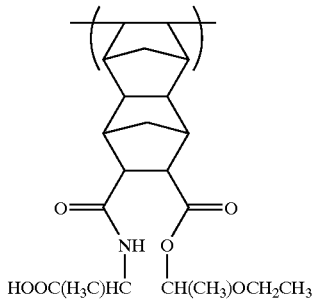 [II-57]
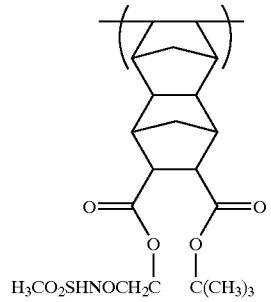 [II-58]
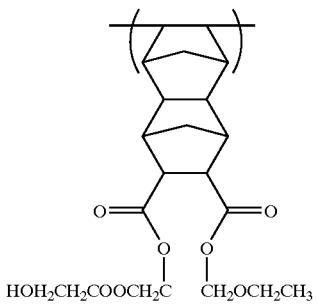 [II-59]
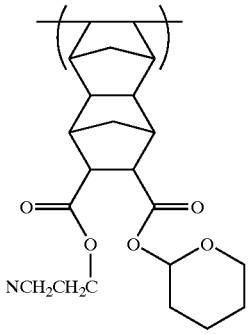 [II-60]
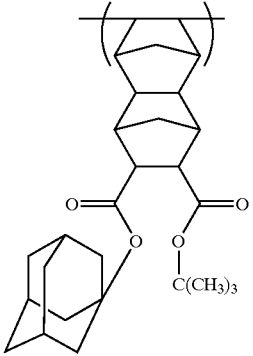 [II-61]

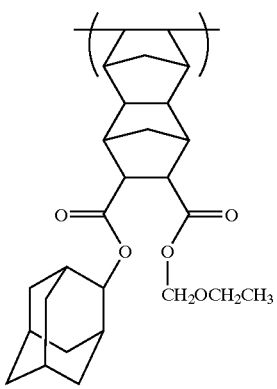
[II-62]
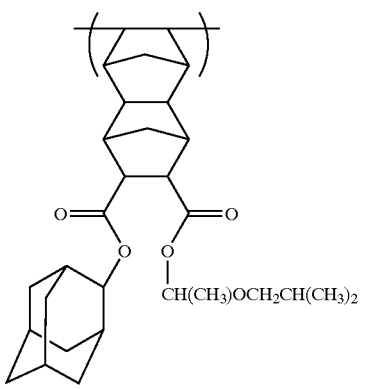
[II-66]
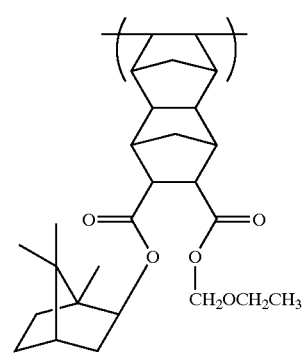
[II-63]
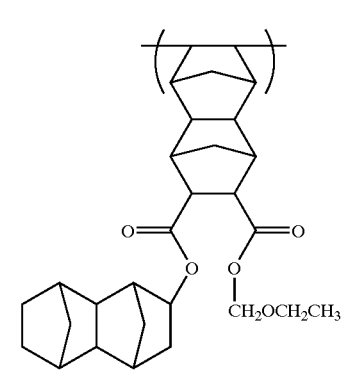
[II-67]
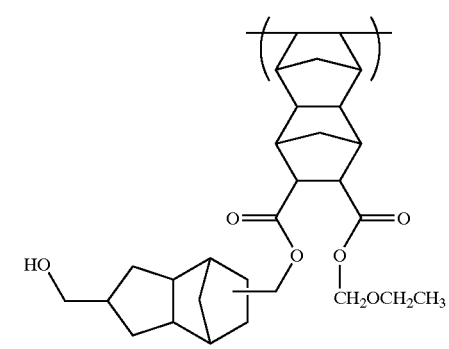
[II-64]
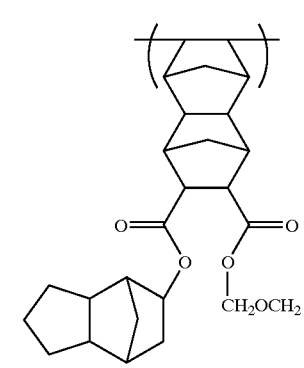
[II-68]
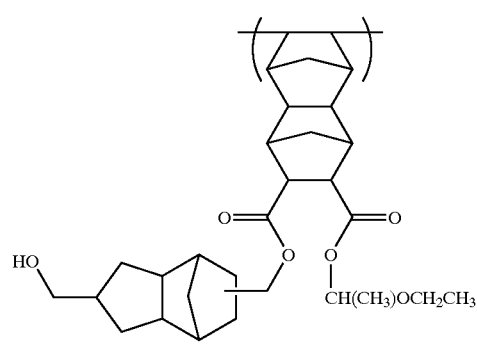
[II-65]
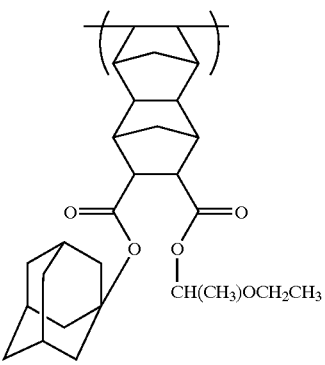
[II-69]

[II-70] 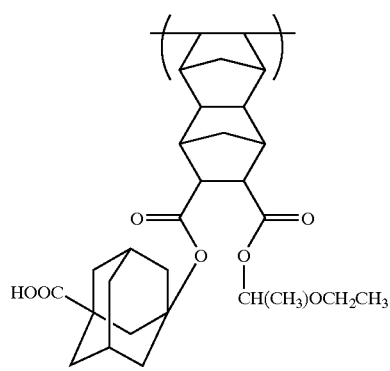
[II-71] 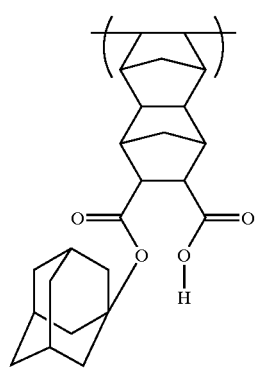
[II-72] 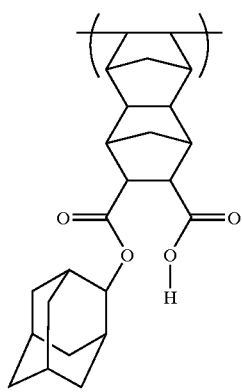
[II-73] 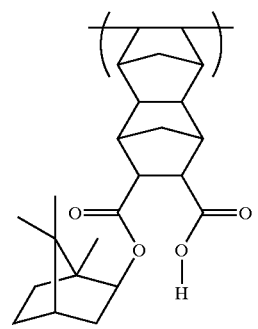
[II-74] 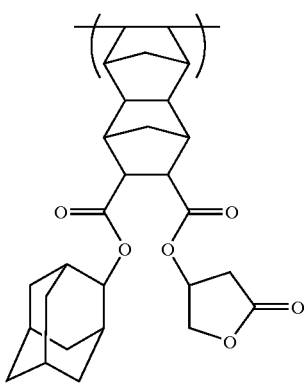
[II-75] 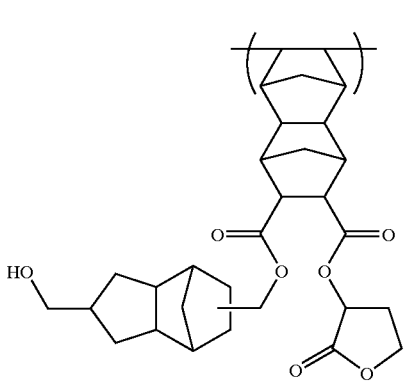
[II-76] 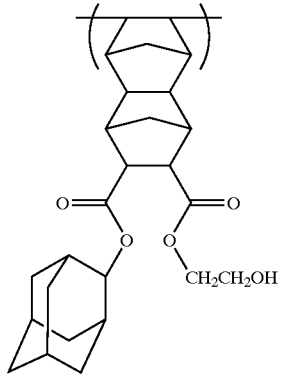
[II-77] 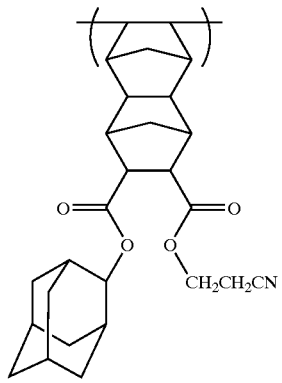

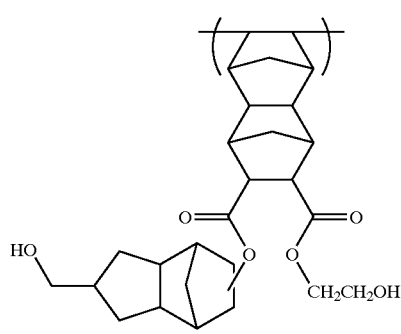 [II-78]
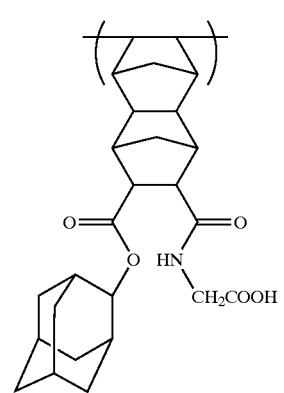 [II-79]
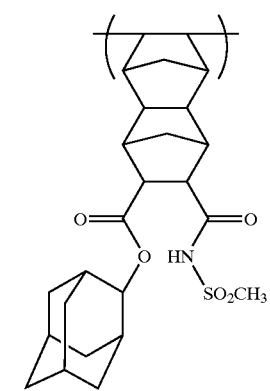 [II-80]
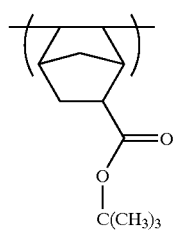 [II-81]
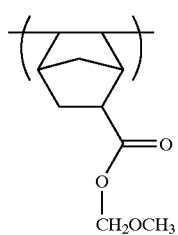 [II-82]
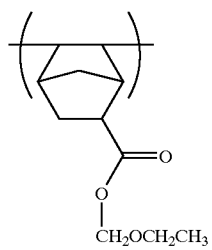 [II-83]
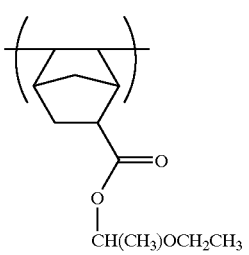 [II-84]
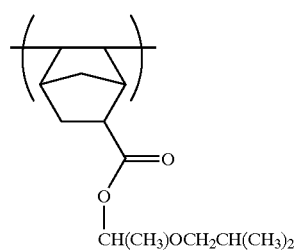 [II-85]
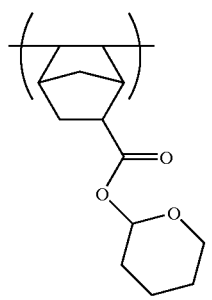 [II-86]
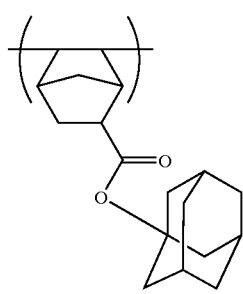 [II-87]

[II-88]
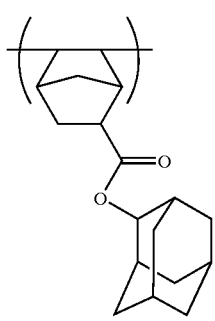
[II-89]
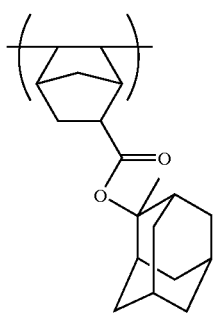
[II-90]
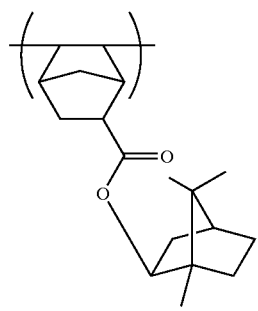
[II-91]
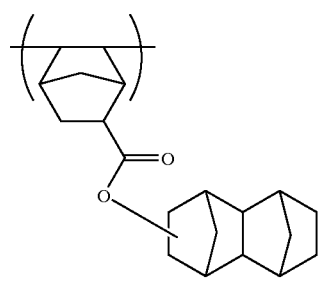
[II-92]
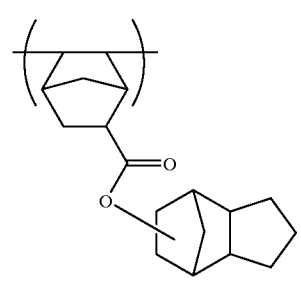
[II-93]
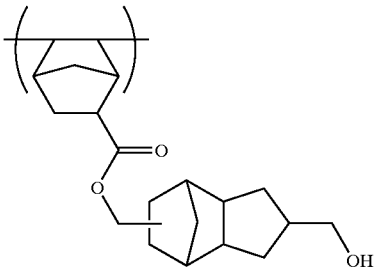
[II-94]
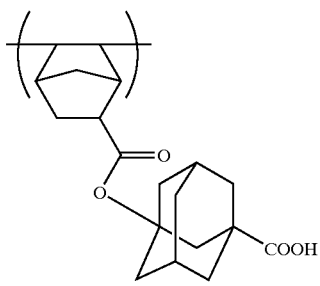
[II-95]
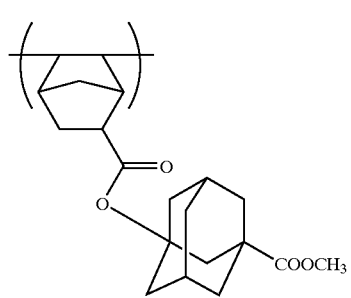
[II-96]
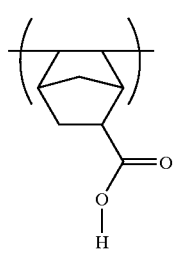
[II-97]
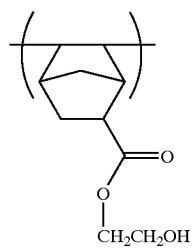
[II-98]

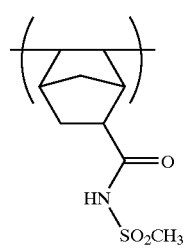 [II-99]
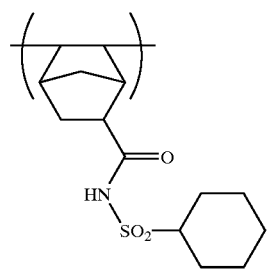 [II-100]
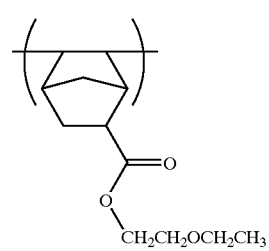 [II-101]
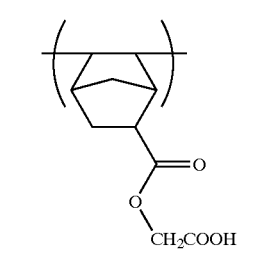 [II-102]
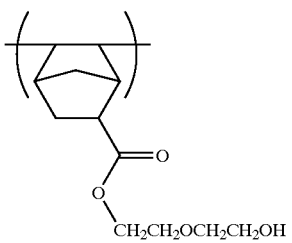 [II-103]
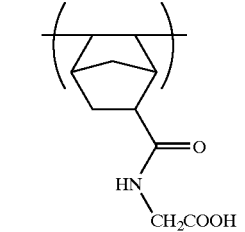 [II-104]
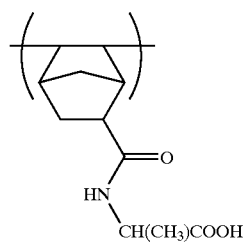 [II-105]
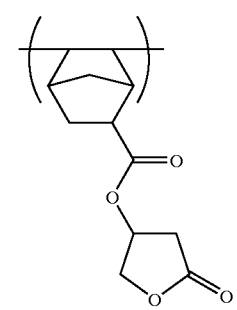 [II-106]
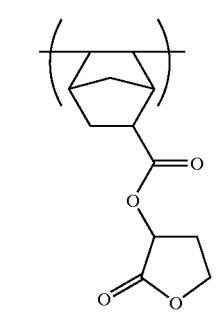 [II-107]
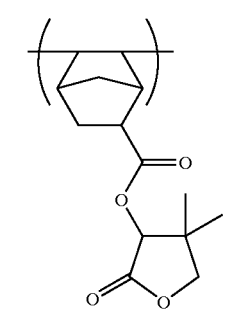 [II-108]
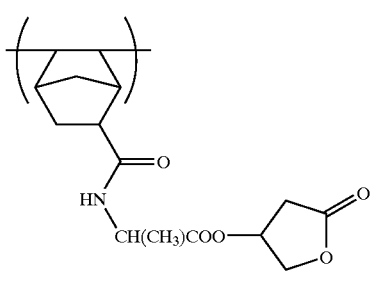 [II-109]

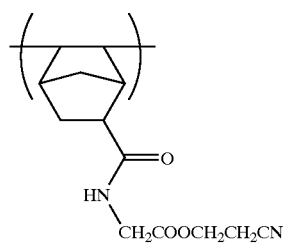 [II-110]
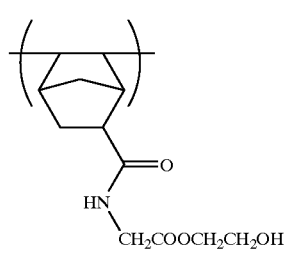 [II-111]
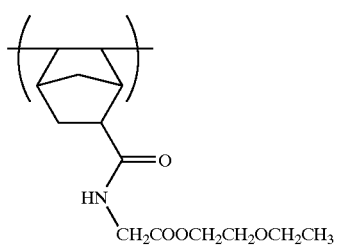 [II-112]
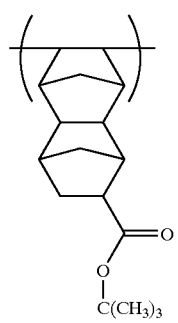 [II-113]
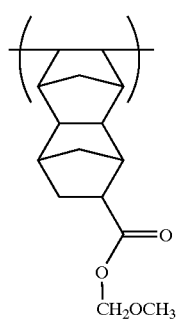 [II-114]
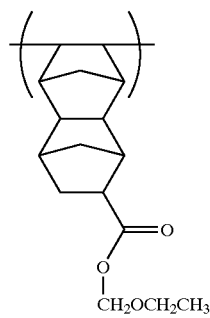 [II-115]
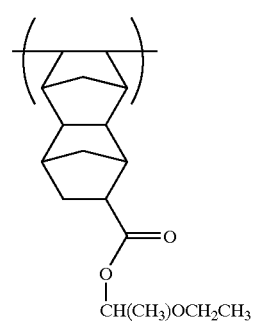 [II-116]
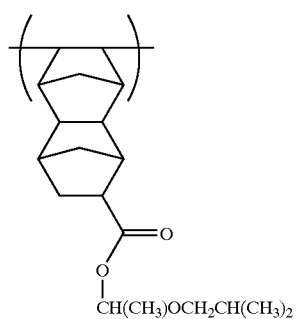 [II-117]
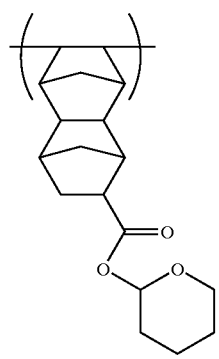 [II-118]

[II-119] 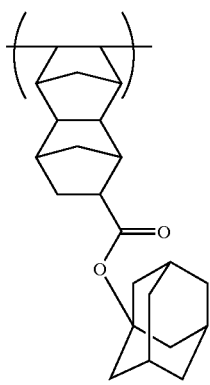
[II-120] 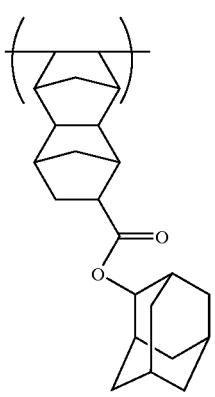
[II-121] 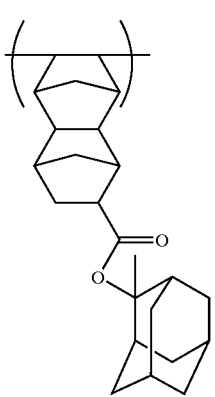
[II-122] 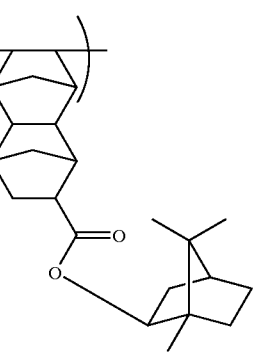
[II-123] 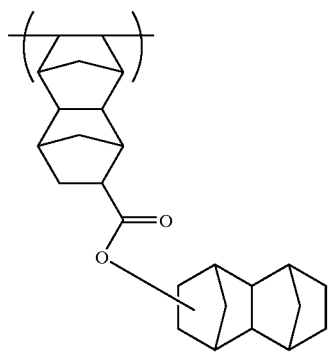
[II-124] 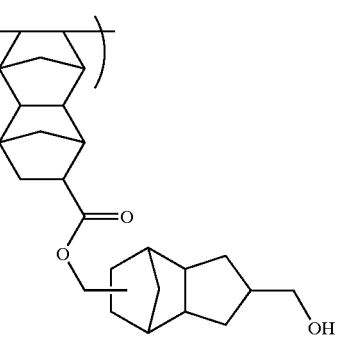
[II-125]
[II-126] 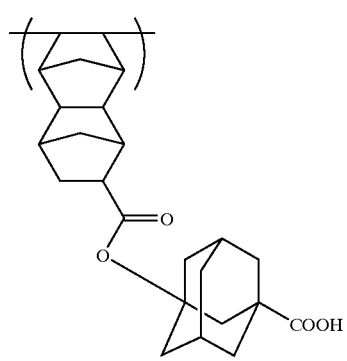

[II-127]
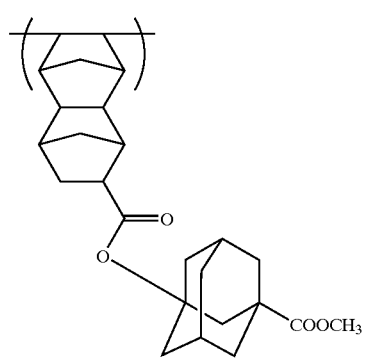
[II-128]
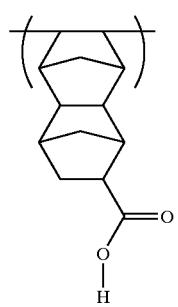
[II-129]
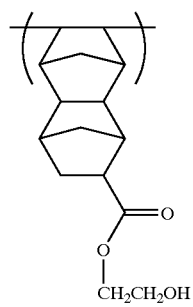
[II-130]
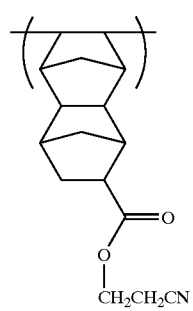
[II-131]
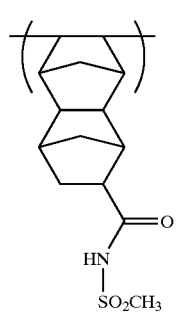
[II-132]
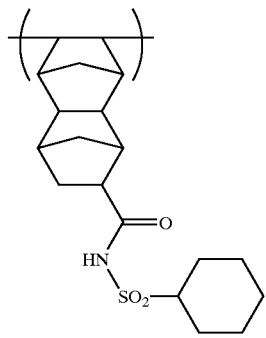
[II-133]
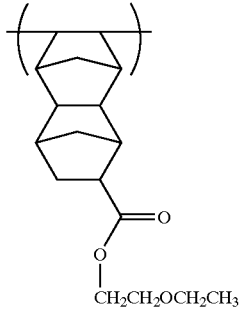
[II-134]
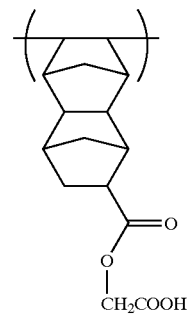
[II-135]
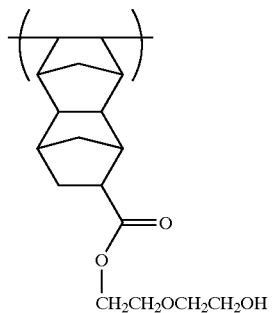
[II-136]
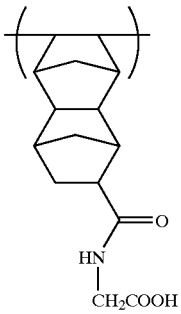

[II-137]
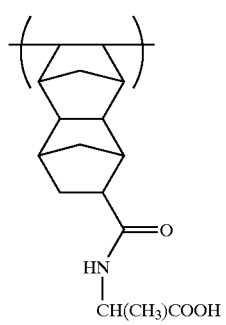
[II-138]
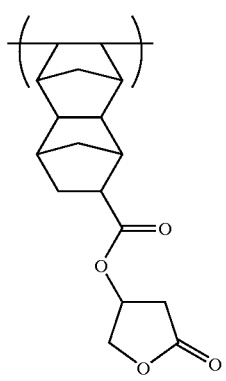
[II-139]
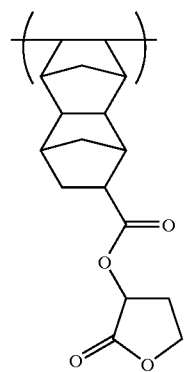
[II-140]
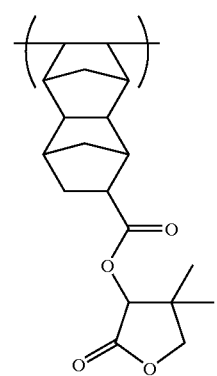
[II-141]
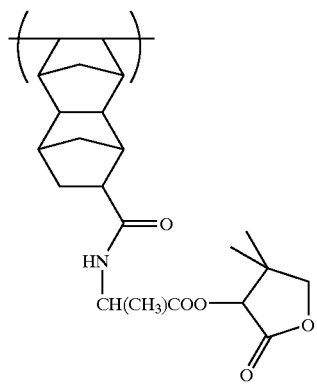
[II-142]
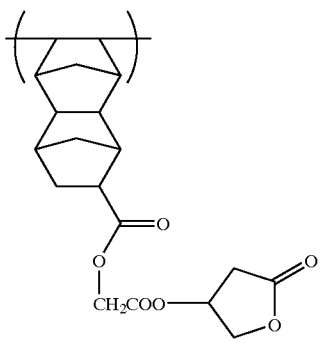
[II-143]
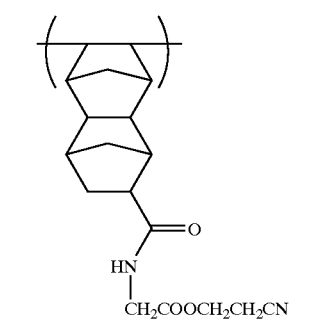
[II-144]
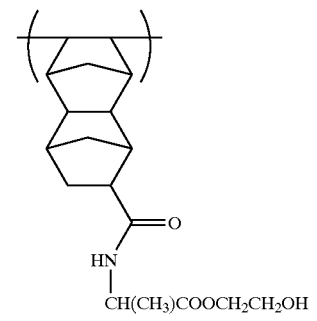

[II-145]
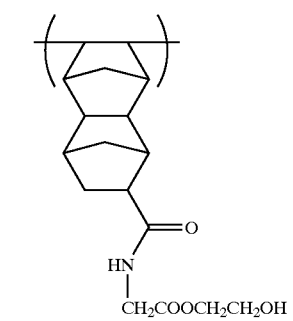
[II-146]
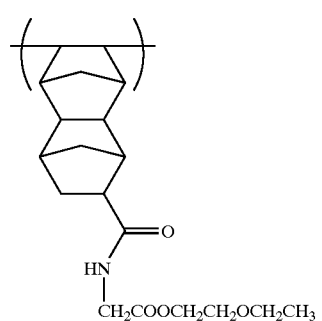
[II-147]
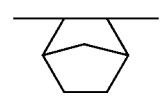
[II-148]
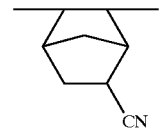
[II-149]
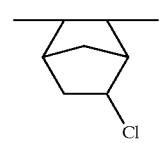
[II-150]
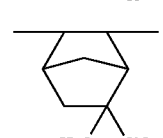
[II-151]
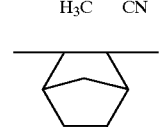
[II-152]
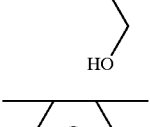
[II-153]
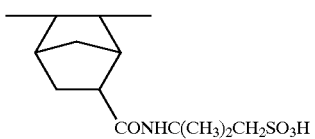
[II-154]
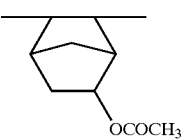
[II-155]
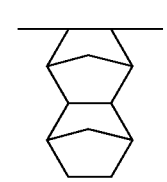
[II-156]
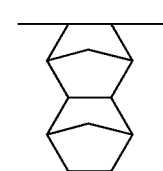
[II-157]
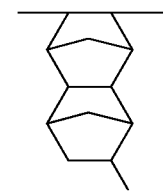
[II-158]
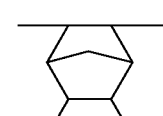
[II-159]
[II-160]
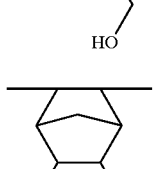

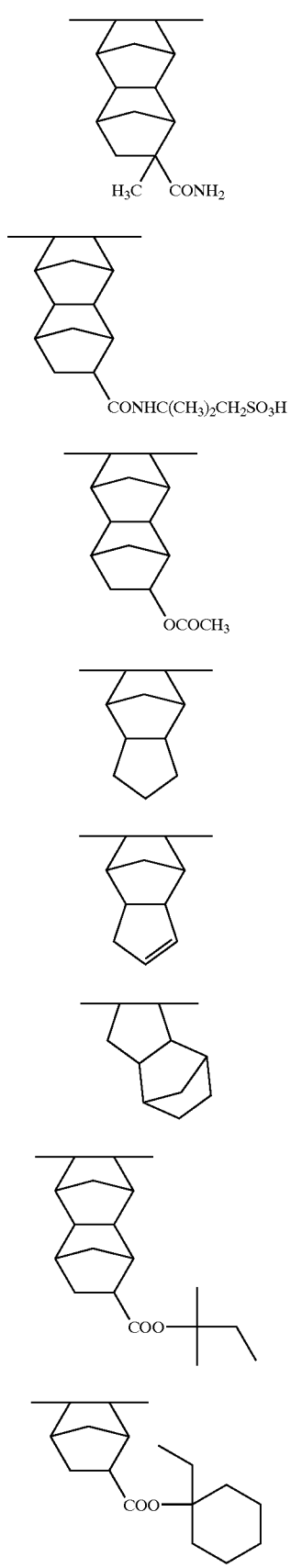
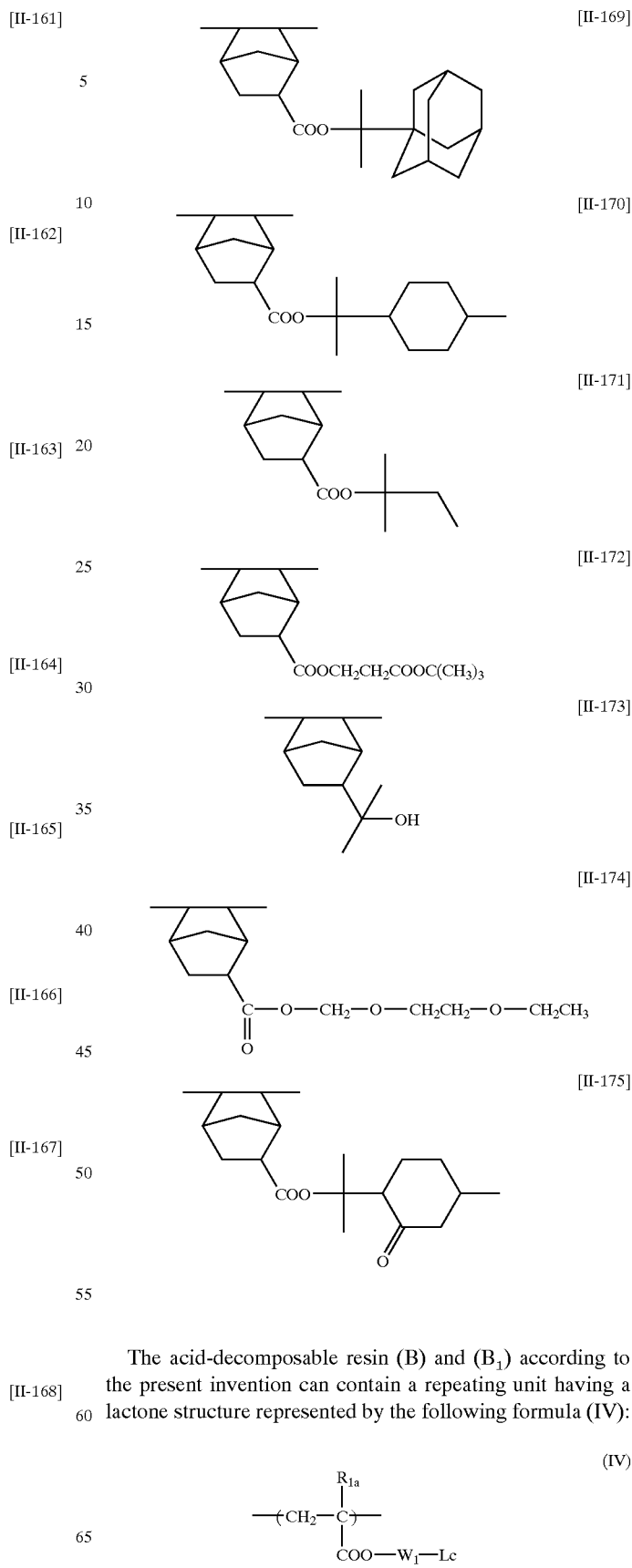
The acid-decomposable resin (B) and (B$_1$) according to the present invention can contain a repeating unit having a lactone structure represented by the following formula (IV):
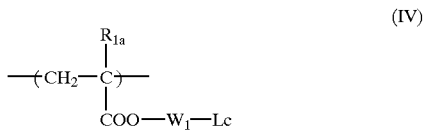

Lc:

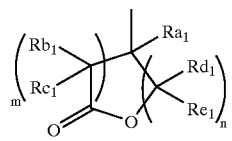

wherein $R_{1a}$ represents a hydrogen atom or a methyl group; $W_1$ represents a group or a combination of two or more groups selected from the group consisting of a single bond, an alkylene group, an ether group, a thioether group, a carbonyl group, and an ester group; $R_{a1}$, $R_{b1}$, $R_{c1}$, $R_{d1}$, and $R_{e1}$ each represents a hydrogen atom or an alkyl group having from 1 to 4 carbon atoms; and m and n each represents an integer of from 0 to 3, and m+n is from 2 to 6.

The examples of the alkyls group having from 1 to 4 carbon atoms represented by $R_{a1}$, $R_{b1}$, $R_{c1}$, $R_{d1}$, and $R_{e1}$ include a methyl group, an ethyl group, a propyl group, an isopropyl group, an n-butyl group, an isobutyl group, a sec-butyl group and a t-butyl group.

The alkylene group represented by $W_1$ in formula (IV) is a group represented by the following formula:

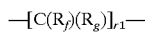

wherein $R_f$ and $R_g$, which may be the same or different, each represents a hydrogen atom, an alkyl group, a substituted alkyl group, a halogen atom, a hydroxyl group or an alkoxyl group. The alkyl group is preferably a lower alkyl group, e.g., a methyl group, an ethyl group, a propyl group, an isopropyl group, or a butyl group, more preferably a methyl group, an ethyl group, a propyl group, or an isopropyl group. The examples of the substituents for the substituted alkyl group include a hydroxyl group, a halogen atom, and an alkoxyl group. The alkoxyl group is an alkoxyl group having from 1 to 4 carbon atoms, e.g., a methoxy group, an ethoxy group, a propoxy group or a butoxy group. The examples of the halogen atoms include a chlorine atom, a bromine atom, a fluorine atom and an iodine atom. $r_1$ represents an integer of from 1 to 10.

The further substituents of the above alkyl group include a carboxyl group, an acyloxy group, a cyano group, an alkyl group, a substituted alkyl group, a halogen atom, a hydroxyl group, an alkoxyl group, a substituted alkoxyl group, an acetylamido group, an alkoxycarbonyl group and an acyl group.

The alkyl group is a lower alkyl group, e.g., a methyl group, an ethyl group, a propyl group, an isopropyl group, a butyl group, a cyclopropyl group, cyclobutyl group or a cyclopentyl group. The examples of the substituents for the substituted alkyl group include a hydroxyl group, a halogen atom, and an alkoxyl group. As the example of the substituted alkoxyl group, an alkoxyl group is exemplified. The alkoxyl group is an alkoxyl group having from 1 to 4 carbon atoms, e.g., a methoxy group, an ethoxy group, a propoxy group or a butoxy group. As the acyloxy group, an acetoxy group can be exemplified. The examples of the halogen atoms include a chlorine atom, a bromine atom, a fluorine atom and an iodine atom.

The specific examples of the monomers corresponding to the repeating structural unit represented by formula (IV) are shown below, however, these compounds should not be construed as limiting the scope of the present invention.

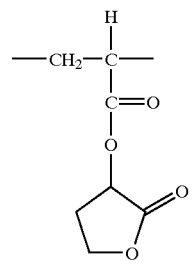

(IV-1)

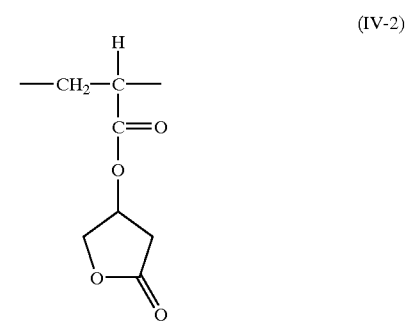

(IV-2)

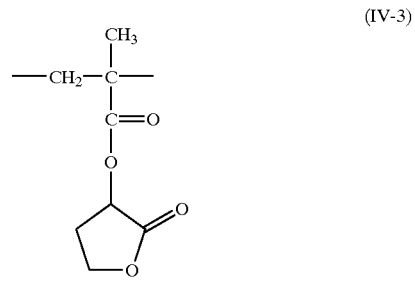

(IV-3)

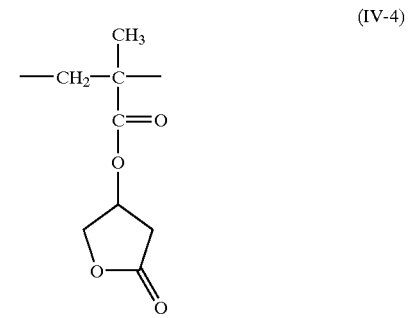

(IV-4)

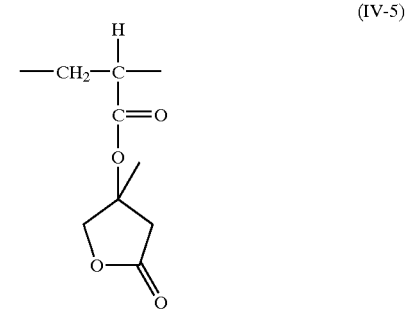

(IV-5)

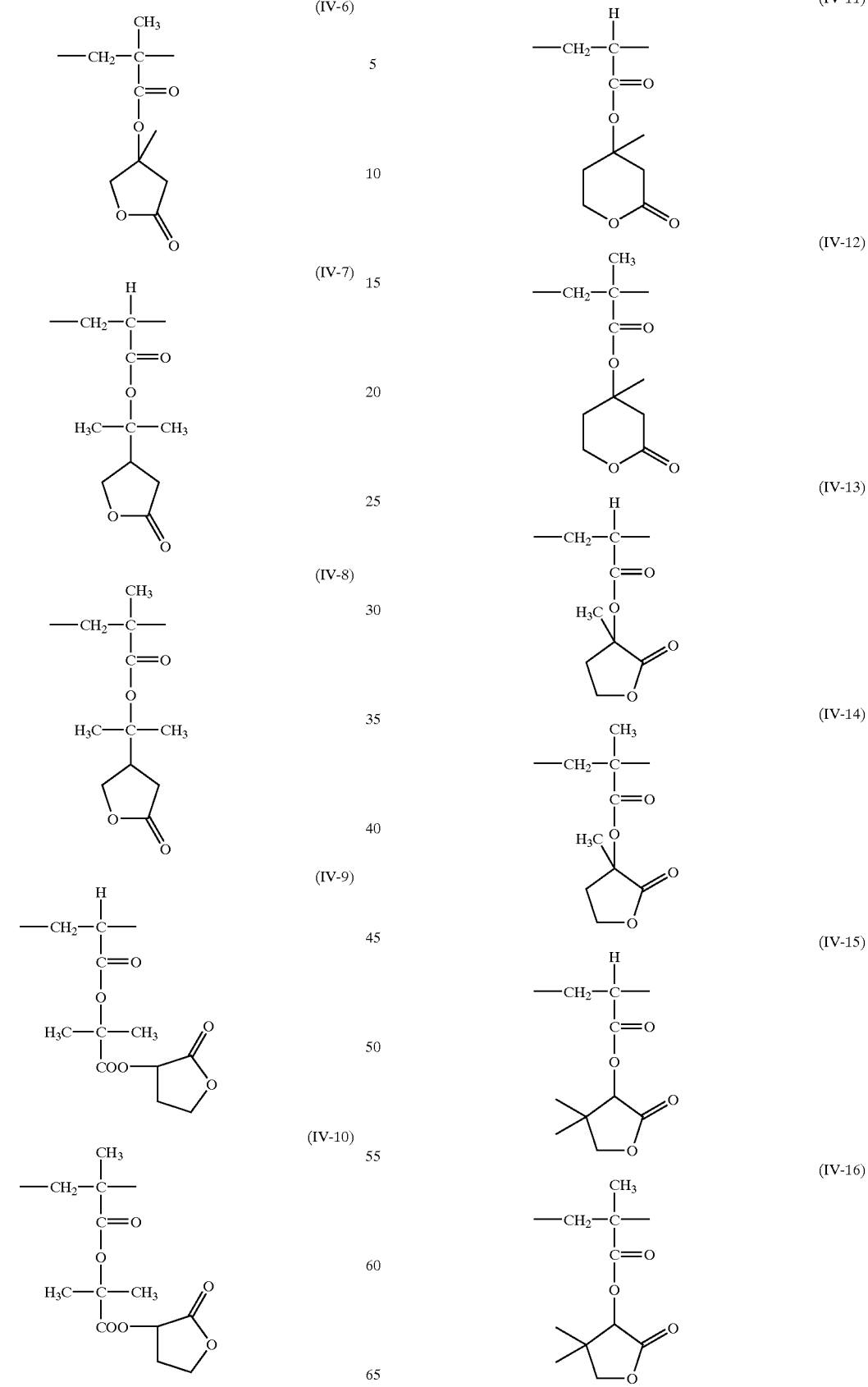

-continued
(IV-17) 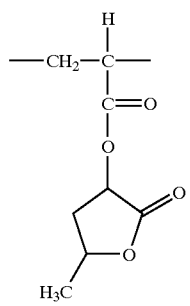
(IV-18) 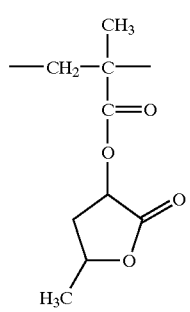
(IV-19) 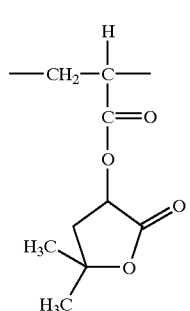
(IV-20) 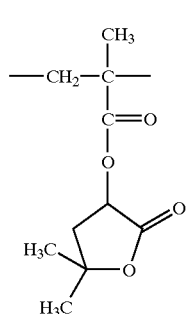
(IV-21) 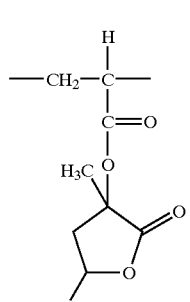
-continued
(IV-22) 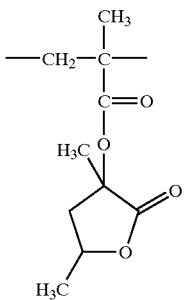
(IV-23) 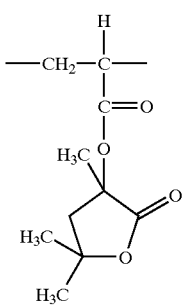
(IV-24) 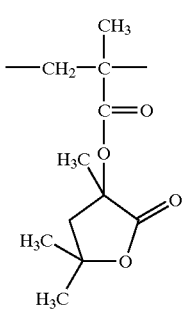
(IV-25) 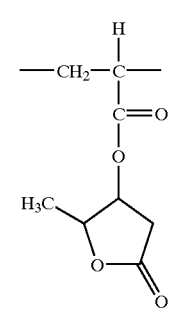
(IV-26) 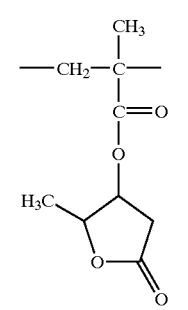

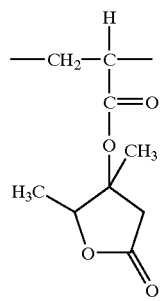
(IV-27)
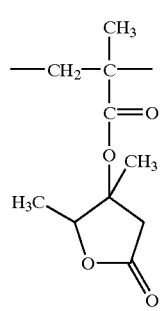
(IV-28)
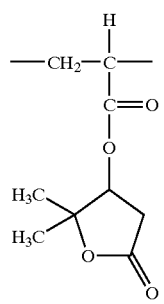
(IV-29)
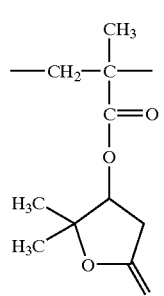
(IV-30)
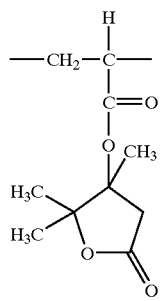
(IV-31)
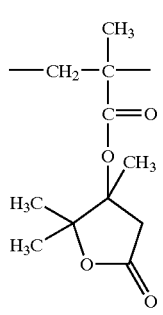
(IV-32)
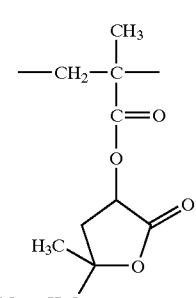
(IV-33)
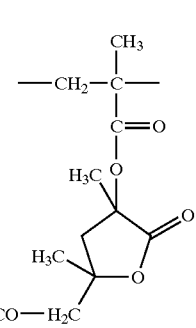
(IV-34)
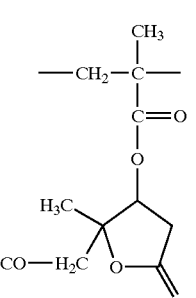
(IV-35)
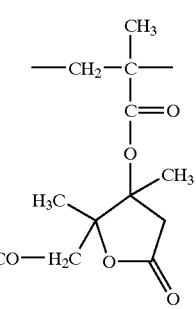
(IV-36)

In the above specific examples of formula (IV), (IV-17) to (IV-36) are preferred from the point of capable of strikingly improving exposure margin.

Further, the structure represented by formula (IV) having an acrylate structure is preferred from the point of capable of improving edge roughness.

The acid-decomposable resin according to the present invention can contain a repeating unit represented by the following formula (VI):

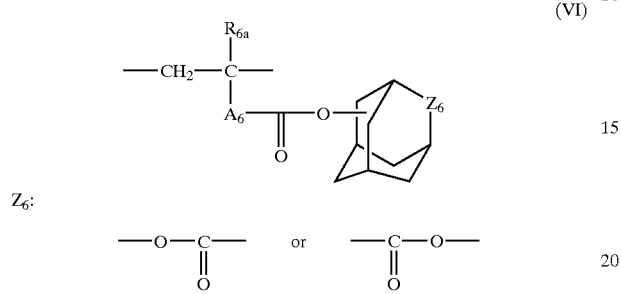
(VI)

$Z_6$:

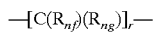

wherein $A_6$ represents one group or a combination of two or more groups selected from the group consisting of a single bond, an alkylene group, a cycloalkylene group, an ether group, a thioether group, a carbonyl group, and an ester group.

$R_{6a}$, represents a hydrogen atom, an alkyl group having from 1 to 4 carbon atoms, a cyano group or a halogen atom.

The alkylene group represented by $A_6$ in formula (VI) is a group represented by the following formula:

—[C($R_{nf}$)($R_{ng}$)]$_r$— wherein $R_{nf}$ and $R_{ng}$, which may be the same or different, each represents a hydrogen atom, an alkyl group, a substituted alkyl group, a halogen atom, a hydroxyl group or an alkoxyl group. The alkyl group is preferably a lower alkyl group, e.g., a methyl group, an ethyl group, a propyl group, an isopropyl group, or a butyl group, more preferably a methyl group, an ethyl group, a propyl group, or an isopropyl group. The examples of the substituents for the substituted alkyl group include a hydroxyl group, a halogen atom, and an alkoxyl group. The alkoxyl group is an alkoxyl group having from 1 to 4 carbon atoms, e.g., a methoxy group, an ethoxy group, a propoxy group or a butoxy group. The examples of the halogen atoms include a chlorine atom, a bromine atom, a fluorine atom and an iodine atom. r represents an integer of from 1 to 10.

In formula (VI), the cycloalkylene group represented by $A_6$ is a cycloalkylene group having from 3 to 10 carbon atoms, e.g., a cyclopentylene group, a cyclohexylene group, or a cyclooctylene group.

The bridge-containing alicyclic ring containing Z may have a substituent. The examples of the substituents include, e.g., a halogen atom, an alkoxyl group (preferably having from 1 to 4 carbon atoms), an alkoxycarbonyl group (preferably having from 1 to 5 carbon atoms), an acyl group (e.g., a formyl group and a benzoyl group), an acyloxy group (e.g., a propylcarbonyloxy group and a benzoyloxy group), an alkyl group (preferably having from 1 to 4 carbon atoms), a carboxyl group, a hydroxyl group, and an alkylsulfonylsulfamoyl group (e.g., —CONHSO$_2$CH$_3$). The alkyl group as the substituent may further be substituted with, e.g., a hydroxyl group, a halogen atom, or an alkoxyl group (preferably having from 1 to 4 carbon atoms).

In formula (VI), the oxygen atom of the ester group bonded to $A_6$ may be bonded anywhere to carbon atoms constituting the bridge-containing alicyclic ring structure containing $Z_6$.

The specific examples of the repeating units represented by formula (VI) are shown below, however, these compounds should not be construed as limiting the scope of the present invention.

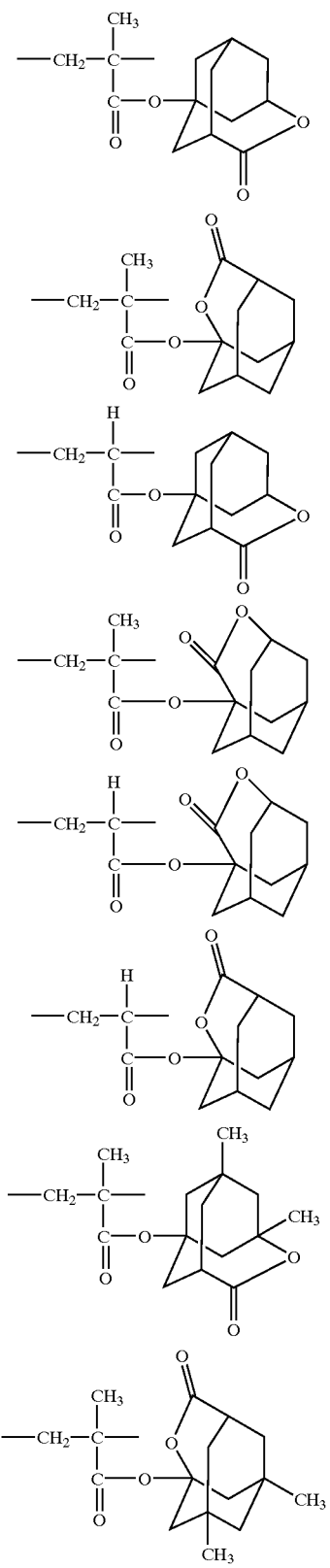

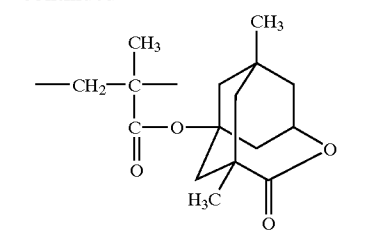
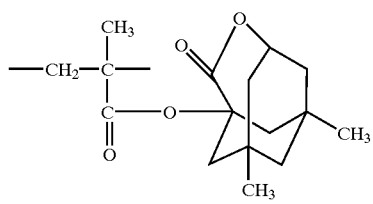
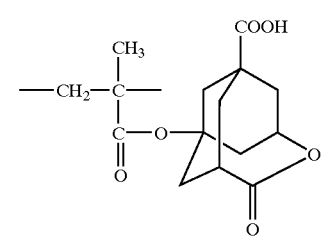
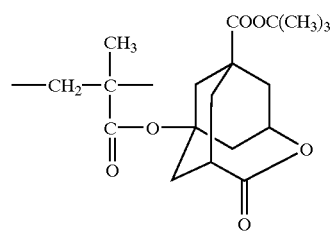
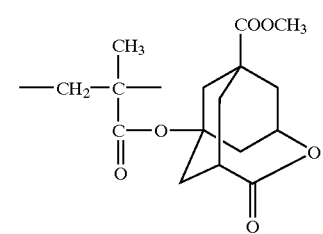
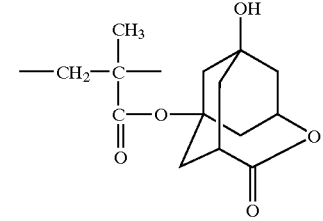
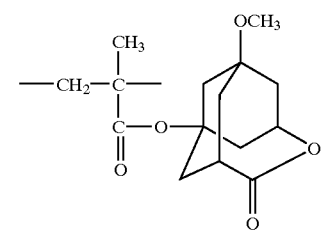

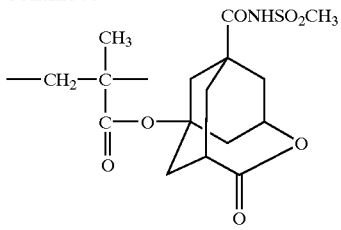

The acid-decomposable resin according to the present invention may further contain a repeating unit having a group represented by the following formula (VII):

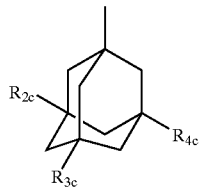

(VII)

wherein $R_{2c}$, $R_{3c}$ and $R_{4c}$ each represents a hydrogen atom or a hydroxyl group, provided that at least one of $R_{2c}$, $R_{3c}$ and $R_{4c}$ represents a hydroxyl group.

The group represented by formula (VII) is preferably dihydroxy product or monohydroxy product, more preferably dihydroxy product.

As the repeating unit having a group represented by formula (VII), a repeating unit represented by formula (II-A) or (II-B) wherein at least one of $R_{13}'$, $R_{14}'$, $R_{15}'$ and $R_{16}'$ has a group represented by formula (VII) (e.g., $R_5$ in —$COOR_5$ is a group represented by formula (V-1), (V-2), (V-3) or (V-4)), or a repeating unit represented by the following formula (AII) can be exemplified.

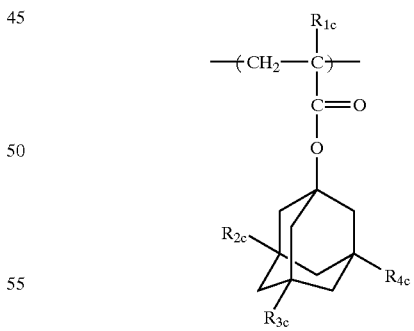

(AII)

wherein $R_{1c}$, represents a hydrogen atom or a methyl group; $R_{2c}$, $R_{3c}$ and $R_{4c}$ each represents a hydrogen atom or a hydroxyl group, provided that at least one of $R_{2c}$, $R_{3c}$ and $R_{4c}$ represents a hydroxyl group.

The specific examples of the repeating units represented by formula (AII) are shown below, however, these compounds should not be construed as limiting the scope of the present invention.

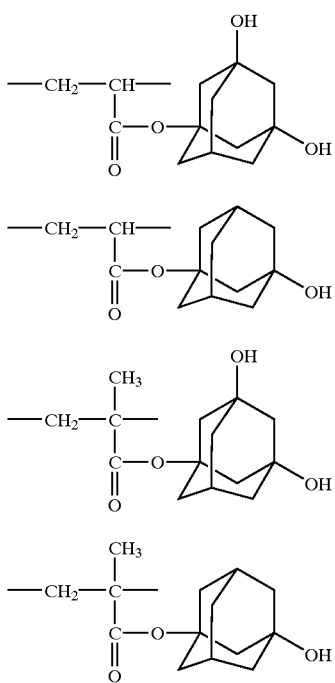

(1)

(2)

(3)

(4)

The acid-decomposable resin according to the present invention may contain a repeating unit having a group represented by the following formula (VIII):

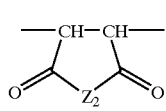

(VIII)

wherein $Z_2$ represents —O— or —N($R_{41}$)—, where $R_{41}$ represents a hydrogen atom, a hydroxyl group, an alkyl group, a haloalkyl group, or —OSO$_2$—$R_{42}$—, and $R_{42}$ represents an alkyl group, a haloalkyl group, a cycloalkyl group or a camphor residue.

In formula (VIII), $Z_2$ represents —O— or —N($R_{41}$)—, where $R_{41}$ represents a hydrogen atom, a hydroxyl group, an alkyl group, a haloalkyl group, or —OSO$_2$—$R_{42}$, and $R_{42}$ represents an alkyl group, a haloalkyl group, a cycloalkyl group or a camphor residue.

The alkyl group represented by $R_{41}$ and $R_{42}$ is preferably a straight chain or branched alkyl group having from 1 to 10 carbon atoms, more preferably a straight chain or branched alkyl group having from 1 to 6 carbon atoms, and still more preferably a methyl group, an ethyl group, a propyl group, an isopropyl group, an n-butyl group, an isobutyl group, a sec-butyl group or a t-butyl group.

The haloalkyl group represented by $R_{41}$ and $R_{42}$ is a trifluoromethyl group, a nanofluorobutyl group, a pentadecafluorooctyl group or a trichloromethyl group. The cycloalkyl group represented by $R_{42}$ is a cyclopentyl group, a cyclohexyl group or a cyclooctyl group.

The alkyl group and haloalkyl group represented by $R_{41}$ and $R_{42}$, and the cycloalkyl group and the camphor residue represented by $R_{42}$ may each have a substituent. The examples of the substituents include, e.g., a hydroxyl group, a carboxyl group, a cyano group, a halogen atom (e.g., chlorine, bromine fluorine and iodine), an alkoxyl group (preferably an alkoxyl group having from 1 to 4 carbon atoms, e.g., methoxy, ethoxy, propoxy and butoxy), an acyl group (preferably an acyl group having from 2 to 5 carbon atoms, e.g., formyl and acetyl), an acyloxy group (preferably an acyloxy group having from 2 to 5 carbon atoms, e.g., acetoxy), and an aryl group (preferably an aryl group having from 6 to 14 carbon atoms, e.g., phenyl).

The specific examples of the repeating units having a group represented by formula (VIII) include the following compounds [I'-1] to [I'-7], however, these compounds should not be construed as limiting the scope of the present invention.

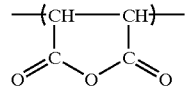

[I'-1]

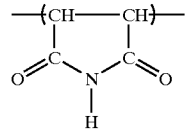

[I'-2]

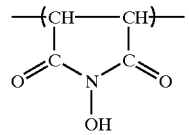

[I'-3]

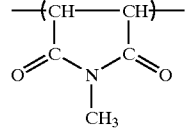

[I'-4]

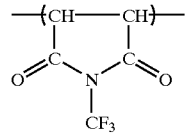

[I'-5]

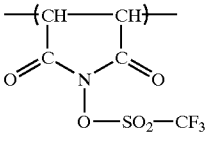

[I'-6]

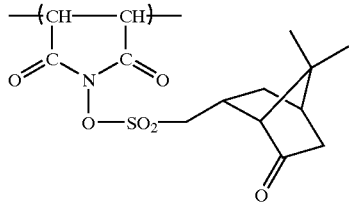

[I'-7]

Acid-decomposable resin components (B) and (B1) can contain various kinds of repeating structural units besides the above-described repeating structural units for the purpose of adjusting dry etching resistance, an aptitude for a standard developing solution, adhesion to a substrate, resist profile, and general characteristics required of the resist, such as resolution, heat resistance and sensitivity.

As such repeating structural units, the repeating structural units corresponding to the monomers shown below can be exemplified but the present invention is not limited thereto.

Due to containing these monomers, it becomes possible to finely adjust the characteristics required of acid-decomposable resin components (B) and (B1), in particular, the following characteristics.
(1) solubility in a coating solvent,
(2) film-forming property (glass transition point),
(3) alkali developability,
(4) film decrease (hydrophilicity/hydrophobicity, selection of alkali-soluble groups),
(5) adhesion to the substrate of an unexposed area, and
(6) dry etching resistance.

As such monomers, compounds having one addition polymerizable unsaturated bond selected from, e.g., acrylic esters, methacrylic esters, acrylamides, methacrylamides, allyl compounds, vinyl ethers and vinyl esters can be exemplified.

Specifically, the following monomers can be exemplified.

Acrylic Esters (Preferably an Alkyl Acrylate, Wherein the Alkyl Group has from 1 to 10 the Carbon Atoms)
methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, and tetrahydrofurfuryl acrylate.

Methacrylic Esters (Preferably an Alkyl Methacrylate, Wherein the Alkyl Group has from 1 to 10 the Carbon Atoms)
methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfurylmethacrylate, and tetrahydrofurfuryl methacrylate.

Acrylamides
acrylamide, N-alkylacrylamide (as the alkyl group, an alkyl group having from 1 to 10 carbon atoms, e.g., methyl, ethyl, propyl, butyl, t-butyl, heptyl, octyl, cyclohexyl, and hydroxyethyl), N,N-dialkylacrylamide (as the alkyl group, an alkyl group having from 1 to 10 carbon atoms, e.g., methyl, ethyl, butyl, isobutyl, ethylhexyl, and cyclohexyl), N-hydroxyethyl-N-methylacrylamide, and N-2-acetamidoethyl-N-acetylacrylamide.

Methacrylamides
methacrylamide, N-alkylmethacrylamide (as the alkyl group, an alkyl group having from 1 to 10 carbon atoms, e.g., methyl, ethyl, t-butyl, ethylhexyl, hydroxyethyl, and cyclohexyl), N,N-dialkylmethacrylamide (as the alkyl group, e.g., ethyl, propyl and butyl), and N-hydroxyethyl-N-methylmethacrylamide.

Allyl Compounds
allyl esters (e.g., allyl acetate, allyl caproate, allyl caprylate, allyl laurate, allyl palmitate, allyl stearate, allyl benzoate, allyl acetoacetate and allyl lactate), and allyloxyethanol.

Vinyl Ethers
alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether).

Vinyl Esters
vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxy acetate, vinyl butoxy acetate, vinyl acetoacetate, vinyl lactate, vinyl-β-phenylbutyrate, and vinyl cyclohexylcarboxylate.

Dialkyl Itaconates
dimethyl itaconate, diethyl itaconate, and dibutyl itaconate.

Dialkyl Esters or Monoalkyl Esters of Fumaric Acid
dibutyl fumarate.

Others
crotonic acid, itaconic acid, maleic anhydride, maleimide, acrylonitrile, methacrylonitrile, and maleylonitrile.

Besides the above compounds, addition polymerizable unsaturated compounds copolymerizable with the monomers corresponding to the above various repeating structural units can be used.

In acid-decomposable resins, the molar ratio of the content of each repeating structural unit can be arbitrarily set for adjusting the dry etching resistance of a resist, an aptitude for a standard developing solution, adhesion to a substrate, resist profile, and general characteristics required of the resist, such as resolution, heat resistance and sensitivity.

As the preferred embodiments of acid-decomposable resin component (B) of the present invention, the following can be exemplified.
(1) Component (B) containing a repeating unit having a partial structure containing an alicyclic hydrocarbon represented by formula (pI), (pII), (pIII), (pIV), (pV) or (pVI) (a side chain type).
(2) Component (B) containing a repeating unit represented by formula (II-AB) (a main chain type). In item (2), the following is further exemplified.
(3) Component (B) containing a repeating unit represented by formula (II-AB), a maleic anhydride derivative and a (meth) acrylate structure (a hybrid type).

The content of the repeating unit having a partial structure containing an alicyclic hydrocarbon represented by formula (pI), (pII), (pIII), (pIV), (pV) or (pVI) in acid-decomposable resin (B) is preferably from 30 to 70 mol % in the entire repeating structural units, more preferably from 35 to 65 mol %, and still more preferably from 40 to 60 mol %.

The content of the repeating unit represented by formula (II-AB) in acid-decomposable resin (B) is preferably from 10 to 60 mol % in the entire repeating structural units, more preferably from 15 to 55 mol %, and still more preferably from 20 to 50 mol %.

The content of the repeating structural units comprising other copolymerizable component monomers in acid-decomposable resin (B) can also be arbitrarily set according to the characteristics of a desired resist, but the content is generally preferably 99 mol % or less of the total mol number of the repeating unit having a partial structure containing an alicyclic hydrocarbon represented by formula (pI), (pII), (pIII), (pIV), (pV) or (pVI) and the repeating unit represented by formula (II-AB), more preferably 90 mol % or less, and still more preferably 80 mol % or less.

When the composition of the present invention is used for ArF exposure, it is preferred that the resin should not contain an aromatic group in view of the transparency to ArF light.

As the preferred embodiments of acid-decomposable resin component (B1) of the present invention, the following can be exemplified.
(1) Component (B1) containing a repeating unit having a group represented by formula (V-1), (V-2), (V-3) or (V-4) and a repeating unit having a partial structure containing an alicyclic hydrocarbon represented by formula (pI), (pII), (pIII), (pIV), (pV) or (pVI) (a side chain type).

(2) Component (B1) containing a repeating unit having a group represented by formula (V-1), (V-2), (V-3) or (V-4) and a repeating unit represented by formula (II-AB) (a main chain type). In item (2), the following is further exemplified.

(3) Component (B1) containing a repeating unit represented by formula (II-AB), a maleic anhydride derivative, and a repeating unit having a group represented by formula (V-1), (V-2), (V-3) or (V-4) (a hybrid type).

The content of the repeating unit having a group represented by formula (V-1), (V-2), (V-3) or (V-4) in acid-decomposable resin (B1) is preferably from 2 to 50 mol % in the entire repeating structural units, more preferably from 5 to 40 mol %, and still more preferably from 10 to 30 mol %.

The content of the repeating unit having a partial structure containing an alicyclic hydrocarbon represented by formula (pI), (pII), (pIII), (pIV), (pV) or (pVI) in acid-decomposable resin (B1) is preferably from 30 to 70 mol % in the entire repeating structural units, more preferably from 35 to 65 mol %, and still more preferably from 40 to 60 mol %.

The content of the repeating unit represented by formula (II-AB) in acid-decomposable resin (B1) is preferably from 10 to 60 mol % in the entire repeating structural units, more preferably from 15 to 55 mol %, and still more preferably from 20 to 50 mol %.

The content of the repeating structural units comprising other copolymerizable component monomers in acid-decomposable resin (B1) can also be arbitrarily set according to the characteristics of a desired resist, but the content is generally preferably 99 mol % or less of the total mol number of the repeating unit having a group represented by formula (V-1), (V-2), (V-3) or (V-4), a partial structure containing an alicyclic hydrocarbon represented by formula (pI), (pII), (pIII), (pIV), (pV) or (pVI) and the repeating unit represented by formula (II-AB), more preferably 90 mol % or less, and still more preferably 80 mol % or less.

Acid-decomposable resin components (B) and (B1) for use in the present invention can be synthesized according to ordinary methods (e.g., radical polymerization). In general synthesis methods, monomer seeds are fed to a reaction vessel in one lot or in the course of reaction, uniformly dissolved in a reaction solvent, according to necessity, e.g., ethers such as tetrahydrofuran, 1,4-dioxane or diisopropyl ether, ketones such as methyl ethyl ketone or methyl isobutyl ketone, an ester solvent such as ethyl acetate, further in the later described solvent for dissolving the composition of the present invention, e.g., propylene glycol monomethyl ether acetate, heated under inert gas atmosphere of nitrogen or argon, according to necessity, and polymerization is initiated using a commercially available radical polymerization initiator (e.g., an azo-based initiator or peroxide) If necessary, the initiator is additionally added or added in parts, the polymer is put into a solvent after termination of the reaction, and the desired polymer is recovered by methods of, e.g., powder recovery or solid recovery. The reaction concentration is 20 wt % or more, preferably 30 wt % or more, and more preferably 40 wt % or more. The reaction temperature is from 10 to 150° C., preferably from 30 to 120° C., and more preferably from 50 to 100° C.

The weight average molecular weight of the resin according to the present invention is preferably from 1,000 to 200,000 measured by a GPC method and calculated in terms of polystyrene. When the weight average molecular weight is less than 1,000, heat resistance and dry etching resistance are disadvantageously deteriorated, while when it exceeds 200,000, developability is deteriorated and viscosity becomes extremely high, which results in lowering of film-forming property.

In the positive photosensitive composition according to the present invention, the proportion of all the acid-decomposable resins in the entire composition is preferably from 40 to 99.99 wt % based on the entire solid content of the resist, more preferably from 50 to 99.97 wt %.

(C) Basic Compound

The positive photosensitive composition in the first embodiment of the present invention contains (C) a basic compound.

It is preferred for the positive photosensitive composition in the second embodiment of the present invention to contain (C) a basic compound for reducing the fluctuation of performances due to aging during the time from exposure to heating.

As the preferred basic compound, the compound having the structure represented by formula (A), (B), (C), (D) or (E) can be exemplified:

(A)

wherein $R^{250}$, $R^{251}$ and $R^{252}$ each represents a hydrogen atom, an alkyl group having from 1 to 6 carbon atoms, an alkylamino group having from 1 to 6 carbon atoms, a hydroxyalkyl group having from 1 to 6 carbon atoms, or a substituted or unsubstituted aryl group having from 6 to 20 carbon atoms, and $R^{251}$ and $R^{252}$ may be bonded to each other to form a ring.

(B)

(C)

(D)

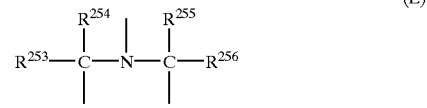

(E)

wherein $R^{253}$, $R^{254}$, $R^{255}$ and $R^{256}$ each represents an alkyl group having from 1 to 6 carbon atoms.

The preferred specific examples of the basic compounds include substituted or unsubstituted guanidine, substituted or unsubstituted aminopyridine, substituted or unsubstituted aminoalkylpyridine, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, substituted or unsubstituted aminoalkylmorpholine, mono-, di- or trialkylamine, a substituted or unsubstituted aniline, substituted or unsubstituted piperidine, and mono- or diethanolamine. The preferred substituents include an amino group, an aminoalkyl group, an alkylamino group, an aminoaryl group, an arylamino group, an alkyl group, an alkoxyl group, an acyl group, an acyloxy group, an aryl group, an aryloxy group, a nitro group, a hydroxyl group and a cyano group.

The specific examples of the preferred basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diamonopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]nona-5-ene, 1,8-diazabicyclo[5.4.0] undeca-7-ene, 2,4,5-triphenylimidazole, tri(n-butyl)amine, tri(n-octyl)amine, N-phenyldiethanolamine, N-hydroxyethylpiperidine, 2,6-diisopropylaniline, and N-cyclohexyl-N'-morpholinoethylthiourea, but the present invention is not limited thereto.

The further preferred compounds include substituted or unsubstituted guanidine, substituted or unsubstituted aminopyrrolidine, substituted or unsubstituted pyrazole, substituted or unsubstituted pyrazoline, substituted or unsubstituted piperazine, substituted or unsubstituted aminomorpholine, substituted or unsubstituted aminoalkylmorpholine, substituted or unsubstituted piperidine, and further, compounds having an imidazole structure, adiazabicyclo structure, an onium hydroxide structure, an onium carboxylate structure, and an aniline structure.

As the compound having an imidazole structure, 2,4,5-triphenylimidazole and benzimidazole can be exemplified. As the compound having a diazabicyclo structure, 1,4-biazabicyclo[2.2.2]octane, 1,5-diazabicyclo[4.3.0]nona-5-ene, and 1,8-diazabicyclo[5.4.0]undeca-7-ene can be exemplified. As the compound having an onium hydroxide structure, triarylsulfonium hydroxide, phenacylsulfonium hydroxide, sulfonium hydroxide having a 2-oxoalkyl group, specifically, triphenylsulfonium hydroxide, tris(t-butylphenyl)sulfonium hydroxide, bis(t-butylphenyl) iodonium hydroxide, phenacylthiophenium hydroxide, and 2-oxopropylthiophenium hydroxide can be exemplified. As the compound having an onium carboxylate structure, the compound having an onium hydroxide structure wherein the anion moiety is replaced with carboxylate, e.g., acetate, adamantane-1-carboxylate, and perfluoroalkyl carboxylate can be exemplified. As the compound having an aniline structure, 2,6-diisopropylaniline and N,N-dimethylaniline can be exemplified. However, these compounds should not be construed as limiting the scope of the present invention.

These basic compounds (C) can be used alone or in combination of two or more. The addition amount of the basic compound (C) is generally from 0.001 to 10 wt %, preferably from 0.01 to 5 wt %, based on the solid content of the photosensitive resin composition. If the content is less than 0.001 wt %, the effect of the addition of the compound cannot be obtained. On the other hand, if it exceeds 10 wt %, the sensitivity lowers and the developing property of the non-exposed area are liable to be deteriorated.

(D) Surfactant Containing at Least One of a Fluorine Atom and a Silicon Atom

The positive photosensitive composition in the first embodiment of the present invention contains either any one, or two or more, of fluorine- and/or silicon-containing surfactant (a fluorine-containing surfactant and a silicon-containing surfactant, a surfactant containing both a fluorine atom and a silicon atom). It is preferred for the positive photosensitive composition in the second embodiment of the present invention to contain component (D).

When the positive photosensitive composition of the present invention contains surfactant component (D), a resist pattern excellent in sensitivity, resolution, adhering property, and free of development defect can be obtained with the exposure light sources of 250 nm or less, in particular 220 nm or less.

Surfactants disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, U.S. Pat. Nos. 5,405,720, 5,360,692, 5,529,881, 5,296,330, 5,436,098, 5,576,143, 5,294,511, and 5,824,451 can be used as surfactant component (D). The following commercially available surfactants can also be used as they are.

As the commercially available surfactants which can be used in the present invention, fluorine-based surfactants and silicon-based surfactants, e.g., Eftop EF301 and EF303 (manufactured by Shin-Akita Chemical Co., Ltd.), Florad FC430 and FC431 (manufactured by Sumitomo 3M Co., Limited), Megafac F171, F173, F176, F189 and RO8 (manufactured by Dainippon Chemicals and Ink, Co., Ltd.), Sarfron S-382, SC101, SC102, SC103, SC104, SC105 and SC106 (manufactured by Asahi Glass Co., Ltd.), and Troy Sol S-366 (manufactured by Troy Chemical Inc.) can be exemplified. Polysiloxane polymer KP-341 (manufactured by Shin-Etsu Chemical Co., Ltd.) can also be used as the silicon-based surfactant.

The proportion of surfactants (D) is preferably from 0.0001 to 2 wt % based on the entire positive photosensitive composition (exclusive of solvents), more preferably from 0.001 to 1 wt %.

(E) Organic Solvent

The photosensitive composition according to the present invention is generally dissolved in a prescribed organic solvent. The examples of the solvents usable in the present invention include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxy propionate, ethyl ethoxy propionate, methyl pyruvate, ethyl pyruvate, propyl pyruvate, N,N-dimethylformamide, dimethyl sulfoxide, N-methylpyrrolidone, and tetrahydrofuran.

In the first embodiment of the present invention, it is preferred to use a mixed solvent comprising a solvent containing a hydroxyl group in the structure and a solvent not containing a hydroxyl group, by which the generation of particles during storage of the resist solution can be reduced.

The examples of the solvents containing a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate, of these solvents, propylene glycol monomethyl ether and ethyl lactate are particularly preferred.

The examples of the solvents not containing a hydroxyl group include propylene glycol monomethyl ether acetate, ethyl ethoxy propionate, 2-heptanone, γ-butyrolactone, cyclohexanone, butyl acetate, N-methylpyrrolidone, N,N-dimethylacetamide, and dimethyl sulfoxide, of these solvents, propylene glycol monomethyl ether acetate, ethyl ethoxy propionate, 2-heptanone, γ-butyrolactone, cyclohexanone and butyl acetate are particularly preferred, and propylene glycol monomethyl ether acetate, ethyl ethoxy propionate and 2-heptanone are most preferred.

The mixing ratio of the solvent containing a hydroxyl group and the solvent not containing a hydroxyl group (by weight) is generally from 1/99 to 99/1, preferably from 10/90 to 90/10, and more preferably from 20/80 to 60/40. A mixed solvent comprising 50 wt % or more of the solvent not containing a hydroxyl group is particularly preferred in the light of the coating uniformity.

It is preferred for the photosensitive composition in the second embodiment of the present invention to contain a mixed solvent as component (E). As such a mixed solvent, a mixed solvent comprising at least one propylene glycol monoalkyl ether acylate (solvent of group A), at least one of propylene glycol monoalkyl ether, alkyl lactate and alkyl alkoxypropionate (solvent of group B), and/or γ-butyrolactone, ethylene carbonate and propylene carbonate (solvent of group C) can be exemplified.

That is, as component (E), a combination of solvent of group A and solvent of group B, a combination of solvent of group A and solvent of group C, and a combination of solvent of group A, solvent of group B, and solvent of group C are used. When a combination of solvent of group A and solvent of group B is used, sensitivity in resolution of contact hole is excellent, and the generation of particles in a resist solution at initial stage can be improved. By using a combination of solvent of group A and solvent of group C, the increase of particles with the lapse of time in a resist solution and the fluctuation in sensitivity can be exhibited, thus a resist excellent in aging stability can be obtained.

The preferred examples of propylene glycol monoalkyl ether acylate include propylene glycol monomethyl ether acetate, propylene glycol monomethyl ether propionate, propylene glycol monoethyl ether acetate, and propylene glycol monoethyl ether propionate.

The preferred examples of propylene glycol monoalkyl ether include propylene glycol monomethyl ether and propylene glycol monoethyl ether. The preferred examples of alkyl lactate include methyl lactate and ethyl lactate. The preferred examples of alkyl alkoxypropionate include ethyl 3-ethoxypropionate, methyl 3-methoxypropionate, ethyl 3-methoxypropionate and methyl 3-ethoxypropionate.

The weight ratio of solvent of group A and solvent of group B (A/B) is preferably from 90/10 to 15/85, more preferably from 85/15 to 20/80, and still more preferably from 80/20 to 25/75.

The weight ratio of solvent of group A and solvent of group C (A/C) is preferably from 99.9/0.1 to 75/25, more preferably from 99/1 to 80/20, and still more preferably from 97/3 to 85/15.

When these three kinds of solvents are combined, the proportion of the use amount of solvent of group C is preferably from 0.1 to 25 wt % based on the use amount of all the solvents, more preferably from 1 to 20 wt %, and still more preferably from 3 to 17 wt %.

The solid contents of the resist composition containing the above each component are dissolved in the above mixed solvent in concentration of solid contents of preferably from 3 to 25 wt %, more preferably from 5 to 22 wt %, and still more preferably from 7 to 20 wt %.

The preferred combinations of mixed solvents containing propylene glycol monoalkyl ether acylate in the present invention are shown below.

Propylene glycol monomethyl ether acetate and propylene glycol monomethyl ether, Propylene glycol monomethyl ether acetate and ethyl lactate, Propylene glycol monomethyl ether acetate and 3-ethoxyethyl propionate, Propylene glycol monomethyl ether acetate and γ-butyrolactone, Propylene glycol monomethyl ether acetate and ethylene carbonate, Propylene glycol monomethyl ether acetate and propylene carbonate, Propylene glycol monomethyl ether acetate, propylene glycol monomethyl ether, and γ-butyrolactone, Propylene glycol monomethyl ether acetate, ethyl lactate, and γ-butyrolactone, Propylene glycol monomethyl ether acetate, 3-ethoxyethyl propionate, and γ-butyrolactone, Propylene glycol monomethyl ether acetate, propylene glycol monomethyl ether, and ethylene carbonate, Propylene glycol monomethyl ether acetate, ethyl lactate, and ethylene carbonate, Propylene glycol monomethyl ether acetate, 3-ethoxyethyl propionate, and ethylene carbonate, Propylene glycol monomethyl ether acetate, propylene glycol monomethyl ether, and propylene carbonate, Propylene glycol monomethyl ether acetate, ethyl lactate, and propylene carbonate, and Propylene glycol monomethyl ether acetate, 3-ethoxyethyl propionate, and propylene carbonate.

Of the above combinations, particularly preferred combinations are:

Propylene glycol monomethyl ether acetate, propylene glycol monomethyl ether, and γ-butyrolactone, Propylene glycol monomethyl ether acetate, ethyl lactate, and γ-butyrolactone, Propylene glycol monomethyl ether acetate, 3-ethoxyethyl propionate, and γ-butyrolactone, Propylene glycol monomethyl ether acetate, propylene glycol monomethyl ether, and ethylene carbonate, Propylene glycol monomethyl ether acetate, ethyl lactate, and ethylene carbonate, Propylene glycol monomethyl ether acetate, 3-ethoxyethyl propionate, and ethylene carbonate, Propylene glycol monomethyl ether acetate, propylene glycol monomethyl ether, and propylene carbonate, Propylene glycol monomethyl ether acetate, ethyl lactate, and propylene carbonate, and Propylene glycol monomethyl ether acetate, 3-ethoxyethyl propionate, and propylene carbonate.

As component (E) of the present invention, a mixed solvent comprising at least one alkyl lactate (solvent (1)) and at least one of an ester solvent and alkyl alkoxypropionate (solvent (2)) can be used. By the addition of solvent (2) to solvent (1), sensitivity in resolution of contact hole is excellent, and the generation of particles in a resist solution at initial stage can be improved. Methyl lactate and ethyl lactate can be exemplified as the alkyl lactate.

The examples of the ester solvents include butyl acetate, pentyl acetate, hexyl acetate and butyl propionate, and butyl acetate is more preferably used. The examples of the alkyl alkoxypropionates include ethyl 3-ethoxypropionate, methyl 3-methoxypropionate, ethyl 3-methoxypropionate and methyl 3-ethoxypropionate.

The proportion of solvent (1) to solvent (2) [(1)/(2)] is preferably from 90/10 to 15/85, more preferably from 85/15 to 20/80, and still more preferably from 80/20 to 25/75.

In the present invention, it is preferred that mixed solvent (E) further comprises at least one of γ-butyrolactone, ethylene carbonate, and propylene carbonate (solvent (3)). By the addition of solvent (3), the increase of particles with the lapse of time in a resist solution and the fluctuation in sensitivity can be exhibited, thus a resist excellent in aging stability can be obtained.

The proportion of the use amount of solvent (3) is preferably from 0.1 to 25 wt % based on the use amount of all the solvents, more preferably from 1 to 20 wt %, and still more preferably from 3 to 15 wt %.

The solid contents of the resist composition containing the above each component are dissolved in the above mixed solvent in concentration of solid contents of preferably from 3 to 25 wt %, more preferably from 5 to 22 wt %, and still more preferably from 7 to 20 wt %.

The preferred combinations of mixed solvents containing alkyl lactate in the present invention are shown below.

Ethyl lactate and butyl acetate,
Ethyl lactate, butyl acetate and γ-butyrolactone,
Ethyl lactate, butyl acetate and ethylene carbonate,
Ethyl lactate, butyl acetate and propylene carbonate,
Ethyl lactate, ethyl 3-ethoxypropionate and γ-butyrolactone,
Ethyl lactate, ethyl 3-ethoxypropionate and ethylene carbonate, and
Ethyl lactate, ethyl 3-ethoxypropionate and propylene carbonate.

Of the above combinations, particularly preferred combinations are:

Ethyl lactate, butyl acetate and γ-butyrolactone,
Ethyl lactate, butyl acetate and ethylene carbonate,
Ethyl lactate, butyl acetate and propylene carbonate,
Ethyl lactate, ethyl 3-ethoxypropionate and γ-butyrolactone,
Ethyl lactate, ethyl 3-ethoxypropionate and ethylene carbonate, and
Ethyl lactate, ethyl 3-ethoxypropionate and propylene carbonate.

Further, as component (E) of the present invention, a mixed solvent comprising at least one heptanone (solvent of group D), at least one of propylene glycol monoalkyl ether, alkyl lactate and alkyl alkoxypropionate (solvent of group E), and/or γ-butyrolactone, ethylene carbonate and propylene carbonate (solvent of group F) can be used.

That is, as component (E), a combination of solvent of group D and solvent of group E, a combination of solvent of group D and solvent of group F, and a combination of solvent of group E, solvent of group E, and solvent of group F are used.

When a combination of solvent of group D and solvent of group E is used, sensitivity in resolution of contact hole is excellent, and the generation of particles in a resist solution at initial stage can be improved. By using a combination of solvent of group D and solvent of group F, the increase of particles with the lapse of time in a resist solution and the fluctuation in sensitivity can be exhibited, thus a resist excellent in aging stability can be obtained.

The examples of heptanones include 2-heptanone, 3-heptanone and 4-heptanone, preferably 2-heptanone.

The preferred examples of propylene glycol monoalkyl ether include propylene glycol monomethyl ether and propylene glycol monoethyl ether. The preferred examples of alkyl lactate include methyl lactate and ethyl lactate. The preferred examples of alkyl alkoxypropionate include ethyl 3-ethoxypropionate, methyl 3-methoxypropionate, ethyl 3-methoxypropionate and methyl 3-ethoxypropionate.

The weight ratio of solvent of group D and solvent of group E (D/E) is preferably from 90/10 to 15/85, more preferably from 85/15 to 20/80, and still more preferably from 80/20 to 25/75.

The weight ratio of solvent of group D and solvent of group F (D/F) is preferably from 99.9/0.1 to 75/25, more preferably from 99/1 to 80/20, and still more preferably from 97/3 to 85/15.

When these three kinds of solvents are combined, the proportion of the use amount of solvent of group F is preferably from 0.1 to 25 wt % based on the use amount of all the solvents, more preferably from 1 to 20 wt %, and still more preferably from 3 to 17 wt %.

The solid contents of the resist composition containing the above each component are dissolved in the above mixed solvent in concentration of solid contents of preferably from 3 to 25 wt %, more preferably from 5 to 22 wt %, and still more preferably from 7 to 20 wt %.

The preferred combinations of mixed solvents containing heptanone in the present invention are shown below.

2-Heptanone and propylene glycol monomethyl ether,
2-Heptanone and ethyl lactate,
2-Heptanone and ethyl 3-ethoxypropionate,
2-Heptanone and γ-butyrolactone,
2-Heptanone and ethylene carbonate,
2-Heptanone and propylene carbonate,
2-Heptanone, propylene glycol monomethyl ether and γ-butyrolactone,
2-Heptanone, ethyl lactate and γ-butyrolactone,
2-Heptanone, ethyl 3-ethoxypropionate and γ-butyrolactone,
2-Heptanone, propylene glycol monomethyl ether and ethylene carbonate,
2-Heptanone, ethyl lactate and ethylene carbonate,
2-Heptanone, ethyl 3-ethoxypropionate and ethylene carbonate,
2-Heptanone, propylene glycol monomethyl ether and propylene carbonate,
2-Heptanone, ethyl lactate and propylene carbonate, and
2-Heptanone, ethyl 3-ethoxypropionate and propylene carbonate.

Of the above combinations, particularly preferred combinations are:

2-Heptanone, propylene glycol monomethyl ether and γ-butyrolactone,
2-Heptanone, ethyl lactate and γ-butyrolactone,
2-Heptanone, ethyl 3-ethoxypropionate and γ-butyrolactone,
2-Heptanone, propylene glycol monomethyl ether and ethylene carbonate,
2-Heptanone, ethyl lactate and ethylene carbonate,
2-Heptanone, ethyl 3-ethoxypropionate and ethylene carbonate,
2-Heptanone, propylene glycol monomethyl ether and propylene carbonate,
2-Heptanone, ethyl lactate and propylene carbonate, and
2-Heptanone, ethyl 3-ethoxypropionate and propylene carbonate.

Other solvents not essential may be added to these mixed solvents of the present invention insofar as they do not hinder the effect of the present invention. In general, such other solvents are added in an amount of 30 weight parts or less per 100 weight parts of each mixed solvent. As other solvents, ethylene dichloride, cyclohexanone, cyclopentanone, methyl ethyl ketone, toluene, N,N-dimethylformamide, dimethyl sulfoxide, N-methylpyrrolidone and tetrahydrofuran can be exemplified in addition to the solvents described as the essential solvents to the above each mixed solvent.

(F) Acid-decomposable Dissolution-inhibiting Compound

It is preferred that the positive photosensitive composition of the present invention contains (F) a low molecular weight dissolution-inhibiting compound having a molecular weight of 3,000 or less which has a group capable of decomposing by the action of an acid to increase the solubility in an alkali developer (hereinafter also referred to as "acid-decomposable dissolution-inhibiting compound").

For the purpose of not reducing the permeability of light of 220 nm or less, alicyclic or aliphatic compounds such as cholic acid derivatives containing an acid-decomposable group as described in *Proceeding of SPIE*, Vol. 2724, page 355 (1996) are preferred as the acid-decomposable dissolution-inhibiting compound (F). The same acid-decomposable groups and alicyclic structures as described above in the acid-decomposable resin can be exemplified.

The addition amount of the acid-decomposable dissolution-inhibiting compound (F) is preferably from 3 to 50 wt %, more preferably from 5 to 40 wt %, based on the solid contents of the entire composition of the positive photosensitive composition.

The specific examples of the acid-decomposable dissolution-inhibiting compound (F) are shown below, however, the present invention is not limited thereto.

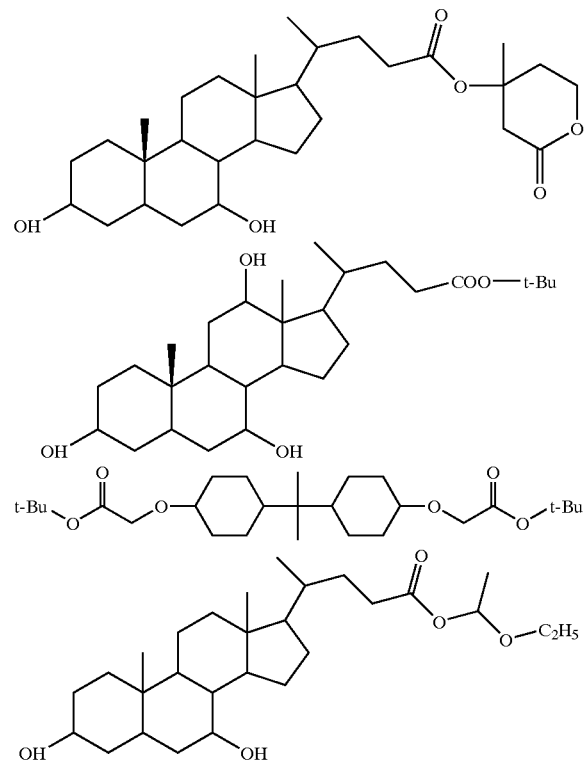

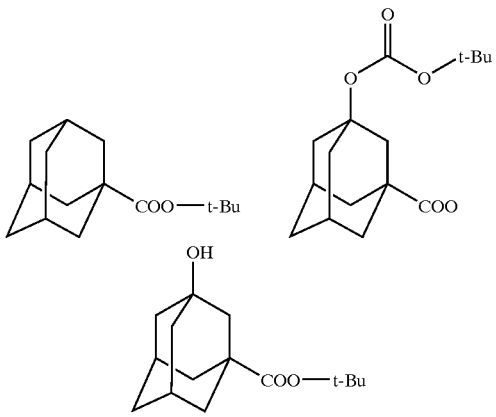

(G) Alkali-Soluble Resin

The positive photosensitive composition of the present invention can contain (G) a resin insoluble in water and soluble in an alkali developer not containing an acid-decomposable group, by which the sensitivity is improved.

Novolak resins having a molecular weight of from 1,000 to 20,000 or so, and polyhydroxystyrene having a molecular weight of from 3,000 to 50,000 or so can be used as such a resin, but since they have large absorption to the light of 250 nm or less, it is preferred to use them after being partially hydrogenated or in an amount of 30 wt % or less of the entire amount of the resins.

Resins having a carboxyl group as an alkali-soluble group can also be used. It is preferred that the resins containing a carboxyl group should contain a monocyclic or polycyclic alicyclic hydrocarbon group for the purpose of improving dry etching resistance. Specifically, copolymers of methacrylic ester having an alicyclic hydrocarbon structure not showing acid decomposability and (meth)acrylic acid, and resins of (meth)acrylic ester of alicyclic hydrocarbon group having carboxyl groups at terminals can be exemplified.

Other Additives

The positive photosensitive composition of the present invention can contain, if necessary, dyes, plasticizers, surfactants other than component (D), photo-sensitizers and compounds which accelerate solubility in a developing solution.

Compounds which accelerate solubility in a developing solution for use in the present invention are low molecular weight compounds having two or more phenolic OH groups or one or more carboxyl group(s) and molecular weight of 1,000 or less. When compounds having a carboxyl group is used, they are preferably alicyclic or aliphatic compounds for the same reason as described above.

The preferred addition amount of these solubility-accelerating compounds is preferably from 2 to 50 wt % based on (B) a resin capable of decomposing by the action of an acid to increase the solubility in an alkali developer, more preferably from 5 to 30 wt %. When the amount exceeds 50 wt %, development scum is deteriorated, and pattern deformation is caused at development.

Such a phenol compound having molecular weight of 1,000 or less can be easily synthesized with referring to the methods disclosed, e.g., in JP-A-4-122938, JP-A-2-28531, U.S. Pat. No. 4,916,210, and EP 219294.

The examples of alicyclic or aliphatic compounds having a carboxyl group include carboxylic acid derivatives having a steroid structure such as cholic acid, deoxycholic acid and lithocholic acid, adamantane carboxylic acid derivatives, adamantane dicarboxylic acid, cyclohexanecarboxylic acid, and cyclohexanedicarboxylic acid, but the present invention is not limited thereto.

Surfactants other than the component (D) a fluorine-containing surfactant and/or a silicon-containing surfactant can also be added to the photosensitive composition according to the present invention. The specific examples of the surfactants usable in the present invention include nonionic surfactants such as polyoxyethylene alkyl ethers (e.g., polyoxyethylene lauryl ether, polyoxyethylene stearyl ether, polyoxyethylene cetyl ether and polyoxyethylene oleyl ether), polyoxyethylene alkylaryl ethers (e.g., polyoxyethylene octylphenol ether and polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate and sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate).

These surfactants may be used alone or in combination of two or more thereof.

Use Method

The positive photosensitive composition of the present invention is coated on a substrate to form a thin film. The thickness of the film is preferably from 0.2 to 1.2 μm.

Inorganic substrates which can be used in the present invention include ordinary Bare Si substrate, SOG substrate, and the substrates having an anti-reflection coating described below.

If necessary, commercially available inorganic or organic anti-reflection coatings can be used in the present invention.

As the anti-reflection coating, inorganic coating types, e.g., titanium, titanium dioxide, titanium nitride, chromium oxide, carbon, and α-silicon, and organic coating types comprised of a light-absorbing agent and a polymer material can be used. The former requires a film-forming apparatus, such as a vacuum deposition apparatus, a CVD apparatus or a sputtering apparatus. As the organic anti-reflection coating, e.g., an anti-reflection coating comprising the condensation product of a diphenylamine derivative and a formaldehyde-modified melamine resin, an alkali-soluble resin and a light-absorbing agent disclosed in JP-B-7-69611 (the term "JP-B" as used herein means an "examined Japanese patent publication"), a reaction product comprising a maleic anhydride copolymer and a diamine type light-absorbing agent disclosed in U.S. Pat. No. 5,294,680, a anti-reflection coating containing a resin binder and a methylolmelamine-based crosslinking agent disclosed in JP-A-6-118631, an acrylate resin-type anti-reflection coating having a carboxylic acid group, an epoxy group and a light-absorbing group in the same molecule disclosed in JP-A-6-118656, an anti-reflection coating comprising a methylolmelamine and a benzophenone-based light-absorbing agent disclosed in JP-A-8-87115, and an anti-reflection coating comprising a polyvinyl alcohol resin and a low molecular weight light-absorbing agent disclosed in JP-A-8-179509 can be exemplified.

Further, DUV-30 series, DUV-40 series and ARC25 manufactured by Brewer Science Co., and AC-2, AC-3, AR19 and AR20 manufactured by Chypre Co. can be used as the organic anti-reflection coating.

After coating the above resist coating solution on such a substrate as used in the production of a precise integrated circuit element (e.g., silicon/silicon dioxide coating) (or the above substrate is provided with an anti-reflection coating, if necessary) by an appropriate coating method with a spinner or a coater, the coated film is subjected to exposure through a prescribed mask, baking and development, thereby a good resist pattern can be obtained. The lights for exposure are preferably lights having wavelengths of from 150 nm to 250 nm. Specifically, a KrF excimer laser (248 nm), an ArF excimer laser (193 nm), an $F_2$ excimer laser (157 nm), an X-ray, an electron beam, etc., can be exemplified.

As the developing solution, an alkaline aqueous solution, such as inorganic alkalis, e.g., sodium hydroxide, potassium hydroxide, sodium carbonate, sodium silicate, sodium metasilicate, aqueous ammonia, etc., primary amines, e.g., ethylamine, n-propylamine, etc., secondary amines, e.g., diethylamine, di-n-butylamine, etc., tertiary amines, e.g., triethylamine, methyldiethylamine, etc., alcohol amines, e.g., dimethylethanolamine, triethanolamine, etc., quaternary ammonium salts, e.g., tetramethylammonium hydroxide, tetraethylammonium hydroxide, etc., and cyclic amines, e.g., pyrrole, piperidine, etc., can be used.

Further, an appropriate amount of alcohols and surfactants can be added to the above alkaline aqueous solution.

EXAMPLE

The present invention is explained in further detail with reference to the following examples, but the present invention should not be construed as being limited thereto.

Synthesis Example of Acid Generator

Synthesis Example 1

Synthesis of Acid Generator (I-3)

Fifty (50) grams of diphenyl sulfoxide was dissolved in 800 ml of benzene, 200 g of aluminum chloride was added thereto, and the solution was refluxed for 24 hours. The reaction solution was slowly poured into 2 liters of water, 400 ml of concentrated sulfuric acid was added thereto, followed by heating at 70° C. for 10 minutes. The aqueous solution was washed with 500 ml of ethyl acetate, filtered out, and an aqueous solution of ammonium iodide obtained by dissolving 200 g of ammonium iodide in 400 ml of water was added thereto. The precipitated powder was filtered out, washed with water, successively with ethyl acetate and dried, thereby 70 g of triphenylsulfonium iodide was obtained.

Triphenylsulfonium iodide (17.6 g) was dissolved in 1,000 ml of methanol, and 12.5 g of silver oxide was added to the methanol solution obtained, followed by stirring at room temperature for 4 hours. After stirring, the reaction solution was filtered, and a methanol solution containing 25 g of perfluoro-n-octanesulfonic acid was added thereto. The reaction solution was concentrated and the precipitated oily product was dissolved in ethyl acetate, washed with water, dried and concentrated, thereby 20.5 g of a desired product was obtained.

Synthesis Example 2

Synthesis of Acid Generator (I-5)

A mixture comprising di(t-butylphenyl)sulfide (80 mmol), di(t-bitylphenyl)iodonium perfluoro-n-butanesulfonate (20 mmol) and copper benzoate (4 mmol) was stirred at 130° C. for 4 hours under a nitrogen stream. The reaction solution was allowed to be cooled, 100 ml of ethanol was added thereto, and the precipitate was removed.

The filtrate was concentrated, 200 ml of ether was added to the filtrate, thereby a powder was precipitated, the precipitate was filtered, washed with ether and then dried to obtain a desired product.

Other acid generator (I) was synthesized in the same manner as above using triphenylsulfonium perfluorobutanesulfonate and triphenylsulfonium trifluorate (products manufactured by Midori Kagaku Co., Ltd.).

Synthesis Example 3

Synthesis of Phenacyltetrahydrothiophenium Perfluorobutanesulfonate (III-1)

Tetrahydrothiophene (53.2 g) was dissolved in 400 ml of acetonitrile, and thereto was slowly added a solution obtained by dissolving 100 g of phenacyl bromide in 300 ml of acetonitrile, and the solution was stirred at room temperature for 3 hours, thereby a powder was precipitated. The reaction solution was poured into 1,500 ml of ethyl acetate, and the powder was filtered out and dried, thus 137 g of phenacyltetrahydrothiophenium bromide was obtained.

Potassium perfluorobutanesulfonate (60 g) was dissolved in a mixed solvent comprising 200 ml of water and 200 ml of methanol, and a solution obtained by dissolving 49.5 g of phenacyltetrahydrothiophenium bromide in 300 ml of water was added to the above solution. The aqueous solution was extracted twice with 200 ml of chloroform, the organic phase was washed with water and concentrated, thereby a crude product was obtained. Distilled water (300 ml) was added to the above-obtained product, followed by heating at 100° C. for 30 minutes and then cooling, thereby a solid product was precipitated. The precipitate was filtered and re-slurried with diisopropyl ether, thereby 77 g of phenacyltetrahydrothiophenium perfluorobutanesulfonate was obtained.

Synthesis Example 4

Synthesis of Phenacyltetrahydrothiophenium Perfluorooctanesulfonate (III-3)

Compound (III-3) was synthesized by salt exchange of phenacyltetrahydrothiophenium bromide with perfluorooctanesulfonic acid in the same manner as above.

Synthesis Example 5

Synthesis of Phenacyltetrahydrothiophenium Trifluoromethanesulfonate (III-2)

Compound (III-2) was synthesized by salt exchange of phenacyltetrahydrothiophenium bromide with trifluoromethanesulfonic acid in the same manner as above.

Other compounds were also obtained in the same manner as above by reacting corresponding phenacyl halogenide and sulfide compound to synthesize phenacylsulfonium halogenide, and then salt exchanging with sulfonic acid (salt).

Synthesis Example 6

Synthesis of Acid Generator (II-11)

Tetrahydrothiophene (11.8 g) was dissolved in 100 ml of acetonitrile, and 20 g of 1-bromo-3,3-dimethyl-2-butanone was slowly added to the above solution. The reaction solution was stirred at room temperature for two days, thereby a powder was precipitated. After adding 100 ml of ethyl acetate to the reaction solution, the powder was filtered out, washed with ethyl acetate and dried, thereby 24 g of 2-oxo-3,3-dimethylbutyltetrahydrothiophenium bromide was obtained.

Potassium perfluorobutanesulfonate (10 g) was dissolved in a mixed solvent comprising 500 ml of water and 100 ml of methanol, and a solution obtained by dissolving 7.7 g of 2-oxo-3,3-dimethylbutyltetrahydrothiophenium bromide in 50 ml of methanol was added to the above solution. The aqueous solution was extracted twice with 100 ml of chloroform, the organic phase was washed with water and concentrated, thereby an oily product was obtained. The above-obtained product was concentrated again with ethyl acetate, thereby a solid product was obtained. The solid product was filtered and re-slurried with diisopropyl ether, to thereby obtain 9 g of 2-oxo-3,3-dimethylbutyltetrahydrothiophenium perfluorobutanesulfonate.

2-Oxocyclohexylmethyl (2-norbornyl)sulfonium trifluoromethanesulfonate (II-4) was synthesized according to synthesis method 1 disclosed in JP-A-8-27102.

Other sulfonium-based acid generators not having an aromatic ring were obtained in the same manner as above by reacting corresponding sulfide compound and alkyl halide to synthesize sulfonium halogenide, and then salt exchanging with sulfonic acid (salt).

Synthesis of Resin

Synthesis Example 1

Synthesis of Resin (1) (Side Chain Type)

2-Ethyl-2-adamantyl methacrylate and butyrolactone methacrylate in proportion of 55/45 were dissolved in a mixed solvent of a 5/5 ratio of methyl ethyl ketone/tetrahydrofuran to prepare 100 ml of a solution having a solid concentration of 20%. V-65 (manufactured by Wako Pure Chemical Industries) was added to the above solution in an amount of 2 mol %, and the mixed solution was dropwise added to 10 ml of methyl ethyl ketone heated at 60° C. over 4 hours under a nitrogen stream. After termination of dripping, the reaction solution was heated for 4 hours, V-65 was added again in an amount of 1 mol %, and the solution was stirred for 4 hours. After completion of the reaction, the reaction solution was cooled to room temperature, crystallized in 3 liters of a mixed solvent of a 1/1 ratio of distilled water/isopropyl alcohol, and resin (1) precipitated as a white powder was recovered.

The composition ratio of the polymer obtained by $C^{13}$NMR was 46/54. The weight average molecular weight measured by GPC and calculated in terms of standard polystyrene was 10,700.

Resins (2) to (15) were synthesized in the same manner as in Synthesis Example 1.

Composition ratios and molecular weights of resins (2) to (15) are shown in Table 1 below. Repeating units 1, 2, 3 and 4 in the Table are the orders from the left side to the right side of each structure.

TABLE 1

| Resin No. | Repeating Unit 1 (mol %) | Repeating Unit 2 (mol %) | Repeating Unit 3 (mol %) | Repeating Unit 4 (mol %) | Molecular Weight |
|---|---|---|---|---|---|
| 2 | 53 | 40 | 7 | | 13,400 |
| 3 | 46 | 34 | 20 | | 9,400 |
| 4 | 42 | 31 | 27 | | 8,300 |
| 5 | 49 | 42 | 9 | | 9,900 |

TABLE 1-continued
| Resin No. | Repeating Unit 1 (mol %) | Repeating Unit 2 (mol %) | Repeating Unit 3 (mol %) | Repeating Unit 4 (mol %) | Molecular Weight |
|---|---|---|---|---|---|
| 6 | 42 | 30 | 28 | | 10,300 |
| 7 | 39 | 35 | 26 | | 8,900 |
| 8 | 46 | 22 | 30 | 2 | 12,900 |
| 9 | 42 | 20 | 32 | 6 | 11,600 |
| 10 | 46 | 42 | 12 | | 9,200 |
| 11 | 38 | 32 | 30 | | 11,300 |
| 12 | 42 | 18 | 38 | 2 | 13,800 |
| 13 | 38 | 31 | 29 | 2 | 11,100 |
| 14 | 50 | 31 | 19 | | 11,700 |
| 15 | 35 | 6 | 16 | 43 | 13,200 |
The structures of the above resins (1) to (15) are shown below.
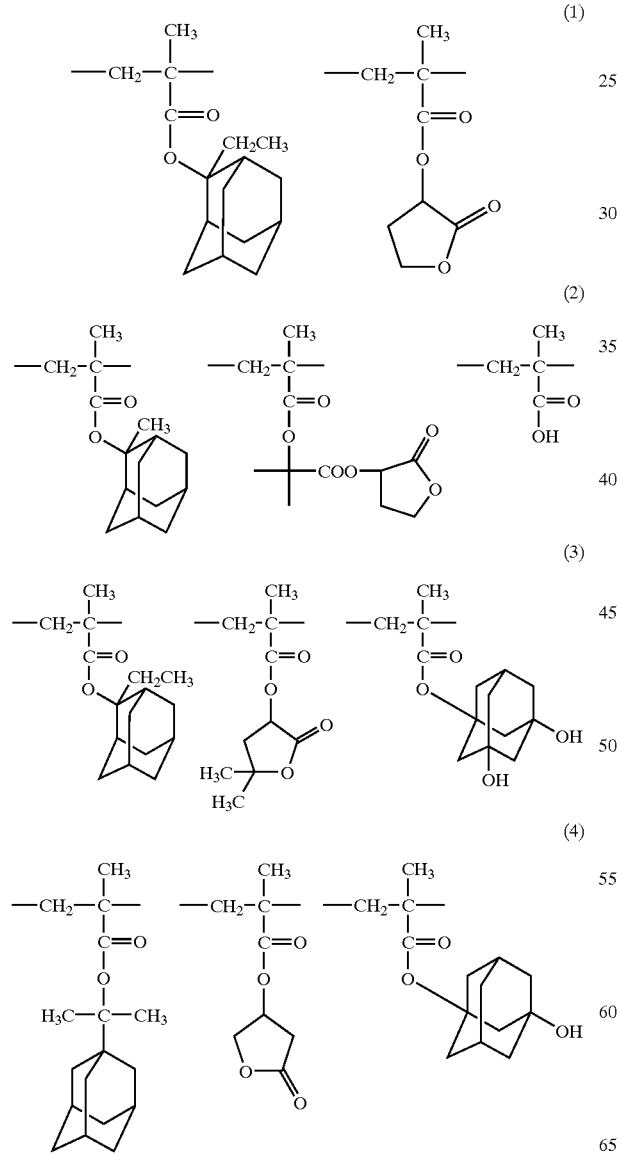
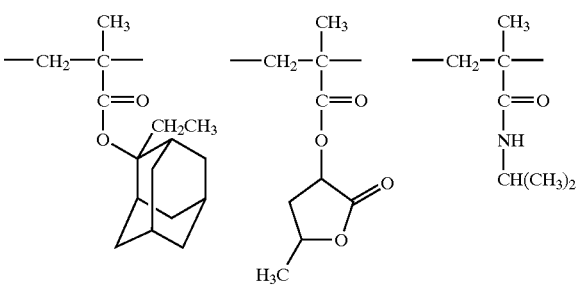
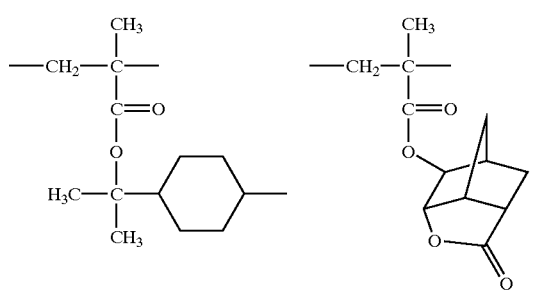
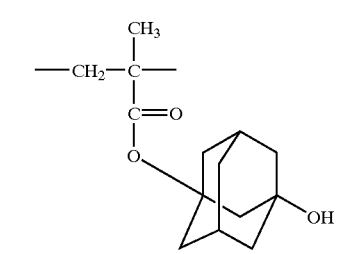
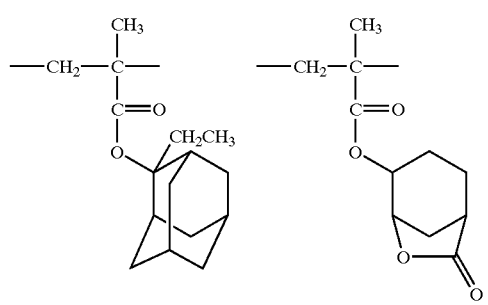
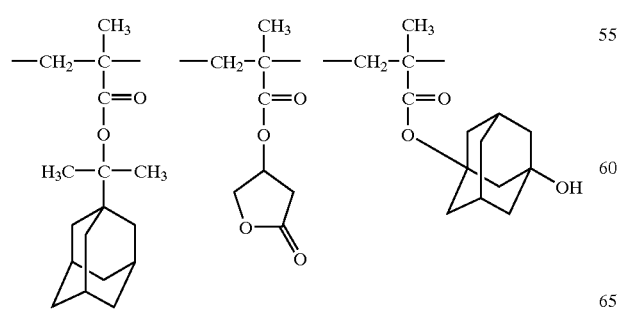
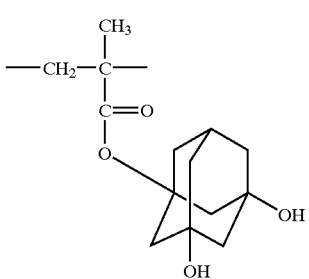

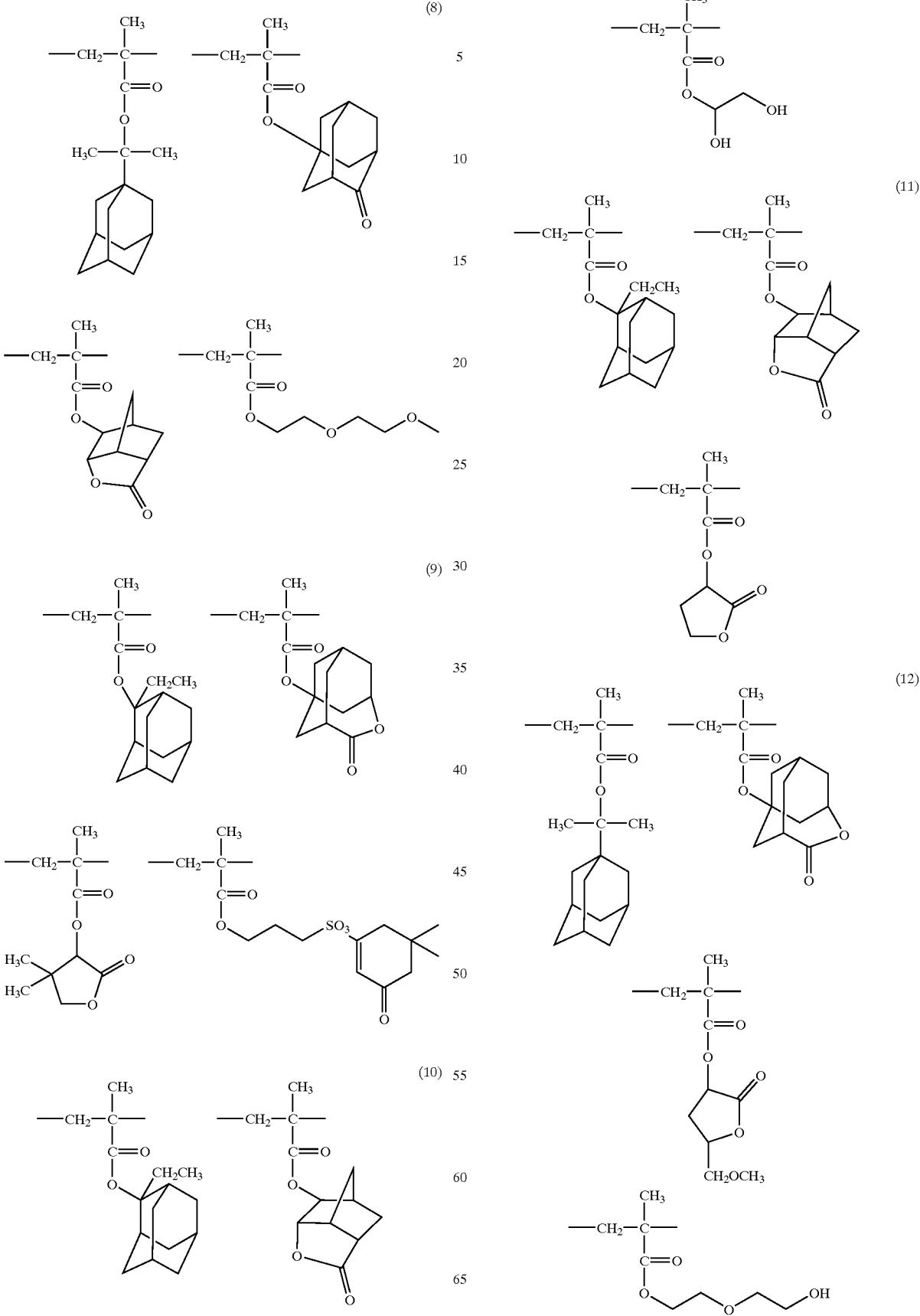

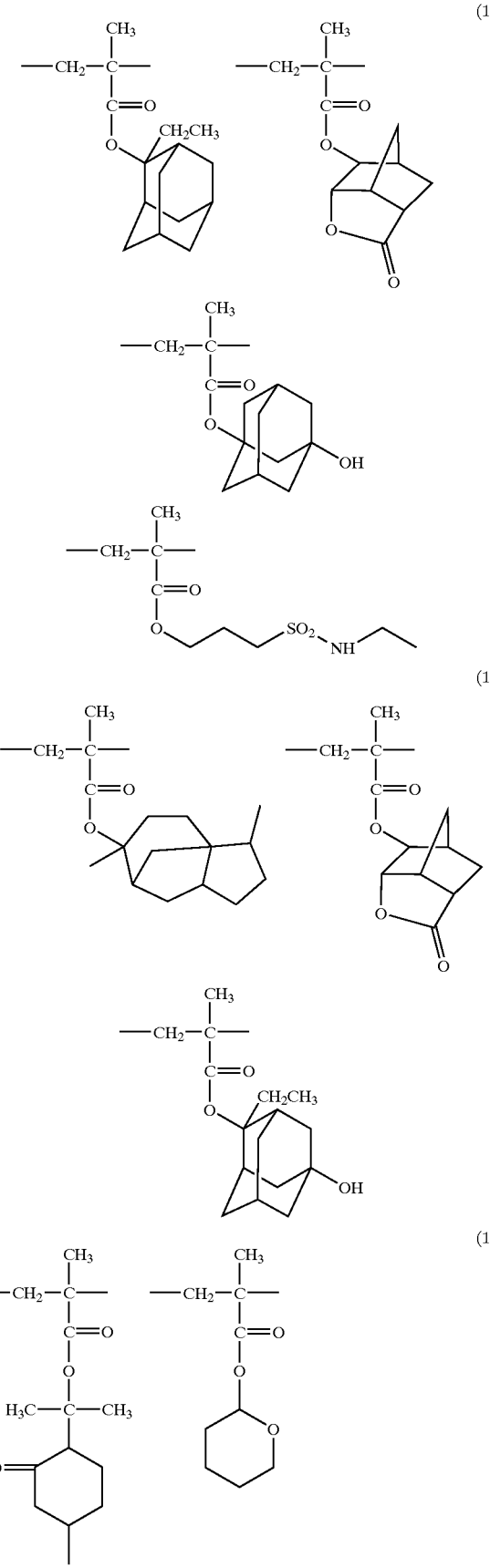

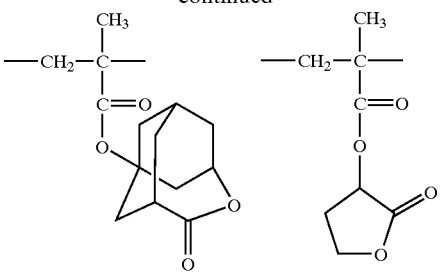

Synthesis Example 2

Synthesis of Resin (16) (Main Chain Type)

Norbornene carboxylic acid t-butyl ester, norbornene carboxylic acid butyrolactone ester and maleic anhydride (40/10/50 in molar ratio), and THF (60 wt % at the reaction temperature) were put in a separable flask, and heated at 60° C. under a nitrogen stream. When the reaction temperature was stabilized, 2 mol % of a radical initiator V-601 (manufactured by Wako Pure Chemical Industries) was added to initiate polymerization. Heating was performed for 12 hours. The obtained reaction mixture was diluted two times with tetrahydrofuran, and then put into a mixed solvent of hexane/isopropyl alcohol (1/1) to thereby precipitate a white powder. The precipitate was filtered and dried, thereby resin (16) was obtained.

The weight average molecular weight measured by GPC and calculated in terms of polystyrene of the resin (16) was 8,300. The molar ratio of the repeating units of norbornene carboxylic acid t-butyl ester/norbornene carboxylic acid butyrolactone ester/maleic anhydride of the resin (16) was confirmed to be 42/8/50 by NMR spectrum.

Resins (17) to (27) were synthesized in the same manner as in Synthesis Example 2. Composition ratios and molecular weights of resins (17) to (27) are shown in Table 2 below. Alicyclic olefin units 1, 2 and 3 in the Table are the orders from the left side to the right side of each structure.

TABLE 2

| Resin No. | Alicyclic Olefin Unit (mol %) | Alicyclic Olefin Unit (mol %) | Alicyclic Olefin Unit (mol %) | Maleic Anhydride (mol %) | Molecular Weight |
|---|---|---|---|---|---|
| 17 | 35 | 15 | | 50 | 8,200 |
| 18 | 20 | 30 | | 50 | 8,600 |
| 19 | 36 | 14 | | 50 | 9,100 |
| 20 | 31 | 19 | | 50 | 7,900 |
| 21 | 35 | 5 | 10 | 50 | 8,300 |
| 22 | 33 | 17 | | 50 | 8,500 |
| 23 | 38 | 12 | | 50 | 8,900 |
| 24 | 31 | 6 | 13 | 50 | 8,100 |
| 25 | 33 | 7 | 10 | 50 | 9,100 |
| 26 | 40 | 10 | | 50 | 9,300 |
| 27 | 34 | 16 | | 50 | 8,800 |

The structures of resins (16) to (27) are shown below.
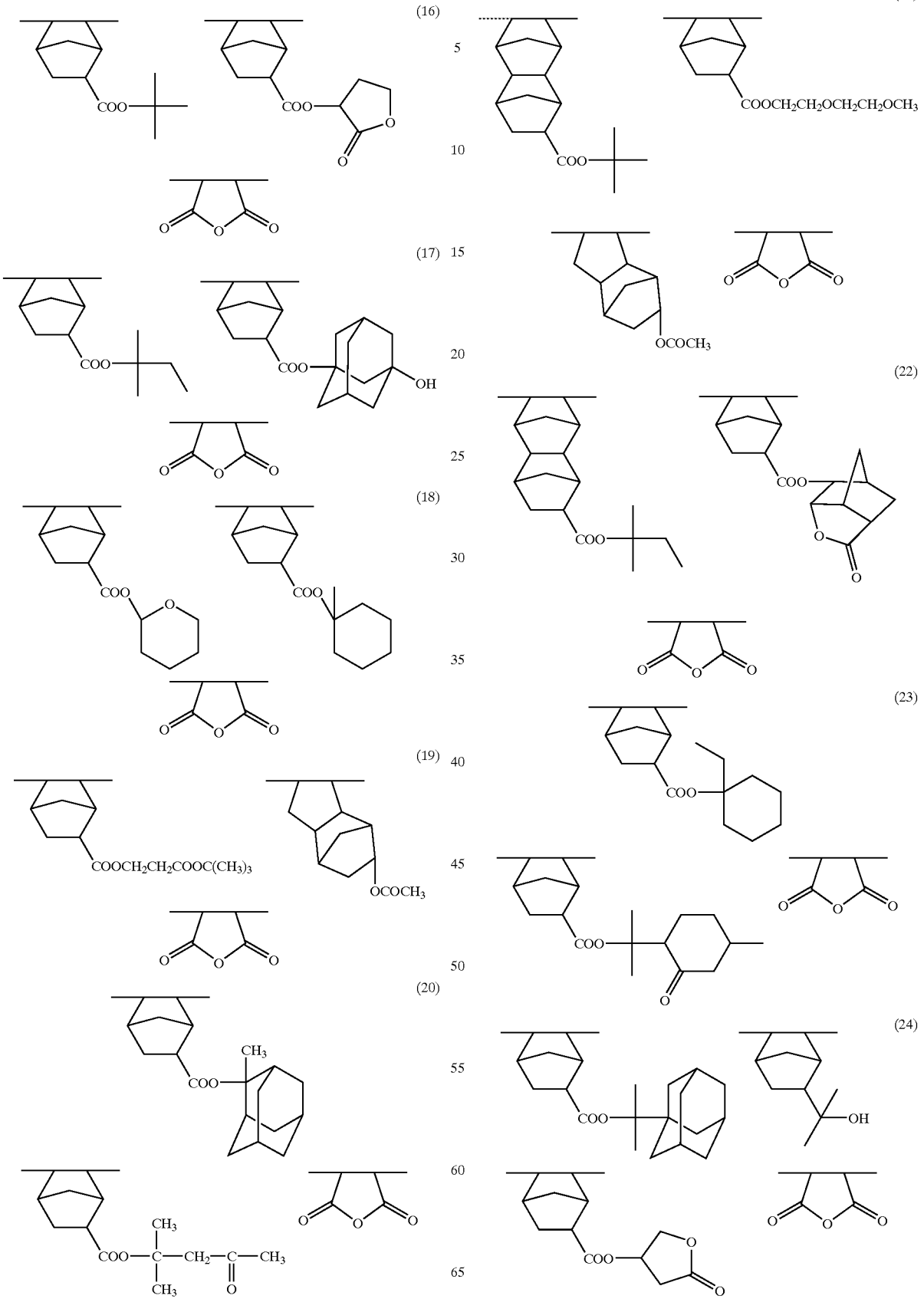

-continued

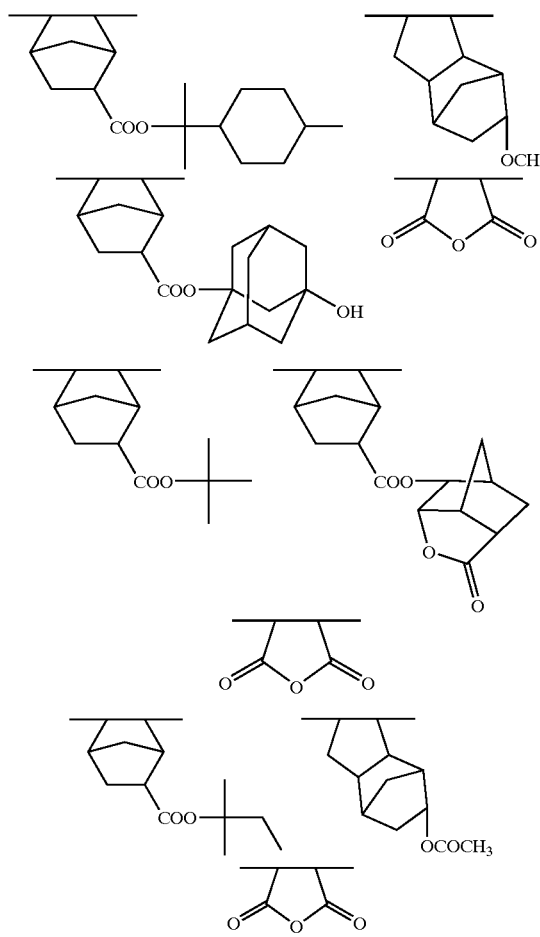

TABLE 3

| Resin No. | Norbornene | Acid Anhydride | (Meth)acrylate | Molecular Weight |
|---|---|---|---|---|
| 29 | 20/15 | 40 | 15/10 | 11,900 |
| 30 | 32 | 37 | 20/8/3 | 10,500 |
| 31 | 16 | 21 | 36/27 | 13,900 |
| 32 | 15 | 22 | 34/29 | 12,300 |
| 33 | 17 | 20 | 33/30 | 12,400 |
| 34 | 18 | 24 | 32/26 | 13,000 |
| 35 | 15 | 19 | 36/30 | 12,700 |
| 36 | 15 | 20 | 29/10/26 | 13,100 |
| 37 | 17 | 21 | 31/31 | 12,800 |
| 38 | 18 | 17/3 | 30/32 | 13,300 |
| 39 | 16 | 19 | 31/12/11/11 | 12,600 |
| 40 | 20 | 22 | 58 | 14,700 |
| 41 | 23 | 28 | 35/14 | 13,300 |

The structures of resins (28) to (41) are shown below.

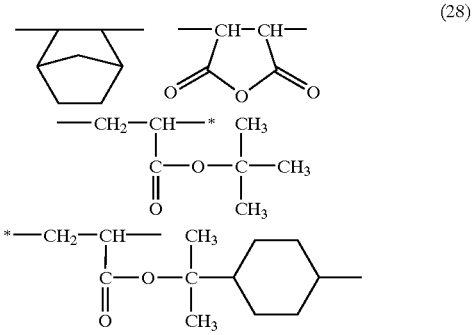

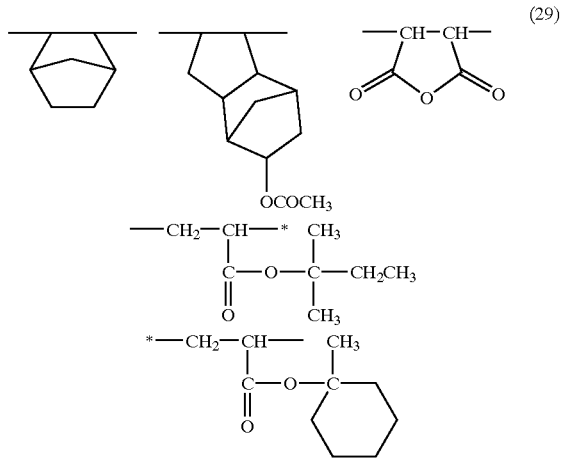

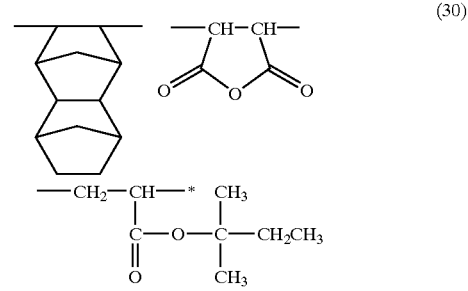

Synthesis Example 3

Synthesis of Resin (28) (Hybrid Type)

Norbornene, maleic anhydride, t-butyl acrylate, and 2-methylcyclohexyl-2-propyl acrylate in molar ratio of 35/35/20/10 were put into a reaction vessel, and dissolved in a tetrahydrofuran to prepare a solution having a solid content of 60% The solution was heated at 65° C. under a nitrogen stream. When the reaction temperature was stabilized, 1 mol % of a radical initiator V-601 (manufactured by Wako Pure Chemical Industries) was added to initiate polymerization. After heating for 8 hour, the reaction mixture was diluted two times with tetrahydrofuran, and then put into a hexane of five time volume of the reaction mixture, thereby a white powder was precpitated. The precipitate was filtered, and dissolved in methyl ethyl ketone, and reprecipitated in a mixed solvent of hexane/t-butylmethyl ether (1/1) of five time volume. The precipitated white powder was filtered and dried, thereby resin (28) was obtained.

The weight average molecular weight measured by GPC and calculated in terms of polystyrene of the resin (28) was 12,100. The composition of norbornene/maleic anhydride/t-butyl acrylate/2-methylcyclohexyl-2-propyl acrylate of the resin (28) was confirmed to be 32/39/19/10 in molar ratio by NMR spectrum.

Resins (29) to (41) were synthesized in the same manner as in Synthesis Example 3. Composition ratios and molecular weights of resins (29) to (41) are shown in Table 3 below.

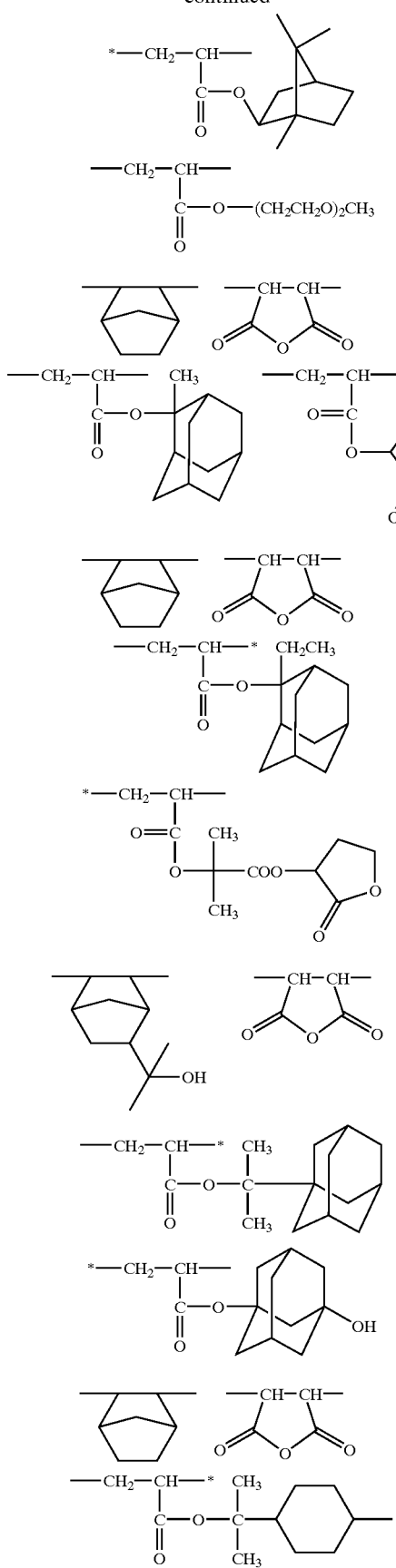
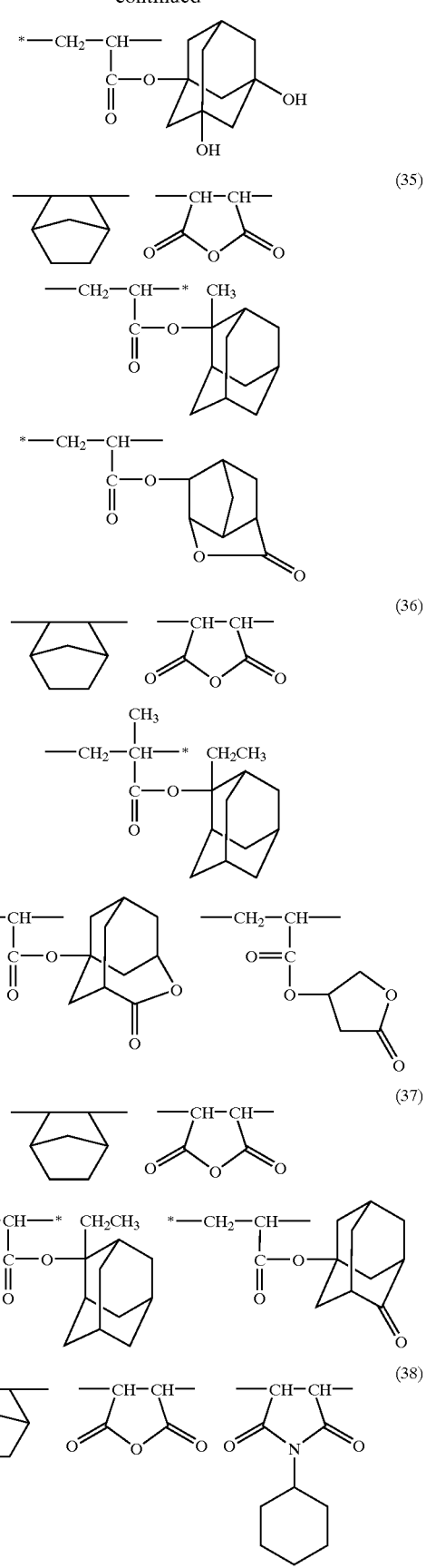

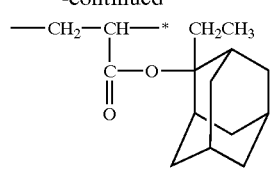

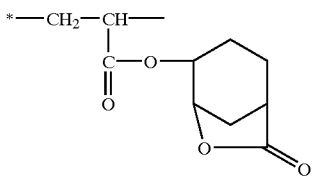

(39)

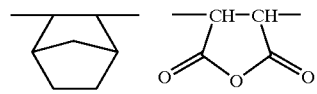

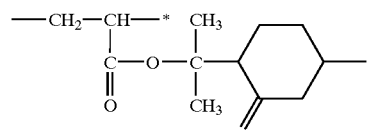

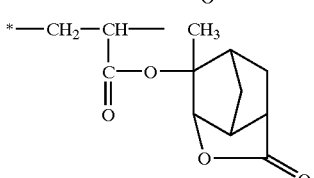

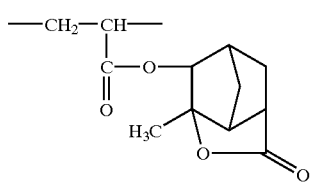

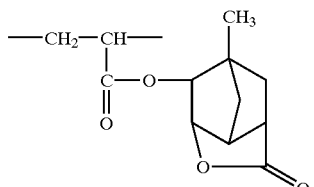

(40)

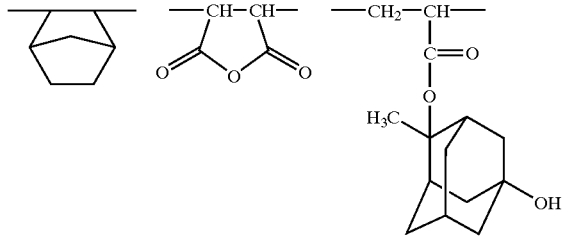

(41)

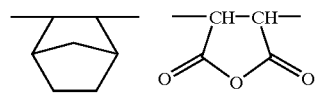

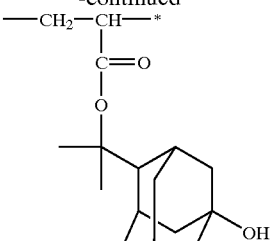

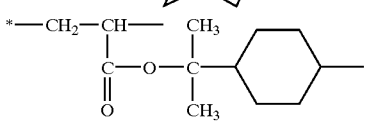

Synthesis Example 4

Synthesis of Resin (42) (Hybrid Type)

Norbornene carboxylic acid t-butyl ester, maleic anhydride, 2-methyl-2-adamantyl acrylate, and norbornene lactone acrylate in molar ratio of 20/20/35/25 were put into a reaction vessel, and dissolved in a mixed solvent of methyl ethyl ketone/tetrahydrofuran (1/1) to prepare a solution having a solid content of 60% The solution was heated at 65° C. under a nitrogen stream. When the reaction temperature was stabilized, 3 mol % of a radical initiator V-601 (manufactured by Wako Pure Chemical Industries) was added to initiate polymerization. After heating for 12 hour, the reaction mixture was put into a hexane of five time volume of the reaction mixture, thereby a white powder was precpitated. The precipitate was again dissolved in 1/1 solvent of methyl ethyl ketone/tetrahydrofuran, and put into hexane/methyl-t-butyl ether of five time volume and a white powder was precipitated. The precipitate was filtered. This procedure wax repeated again and dried, thereby resin (42) was obtained.

The weight average molecular weight measured by RI analysis and calculated in terms of polystyrene of the resin (42) was 11,600. The amount of the residual monomer was 0.4%. The composition of norbornene/maleic anhydride/2-methyl-2-adamantyl acrylatet/norbornene lactone acrylate of the resin (42) was confirmed to be 18/23/34/25 in molar ratio by NMR spectrum.

Resins (43) to (66) were synthesized in the same manner as in Synthesis Example 4. Composition ratios and molecular weights of resins (43) to (66) are shown in Table 4 below.

TABLE 4

| Resin No. | Alicyclic Olefin | Monomer of Formula (III) (anhydride) | Acrylic Monomer | Molecular Weight |
| --- | --- | --- | --- | --- |
| 43 | 24 | 29 | 31/16 | 12,300 |
| 44 | 21 | 28 | 32/29 | 11,100 |
| 45 | 22 | 27 | 28/23 | 11,300 |
| 46 | 27 | 31 | 24/18 | 10,700 |
| 47 | 32 | 38 | 20/10 | 9,700 |
| 48 | 31 | 35 | 21/13 | 9,200 |
| 49 | 29 | 35 | 20/16 | 8,900 |
| 50 | 35 | 39 | 23/3 | 8,700 |
| 51 | 28 | 36 | 22/14 | 10,600 |
| 52 | 28/8 | 44 | 20 | 9,100 |
| 53 | 30/6 | 42 | 22 | 7,700 |
| 54 | 46 | 47/3 | 4 | 6,300 |
| 55 | 37/6 | 48 | 9 | 6,800 |

TABLE 4-continued
| Resin No. | Alicyclic Olefin | Monomer of Formula (III) (anhydride) | Acrylic Monomer | Molecular Weight |
|---|---|---|---|---|
| 56 | 34/10 | 51 | 5 | 7,400 |
| 57 | 41 | 43 | 10/6 | 6,700 |
| 58 | 39 | 42 | 11/8 | 8,800 |
| 59 | 36 | 42 | 10/12 | 9,300 |
| 60 | 39 | 43 | 14/4 | 9,800 |
| 61 | 38 | 42 | 15/5 | 9,300 |
| 62 | 24 | 27 | 25/24 | 12,600 |
| 63 | 19 | 24 | 40/17 | 9,500 |
| 64 | 29 | 32 | 34/5 | 10,400 |
| 65 | 20 | 25 | 26/5/24 | 13,400 |
| 66 | 16 | 24 | 32/24/4 | 12,700 |
The structures of resins (42) to (66) are shown below.
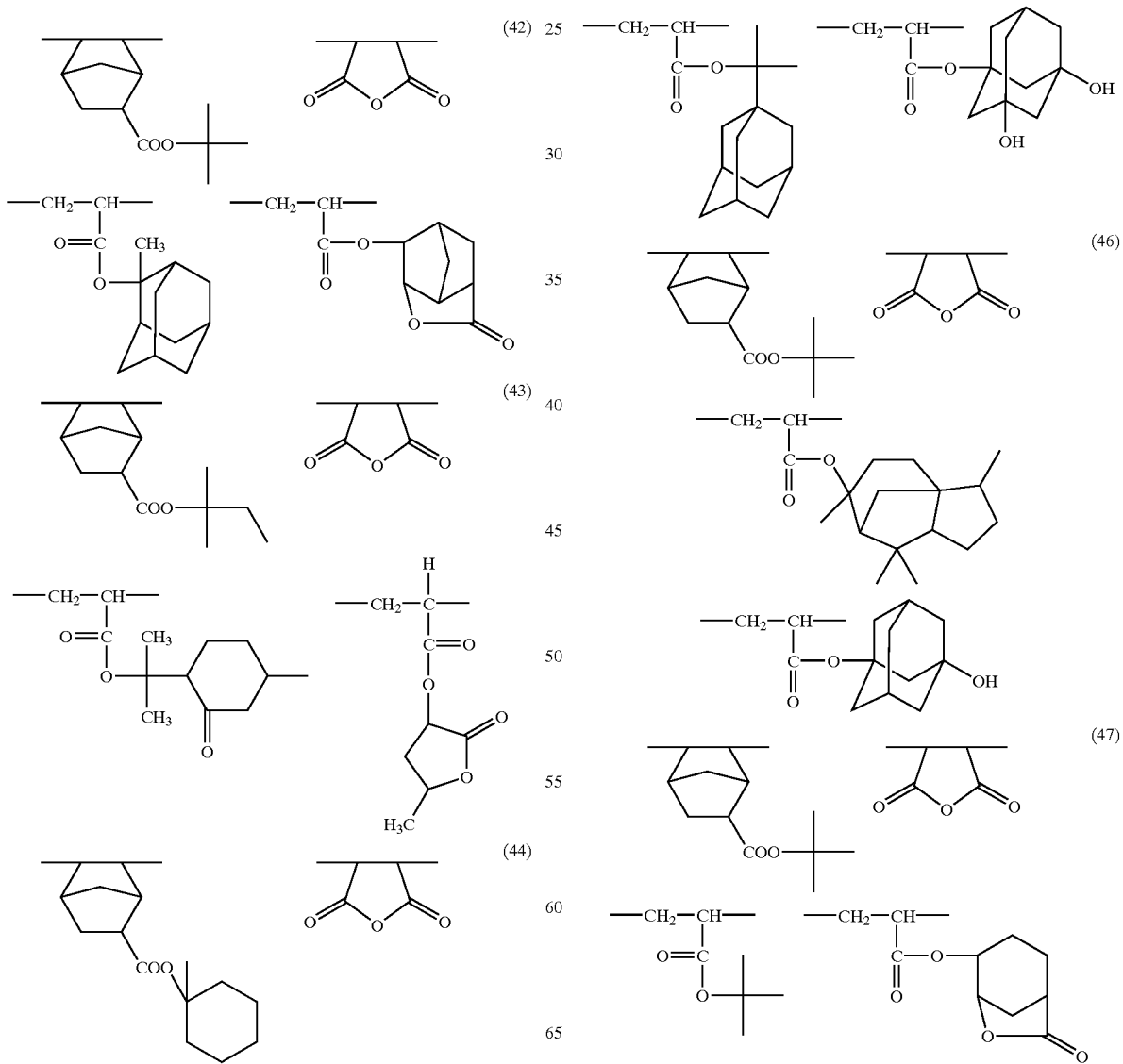

(48)
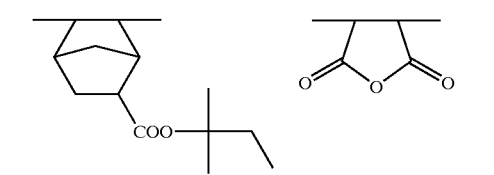
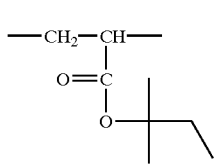 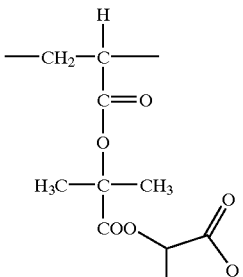
(49)
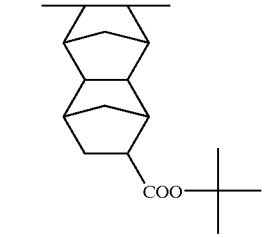
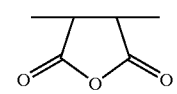
(50)
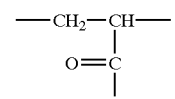
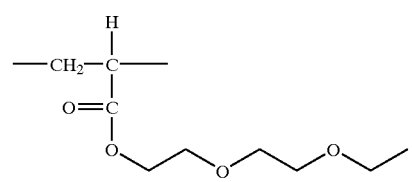
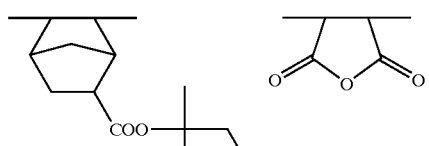
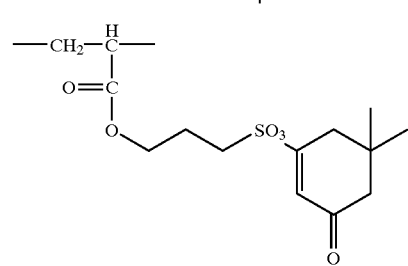
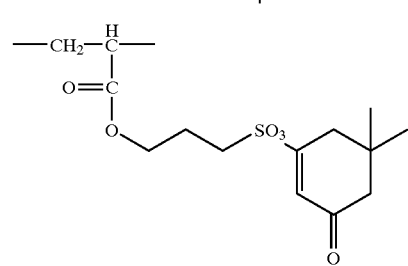
(51)
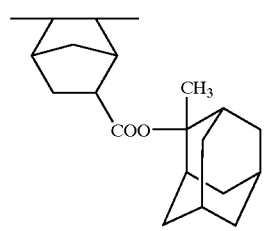
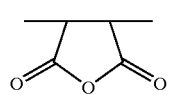
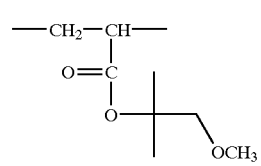
(52)
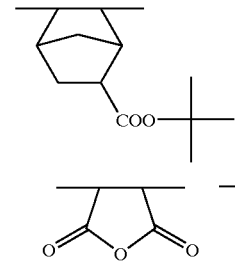
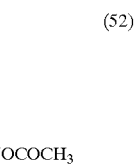
(53)
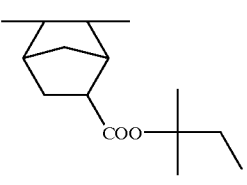 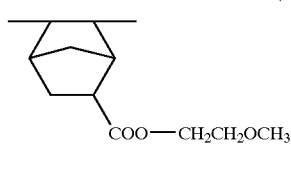
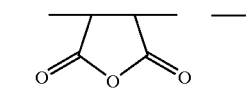 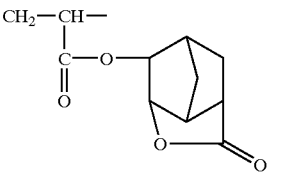
(54)
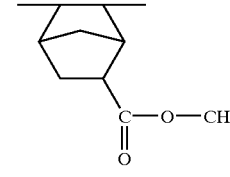
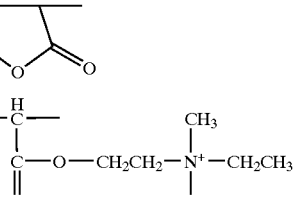
CF₃SO₃⁻

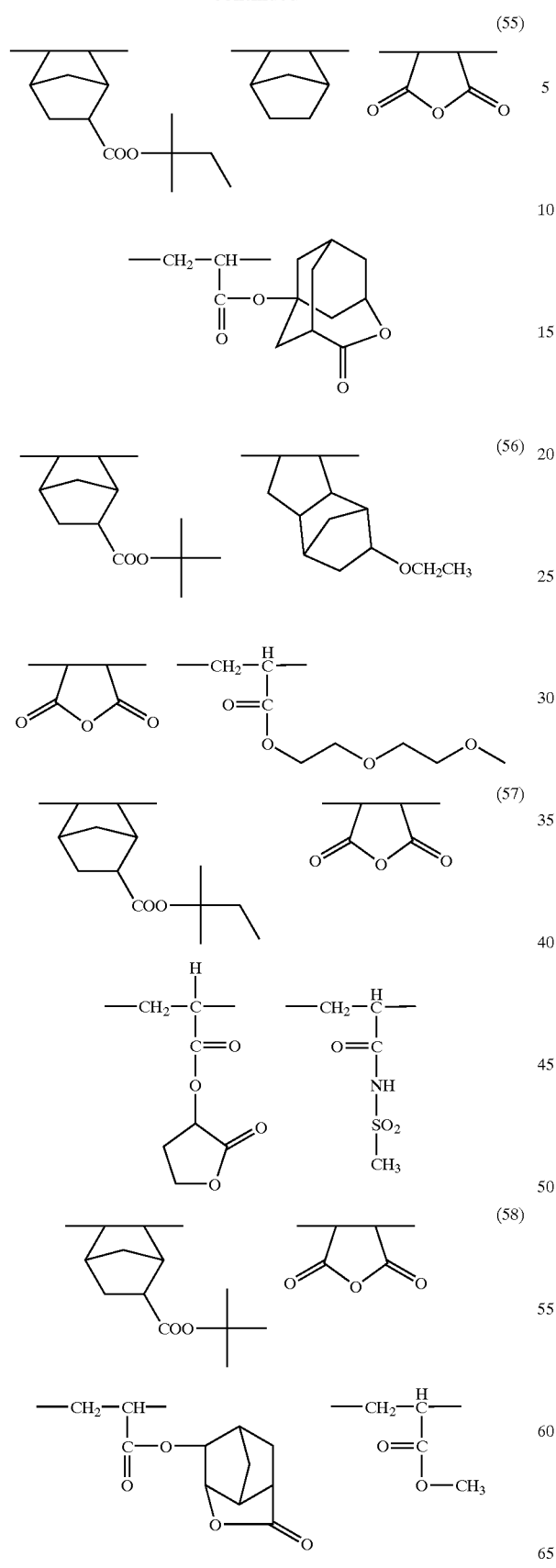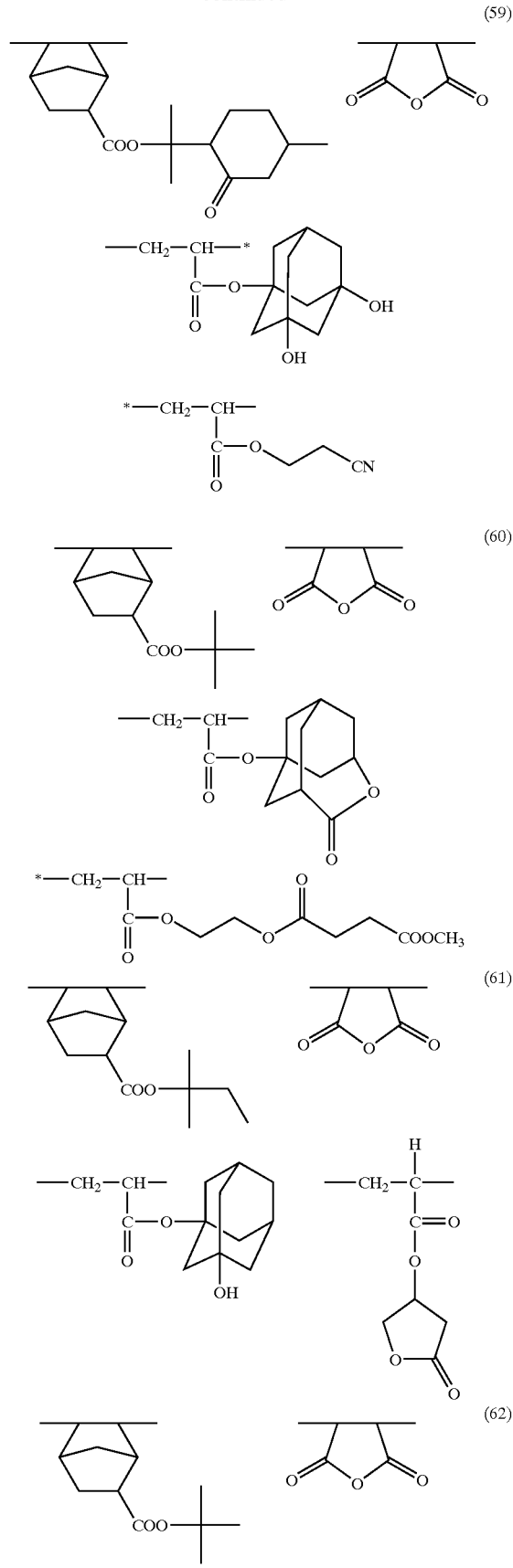

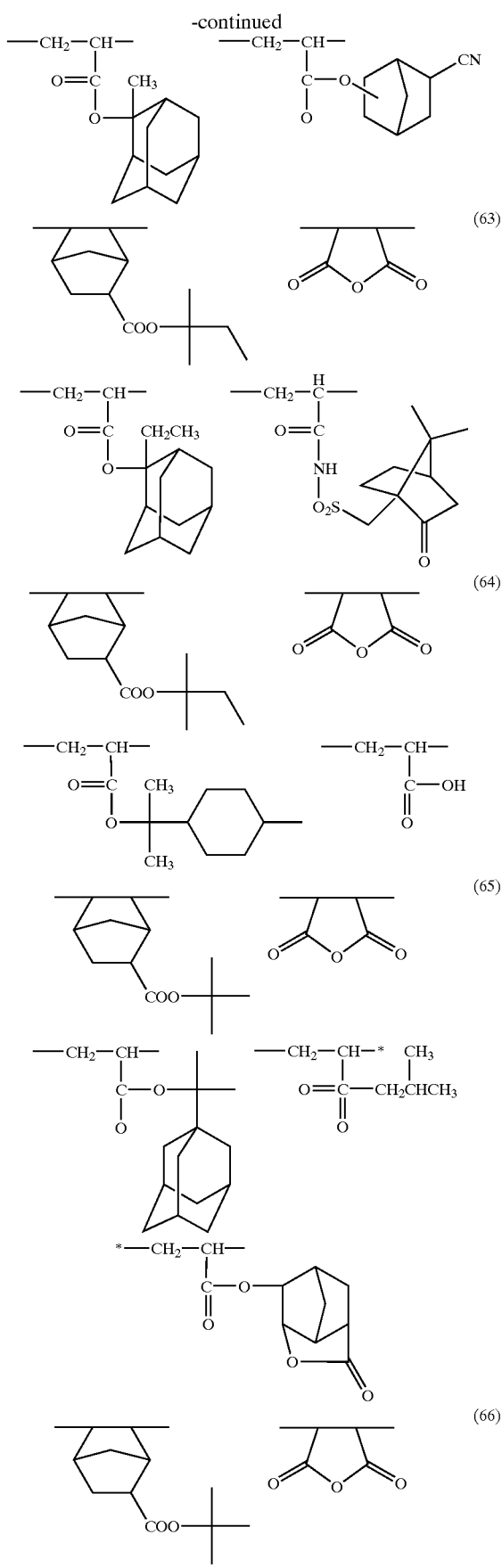
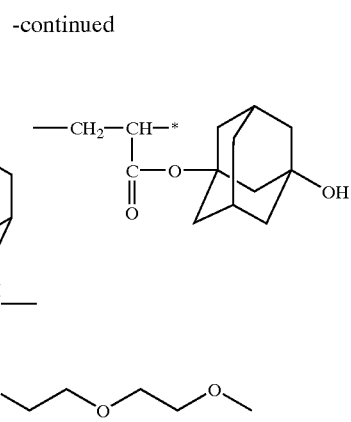

Synthesis Example 5

Synthesis of Resin (71) (Acryl Type)

2-Adamantyl-2-propyl methacrylate, butyrolactone methacrylate, and the monomer of the present invention were fed in proportion of 48/22/30 and dissolved in solvents of a 1/1 ratio of methyl ethyl ketone/tetrahydrofuran to prepare 100 ml of a solution having a solid concentration of 35%. V-65 (manufactured by Wako Pure Chemical Industries) in an amount of 2 mol %, and mercapto ethanol in an amount of 2 mol % were added to the above solution, and the mixed solution was dropwise added to 10 ml of methyl ethyl ketone heated at 65° C. over 4 hours under a nitrogen stream. After termination of dripping, the reaction solution was heated for 4 hours. After completion of the reaction, the reaction solution was cooled to room temperature, crystallized in 1.2 liters of a mixed solvent of a 3/1 ratio of methanol/isopropyl alcohol, the precipitated white powder was filtered. The powder obtained was re-slurried with 1 liter of methanol, and resin (71) was recovered.

The composition ratio of the polymer obtained by NMR was 49/22/29. The weight average molecular weight measured by GPC and calculated in terms of standard polystyrene was 8,900.

Resins (72) to (80) were synthesized in the same manner as in Synthesis Example 5. Composition ratios and molecular weights of resins (72) to (80) are shown in Table 5 below. Repeating units 1, 2 and 3 in the Table are the orders from the left side to the right side of each structure.

TABLE 5

| Resin No. | Repeating Unit 1 (mol %) | Repeating Unit 2 (mol %) | Repeating Unit 3 (mol %) | Repeating Unit of the Present Invention (mol %) | Molecular Weight |
|---|---|---|---|---|---|
| 72 | 51 | 21 |    | 28      | 8,300 |
| 73 | 40 | 10 |    | 18/8/24 | 7,400 |
| 74 | 47 | 15 | 12 | 26      | 8,300 |
| 75 | 51 | 11 | 25 | 13      | 7,900 |
| 76 | 49 | 9  | 20 | 22      | 8,800 |
| 77 | 51 | 20 | 4  | 25      | 8,100 |
| 78 | 39 | 15 | 10 | 36      | 8,200 |
| 79 | 46 | 28 | 8  | 18      | 8,600 |
| 80 | 48 | 20 |    | 32      | 7,200 |

The structures of resins (71) to (80) are shown below.
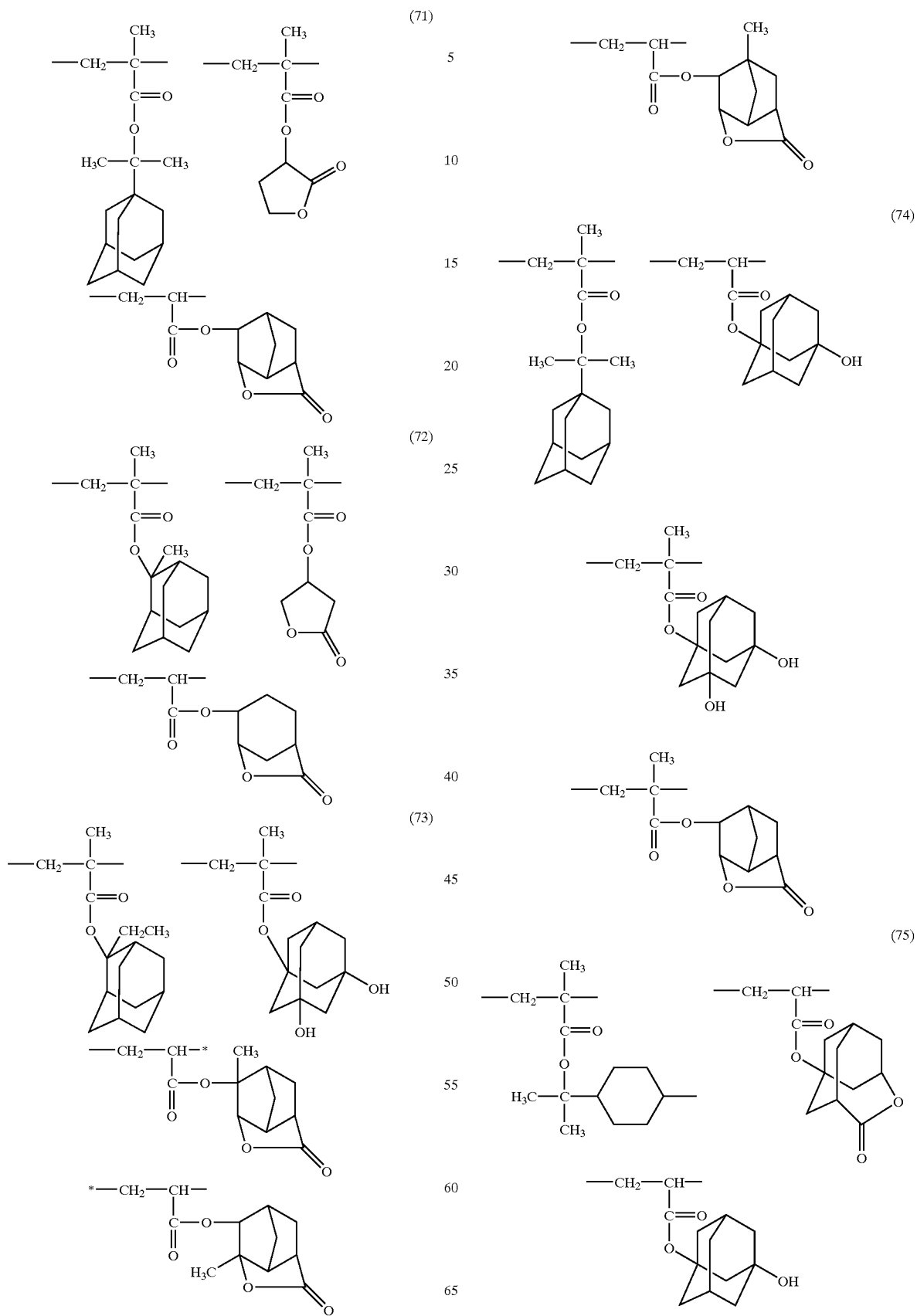

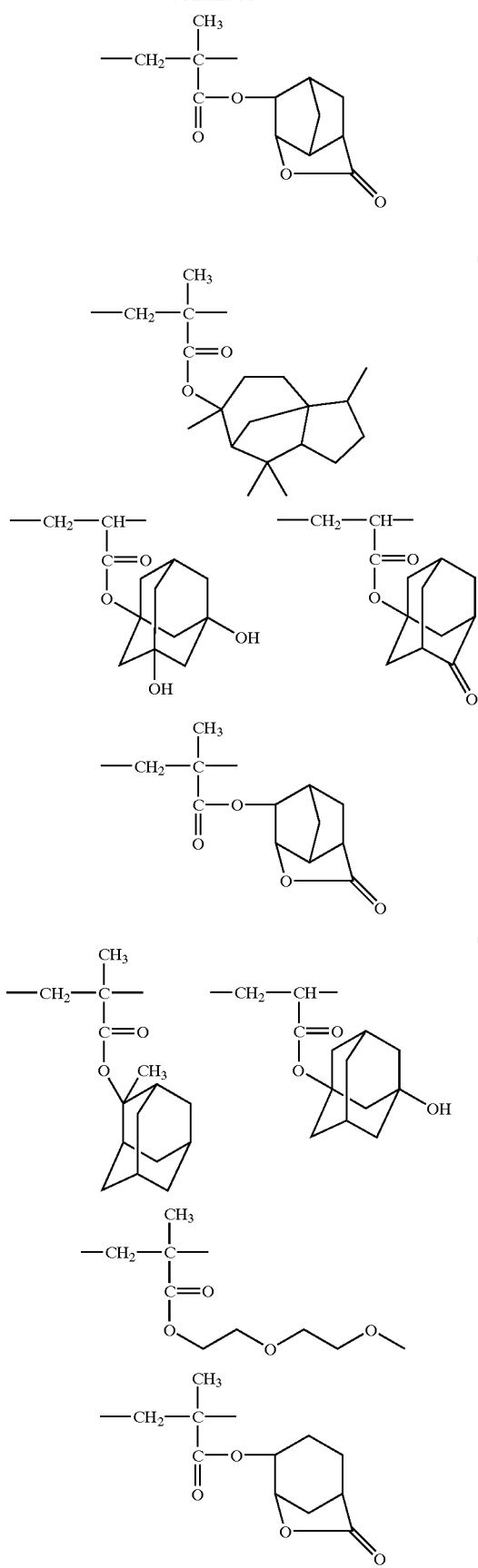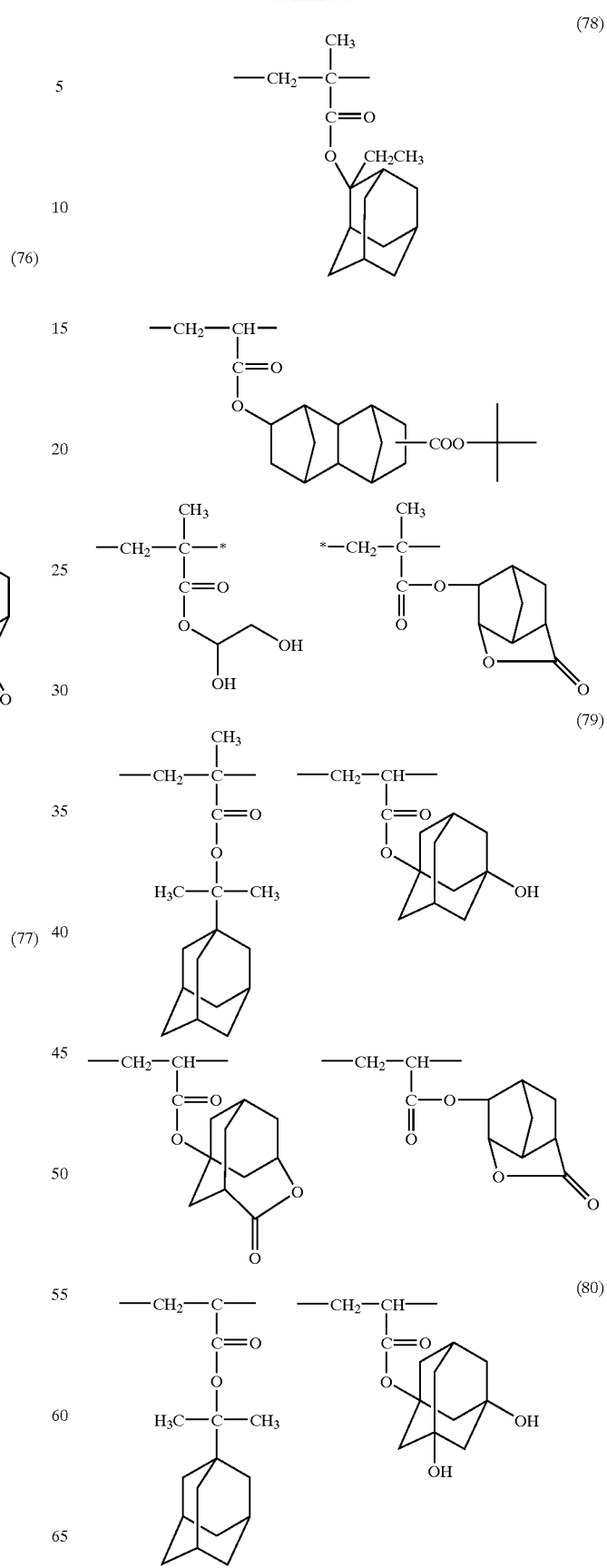

Synthesis Example 6

Synthesis of Resin (81)

Norbornene carboxylic acid t-butyl ester, maleic anhydride, 2-methyl-2-adamantyl acrylate, and acrylate monomer of the present invention in molar ratio of 30/30/20/20 were fed to a reaction vessel, and dissolved in a mixed solvent of methyl ethyl ketone/tetrahydrofuran (8/2) to prepare a solution having a solid content of 60% The solution was heated at 65° C. under a nitrogen stream. When the reaction temperature was stabilized, a 20% solution of methyl ethyl ketone containing 4 mol % of a radical initiator V-601 (manufactured by Wako Pure Chemical Industries) was dropwise added to the above solution over 6 hours. After completion of dripping, the reaction solution was heated for 4 hours, and then the reaction mixture was put into a 3/1 mixed solution of hexane/methyl-t-butyl ether of five time volume of the reaction mixture and a white powder was precipitated. The precipitate was again dissolved in tetrahydrofuran of five time volume and a white powder was precipitated. The precipitate was filtered. This procedure wax repeated again and dried, thereby resin (81) was obtained.

The weight average molecular weight measured by RI analysis and calculated in terms of polystyrene of the resin (81) was 9,700. The amount of the residual monomer was 0.2%. The composition of norbornene/maleic anhydride/2-methyl-2-adamantyl acrylatet/acrylate monomer of the resin (81) was confirmed to be 22/30/25/223 in molar ratio by NMR spectrum.

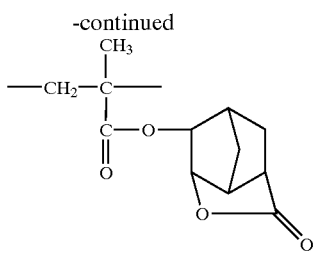

Resins (82) to (99) were synthesized in the same manner as in Synthesis Example 6. Composition ratios and molecular weights of resins (82) to (99) are shown in Table 6 below. Alicyclic olefin, monomer of (VIII) (anhydride), and acryl monomer are the orders from the left side to the right side of each structure.

TABLE 6

| Resin No. | Alicyclic Olefin (mol %) | Monomer of Formula (VIII) (anhydride) (mol %) | Acrylic Monomer (mol %) | Monomer of the Present Invention (mol %) | Molecular Weight |
|---|---|---|---|---|---|
| 82 | 28 | 35 | 20/8 | 9 | 9,300 |
| 83 | 27 | 34 | 27 | 12 | 9,800 |
| 84 | 39 | 42 |  | 19 | 8,300 |
| 85 | 36 | 40 | 8 | 4/2/10 | 10,400 |
| 86 | 30 | 36 | 16 | 18 | 10,100 |
| 87 | 25 | 30 | 20/6 | 19 | 10,900 |
| 88 | 32 | 36 |  | 10/4/18 | 10,100 |
| 89 | 25/5 | 34 | 24 | 12 | 9,600 |
| 90 | 32/6 | 40 | 8 | 14 | 10,600 |
| 91 | 22 | 27 | 37 | 14 | 11,400 |
| 92 | 18 | 24 | 34 | 24 | 13,000 |
| 93 | 15 | 20 | 28 | 12/5/20 | 12,800 |
| 94 | 16 | 22 | 42 | 20 | 12,300 |
| 95 | 22 | 28 | 32 | 18 | 14,400 |
| 96 | 20 | 26 | 32/10 | 12 | 13,100 |
| 97 | 20 | 23 | 31 | 26 | 12,900 |
| 98 | 18 | 20/3 | 31 | 28 | 13,200 |
| 99 | 10/12 | 26 | 33 | 19 | 14,100 |

The structures of resins (81) to (99) are shown below.

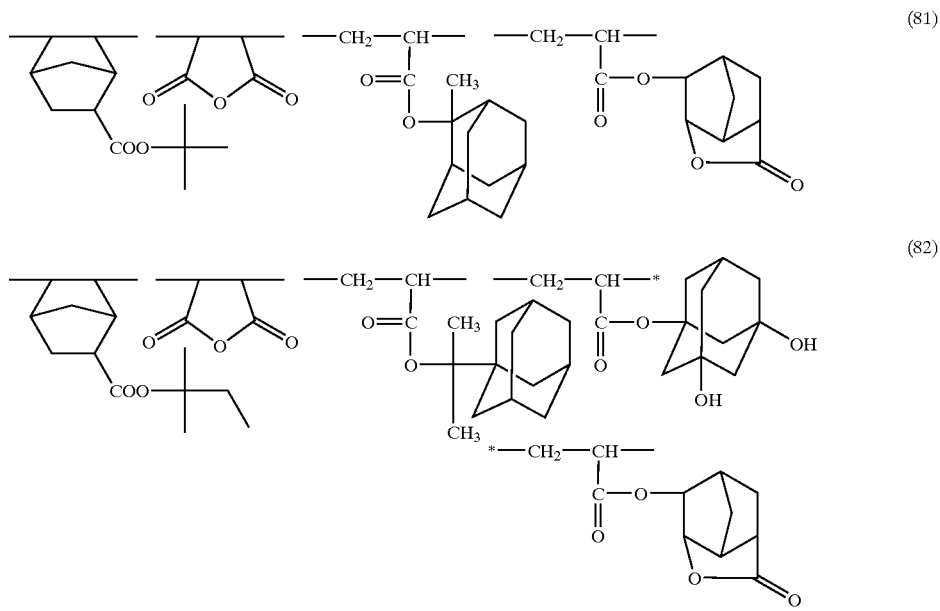

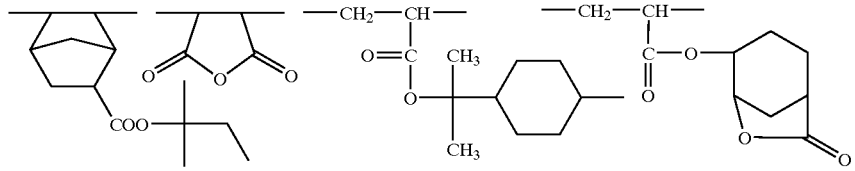
(83)
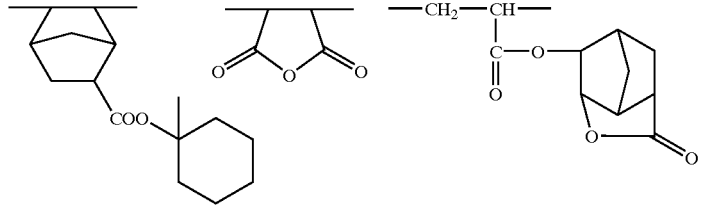
(84)
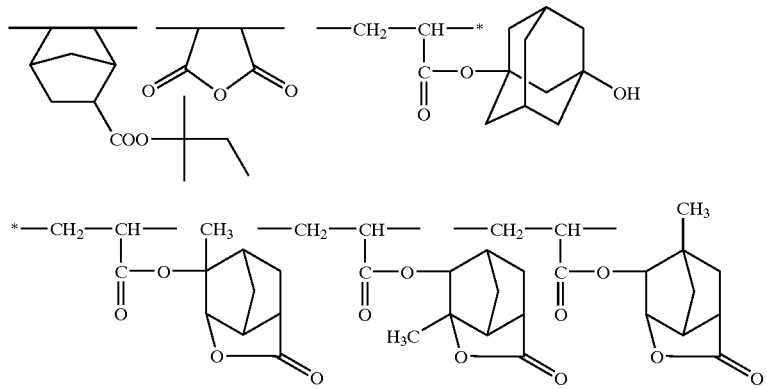
(85)
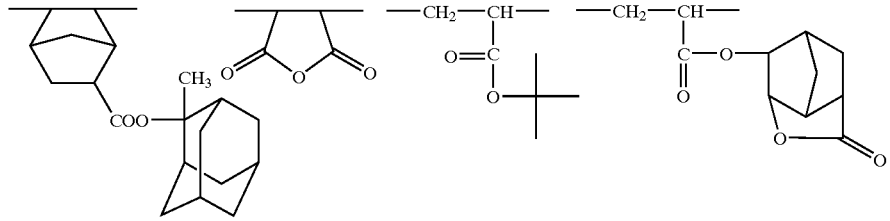
(86)
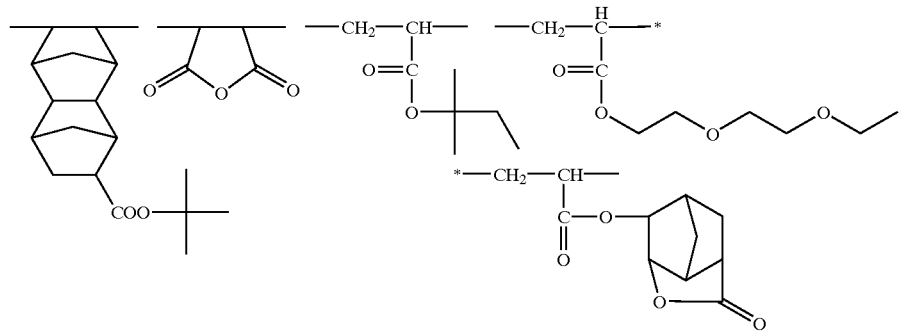
(87)

-continued
(88)
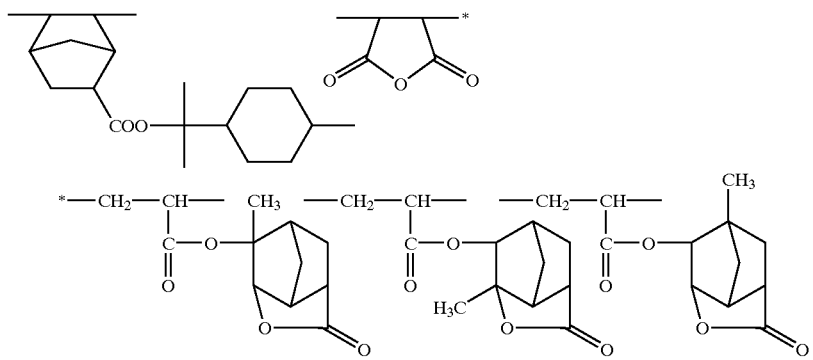
(89)
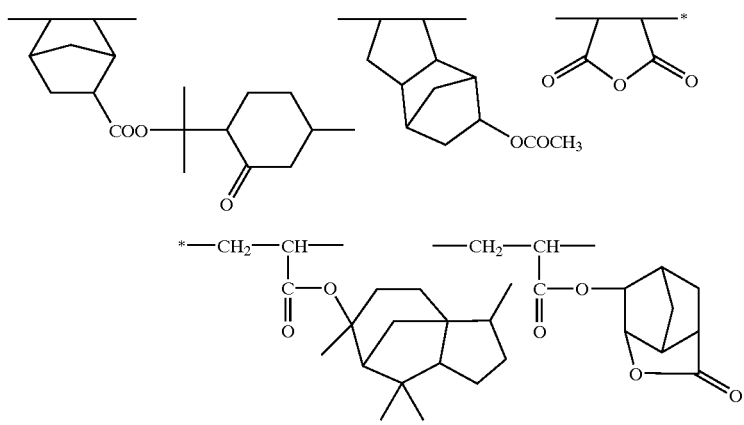
(90)
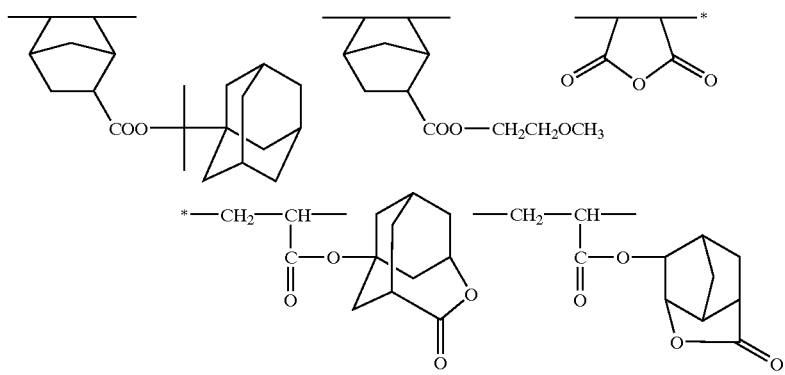
(91)
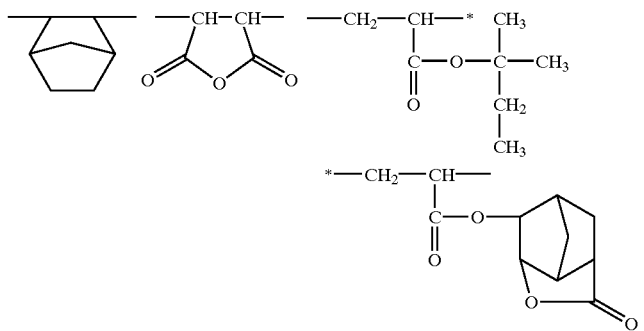

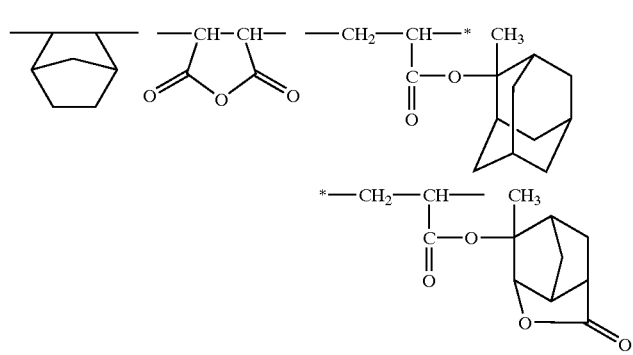
(92)
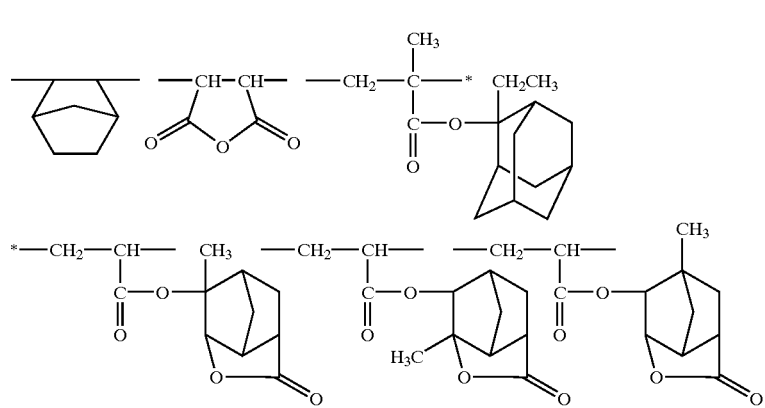
(93)
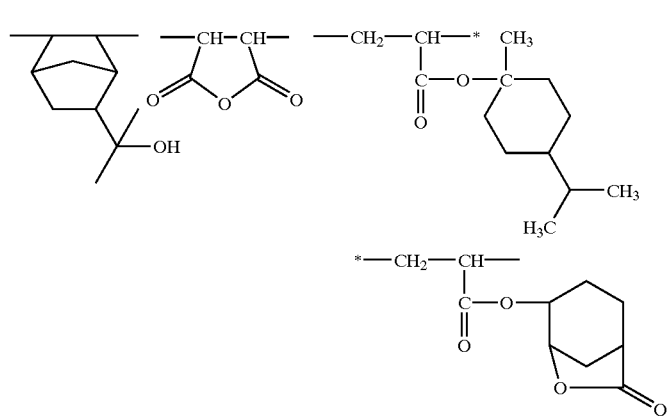
(94)
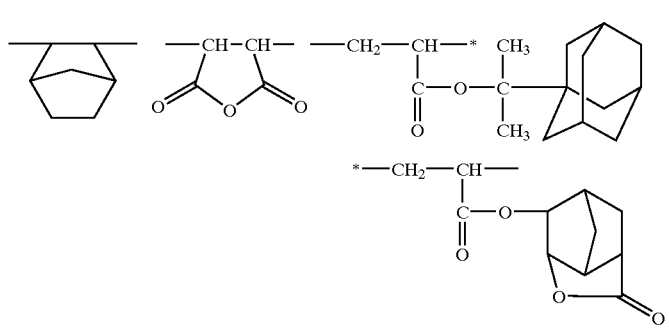
(95)

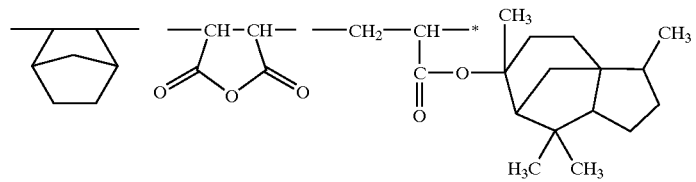
(96)
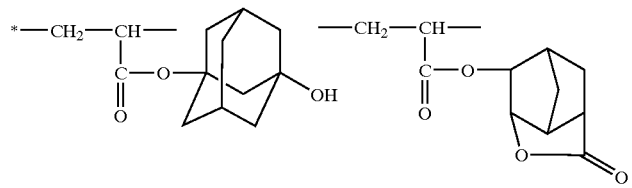
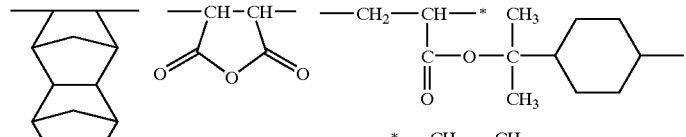
(97)
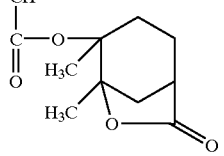
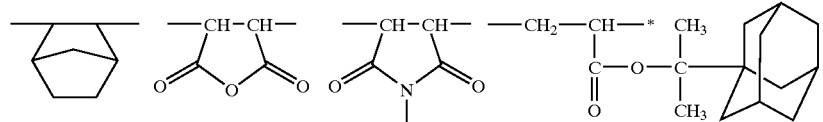
(98)
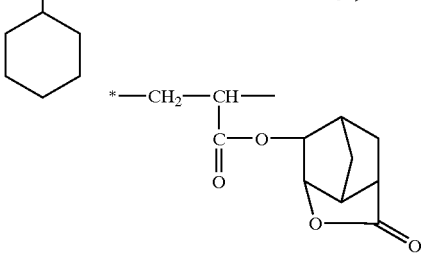
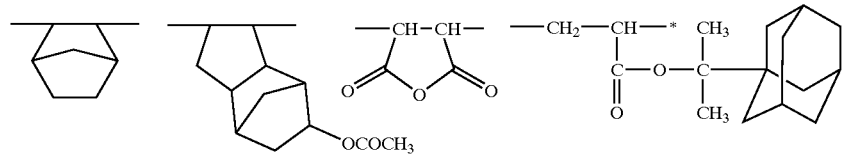
(99)
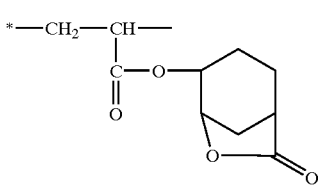

Preparation of Resist

Examples I-1 to I-80, II-1 to II-80 and III-1 to III-66 and Comparative Examples I-1 to I-4, II-1 to II-4, III-1 to III-4

Each component shown in Tables 7 to 17 below was dissolved and a solution having a solid content concentration of 12 wt % was prepared, and the solution was filtered through a Teflon filter having a pore diameter of 0.1 μm. Each of the prepared composition was evaluated in the methods described below. The results obtained are shown in Tables 18 to 28.

TABLE 7

| Example No. | Resin (10 g) | Acid Generator (II) (g) | Acid Generator (III) (g) | Others (g) | Base (g) | Surfactant (0.03 g) | Weight Ratio of Solvent |
|---|---|---|---|---|---|---|---|
| I-1 | (1) | I-2 (0.1) | III-2 (0.5) | | DBN (0.02) | W-1 | A1/B1 (95/5) |
| I-2 | (2) | I-8 (0.15) | III-1 (0.6) | | TPI (0.03) | W-1 | A1 (100) |
| I-3 | (3) | I-11 (0.15) | III-11 (0.5) | | TPSA (0.02) | W-2 | A1/B1 (90/10) |
| I-4 | (4) | I-5 (0.2) | III-15 (0.2) | a1 (0.1) | HEP (0.01) | W-2 | A3/B2 (80/20) |
| I-5 | (5) | I-14 (0.1) | III-2 (0.4) | | TPI (0.03) | W-3 | A2/B1 (90/10) |
| I-6 | (6) | I-13 (0.2) | III-12 (0.3) | | DIA (0.01) | W-3 | A4/B1 (90/10) |
| I-7 | (7) | I-11 (0.15) | III-17 (0.15) | | DIA (0.007) | W-4 | A1/B1 (50/50) |
| I-8 | (8) | I-10 (0.2) | III-1 (0.4) | | DBN (0.02) | W-4 | A1/B1 (90/10) |
| I-9 | (9) | I-8 (0.1) | III-1 (0.7) | LCB (1) | TPI (0.03) | W-1 | A5/B2 (90/10) |
| I-10 | (10) | I-8 (0.15) | III-14 (0.2) | | TPI (0.02) | W-1 | A1/B1 (95/5) |
| I-11 | (11) | I-11 (0.05) | III-14 (0.7) | | TPI (0.03) | W-2 | A1/B1 (90/10) |
| I-12 | (12) | I-5 (0.2) | III-1 (0.3) | | TPI (0.03) | W-2 | A1/B1 (95/5) |
| I-13 | (13) | I-14 (0.1) | III-1 (0.5) | a5 (0.2) | TPI (0.03) | W-3 | A1/B1 (95.5) |
| I-14 | (14) | I-13 (0.2) | III-4 (0.3) | | DBN (0.02) | W-3 | A1/B1 (95/5) |
| I-15 | (15) | I-11 (0.15) | III-16 (0.2) | | TPI (0.03) | W-4 | A1/B1 (80/20) |
| I-16 | (16) | I-10 (0.2) | III-1 (0.15) | | DIA (0.01) | W-4 | A1/B1 (80/20) |
| I-17 | (17) | I-12 (0.1) | III-1 (0.1) | | TPI (0.03) | W-4 | A1/B1 (95/5) |
| I-18 | (18) | I-12 (0.2) | III-8 (0.4) | | DCMA (0.01) | W-4 | A1/B1 (95/5) |
| I-19 | (19) | I-1 (0.2) | III-13 (0.5) | | TPI (0.02) | W-4 | A1/B1 (95/5) |
| I-20 | (20) | I-17 (0.05) | III-8 (0.5) | | TPI (0.03) | W-4 | A1/B1 (95/5) |
| I-21 | (21) | I-2 (0.1) | III-2 (0.5) | | DBN (0.02) | W-1 | A1/B1 (95/5) |
| I-22 | (22) | I-8 (0.15) | III-1 (0.6) | | TPI (0.03) | W-1 | A1/B1 (80/20) |
| I-23 | (23) | I-11 (0.1) | III-11 (0.6) | | TPSA (0.02) | W-2 | A1/B1 (90/10) |
| I-24 | (24) | I-5 (0.2) | III-15 (0.2) | a1 (0.1) | HEP (0.01) | W-2 | A3/B2 (80/20) |
| I-25 | (25) | I-14 (0.1) | III-2 (0.4) | | TPI (0.03) | W-3 | A2/B1 (90/10) |

TABLE 8

| Example No. | Resin (10 g) | Acid Generator (II) (g) | Acid Generator (III) (g) | Others (g) | Base (g) | Surfactant (0.03 g) | Weight Ratio of Solvent |
|---|---|---|---|---|---|---|---|
| I-26 | (26) | I-13 (0.2) | III-12 (0.3) | | DIA (0.01) | W-3 | A4/B1 (90/10) |
| I-27 | (27) | I-11 (0.15) | III-17 (0.15) | | DIA (0.007) | W-4 | A1/B1 (50/50) |
| I-28 | (28) | I-10 (0.2) | III-1 (0.4) | | DBN (0.02) | W-4 | A1/B1 (90/10) |
| I-29 | (29) | I-8 (0.1) | III-1 (0.7) | LCB (1) | TPI (0.03) | W-1 | A5/B2 (90/10) |
| I-30 | (30) | I-8 (0.15) | III-14 (0.2) | | TPI (0.02) | W-1 | A1/B1 (95/5) |
| I-31 | (31) | I-11 (0.1) | III-14 (0.5) | | TPI (0.03) | W-2 | A1/B1 (90/10) |
| I-32 | (32) | I-5 (0.2) | III-1 (0.3) | | TPI (0.03) | W-2 | A1/B1 (95/5) |
| I-33 | (33) | I-14 (0.1) | III-1 (0.5) | a5 (0.2) | TPI (0.03) | W-3 | A1/B1 (95/5) |
| I-34 | (34) | I-13 (0.2) | III-4 (0.3) | | DBN (0.02) | W-3 | A1/B1 (95/5) |
| I-35 | (35) | I-11 (0.15) | III-16 (0.2) | | TPI (0.03) | W-4 | A1/B1 (80/20) |
| I-36 | (36) | I-10 (0.2) | III-1 (0.15) | | DIA (0.01) | W-4 | A1/B1 (80/20) |
| I-37 | (37) | I-12 (0.1) | III-1 (0.1) | | TPI (0.03) | W-4 | A1/B1 (95/5) |
| I-38 | (38) | I-12 (0.2) | III-8 (0.4) | | DCMA (0.01) | W-4 | A1/B1 (95/5) |
| I-39 | (39) | I-1 (0.2) | III-13 (0.5) | | TPI (0.02) | W-4 | A1/B1 (95/5) |
| I-40 | (40) | I-17 (0.05) | III-8 (0.5) | | TPI (0.03) | W-4 | A1/B1 (95/5) |
| I-41 | (41) | I-2 (0.1) | III-2 (0.5) | | DBN (0.02) | W-1 | A1/B1 (95/5) |
| I-42 | (42) | I-8 (0.15) | III-1 (0.6) | | TPI (0.03) | W-1 | A1/B1 (80/20) |
| I-43 | (43) | I-11 (0.1) | III-11 (0.6) | | TPSA (0.02) | W-2 | A1/B1 (90/10) |
| I-44 | (44) | I-5 (0.2) | III-15 (0.2) | a1 (0.1) | HEP (0.01) | W-2 | A3/B2 (80/20) |
| I-45 | (45) | I-14 (0.1) | III-2 (0.4) | | TPI (0.03) | W-3 | A2/B1 (90/10) |
| I-46 | (46) | I-13 (0.2) | III-12 (0.3) | | DIA (0.01) | W-3 | A4/B1 (90/10) |
| I-47 | (47) | I-11 (0.15) | III-17 (0.15) | | DIA (0.007) | W-4 | A1/B1 (50/50) |
| I-48 | (48) | I-10 (0.2) | III-1 (0.4) | | DBN (0.02) | W-4 | A1/B1 (90/10) |
| I-49 | (49) | I-8 (0.1) | III-1 (0.7) | LCB (1) | TPI (0.03) | W-1 | A5/B2 (90/10) |
| I-50 | (50) | I-8 (0.15) | III-14 (0.2) | | TPI (0.02) | W-1 | A1/B1 (95/5) |

TABLE 9

| Example No. | Resin (10 g) | Acid Generator (II) (g) | Acid Generator (III) (g) | Others (g) | Base (g) | Surfactant (0.03 g) | Weight Ratio of Solvent |
|---|---|---|---|---|---|---|---|
| I-51 | (51) | I-11 (0.05) | III-14 (0.7) | | TPI (0.03) | W-2 | A1/B1 (90/10) |
| I-52 | (52) | I-5 (0.2) | III-1 (0.3) | | TPI (0.03) | W-2 | A1/B1 (95/5) |
| I-53 | (53) | I-14 (0.1) | III-1 (0.5) | a5 (0.2) | TPI (0.03) | W-3 | A1/B1 (95/5) |
| I-54 | (54) | I-13 (0.2) | III-4 (0.3) | | DBN (0.02) | W-3 | A1/B1 (95/5) |
| I-55 | (55) | I-11 (0.15) | III-16 (0.2) | | TPI (0.03) | W-4 | A1/B1 (80/20) |
| I-56 | (56) | I-10 (0.2) | III-1 (0.15) | | DIA (0.01) | W-4 | A1/B1 (80/20) |
| I-57 | (57) | I-12 (0.1) | III-1 (0.1) | | TPI (0.03) | W-4 | A1/B1 (95/5) |
| I-58 | (58) | I-12 (0.2) | III-8 (0.4) | | DCMA (0.1) | W-4 | A1/B1 (95/5) |
| I-59 | (59) | I-1 (0.1) | III-13 (0.5) | | TPI (0.02) | W-4 | A1/B1 (95/5) |
| I-60 | (60) | I-17 (0.05) | III-8 (0.5) | | TPI (0.03) | W-4 | A1/B1 (95/5) |
| I-61 | (61) | I-2 (0.1) | III-2 (0.5) | | DBN (0.02) | W-1 | A1/B1 (95/5) |
| I-62 | (62) | I-8 (0.15) | III-1 (0.6) | | TPI (0.03) | W-1 | A1/B1 (80/20) |
| I-63 | (63) | I-11 (0.1) | III-11 (0.6) | | TPSA (0.02) | W-2 | A1/B1 (90/10) |
| I-64 | (64) | I-5 (0.2) | III-15 (0.2) | a1 (0.1) | HEP (0.01) | W-2 | A3/B2 (80/20) |
| I-65 | (65) | I-14 (0.1) | III-2 (0.4) | | TPI (0.03) | W-3 | A2/B1 (90/10) |
| I-66 | (66) | I-13 (0.2) | III-12 (0.3) | | DIA (0.01) | W-3 | A4/B1 (90/10) |
| I-67 | (1) | I-1 (0.1) | III-15 (0.2) | | DBN (0.02) | W-1 | A1 (100) |
| I-68 | (3) | I-11 (0.15) | III-19 (0.3) | | TPI (0.03) | W-1 | A1 (100) |
| I-69 | (4) | I-5 (0.2) | III-23 (0.4) | | TPSA (0.02) | W-2 | A1/B1 (80/20) |
| I-70 | (6) | I-12 (0.2) | III-25 (0.2) | a1 (0.1) | HEP (0.01) | W-2 | A1/B1 (80/20) |
| I-71 | (7) | I-11 (0.2) | III-15 (0.1) | | TPI (0.03) | W-3 | A1/B2 (80/20) |
| I-72 | (11) | I-17 (0.1) | III-46 (0.3) | | DIA (0.01) | W-3 | A1/B2 (80/20) |
| I-73 | (13) | I-7 (0.1) | III-40 (0.3) | | DIA (0.007) | W-4 | A3/B2 (80/20) |
| I-74 | (14) | I-8 (0.15) | III-38 (0.5) | | DBN (0.02) | W-4 | A2/B2 (90/10) |
| I-75 | (15) | I-12 (0.1) | III-33 (0.2) | LCB-1 | TPI (0.03) | W-1 | A1/B4 (95/5) |

TABLE 10

| Example No. | Resin (10 g) | Acid Generator (II) (g) | Acid Generator (III) (g) | Others (g) | Base (g) | Surfactant (0.03 g) | Weight Ratio of Solvent |
|---|---|---|---|---|---|---|---|
| I-76 | (26) | I-21 (0.1) | III-32 (0.5) | | TPI (0.02) | W-1 | A1 (100) |
| I-77 | (31) | I-10 (0.2) | III-23 (0.3) | | TPI (0.03) | W-2 | A1/B1 (80/20) |
| I-78 | (35) | I-11 (0.15) | III-42 (0.3) | | TPI (0.03) | W-2 | A1/B1 (80/20) |
| I-79 | (42) | I-12 (0.2) | III-60 (0.2) | a5 (0.2) | TPI (0.03) | W-3 | A1 (100) |
| I-80 | (3) | I-11 (0.15) | III-40 (0.3) | | DBN (0.02) | W-3 | A1/A4 (95/5) |
| Comp. Ex. | | | | | | | |
| I-1 | (1) | I-2 (0.1) | | | DBN (0.02) | W-1 | A1/B1 (95/5) |
| I-2 | (1) | | III-2 (0.5) | | DBN (0.02) | W-1 | A1/B1 (95/5) |
| I-3 | (1) | I-2 (0.1) | III-2 (0.5) | | | W-1 | A1 (100) |
| I-4 | (1) | I-2 (0.1) | III-2 (0.5) | | DBN (0.02) | | A1/B1 (95/5) |

TABLE 11

| Example No. | Resin (10 g) | Acid Generator (II) (g) | Acid Generator (III) (g) | Others (g) | Base (g) | Surfactant (0.03 g) | Weight Ratio of Solvent |
|---|---|---|---|---|---|---|---|
| II-1 | (1) | II-2 (0.5) | III-2 (0.2) | | DBN (0.02) | W-1 | A1/B1 (95/5) |
| II-2 | (2) | II-1 (0.6) | III-1 (0.5) | | TPI (0.03) | W-1 | A1 (100) |
| II-3 | (3) | II-11 (0.6) | III-11 (0.7) | | TPSA (0.02) | W-2 | A1/B1 (90/10) |
| II-4 | (4) | II-15 (0.2) | III-15 (0.3) | a1 (0.1) | HEP (0.01) | W-2 | A3/B2 (80/20) |
| II-5 | (5) | II-2 (0.4) | III-2 (0.4) | TPST (0.1) | TPI (0.03) | W-3 | A2/B1 (90/10) |
| II-6 | (6) | II-12 (1) | III-12 (0.1) | | DIA (0.01) | W-3 | A4/B1 (90/10) |
| II-7 | (7) | II-17 (0.6) | III-17 (0.15) | | DIA (0.007) | W-4 | A1/B1 (50/50) |
| II-8 | (8) | II-1 (0.4) | III-1 (0.4) | | DBN (0.02) | W-4 | A1/B1 (90/10) |
| II-9 | (9) | II-1 (0.7) | III-1 (0.7) | LCB (1) | TPI (0.03) | W-1 | A5/B2 (90/10) |
| II-10 | (10) | II-14 (0.8) | III-14 (0.2) | | TPI (0.02) | W-1 | A1/B1 (95/5) |
| II-11 | (11) | II-14 (0.7) | III-14 (0.7) | | TPI (0.03) | W-2 | A1/B1 (90/10) |
| II-12 | (12) | II-1 (0.5) | III-1 (0.3) | | TPI (0.03) | W-2 | A1/B1 (95/5) |
| II-13 | (13) | II-1 (0.5) | III-1 (0.3) | a5 (0.2) | TPI (0.03) | W-3 | A1/B1 (95/5) |
| II-14 | (14) | II-4 (0.5) | III-4 (0.3) | | DBN (0.02) | W-3 | A1/B1 (95/5) |

TABLE 11-continued

| Example No. | Resin (10 g) | Acid Generator (II) (g) | Acid Generator (III) (g) | Others (g) | Base (g) | Surfactant (0.03 g) | Weight Ratio of Solvent |
|---|---|---|---|---|---|---|---|
| II-15 | (15) | II-16 (0.2) | III-16 (0.2) | | TPI (0.03) | W-4 | A1/B1 (80/20) |
| II-16 | (16) | II-1 (0.6) | III-1 (0.15) | | DIA (0.01) | W-4 | A1/B1 (80/20) |
| II-17 | (17) | II-1 (0.1) | III-1 (0.7) | | TPI (0.03) | W-4 | A1/B1 (95/5) |
| II-18 | (18) | II-8 (0.4) | III-8 (0.6) | | DCMA (0.01) | W-4 | A1/B1 (95/5) |
| II-19 | (19) | II-13 (0.7) | III-13 (0.3) | | TPI (0.02) | W-4 | A1/B1 (95/5) |
| II-20 | (20) | II-8 (0.5) | III-8 (0.5) | | TPI (0.03) | W-4 | A1/B1 (95/5) |
| II-21 | (21) | II-2 (0.5) | III-2 (0.2) | | DBN (0.02) | W-1 | A1/B1 (95/5) |
| II-22 | (22) | II-1 (0.6) | III-1 (0.5) | | TPI (0.03) | W-1 | A1/B1 (80/20) |
| II-23 | (23) | II-11 (0.6) | III-11 (0.7) | | TPSA (0.02) | W-2 | A1/B1 (90/10) |
| II-24 | (24) | II-15 (0.2) | III-15 (0.3) | a1 (0.1) | HEP (0.01) | W-2 | A3/B2 (80/20) |
| II-25 | (25) | II-2 (0.4) | III-2 (0.4) | TPST (0.1) | TPI (0.03) | W-3 | A2/B1 (90/10) |

TABLE 12

| Example No. | Resin (10 g) | Acid Generator (II) (g) | Acid Generator (III) (g) | Others (g) | Base (g) | Surfactant (0.03 g) | Weight Ratio of Solvent |
|---|---|---|---|---|---|---|---|
| II-26 | (26) | II-12 (1) | III-12 (0.1) | | DIA (0.01) | W-3 | A4/B1 (90/10) |
| II-27 | (27) | II-17 (0.6) | III-17 (0.15) | | DIA (0.007) | W-4 | A1/B1 (50/50) |
| II-28 | (28) | II-1 (0.4) | III-1 (0.4) | | DBN (0.02) | W-4 | A1/B1 (90/10) |
| II-29 | (29) | II-1 (0.7) | III-1 (0.7) | LCB (1) | TPI (0.03) | W-1 | A5/B2 (90/10) |
| II-30 | (30) | II-14 (0.8) | III-14 (0.2) | | TPI (0.02) | W-1 | A1/B1 (95/5) |
| II-31 | (31) | II-14 (0.7) | III-14 (0.7) | | TPI (0.03) | W-2 | A1/B1 (90/10) |
| II-32 | (32) | II-1 (0.5) | III-1 (0.3) | | TPI (0.03) | W-2 | A1/B1 (95/5) |
| II-33 | (33) | II-1 (0.5) | III-1 (0.3) | a5 (0.2) | TPI (0.03) | W-3 | A1/B1 (95/5) |
| II-34 | (34) | II-4 (0.5) | III-4 (0.3) | | DBN (0.2) | W-3 | A1/B1 (95/5) |
| II-35 | (35) | II-16 (0.2) | III-16 (0.2) | | TPI (0.03) | W-4 | A1/B1 (80/20) |
| II-36 | (36) | II-1 (0.6) | III-1 (0.15) | | DIA (0.01) | W-4 | A1/B1 (80/20) |
| II-37 | (37) | II-1 (0.1) | III-1 (0.7) | | TPI (0.03) | W-4 | A1/B1 (95/5) |
| II-38 | (38) | II-8 (0.4) | III-8 (0.6) | | DCMA (0.01) | W-4 | A1/B1 (95/5) |
| II-39 | (39) | II-13 (0.7) | III-13 (0.3) | | TPI (0.02) | W-4 | A1/B1 (95/5) |
| II-40 | (40) | II-8 (0.5) | III-8 (0.5) | | TPI (0.03) | W-4 | A1/B1 (95/5) |
| II-41 | (41) | II-2 (0.5) | III-2 (0.2) | | DBN (0.02) | W-1 | A1/B1 (95/5) |
| II-42 | (42) | II-1 (0.6) | III-1 (0.5) | | TPI (0.03) | W-1 | A1/B1 (80/20) |
| II-43 | (43) | II-11 (0.6) | III-11 (0.7) | | TPSA (0.02) | W-2 | A1/B1 (90/10) |
| II-44 | (44) | II-15 (0.2) | III-15 (0.3) | a1 (0.1) | HEP (0.01) | W-2 | A3/B2 (80/20) |
| II-45 | (45) | II-2 (0.4) | III-2 (0.4) | TPST (0.1) | TPI (0.03) | W-3 | A2/B1 (90/10) |
| II-46 | (46) | II-12 (1) | III-12 (0.1) | | DIA (0.01) | W-3 | A4/B1 (90/10) |
| II-47 | (47) | II-17 (0.6) | III-17 (0.15) | | DIA (0.007) | W-4 | A1/B1 (50/50) |
| II-48 | (48) | II-1 (0.4) | III-1 (0.4) | | DBN (0.02) | W-4 | A1/B1 (90/10) |
| II-49 | (49) | II-1 (0.7) | III-1 (0.7) | LCB (1) | TPI (0.03) | W-1 | A5/B2 (90/10) |
| II-50 | (50) | II-14 (0.8) | III-14 (0.2) | | TPI (0.02) | W-1 | A1/B1 (95/5) |

TABLE 13

| Example No. | Resin (10 g) | Acid Generator (II) (g) | Acid Generator (III) (g) | Others (g) | Base (g) | Surfactant (0.03 g) | Weight Ratio of Solvent |
|---|---|---|---|---|---|---|---|
| II-51 | (51) | II-14 (0.7) | III-14 (0.7) | | TPI (0.03) | W-2 | A1/B1 (90/10) |
| II-52 | (52) | II-1 (0.5) | III-1 (0.3) | | TPI (0.03) | W-2 | A1/B1 (95/5) |
| II-53 | (53) | II-1 (0.5) | III-1 (0.3) | a5 (0.2) | TPI (0.03) | W-3 | A1/B1 (95/5) |
| II-54 | (54) | II-4 (0.5) | III-4 (0.3) | | DBN (0.02) | W-3 | A1/B1 (95/5) |
| II-55 | (55) | II-16 (0.2) | III-16 (0.2) | | TPI (0.03) | W-4 | A1/B1 (80/20) |
| II-56 | (56) | II-1 (0.6) | III-1 (0.15) | | DIA (0.01) | W-4 | A1/B1 (80/20) |
| II-57 | (57) | II-1 (0.1) | III-1 (0.7) | | TPI (0.03) | W-4 | A1/B1 (95/5) |
| II-58 | (58) | II-8 (0.4) | III-8 (0.6) | | DCMA (0.01) | W-4 | A1/B1 (95/5) |
| II-59 | (59) | II-13 (0.7) | III-13 (0.3) | | TPI (0.02) | W-4 | A1/B1 (95/5) |
| II-60 | (60) | II-8 (0.5) | III-8 (0.5) | | TPI (0.03) | W-4 | A1/B1 (95/5) |
| II-61 | (61) | II-2 (0.5) | III-2 (0.2) | | DBN (0.02) | W-1 | A1/B1 (95/5) |
| II-62 | (62) | II-1 (0.6) | III-1 (0.5) | | TPI (0.03) | W-1 | A1/B1 (80/20) |
| II-63 | (63) | II-11 (0.6) | III-11 (0.7) | | TPSA (0.02) | W-2 | A1/B1 (90/10) |
| II-64 | (64) | II-15 (0.2) | III-15 (0.3) | a1 (0.1) | HEP (0.01) | W-2 | A3/B2 (80/20) |
| II-65 | (65) | II-2 (0.4) | III-2 (0.4) | TPST (0.1) | TPI (0.03) | W-3 | A2/B1 (90/10) |
| II-66 | (66) | II-12 (1) | III-12 (0.1) | | DIA (0.01) | W-3 | A4/B1 (90/10) |
| II-67 | (1) | II-1 (1) | III-15 (0.2) | | DBN (0.02) | W-1 | A1 (100) |
| II-68 | (3) | II-8 (0.3) | III-19 (0.3) | | TPI (0.03) | W-1 | A1 (100) |

TABLE 13-continued

| Example No. | Resin (10 g) | Acid Generator (II) (g) | Acid Generator (III) (g) | Others (g) | Base (g) | Surfactant (0.03 g) | Weight Ratio of Solvent |
|---|---|---|---|---|---|---|---|
| II-69 | (4) | II-10 (0.6) | III-23 (0.4) | | TPSA (0.02) | W-2 | A1/B1 (80/20) |
| II-70 | (6) | II-9 (0.2) | III-25 (0.2) | a1 (0.1) | HEP (0.01) | W-2 | A1/B1 (80/20) |
| II-71 | (7) | II-19 (0.2) | III-15 (0.1) | TPST (0.1) | TPI (0.03) | W-3 | A1/B2 (80/20) |
| II-72 | (11) | II-11 (0.1) | III-46 (0.3) | | DIA (0.03) | W-3 | A1/B2 (80/20) |
| II-73 | (13) | II-14 (0.3) | III-40 (0.3) | | DIA (0.007) | W-4 | A3/B2 (80/20) |
| II-74 | (14) | II-16 (0.7) | III-38 (0.3) | | DBN (0.02) | W-4 | A2/B2 (90/10) |
| II-75 | (15) | II-17 (0.2) | III-33 (0.5) | LCB (1) | TPI (0.03) | W-1 | A1/B4 (95/5) |

TABLE 14

| Example No. | Resin (10 g) | Acid Generator (II) (g) | Acid Generator (III) (g) | Others (g) | Base (g) | Surfactant (0.03) | Weight Ratio of Solvent |
|---|---|---|---|---|---|---|---|
| II-76 | (26) | II-20 (0.3) | III-32 (0.5) | | TPI (0.02) | W-1 | A1 (100) |
| II-77 | (31) | II-10 (0.2) | III-23 (0.3) | | TPI (0.03) | W-2 | A1/B1 (80/20) |
| II-78 | (35) | II-9 (0.15) | III-42 (0.3) | | TPI (0.03) | W-2 | A1/B1 (80/20) |
| II-79 | (42) | II-8 (0.2) | III-60 (0.2) | a5 (0.2) | TPI (0.03) | W-3 | A1 (100) |
| II-80 | (3) | II-11 (0.3) | III-40 (0.3) | | DBN (0.02) | W-3 | A1/A4 (95/5) |
| Comp. Ex. | | | | | | | |
| II-1 | (1) | II-2 (0.5) | | | DBN (0.02) | W-1 | A1/B1 (95/5) |
| II-2 | (1) | | III-2 (0.2) | | DBN (0.02) | W-1 | A1/B1 (95/5) |
| II-3 | (1) | II-2 (0.5) | III-2 (0.2) | | DBN (0.02) | | A1/B1 (95/5) |
| II-4 | (1) | II-2 (0.5) | III-2 (0.2) | | | W-1 | A1 (100) |

TABLE 15

| Example No. | Acid Generator (I) (g) | Acid Generator (II) (g) | Resin (10 g) | Basic Compound (g) | Surfactant (0.03 g) | Weight Ratio of Solvent | Others (g) |
|---|---|---|---|---|---|---|---|
| III-1 | I-2 (0.1) | II-2 (0.5) | (1) | DBN (0.02) | W-1 | A1/B1 (95/5) | |
| III-2 | I-8 (0.15) | II-1 (0.6) | (2) | TPI (0.03) | W-1 | A1 (100) | |
| III-3 | I-11 (0.1) | II-11 (0.6) | (3) | TPSA (0.02) | W-2 | A1/B1 (90/10) | |
| III-4 | I-5 (0.2) | II-15 (0.2) | (4) | HEP (0.01) | W-2 | A3/B2 (80/20) | a1 (0.1) |
| III-5 | I-14 (0.1) | II-2 (0.4) | (5) | TPI (0.03) | W-3 | A2/B1 (90/10) | |
| III-6 | I-13 (0.2) | II-12 (0.3) | (6) | TPA (0.01) | W-3 | A4/B1 (90/10) | |
| III-7 | I-11 (0.15) | II-17 (0.15) | (7) | TPA (0.007) | W-4 | A1/B1 (50/50) | |
| III-8 | I-10 (0.2) | II-1 (0.4) | (8) | DBN (0.02) | W-4 | A1/B1 (90/10) | |
| III-9 | I-8 (0.1) | II-1 (0.7) | (9) | TPI (0.03) | W-1 | A5/B2 (90/10) | LCB (1) |
| III-10 | I-8 (0.15) | II-14 (0.2) | (10) | TPI (0.02) | W-1 | A1/B1 (95/5) | |
| III-11 | I-11 (0.05) | II-14 (0.7) | (11) | TPI (0.03) | W-2 | A1/B1 (90/10) | |
| III-12 | I-5 (0.2) | II-1 (0.3) | (12) | TPI (0.03) | W-2 | A1/B1 (95/5) | |
| III-13 | I-14 (0.1) | II-1 (0.5) | (13) | TPI (0.03) | W-3 | A1/B1 (95/5) | a5 (0.2) |
| III-14 | I-13 (0.2) | II-4 (0.3) | (14) | DBN (0.02) | W-3 | A1/B1 (95/5) | |
| III-15 | I-11 (0.15) | II-16 (0.2) | (15) | TPI (0.03) | W-4 | A1/B1 (80/20) | |
| III-16 | I-10 (0.2) | II-1 (0.15) | (16) | TPA (0.01) | W-4 | A1/B1 (80/20) | |
| III-17 | I-12 (0.1) | II-1 (0.1) | (17) | TPI (0.03) | W-4 | A1/B1 (95/5) | |
| III-18 | I-12 (0.2) | II-8 (0.4) | (18) | DCHA (0.01) | W-4 | A1/B1 (95/5) | |
| III-19 | I-1 (0.1) | II-13 (0.5) | (19) | TPI (0.02) | W-4 | A1/B1 (95/5) | |
| III-20 | I-17 (0.05) | II-8 (0.5) | (20) | TPI (0.03) | W-4 | A1/B1 (95/5) | |
| III-21 | I-2 (0.1) | II-2 (0.5) | (21) | DBN (0.02) | W-1 | A1/B1 (95/5) | |
| III-22 | I-8 (0.15) | II-1 (0.6) | (22) | TPI (0.03) | W-1 | A1/B1 (80/20) | |
| III-23 | I-11 (0.1) | II-11 (0.6) | (23) | TPSA (0.02) | W-2 | A1/B1 (90/10) | |
| III-24 | I-5 (0.2) | II-15 (0.2) | (24) | HEP (0.01) | W-2 | A3/B2 (80/20) | a1 (0.1) |
| III-25 | I-14 (0.1) | II-2 (0.4) | (25) | TPI (0.03) | W-3 | A2/B1 (90/10) | |

TABLE 16

| Example No. | Acid Generator (I) (g) | Acid Generator (II) (g) | Resin (10 g) | Basic Compound (g) | Surfactant (0.03) | Weight Ratio of Solvent | Others (g) |
|---|---|---|---|---|---|---|---|
| III-26 | I-13 (0.2) | II-12 (0.3) | (26) | TPA (0.01) | W-3 | A4/B1 (90/10) | |
| III-27 | I-11 (0.15) | II-17 (0.15) | (27) | TPA (0.007) | W-4 | A1/B1 (50/50) | |
| III-28 | I-10 (0.2) | II-1 (0.4) | (28) | DBN (0.02) | W-4 | A1/B1 (90/10) | |

TABLE 16-continued

| Example No. | Acid Generator (I) (g) | Acid Generator (II) (g) | Resin (10 g) | Basic Compound (g) | Surfactant (0.03) | Weight Ratio of Solvent | Others (g) |
|---|---|---|---|---|---|---|---|
| III-29 | I-8 (0.1) | II-1 (0.7) | (29) | TPI (0.03) | W-1 | A5/B2 (90/10) | LCB (1) |
| III-30 | I-8 (0.15) | II-14 (0.2) | (30) | TPI (0.02) | W-1 | A1/B1 (95/5) | |
| III-31 | I-11 (0.05) | II-14 (0.7) | (31) | TPI (0.03) | W-2 | A1/B1 (90/10) | |
| III-32 | I-5 (0.2) | II-1 (0.3) | (32) | TPI (0.03) | W-2 | A1/B1 (95/5) | |
| III-33 | I-14 (0.1) | II-1 (0.5) | (33) | TPI (0.03) | W-3 | A1/B1 (95/5) | a5 (0.2) |
| III-34 | I-13 (0.2) | II-4 (0.3) | (34) | DBN (0.02) | W-3 | A1/B1 (95/5) | |
| III-35 | I-11 (0.15) | II-16 (0.2) | (35) | TPI (0.03) | W-4 | A1/B1 (80/20) | |
| III-36 | I-10 (0.2) | II-1 (0.15) | (36) | TPA (0.01) | W-4 | A1/B1 (80/20) | |
| III-37 | I-12 (0.1) | II-1 (0.1) | (37) | TPI (0.03) | W-4 | A1/B1 (95/5) | |
| III-38 | I-12 (0.2) | II-8 (0.4) | (38) | DCMA (0.01) | W-4 | A1/B1 (95/5) | |
| III-39 | I-1 (0.1) | II-13 (0.5) | (39) | TPI (0.02) | W-4 | A1/B1 (95/5) | |
| III-40 | I-17 (0.05) | II-8 (0.5) | (40) | TPI (0.03) | W-4 | A1/B1 (95/5) | |
| III-41 | I-2 (0.1) | II-2 (0.5) | (41) | DBN (0.02) | W-1 | A1/B1 (95/5) | |
| III-42 | I-8 (0.15) | II-1 (0.6) | (42) | TPI (0.03) | W-1 | A1/B1 (80/20) | |
| III-43 | I-11 (0.1) | II-11 (0.6) | (43) | TPSA (0.02) | W-2 | A1/B1 (90/10) | |
| III-44 | I-5 (0.2) | II-15 (0.2) | (44) | HEP (0.01) | W-2 | A3/B2 (80/20) | a1 (0.1) |
| III-45 | I-14 (0.1) | II-2 (0.4) | (45) | TPI (0.03) | W-3 | A1/B1 (90/10) | |
| III-46 | I-13 (0.2) | II-12 (0.3) | (46) | TPA (0.01) | W-3 | A4/B1 (90/10) | |
| III-47 | I-11 (0.15) | II-17 (0.15) | (47) | TPA (0.007) | W-4 | A1/B1 (50/50) | |
| III-48 | I-10 (0.2) | II-1 (0.4) | (48) | DBN (0.02) | W-4 | A1/B1 (90/10) | |
| III-49 | I-8 (0.1) | II-1 (0.7) | (49) | TPI (0.03) | W-1 | A5/B2 (90/10) | LCB (1) |
| III-50 | I-8 (0.15) | II-14 (0.2) | (50) | TPI (0.02) | W-1 | A1/B1 (95/5) | |

TABLE 17

| Example No. | Acid Generator (I) (g) | Acid Generator (II) (g) | Resin (10 g) | Basic Compound (g) | Surfactant (0.03 g) | Weight Ratio of Solvent | Others (g) |
|---|---|---|---|---|---|---|---|
| III-51 | I-11 (0.05) | II-14 (0.7) | (51) | TPI (0.03) | W-2 | A1/B1 (90/10) | |
| III-52 | I-5 (0.2) | II-1 (0.3) | (52) | TPI (0.03) | W-2 | A1/B1 (95/5) | |
| III-53 | I-14 (0.1) | II-1 (0.5) | (53) | TPI (0.03) | W-3 | A1/B1 (95/5) | a5 (0.2) |
| III-54 | I-13 (0.2) | II-4 (0.3) | (54) | DBN (0.02) | W-3 | A1/B1 (95/5) | |
| III-55 | I-11 (0.15) | II-16 (0.2) | (55) | TPI (0.03) | W-4 | A1/B1 (80/20) | |
| III-56 | I-10 (0.2) | II-1 (0.15) | (56) | TPA (0.01) | W-4 | A1/B1 (80/20) | |
| III-57 | I-12 (0.1) | II-1 (0.1) | (57) | TPI (0.03) | W-4 | A1/B1 (95/5) | |
| III-58 | I-12 (0.2) | II-8 (0.4) | (58) | DCMA (0.01) | W-4 | A1/B1 (95/5) | |
| III-59 | I-1 (0.1) | II-13 (0.5) | (59) | TPI (0.02) | W-4 | A1/B1 (95/5) | |
| III-60 | I-17 (0.05) | II-8 (0.5) | (60) | TPI (0.03) | W-4 | A1/B1 (95/5) | |
| III-61 | I-2 (0.1) | II-2 (0.5) | (61) | DBN (0.02) | W-1 | A1/B1 (95/5) | |
| III-62 | I-8 (0.15) | II-1 (0.6) | (62) | TPI (0.03) | W-1 | A1/B1 (80/20) | |
| III-63 | I-11 (0.1) | II-11 (0.6) | (63) | TPSA (0.02) | W-2 | A1/B1 (90/10) | |
| III-64 | I-5 (0.2) | II-15 (0.2) | (64) | HEP (0.01) | W-2 | A3/B2 (80/20) | a1 (0.1) |
| III-65 | I-14 (0.1) | II-12 (0.4) | (65) | TPI (0.03) | W-3 | A2/B1 (90/10) | |
| III-66 | I-13 (0.2) | II-12 (0.3) | (66) | TPA (0.01) | W-3 | A4/B1 (90/10) | |
| Comp. Ex. III-1 | I-2 (0.1) | | (1) | DBN (0.02) | W-1 | A1/B1 (95/5) | |
| Comp. Ex. III-2 | | II-2 (0.5) | (1) | DBN (0.02) | W-1 | A1/B1 (95/5) | |
| Comp. Ex. III-3 | I-2 (0.1) | II-2 (0.5) | (1) | DBN (0.02) | | A1/B1 (95/5) | |
| Comp. Ex. III-4 | I-2 (0.1) | II-2 (0.5) | (1) | | W-1 | A1 (100) | |

The abbreviations in the Tables are as follows.
DBN: 1,5-Diazabicyclo[4.3.0]nona-5-ene
TPI: 2,4,5-Triphenylimidazole
TPSA: Triphenylsulfonium acetate
HEP: N-Hydroxyethyl piperidine
DIA: 2,6-Diisopropylaniline
DCMA: Dicyclohexylmethylamine
LCB: t-Butyl lithocholate
TPA: Tripentylamine
TPST: Triphenylsulfonium perfluorobutanesulfonate
W-1: Megafac F176 (manufactured by Dainippon Chemicals and Ink Co., Ltd., fluorine-based)
W-2: Megafac R08 (manufactured by Dainippon Ink & Chemicals, Co., Ltd., fluorine-based and silicon-based)
W-3: Polysiloxane polymer KP-341 (manufactured by Shin-Etsu Chemical Co., Ltd.)
W-4: Troy Sol S-366 (manufactured by Troy Chemical Inc.)

The abbreviations of the solvents are as follows. In the case where a plurality of solvents are used, the ratio is described in weight ratio in the Tables.
A1: Propylene glycol methyl ether acetate
A2: 2-Heptanone
A3: Ethylethoxy propionate
A4: γ-Butyrolactone
A5: Cyclohexanone
A6: Butyl acetate
B1: Propylene glycol methyl ether
B2: Ethyl lactate
Image Evaluation
(1) DOF (Defocus Latitude)
ARC25 anti-reflection coating manufactured by Brewer Science Co. was coated on a silicon substrate subjected to treatment with hexamethyl disilazane in a uniform thickness of 600 Å with a spin coater, the substrate was dried on a hot plate at 100° C. for 90 seconds, and then dried by heating at 190° C. for 240 seconds. Thereafter, each photosensitive composition was coated on the substrate with a spin coater, dried for 90 seconds (at 140° C. in Examples I-1 to I-80 and Comparative Examples I-1 to I-4, at 130° C. in Examples II-1 to II-80 and Comparative Examples II-1 to II-4, and at 135° C. in Examples III-1 to III-66 and Comparative Examples III-1 to III-4), thereby a resist film having a thickness of 0.40 μm was obtained. Exposure was performed on the resist film through a mask with an ArF excimer laser stepper (ISI Co., NA: 0.6 (σ=0.75, 2/3 zonal illumination)), and the resist film was heated on a hot plate immediately after exposure for 90 seconds (at 140° C. in Examples I-1 to I-80 and Comparative Examples I-1 to I-4, at 130° C. in Examples II-1 to II-80 and Comparative Examples II-1 to II-4, and at 135° C. in Examples III-1 to III-66 and Comparative Examples III-1 to III-4). Further, the resist was subjected to development with a 2.38 wt % tetramethylammonium hydroxide aqueous solution at 23° C. for 60 seconds, rinsed with pure water for 30 seconds and dried, thereby a resist pattern was obtained. Defocus latitude of 0.13 μm in exposure amount required to reproduce 0.13 μm line-and-space (1/1) was observed.

(2) Side Lobe Margin

ARC25 anti-reflection coating manufactured by Brewer Science Co. was coated on a silicon substrate treated with hexamethyl disilazane in a uniform thickness of 600 Å with a spin coater, the substrate was dried on a hot plate at 100° C. for 90 seconds, and then dried by heating at 190° C. for 240 seconds. Thereafter, each photosensitive composition was coated on the substrate with a spin coater, dried for 90 seconds (at 140° C. in Examples I-1 to I-80 and Comparative Examples I-1 to I-4, at 130° C. in Examples II-1 to II-80 and Comparative Examples II-1 to II-4, and at 135° C. in Examples III-1 to III-66 and Comparative Examples III-1 to III-4), thereby a resist film having a thickness of 0.40 μm was obtained. Exposure was performed on the resist film through a half tone phase shift mask having transmittance of 6% with an ArF excimer laser stepper (ISI Co., NA: 0.6), and the resist film was heated on a hot plate immediately after exposure for 90 seconds (at 140° C. in Examples I-1 to I-80 and Comparative Examples I-1 to I-4, at 130° C. in Examples II-1 to II-80 and Comparative Examples II-1 to II-4, and at 135° C. in Examples III-1 to III-66 and Comparative Examples III-1 to III-4). Further, the resist was subjected to development with a 2.38 wt % tetramethylammonium hydroxide aqueous solution at 23° C. for 60 seconds, rinsed with pure water for 30 seconds and dried, thereby a contact hole pattern was obtained.

The exposure amount to open a contact hole of 0.18 μm with the dimension of mask size 0.20 μm of duty ratio 1/2 is taken optimal exposure amount Eop, and the relationship with the exposure amount Es which causes side lobe by exposure over optimal exposure amount is obtained from the following equation, and this value is taken as side lobe margin. The higher the value, the higher is the side lobe resistance.

Side lobe margin (%)=[($Es-Eop$)/$Eop$]×100

(3) Particles

After allowing to stand the prepared photosensitive composition at 4° C. for one week, the number of particles having a particle size of 0.2 μm or more present in the solution with a particle counter manufactured by Lyon Co.

TABLE 18

| Example No. | DOF (μm) | Side Lobe Margin (%) | Particle |
|---|---|---|---|
| I-1 | 0.6 | 21 | <5 |
| I-2 | 0.6 | 24 | 5 |
| I-3 | 0.6 | 26 | <5 |
| I-4 | 0.8 | 29 | <5 |
| I-5 | 0.8 | 25 | <5 |
| I-6 | 0.8 | 30 | <5 |
| I-7 | 0.6 | 28 | <5 |
| I-8 | 0.8 | 31 | <5 |
| I-9 | 0.7 | 22 | <5 |
| I-10 | 0.9 | 32 | <5 |
| I-11 | 0.7 | 21 | <5 |
| I-12 | 0.8 | 27 | <5 |
| I-13 | 0.6 | 22 | <5 |
| I-14 | 0.8 | 29 | <5 |
| I-15 | 0.7 | 28 | <5 |
| I-16 | 0.8 | 26 | <5 |
| I-17 | 0.9 | 33 | <5 |
| I-18 | 0.7 | 30 | <5 |
| I-19 | 0.8 | 29 | <5 |
| I-20 | 0.8 | 25 | <5 |
| I-21 | 0.8 | 24 | <5 |
| I-22 | 0.7 | 24 | <5 |
| I-23 | 0.8 | 24 | <5 |
| I-24 | 0.9 | 33 | <5 |
| I-25 | 0.8 | 29 | <5 |

TABLE 19

| Example No. | DOF (μm) | Side Lobe Margin (%) | Particle |
|---|---|---|---|
| I-26 | 0.8 | 31 | <5 |
| I-27 | 0.8 | 30 | <5 |
| I-28 | 0.7 | 29 | <5 |
| I-29 | 0.8 | 25 | <5 |
| I-30 | 0.7 | 28 | <5 |
| I-31 | 0.8 | 24 | <5 |
| I-32 | 0.8 | 29 | <5 |
| I-33 | 0.9 | 26 | <5 |
| I-34 | 0.9 | 33 | <5 |
| I-35 | 0.8 | 31 | <5 |
| I-36 | 0.7 | 28 | <5 |
| I-37 | 0.8 | 30 | <5 |
| I-38 | 0.7 | 28 | <5 |
| I-39 | 0.8 | 29 | <5 |
| I-40 | 0.7 | 26 | <5 |
| I-41 | 0.6 | 24 | <5 |
| I-42 | 0.8 | 27 | <5 |
| I-43 | 0.8 | 27 | Particle |
| I-44 | 0.9 | 34 | <5 |
| I-45 | 0.8 | 28 | <5 |
| I-46 | 0.9 | 33 | <5 |
| I-47 | 0.8 | 31 | <5 |
| I-48 | 0.8 | 30 | <5 |
| I-49 | 0.8 | 26 | <5 |
| I-50 | 0.8 | 31 | <5 |

TABLE 20

| Example No. | DOF (μm) | Side Lobe Margin (%) | Particle |
|---|---|---|---|
| I-51 | 0.7 | 25 | <5 |
| I-52 | 0.8 | 30 | <5 |
| I-53 | 0.8 | 24 | <5 |
| I-54 | 0.8 | 30 | <5 |
| I-55 | 0.8 | 31 | <5 |
| I-56 | 0.7 | 28 | <5 |

TABLE 20-continued

| Example No. | DOF (μm) | Side Lobe Margin (%) | Particle |
|---|---|---|---|
| I-57 | 0.7 | 29 | <5 |
| I-58 | 0.7 | 30 | <5 |
| I-59 | 0.7 | 25 | <5 |
| I-60 | 0.7 | 25 | <5 |
| I-61 | 0.7 | 25 | <5 |
| I-62 | 0.7 | 27 | <5 |
| I-63 | 0.7 | 25 | <5 |
| I-64 | 0.9 | 34 | <5 |
| I-65 | 0.8 | 30 | <5 |
| I-66 | 0.6 | 35 | <5 |
| I-67 | 0.8 | 36 | <5 |
| I-68 | 0.9 | 38 | <5 |
| I-69 | 0.8 | 37 | <5 |
| I-70 | 0.9 | 39 | <5 |
| I-71 | 0.8 | 45 | <5 |
| I-72 | 0.9 | 41 | <5 |
| I-73 | 0.8 | 40 | <5 |
| I-74 | 0.9 | 38 | <5 |
| I-75 | 0.8 | 37 | <5 |

TABLE 21

| Example No. | DOF (μm) | Side Lobe Margin (%) | Particle |
|---|---|---|---|
| I-76 | 0.8 | 45 | <5 |
| I-77 | 0.9 | 41 | <5 |
| I-78 | 0.8 | 40 | <5 |
| I-79 | 0.9 | 38 | <5 |
| I-80 | 0.8 | 37 | <5 |
| Comparative Example | | | |
| I-1 | 0.4 | 16 | <5 |
| I-2 | 0.5 | 12 | <5 |
| I-3 | 0.3 | 9 | <5 |
| I-4 | 0.4 | 10 | 145 |

TABLE 22

| Example No. | DOF (μm) | Side Lobe Margin (%) | Particle |
|---|---|---|---|
| II-1 | 0.6 | 23 | <5 |
| II-2 | 0.6 | 25 | 10 |
| II-3 | 0.7 | 27 | <5 |
| II-4 | 0.8 | 34 | <5 |
| II-5 | 0.7 | 29 | <5 |
| II-6 | 0.8 | 30 | <5 |
| II-7 | 0.7 | 28 | <5 |
| II-8 | 0.8 | 32 | <5 |
| II-9 | 0.7 | 27 | <5 |
| II-10 | 0.7 | 26 | <5 |
| II-11 | 0.7 | 25 | <5 |
| II-12 | 0.8 | 32 | <5 |
| II-13 | 0.7 | 23 | <5 |
| II-14 | 0.8 | 33 | <5 |
| II-15 | 0.8 | 29 | <5 |
| II-16 | 0.8 | 35 | <5 |
| II-17 | 0.9 | 34 | <5 |
| II-18 | 0.7 | 34 | <5 |
| II-19 | 0.8 | 35 | <5 |
| II-20 | 0.8 | 38 | <5 |
| II-21 | 0.8 | 39 | <5 |
| II-22 | 0.8 | 40 | <5 |

TABLE 22-continued

| Example No. | DOF (μm) | Side Lobe Margin (%) | Particle |
|---|---|---|---|
| II-23 | 0.8 | 40 | <5 |
| II-24 | 0.9 | 45 | <5 |
| II-25 | 0.9 | 44 | <5 |

TABLE 23

| Example No. | DOF (μm) | Side Lobe Margin (%) | Particle |
|---|---|---|---|
| II-26 | 0.8 | 38 | <5 |
| II-27 | 0.8 | 41 | <5 |
| II-28 | 0.7 | 37 | <5 |
| II-29 | 0.8 | 38 | <5 |
| II-30 | 0.7 | 37 | <5 |
| II-31 | 0.8 | 37 | <5 |
| II-32 | 0.8 | 38 | <5 |
| II-33 | 0.9 | 41 | <5 |
| II-34 | 0.9 | 40 | <5 |
| II-35 | 0.8 | 37 | <5 |
| II-36 | 0.7 | 36 | <5 |
| II-37 | 0.8 | 37 | <5 |
| II-38 | 0.7 | 35 | <5 |
| II-39 | 0.8 | 36 | <5 |
| II-40 | 0.7 | 35 | <5 |
| II-41 | 0.7 | 35 | <5 |
| II-42 | 0.8 | 38 | <5 |
| II-43 | 0.8 | 37 | <5 |
| II-44 | 0.9 | 45 | <5 |
| II-45 | 0.9 | 46 | <5 |
| II-46 | 0.9 | 46 | <5 |
| II-47 | 0.8 | 39 | <5 |
| II-48 | 0.8 | 40 | <5 |
| II-49 | 0.8 | 41 | <5 |
| II-50 | 0.8 | 39 | <5 |

TABLE 24

| Example No. | DOF (μm) | Side Lobe Margin (%) | Particle |
|---|---|---|---|
| II-51 | 0.8 | 38 | <5 |
| II-52 | 0.8 | 37 | <5 |
| II-53 | 0.8 | 38 | <5 |
| II-54 | 0.8 | 37 | <5 |
| II-55 | 0.8 | 38 | <5 |
| II-56 | 0.8 | 39 | <5 |
| II-57 | 0.7 | 39 | <5 |
| II-58 | 0.7 | 38 | <5 |
| II-59 | 0.7 | 38 | <5 |
| II-60 | 0.7 | 38 | <5 |
| II-61 | 0.7 | 39 | <5 |
| II-62 | 0.7 | 41 | <5 |
| II-63 | 0.7 | 40 | <5 |
| II-64 | 0.9 | 45 | <5 |
| II-65 | 0.9 | 48 | <5 |
| II-66 | 0.6 | 41 | <5 |
| II-67 | 0.8 | 36 | <5 |
| II-68 | 0.9 | 35 | <5 |
| II-69 | 0.8 | 40 | <5 |
| II-70 | 0.9 | 38 | <5 |
| II-71 | 0.8 | 39 | <5 |
| II-72 | 0.9 | 37 | <5 |
| II-73 | 0.8 | 41 | <5 |
| II-74 | 0.9 | 35 | <5 |
| II-75 | 0.8 | 36 | <5 |

TABLE 25

| Example No. | DOF (μm) | Side Lobe Margin (%) | Particle |
| --- | --- | --- | --- |
| Example | | | |
| II-76 | 0.8 | 35 | <5 |
| II-77 | 0.9 | 36 | <5 |
| II-78 | 0.8 | 37 | <5 |
| II-79 | 0.9 | 38 | <5 |
| II-80 | 0.8 | 37 | <5 |
| Comparative Example | | | |
| II-1 | 0.5 | 18 | <5 |
| II-2 | 0.4 | 15 | <5 |
| II-3 | 0.5 | 20 | 98 |
| II-4 | 0.2 | 8 | <5 |

TABLE 26

| Example No. | DOF (μm) | Side Lobe Margin (%) | Particle |
| --- | --- | --- | --- |
| III-1 | 0.6 | 21 | <5 |
| III-2 | 0.6 | 22 | 5 |
| III-3 | 0.7 | 27 | <5 |
| III-4 | 0.8 | 31 | <5 |
| III-5 | 0.8 | 26 | <5 |
| III-6 | 0.8 | 28 | <5 |
| III-7 | 0.7 | 25 | <5 |
| III-8 | 0.8 | 30 | <5 |
| III-9 | 0.7 | 26 | <5 |
| III-10 | 0.9 | 25 | <5 |
| III-11 | 0.7 | 23 | <5 |
| III-12 | 0.8 | 30 | <5 |
| III-13 | 0.6 | 21 | <5 |
| III-14 | 0.8 | 31 | <5 |
| III-15 | 0.7 | 28 | <5 |
| III-16 | 0.8 | 33 | <5 |
| III-17 | 0.9 | 32 | <5 |
| III-18 | 0.7 | 32 | <5 |
| III-19 | 0.8 | 34 | <5 |
| III-20 | 0.8 | 36 | <5 |
| III-21 | 0.8 | 37 | <5 |
| III-22 | 0.8 | 39 | <5 |
| III-23 | 0.8 | 38 | <5 |
| III-24 | 0.9 | 43 | <5 |
| III-25 | 0.8 | 42 | <5 |

TABLE 27

| Example No. | DOF (μm) | Side Lobe Margin (%) | Particle |
| --- | --- | --- | --- |
| III-26 | 0.8 | 36 | <5 |
| III-27 | 0.8 | 39 | <5 |
| III-28 | 0.7 | 34 | <5 |
| III-29 | 0.8 | 37 | <5 |
| III-30 | 0.7 | 36 | <5 |
| III-31 | 0.8 | 36 | <5 |
| III-32 | 0.8 | 37 | <5 |
| III-33 | 0.9 | 40 | <5 |
| III-34 | 0.9 | 38 | <5 |
| III-35 | 0.8 | 36 | <5 |
| III-36 | 0.7 | 34 | <5 |
| III-37 | 0.8 | 36 | <5 |
| III-38 | 0.7 | 34 | <5 |
| III-39 | 0.8 | 35 | <5 |
| III-40 | 0.7 | 33 | <5 |
| III-41 | 0.7 | 33 | <5 |
| III-42 | 0.8 | 36 | <5 |
| III-43 | 0.8 | 36 | <5 |
| III-44 | 0.9 | 43 | <5 |
| III-45 | 0.9 | 44 | <5 |
| III-46 | 0.9 | 44 | <5 |
| III-47 | 0.8 | 37 | <5 |
| III-48 | 0.8 | 39 | <5 |
| III-49 | 0.8 | 40 | <5 |
| III-50 | 0.8 | 38 | <5 |

TABLE 28

| Example No. | DOF (μm) | Side Lobe Margin (%) | Particle |
| --- | --- | --- | --- |
| III-51 | 0.8 | 36 | <5 |
| III-52 | 0.8 | 35 | <5 |
| III-53 | 0.8 | 36 | <5 |
| III-54 | 0.8 | 35 | <5 |
| III-55 | 0.8 | 36 | <5 |
| III-56 | 0.8 | 37 | <5 |
| III-57 | 0.7 | 37 | <5 |
| III-58 | 0.7 | 35 | <5 |
| III-59 | 0.7 | 36 | <5 |
| III-60 | 0.7 | 35 | <5 |
| III-61 | 0.7 | 37 | <5 |
| III-62 | 0.7 | 40 | <5 |
| III-63 | 0.7 | 38 | <5 |
| III-64 | 0.9 | 44 | <5 |
| III-65 | 0.9 | 46 | <5 |
| III-66 | 0.6 | 38 | <5 |
| Comparative Example III-1 | 0.5 | 16 | <5 |
| Comparative Example III-2 | 0.7 | 14 | <5 |
| Comparative Example III-3 | 0.4 | 16 | 93 |
| Comparative Example III-4 | 0.5 | 13 | 146 |

From the above results, the following facts can be seen.

The compositions of the present invention are broad in defocus latitude, excellent in side lobe resistance, and particles are hardly generated.

On the other hand, the compositions in comparative examples are inferior to the compositions of the present invention in defocus latitude, side lobe resistance, and particle generation.

The positive photosensitive composition in the first embodiment of the present invention is broad in defocus latitude when zonal illumination is used, side lobe is difficult to be caused when pattern formation is performed with a half tone phase shift mask, and particles are hardly generated in aging storage.

Examples IV-1 to IV-60 and Comparative Examples IV-1 and IV-2

Preparation and Evaluation of Positive Resist Composition

Each of the above synthesized resins shown in Tables 29 to 31 (2 g), a photo-acid generator, organic basic compound (amine) (5 mg) and, if necessary, a surfactant (10 mg) were blended as shown in Tables 29 to 31, dissolved in the solvent shown in Tables 29 to 31 in solid content concentration of 14 wt %, filtered through a microfilter having a pore diameter of 0.1 μm, and each of the positive resist compositions in Examples IV-1 to IV-60 and Comparative Examples IV-1 and IV-2 was prepared.

In Comparative Example IV-1, the resin synthesized in Example 10 in Japanese Patent 3042618, having the structure shown below (hereinafter referred to as resin A) was used.

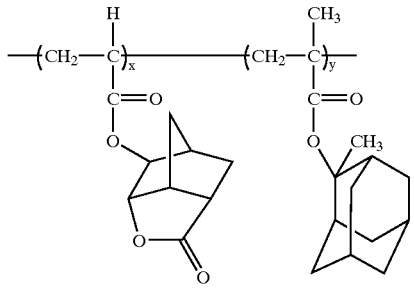

(Resin A, x=0.7, y=0.3, Mw=9,500)

In Comparative Example IV-2, Polymer 12 disclosed in JP-A-00-159758 was used (hereinafter referred to as resin B).

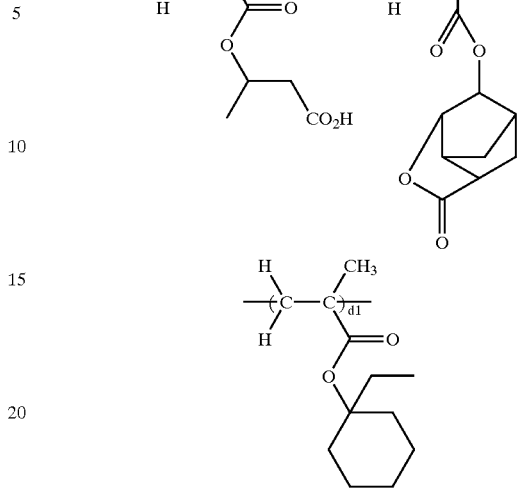

(Resin B, a1=0.10, b1=0.20, d1=0.70, Mw=10,000)

TABLE 29

| Example No. | Resin | Photo-Acid Generator (mg) | Solvent | Surfactant | Amine |
|---|---|---|---|---|---|
| IV-1 | 71 | I-1/III-12 (25/30) | S1 | 1 | 1 |
| IV-2 | 72 | I-2/II-4 (42/30) | S1 | 4 | 2 |
| IV-3 | 73 | I-2/II-1 (28/40) | S1/S5 (80/20) | 2 | 3 |
| IV-4 | 74 | III-3/II-7 (40/60) | S1/S7 (95/5) | 5 | 4 |
| IV-5 | 75 | I-5/II-5 (32/30) | S1/S2 (85/15) | 3 | 5 |
| IV-6 | 76 | III-10/II-10 (45/48) | S1/S9 (92/8) | 2 | 6 |
| IV-7 | 77 | I-6/II-8 (40/40) | S1/S5/S8 (80/13/7) | 1 | 6 |
| IV-8 | 78 | I-3/III-2 (40/20) | S1/S2/S8 (75/15/10) | 2 | 6 |
| IV-9 | 79 | III-3/II-10 (62/20) | S2/S3 (60/40) | 5 | 5 |
| IV-10 | 80 | III-17/II-9 (45/25) | S2/S6 (70/30) | 5 | 3 |
| IV-11 | 81 | I-8/III-11 (36/25) | S1/S2 (82/18) | 3 | 4/5 (1/1) |
| IV-12 | 82 | III-1/II-19 (68/35) | S1/S4 (65/35) | 5 | 5 |
| IV-13 | 83 | I-10/III-1 (40/40) | S1/S5 (75/25) | 2 | 4 |
| IV-14 | 84 | III-1/III-8 (50/20) | S1 | 1 | 1 |
| IV-15 | 85 | I-11/III-2 (34/15) | S1/S6 (80/20) | 2 | 1 |
| IV-16 | 86 | III-1/II-11 (63/30) | S1/S9 (90/10) | 5 | 2 |
| IV-17 | 87 | I-12/III-1 (41/25) | S1/S8 (92/8) | 5 | 3 |
| IV-18 | 88 | I-18/II-14 (40/35) | S1/S2/S9 (78/18/4) | 3 | 4 |
| IV-19 | 89 | I-17/III-2 (37/30) | S1/S5/S10 (75/20/5) | 3 | 5 |
| IV-20 | 90 | III-3/II-12 (55/60) | S1/S7 (93/7) | 5 | 4/5 (2/1) |
| IV-21 | 91 | I-19/III-7 (40/5) | S1/S6/S8 (80/16/4) | 5 | 4 |
| IV-22 | 92 | I-21/II-18 (30/60) | S2/S3 (70/30) | 2 | 6 |
| IV-23 | 93 | I-20/II-14 (34/38) | S2/S6/S9 (60/25/15) | 1 | 6 |
| IV-24 | 94 | III-3/II-11 (58/60) | S2/S6 (85/15) | 3 | 5 |
| IV-25 | 95 | III-1/II10 (60/45) | S2/S3/S7 (70/22/8) | 5 | 4 |

TABLE 30

| Example No. | Resin | Photo-Acid Generator (mg) | Solvent | Surfactant | Amine |
|---|---|---|---|---|---|
| IV-26 | 96 | III-1/II-11 (60/60) | S4/S2 (80/20) | 4 | 3 |
| IV-27 | 97 | I-21/III-2 (20/30) | S4/S5/S8 (65/35/5) | 3 | 2 |
| IV-28 | 98 | I-15/II-19 (43/38) | S4/S2/S9 (65/35/3) | 2 | 1 |
| IV-29 | 99 | I-2/III-5 (32/10) | S4/S5 (70/30) | 1 | 2 |
| IV-30 | 71 | I-1/III-4 (5/40) | S1/S6 (80/20) | 1 | 4 |
| IV-31 | 72 | I-6/III-6 (40/12) | S2/S3/S8 (72/18/10) | 5 | 5 |
| IV-32 | 73 | III-3/II-7 (60/35) | S1/S6/S9 (70/20/10) | 5 | 5 |
| IV-33 | 74 | I-7/II-10 (38/15) | S2/S6/S1 (75/20/5) | 5 | 6 |
| IV-34 | 75 | I-11/II-8 (40/30) | S4/S2 (80/20) | 5 | 6 |
| IV-35 | 76 | I-12/IV-12 (39/11) | S4/S6/S9 (75/18/7) | 5 | 4 |
| IV-36 | 77 | III-3/II-12 (70/30) | S4/S5 (90/10) | 3 | 5 |

TABLE 30-continued

| Example No. | Resin | Photo-Acid Generator (mg) | Solvent | Surfactant | Amine |
|---|---|---|---|---|---|
| IV-37 | 78 | I-13/II-13 (40/28) | S4/S2/S7 (80/16/4) | 2 | 6 |
| IV-38 | 79 | III-17/II-13 (65/40) | S4/S6 (85/15) | 1 | 1 |
| IV-39 | 80 | IV-1/II-20 (48/40) | S4/S6/S8 (78/18/4) | 1 | 2 |
| IV-40 | 81 | I-14/III-15 (36/30) | S4/S6 (75/25) | 1 | 1 |
| IV-41 | 82 | IV-3/II-22 (75/30) | S4/S6/S7 (70/26/4) | 2 | 1 |
| IV-42 | 83 | I-17/II-15 (34/48) | S1/S3 (70/30) | 2 | 2 |
| IV-43 | 84 | III-14/II-14 (40/30) | S1/S2/S8 (68/30/2) | 3 | 4 |
| IV-44 | 85 | I-8/II-10 (42/35) | S1/S7 (92/8) | 5 | 3 |
| IV-45 | 86 | I-14/III-1 (35/34) | S1/S2/S7 (70/26/4) | 5 | 4 |
| IV-46 | 87 | I-9/II-11 (45/45) | S2/S6/S7 (60/28/12) | 5 | 3/5 (1/1) |
| IV-47 | 88 | I-7/II-11 (33/60) | S1/S5/S8 (65/30/5) | 1 | 1/6 (1/1) |
| IV-48 | 89 | III-1/II-10 (58/40) | S2/S6/S8 (60/30/10) | 1 | 5 |
| IV-49 | 90 | I-11/II-11 (35/70) | S1/S5/S9 (70/24/6) | 1 | 4 |
| IV-50 | 91 | III-3/II-8 (45/68) | S4/S2/S7 (80/12/8) | 1 | 2 |

TABLE 31

| Example No. | Resin | Photo-Acid Generator (mg) | Solvent | Surfactant | Amine |
|---|---|---|---|---|---|
| IV-51 | 92 | I-12/III-2 (32/80) | S1/S5/S8 (65/35/5) | 5 | 2 |
| IV-52 | 93 | III-3/II-7 (80/45) | S1/S6/S9 (70/25/5) | 5 | 3 |
| IV-53 | 94 | I-5/III-2 (38/25) | S4/S6/S7 (65/30/5) | 3 | 4 |
| IV-54 | 95 | III-3/II-8 (72/50) | S4/S6/S8 (70/28/2) | 3 | 5 |
| IV-55 | 96 | I-8/II-9 (36/48) | S4/S2/S7 (70/20/10) | 1 | 6 |
| IV-56 | 97 | III-3/II-10 (60/40) | S4/S6/S9 (65/27/5) | 1 | 6 |
| IV-57 | 98 | I-6/III-1 (42/32) | S1/S7 (94/6) | 2 | 4 |
| IV-58 | 99 | III-3/II-11 (62/40) | S1/S7 (96/4) | 2 | 3 |
| IV-59 | 71 | I-8/II-12 (30/38) | S1 | | 1 |
| IV-60 | 72 | I-10/II-11 (32/60) | S1 | 5 | |
| Comparative Example IV-1 | Resin A | I-1 (20) | S1 | | |
| Comparative Example IV-2 | Resin B | Compound (A) (50) | S1 | | 3 |

W-1: Megafac F176 (manufactured by Dainippon Chemicals and Ink Co., Ltd., fluorine-based)

W-2: Megafac R08 (manufactured by Dainippon Ink & Chemicals, Co., Ltd., fluorine-based and silicon-based)

W-3: Polysiloxane polymer KP-341 (manufactured by Shin-Etsu Chemical Co., Ltd.)

W-4: Troy Sol S-366 (manufactured by Troy Chemical Inc.)

As amines:

1: 1,5-Diazabicyclo[4.3.0]nona-5-ene (DBN)

2: bis(1,2,2,6,6-pentamethyl-4-piperidyl)sebacate

3: Tri-n-butylamine

4: Triphenylimidazole

5: Antipyrine

6: 2,6-Diisopropylaniline

As the solvents:

S1: Propylene glycol monomethyl ether acetate

S2: Ethyl lactate

S3: Butyl acetate

S4: 2-Heptanone

S5: Propylene glycol monomethyl ether

S6: Ethyl ethoxypropionate

S7: γ-Butyrolactone

S8: Ethylene carbonate

S9: Propylene carbonate

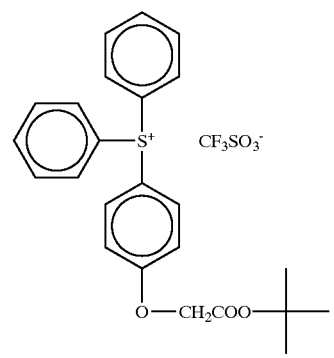

Compound (A)

Evaluation Test

ARC25 (manufactured by Brewer Science Co.) was coated on a silicon wafer in a thickness of 30 nm with a spin coater and dried, then the positive resist composition solution prepared was coated thereon with a spin coater. The samples in which resins 71 to 80 were used were dried at 130° C., and other samples were dried at 140° C., respectively for 90 seconds, to thereby prepare positive photoresist films having a thickness of about 0.4 μm. Each resist underwent exposure with an ArF excimer laser (193 nm). The samples in which resins 71 to 80 were used were subjected to heat treatment after exposure at 120° C., and other samples at 130° C., respectively for 90 seconds, and then to development with a 2.38 wt % tetramethylammonium hydroxide aqueous solution, rinsing with distilled water, thus resist pattern profile was obtained.

The resist pattern of the thus-obtained silicon wafer was observed with a scanning electron microscope (SEM) and evaluated as follows.

The results of evaluations are shown in Tables 32 to 35 below.

PED Stability

The fluctuation coefficient of line width by the exposure amount to reproduce 0.13 µm line pattern (left standing at 23° C. for 60 minutes after exposure) was obtained by the following equation, and PED stability was evaluated by the obtained value.

PED stability (%)=|(line width of the pattern aged after exposure (0.13 µm))−(line width of the pattern heat-treated immediately after exposure)|/(0.13 µm)×100

PED Fluctuation with the Lapse of Time

PED stability of the positive resist composition solution left to stand at 4° C. for one week was evaluated. The fluctuation coefficient of the line width before and after storage was obtained by the following equation, and PED fluctuation with the lapse of time was evaluated by the obtained value.

PED fluctuation with the lapse of time (%)=|(PED stability before aging (%))−(PED stability after aging (%))|/(PED stability before aging (%))×100

Sensitivity Fluctuation Before and After Aging

The sensitivities of the positive resist composition solution just after preparation (the exposure amount before aging) and after being left to stand at 4° C. for one week (the exposure amount after aging) were thus evaluated, and the fluctuation coefficient of sensitivity was evaluated by the value obtained according to the following equation.

Fluctuation coefficient of sensitivity (%)=|(exposure amount before aging)−(exposure amount after aging)|/(exposure amount before aging)×100

Side Lobe Resistance

A pattern of 0.22 µm was resolved to 0.20 µm through a half tone phase shift mask, and pattern of 0.18 µm was observed. Evaluation was performed by the following criteria.

◯: Side lobe was not observed at all.
_: Side lobe was observed a little.
x: Side lobe was observed apparently.

Hole Pitch Dependency

In contact hole pattern (fine pattern) and isolated contact hole pattern (rough pattern) of 0.16 µm, the overlapping range of the depth of focus tolerating 0.20 µm±10% was obtained. The larger the range, the better is the pitch dependency.

Exposure Margin

The value obtained by dividing the exposure amount width reproducing line width of 0.16 µm±10% by the optimal exposure amount was expressed by percentage (%), with the exposure amount reproducing contact hole of 0.16 µm being the optimal exposure amount. The larger the numeral, the smaller is the line width fluctuation to the variation of exposure amount.

Uniformity in Film Decrease

The above-obtained contact hole pattern of 0.16 µm was subjected to etching with $CHF_3/O_2$ of 8/2 plasma for 60 seconds, and the cross section and the surface of the obtained sample was observed with an SEM. Evaluation was performed by the following criteria.

x: Pinhole-like defect was generated (the lower layer of the part prearranged not to be processed was etched).
_: Surface chapping was generated but defect was not seen, and accompanied by the deformation of hole.
◯: Surface chapping was little and free of deformation of hole.

TABLE 32

| Example No. | PED Stability (%) | Sensitivity Fluctuation (%) | PED Fluctuation with Aging (%) | Half Tone Aptitude (side lobe resistance) | Hole Pitch Dependency (µm) | Exposure Margin (%) | Film Decrease Uniformity |
|---|---|---|---|---|---|---|---|
| IV-1 | 5 | 8 | 6 | ◯ | 0.6 | 9 | — |
| IV-2 | 5 | 9 | 6 | ◯ | 0.5 | 7 | — |
| IV-3 | 4 | 6 | 5 | ◯ | 0.6 | 9 | — |
| IV-4 | 4 | 6 | 5 | ◯ | 0.6 | 9 | — |
| IV-5 | 4 | 6 | 5 | ◯ | 0.6 | 9 | — |
| IV-6 | 4 | 6 | 5 | ◯ | 0.6 | 9 | — |
| IV-7 | 4 | 5 | 4 | ◯ | 0.6 | 9 | — |
| IV-8 | 4 | 5 | 4 | ◯ | 0.6 | 9 | — |
| IV-9 | 5 | 6 | 5 | ◯ | 0.6 | 9 | — |
| IV-10 | 5 | 6 | 5 | ◯ | 0.6 | 9 | — |
| IV-11 | 4 | 5 | 4 | ◯ | 0.6 | 10 | ◯ |
| IV-12 | 4 | 7 | 5 | ◯ | 0.6 | 10 | ◯ |
| IV-13 | 4 | 5 | 4 | ◯ | 0.6 | 10 | ◯ |
| IV-14 | 4 | 7 | 5 | ◯ | 0.6 | 10 | ◯ |
| IV-15 | 4 | 5 | 4 | ◯ | 0.6 | 10 | ◯ |
| IV-16 | 4 | 5 | 4 | ◯ | 0.6 | 10 | ◯ |
| IV-17 | 4 | 5 | 4 | ◯ | 0.6 | 10 | ◯ |
| IV-18 | 3 | 4 | 3 | ◯ | 0.6 | 10 | ◯ |
| IV-19 | 3 | 4 | 3 | ◯ | 0.6 | 10 | ◯ |
| IV-20 | 4 | 5 | 4 | ◯ | 0.6 | 10 | ◯ |

TABLE 33

| Example No. | PED Stability (%) | Sensitivity Fluctuation (%) | PED Fluctuation with Aging (%) | Half Tone Aptitude (side lobe resistance) | Hole Pitch Dependency ($\mu$m) | Exposure Margin (%) | Film Decrease Uniformity |
|---|---|---|---|---|---|---|---|
| IV-21 | 4 | 4 | 3 | o | 0.6 | 10 | o |
| IV-22 | 4 | 5 | 4 | o | 0.6 | 10 | o |
| IV-23 | 3 | 4 | 3 | o | 0.6 | 10 | o |
| IV-24 | 4 | 5 | 4 | o | 0.6 | 10 | o |
| IV-25 | 3 | 4 | 3 | o | 0.6 | 10 | o |
| IV-26 | 4 | 5 | 4 | o | 0.5 | 8 | o |
| IV-27 | 3 | 4 | 3 | o | 0.6 | 10 | o |
| IV-28 | 3 | 4 | 3 | o | 0.6 | 10 | o |
| IV-29 | 4 | 5 | 4 | o | 0.6 | 10 | o |
| IV-30 | 5 | 7 | 5 | o | 0.6 | 10 | — |
| IV-31 | 4 | 5 | 4 | o | 0.6 | 10 | — |
| IV-32 | 4 | 5 | 4 | o | 0.6 | 10 | — |
| IV-33 | 4 | 5 | 4 | o | 0.6 | 10 | — |
| IV-34 | 5 | 7 | 5 | o | 0.6 | 10 | — |
| IV-35 | 4 | 5 | 4 | o | 0.6 | 10 | — |
| IV-36 | 5 | 7 | 5 | o | 0.6 | 10 | — |
| IV-37 | 4 | 5 | 4 | o | 0.6 | 10 | — |
| IV-38 | 5 | 7 | 5 | o | 0.6 | 10 | — |
| IV-39 | 4 | 5 | 4 | o | 0.6 | 10 | — |
| IV-40 | 4 | 5 | 4 | o | 0.6 | 10 | o |

TABLE 34

| Example No. | PED Stability (%) | Sensitivity Fluctuation (%) | PED Fluctuation with Aging (%) | Half Tone Aptitude (side lobe resistance) | Hole Pitch Dependency ($\mu$m) | Exposure Margin (%) | Film Decrease Uniformity |
|---|---|---|---|---|---|---|---|
| IV-41 | 3 | 4 | 3 | o | 0.6 | 10 | o |
| IV-42 | 4 | 6 | 5 | o | 0.6 | 10 | o |
| IV-43 | 3 | 4 | 3 | o | 0.6 | 10 | o |
| IV-44 | 4 | 5 | 4 | o | 0.6 | 10 | o |
| IV-45 | 3 | 4 | 3 | o | 0.6 | 10 | o |
| IV-46 | 3 | 4 | 3 | o | 0.6 | 10 | o |
| IV-47 | 3 | 4 | 3 | o | 0.6 | 10 | o |
| IV-48 | 3 | 4 | 3 | o | 0.6 | 10 | o |
| IV-49 | 3 | 4 | 3 | o | 0.6 | 10 | o |
| IV-50 | 3 | 4 | 3 | o | 0.6 | 10 | o |
| IV-51 | 3 | 4 | 3 | o | 0.6 | 10 | o |
| IV-52 | 3 | 4 | 3 | o | 0.6 | 10 | o |
| IV-53 | 3 | 4 | 3 | o | 0.6 | 10 | o |
| IV-54 | 3 | 4 | 3 | o | 0.6 | 10 | o |
| IV-55 | 3 | 4 | 3 | o | 0.6 | 10 | o |
| IV-56 | 3 | 4 | 3 | o | 0.6 | 10 | o |
| IV-57 | 4 | 5 | 4 | o | 0.6 | 10 | o |
| IV-58 | 4 | 5 | 4 | o | 0.6 | 10 | o |
| IV-59 | 6 | 10 | 7 | o | 0.4 | 6 | — |
| IV-60 | 6 | 11 | 6 | o | 0.5 | 7 | — |

TABLE 35

| Example No. | PED Stability (%) | Sensitivity Fluctuation (%) | PED Fluctuation with Aging (%) | Half Tone Aptitude (side lobe resistance) | Hole Pitch Dependency ($\mu$m) | Exposure Margin (%) | Film Decrease Uniformity |
|---|---|---|---|---|---|---|---|
| Comparative Example IV-1 | 10 | 25 | 15 | x | 0.2 | 2 | x |
| Comparative Example IV-2 | 15 | 20 | 17 | x | 0.2 | 3 | x |

As is apparent from the above results, the composition of the present invention is excellent in half tone exposure aptitude, hole pitch dependency and exposure margin, as a result, sensitivity fluctuation due to aging storage can be prevented. Further, the composition of the present invention exhibits excellent PED stability and PED stability with the lapse of time, therefore, PED fluctuation by aging can be prevented, and the composition is also excellent in film decrease uniformity when resins are subjected to oxide etching.

The composition in the second embodiment of the present invention has aptitude to far ultraviolet rays, in particular, ArF excimer laser beams of wavelength of 193 nm, and is excellent in half tone exposure aptitude, hole pitch dependency and exposure margin, thus sensitivity fluctuation due to aging storage can be prevented. Further, the composition of the present invention exhibits excellent PED stability, therefore, PED fluctuation by aging can be prevented, and the composition is also excellent in film decrease uniformity when resins are subjected to oxide etching.

Accordingly, the composition of the present invention can be preferably used in lithography using far ultraviolet ray including ArF excimer laser exposure.

While the invention has been described in detail and with reference to specific examples thereof, it will be apparent to one skilled in the art that various changes and modifications can be made therein without departing from the spirit and scope thereof.

The entire disclosure of each and every foreign patent application from which the benefit of foreign priority has been claimed in the present application is incorporated herein by reference, as if fully set forth.

What is claimed is:

1. A positive photosensitive composition comprising:
   (A) an acid generator capable of generating an acid upon irradiation with one of an actinic ray and a radiation;
   (B) a resin: having a monocyclic or polycyclic alicyclic hydrocarbon structure; and being capable of decomposing by the action of an acid to increase the solubility in an alkali developer;
   (C) a basic compound; and
   (D) a surfactant containing at least one of a fluorine atom and a silicon atom;
   wherein the acid generator (A) comprises at least two compounds selected from the group consisting of a sulfonium salt compound not having an aromatic ring, a triarylsulfonium salt compound, and a compound having a phenacylsulfonium salt structure.

2. The positive photosensitive composition as claimed in claim 1, which comprises (E) a solvent mixture including:
   a solvent containing a hydroxyl group; and
   a solvent not containing a hydroxyl group.

3. The positive photosensitive composition as claimed in claim 1, wherein the basic compound (C) includes a compound having at least one structure selected from the group consisting of an imidazole structure, a diazabicyclo structure, an onium hydroxide structure, an onium carboxylate structure and an aniline structure.

4. The positive photosensitive composition as claimed in claim 1, which further comprises (F) a low molecular weight dissolution-inhibiting compound having: a molecular weight of 3,000 or less; and a group capable of decomposing by the action of an acid to increase the solubility in an alkali developer.

5. The positive photosensitive composition as claimed in claim 1, wherein the acid generator (A) comprises the triarylsulfonium salt compound and the compound having a phenacylsulfonium salt structure.

6. The positive photosensitive composition as claimed in claim 1, wherein the acid generator (A) comprises the sulfonium salt compound not having an aromatic ring and the compound having a phenacylsulfonium salt structure.

7. The positive photosensitive composition as claimed in claim 1, wherein the acid generator (A) comprises the sulfonium salt compound not having an aromatic ring and the triarylsulfonium salt compound.

8. The positive photosensitive composition as claimed in claim 1, wherein the resin (B) contains at least one selected from the group consisting of: a repeating unit having a partial structure containing an alicyclic hydrocarbon represented by formula (pI), (pII), (pIII), (pIV), (pV) or (pVI) below; and a repeating unit represented by formula (II-AB):

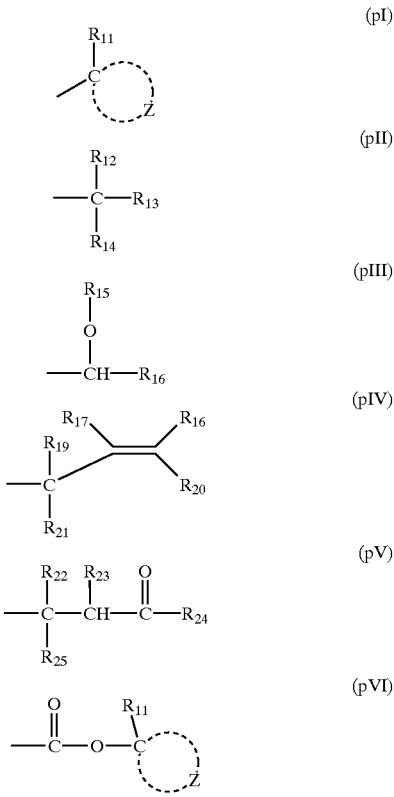

wherein $R_{11}$ represents a methyl group, an ethyl group, an n-propyl group, an isopropyl group, an n-butyl group, an isobutyl group or a sec-butyl group; Z represents an atomic group necessary to form an alicyclic hydrocarbon group together with the carbon atom; $R_{12}$, $R_{13}$, $R_{14}$, $R_{15}$ and $R_{16}$ each independently represents a straight chain or branched alkyl group having from 1 to 4 carbon atoms, or an alicyclic hydrocarbon group, provided that at least one of $R_{12}$, $R_{13}$ and $R_{14}$ represents an alicyclic hydrocarbon group, and at least one of $R_{15}$ and $R_{16}$ represents an alicyclic hydrocarbon group; $R_{17}$, $R_{18}$, $R_{19}$, $R_{20}$ and $R_{21}$ each independently represents a hydrogen atom, a straight chain or branched alkyl group having from 1 to 4 carbon atoms, or an alicyclic hydrocarbon group, provided that at least one of $R_{17}$, $R_{18}$, $R_{19}$, $R_{20}$ and $R_{21}$ represents an alicyclic hydrocarbon group, and at least one of $R_{19}$ and $R_{21}$ represents a straight chain or branched alkyl group having from 1 to 4 carbon atoms, or an alicyclic hydrocarbon group; and $R_{22}$, $R_{23}$, $R_{24}$ and $R_{25}$ each independently represents a straight chain or branched alkyl group having from 1 to 4 carbon atoms, or an alicyclic hydrocarbon group, provided that at least one of $R_{22}$, $R_{23}$, $R_{24}$ and $R_{25}$ represents an alicyclic hydrocarbon group, and $R_{23}$ and $R_{24}$ may be bonded to each other to form a ring;

wherein $R_{11}'$ and $R_{12}'$ each independently represents a hydrogen atom, a cyano group, a halogen atom, or an alkyl group which may have a substituent; Z' represents an atomic group necessary to form an alicyclic structure together with the two carbon atoms (C—C), which may have a substituent.

9. The positive photosensitive composition as claimed in claim 8, wherein Z' in formula (II-AB) represents an atomic group necessary to form a bridge-containing alicyclic structure together with the two carbon atoms (C—C), which may have a substituent.

10. The positive photosensitive composition as claimed in claim 8, wherein the compound represented by formula (II-AB) is represented by formula (II-A) or (II-B):

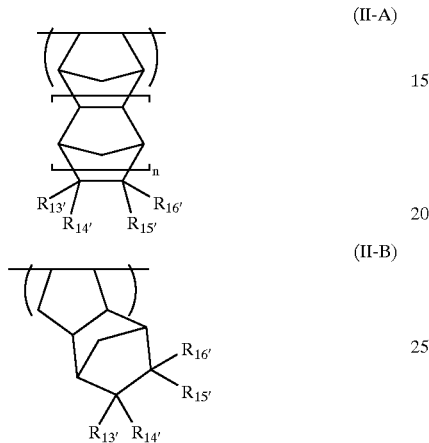

wherein $R_{13}'$, $R_{14}'$, $R_{15}'$ and $R_{16}'$ each independently represents a hydrogen atom, a halogen atom, a cyano group, —COOH, —COOR$_5$, a group which decomposes by the action of an acid, —C(=O)—X—A'—R$_{17}'$, an alkyl group which may have a substituent, or an alicyclic hydrocarbon group which may have a substituent; $R_5$ represents an alkyl group which may have a substituent, a cyclic hydrocarbon group which may have a substituent, or a —Y group shown below; X represents an oxygen atom, a sulfur atom, —NH—, —NHSO$_2$— or —NHSO$_2$NH—; A' represents a single bond or a divalent linking group; at least two of $R_{13}'$, $R_{14}'$, $R_{15}'$ and $R_{16}'$ may be bonded to each other to form a ring; n represents 0 or 1; $R_{17}'$ represents —COOH, —COOR$_5$, —CN, a hydroxyl group, an alkoxyl group which may have a substituent, —CO—NH—R$_6$, —CO—NH—SO$_2$—R$_6$, or a —Y group shown below; $R_6$ represents an alkyl group which may have a substituent or a cyclic hydrocarbon group which may have a substituent, —Y group:

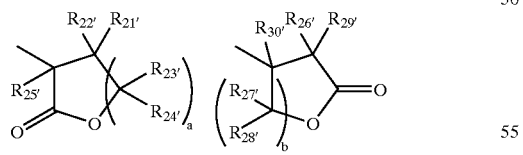

wherein $R_{21}'$ to $R_{30}'$ each independently represents a hydrogen atom or an alkyl group which may have a substituent, and a and b each represents 1 or 2.

11. A positive photosensitive composition comprising:
(A) a compound capable of generating an acid upon irradiation with one of an actinic ray and a radiation; and
(B1) a resin capable of increasing the solubility in an alkali developer by the action of an acid, in which the resin has: a repeating unit having a group represented by formula (V-1), (V-2), (V-3) or (V-4) below; and an aliphatic cyclic hydrocarbon group:

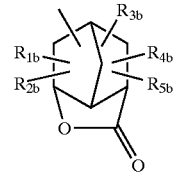

(V-1)

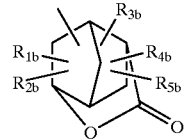

(V-2)

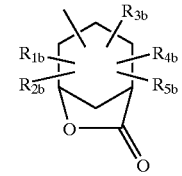

(V-3)

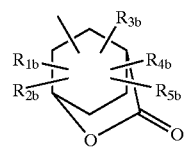

(V-4)

wherein $R_{1b}$, $R_{2b}$, $R_{3b}$, $R_{4b}$ and $R_{5b}$ each independently represents a hydrogen atom, an alkyl group which may have a substituent, a cycloalkyl group which may have a substituent, or an alkenyl group which may have a substituent; two of $R_{1b}$, $R_{2b}$, $R_{3b}$, $R_{4b}$ and $R_{5b}$ may be bonded to form a ring, wherein the acid generator (A) comprises at least two compounds selected from the group consisting of a triarylsulfonium salt compound, a compound having a phenacylsulfonium salt structure, and a sulfonium salt compound not having an aromatic ring.

12. The positive photosensitive composition as claimed in claim 11, wherein the resin (B) contains at least one selected from the group consisting of: a repeating unit having a partial structure containing an alicyclic hydrocarbon represented by formula (pI), (pII), (pIII), (pIV), (pV) or (pVI) below; and a repeating unit represented by formula (II-AB):

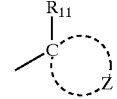

(pI)

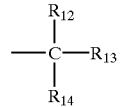

(pII)

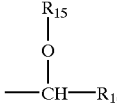

(pIII)

-continued (pIV)

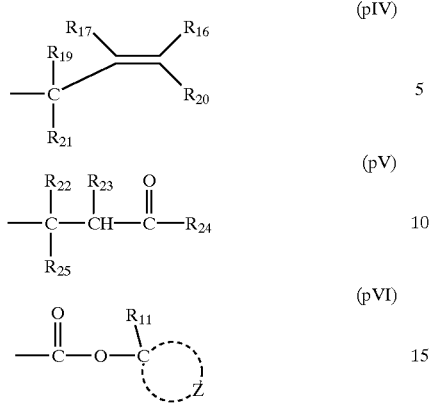

(pV)

(pVI)

(II-A)

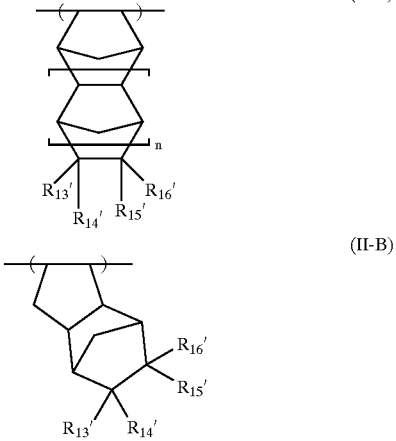

(II-B)

wherein $R_{11}$ represents a methyl group, an ethyl group, an n-propyl group, an isopropyl group, an n-butyl group, an isobutyl group or a sec-butyl group; Z represents an atomic group necessary to form an alicyclic hydrocarbon group together with the carbon atom; $R_{12}$, $R_{13}$, $R_{14}$, $R_{15}$ and $R_{16}$ each independently represents a straight chain or branched alkyl group having from 1 to 4 carbon atoms, or an alicyclic hydrocarbon group, provided that at least one of $R_{12}$, $R_{13}$ and $R_{14}$ represents an alicyclic hydrocarbon group, and at least one of $R_{15}$ and $R_{16}$ represents an alicyclic hydrocarbon group; $R_{17}$, $R_{18}$, $R_{19}$, $R_{20}$ and $R_{21}$ each independently represents a hydrogen atom, a straight chain or branched alkyl group having from 1 to 4 carbon atoms, or an alicyclic hydrocarbon group, provided that at least one of $R_{17}$, $R_{18}$, $R_{19}$, $R_{20}$ and $R_{21}$ represents an alicyclic hydrocarbon group, and at least one of $R_{19}$ and $R_{21}$ represents a straight chain or branched alkyl group having from 1 to 4 carbon atoms, or an alicyclic hydrocarbon group; and $R_{22}$, $R_{23}$, $R_{24}$ and $R_{25}$ each independently represents a straight chain or branched alkyl group having from 1 to 4 carbon atoms, or an alicyclic hydrocarbon group, provided that at least one of $R_{22}$, $R_{23}$, $R_{24}$ and $R_{25}$ represents an alicyclic hydrocarbon group, and $R_{23}$ and $R_{24}$ may be bonded to each other to form a ring;

(II-AB)

wherein $R_{11}'$ and $R_{12}'$ each independently represents a hydrogen atom, a cyano group, a halogen atom, or an alkyl group which may have a substituent; Z' represents an atomic group necessary to form an alicyclic structure together with the two carbon atoms (C—C), which may have a substituent.

13. The positive photosensitive composition as claimed in claim 12, wherein Z' in formula (II-AB) represents an atomic group necessary to form a bridge-containing alicyclic structure together with the two carbon atoms (C—C), which may have a substituent.

14. The positive photosensitive composition as claimed in claim 12, wherein the compound represented by formula (II-AB) is represented by formula (II-A) or (II-B):

wherein $R_{13}'$, $R_{14}'$, $R_{15}'$ and $R_{16}'$ each independently represents a hydrogen atom, a halogen atom, a cyano group, —COOH, —COOR$_5$, a group which decomposes by the action of an acid, —C(=O)—X—A'—R$_{17}'$, an alkyl group which may have a substituent, or an alicyclic hydrocarbon group which may have a substituent; $R_5$ represents an alkyl group which may have a substituent, a cyclic hydrocarbon group which may have a substituent, or a —Y group shown below; X represents an oxygen atom, a sulfur atom, —NH—, —NHSO$_2$— or —NHSO$_2$NH—; A' represents a single bond or a divalent linking group; at least two of $R_{13}'$, $R_{14}'$, $R_{15}'$ and $R_{16}'$ may be bonded to each other to form a ring; n represents 0 or 1; $R_{17}'$ represents —COOH, —COOR$_5$, —CN, a hydroxyl group, an alkoxyl group which may have a substituent, —CO—NH—R$_6$, —CO—NH—SO$_2$—R$_6$, or a —Y group shown below; $R_6$ represents an alkyl group which may have a substituent or a cyclic hydrocarbon group which may have a substituent, —Y group:

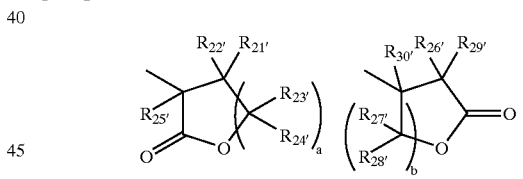

wherein $R_{21}'$ to $R_{30}'$ each independently represents a hydrogen atom or an alkyl group which may have a substituent, and a and b each represents 1 or 2.

15. The positive photosensitive composition as claimed in claim 11, which further comprises (C) a surfactant containing at least one of a fluorine atom and a silicon atom.

16. The positive photosensitive composition as claimed in claim 11, which further comprises (D) a solvent mixture containing:
   at least one solvent selected from the solvent group A below; and
   at least one of a solvent selected from the solvent group B below, and a solvent selected from the solvent group C:
   group A: propylene glycol monoalkyl ether acylate,
   group B: propylene glycol monoalkyl ether, alkyl lactate and alkyl alkoxypropionate,
   group C: γ-butyrolactone, ethylene carbonate, and propylene carbonate.

17. The positive photosensitive composition as claimed in claim 11, which further comprises (D) a solvent mixture containing:

at least one alkyl lactate; and at least one of an ester solvent and alkyl alkoxypropionate.

18. The positive photosensitive composition as claimed in claim 17, wherein the solvent (D) further contains at least one of γ-butyrolactone, ethylene carbonate, and propylene carbonate.

19. The positive photosensitive composition as claimed in claim 11, which further comprises (D) a solvent mixture containing:

at least one solvent selected from the solvent group D below; and at least one of a solvent selected from the solvent group E, and at a solvent selected from the solvent group F:

group D: heptanone;

group E: propylene glycol monoalkyl ether, alkyl lactate and alkyl alkoxypropionate;

group F: γ-butyrolactone, ethylene carbonate, and propylene carbonate.

* * * * *